US009291897B2

(12) United States Patent
Hirano et al.

(10) Patent No.: US 9,291,897 B2

(45) Date of Patent: Mar. 22, 2016

(54) PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE USING THE SAME, AND ELECTRONIC DEVICE

(71) Applicant: FUJIFILM Corporation, Tokyo (JP)

(72) Inventors: Shuji Hirano, Shizuoka (JP); Natsumi Yokokawa, Shizuoka (JP); Hiroo Takizawa, Shizuoka (JP); Wataru Nihashi, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/605,292

(22) Filed: Jan. 26, 2015

(65) Prior Publication Data

US 2015/0185610 A1 Jul. 2, 2015

Related U.S. Application Data

(63) Continuation of application No. PCT/JP2013/070832, filed on Jul. 25, 2013.

(60) Provisional application No. 61/708,782, filed on Oct. 2, 2012.

(30) Foreign Application Priority Data

Jul. 27, 2012 (JP) ................................ 2012-167815
Mar. 15, 2013 (JP) ................................ 2013-054402

(51) Int. Cl.

| | |
|---|---|
| ***G03F 7/004*** | (2006.01) |
| ***G03F 7/30*** | (2006.01) |
| ***G03F 7/038*** | (2006.01) |
| ***G03F 7/20*** | (2006.01) |
| ***C08F 220/28*** | (2006.01) |
| ***C08F 222/14*** | (2006.01) |
| ***C08F 220/18*** | (2006.01) |
| ***C08F 220/26*** | (2006.01) |
| ***H01L 21/027*** | (2006.01) |
| ***C08F 12/24*** | (2006.01) |
| ***C08F 232/08*** | (2006.01) |
| ***C09D 125/18*** | (2006.01) |
| *C08F 212/14* | (2006.01) |
| *C08F 12/20* | (2006.01) |
| *C08F 12/30* | (2006.01) |

(52) U.S. Cl.

CPC .............. *G03F 7/0388* (2013.01); *C08F 12/24* (2013.01); *C08F 220/18* (2013.01); *C08F 220/26* (2013.01); *C08F 220/28* (2013.01); *C08F 222/14* (2013.01); *C08F 232/08* (2013.01); *C09D 125/18* (2013.01); *G03F 7/2002* (2013.01); *G03F 7/2037* (2013.01); *G03F 7/30* (2013.01); *H01L 21/0274* (2013.01); *C08F 12/20* (2013.01); *C08F 12/30* (2013.01); *C08F 212/14* (2013.01); *C08F 2220/281* (2013.01)

(58) Field of Classification Search

CPC ......... G03F 7/038; G03F 7/0388; G03F 7/30; C08F 220/18; C08F 220/12; C08F 220/20; C08F 220/26; C08F 12/24; C08F 2220/285; H01L 21/0271; H01L 21/0273; H01L 21/0274

USPC ................ 430/270.1, 322, 325, 329; 526/320

See application file for complete search history.

(56) References Cited

U.S. PATENT DOCUMENTS

| | | | | |
|---|---|---|---|---|
| 8,252,504 | B2 * | 8/2012 | Harada et al. | 430/270.1 |
| 8,426,115 | B2 * | 4/2013 | Hatakeyama et al. | 430/312 |
| 8,795,948 | B2 * | 8/2014 | Dazai et al. | 430/270.1 |
| 8,802,352 | B2 * | 8/2014 | Ichikawa et al. | 430/270.1 |
| 8,841,060 | B2 * | 9/2014 | Kataoka et al. | 430/270.1 |
| 8,883,396 | B2 * | 11/2014 | Yahagi et al. | 430/270.1 |
| 9,017,924 | B2 * | 4/2015 | Takaki et al. | 430/270.1 |
| 2002/0061462 | A1 | 5/2002 | Uenishi | |
| 2004/0023153 | A1 | 2/2004 | Takeda et al. | |
| 2008/0241745 | A1 | 10/2008 | Shirakawa et al. | |
| 2010/0055608 | A1 * | 3/2010 | Ohashi et al. | 430/270.1 |
| 2010/0136485 | A1 * | 6/2010 | Hasegawa et al. | 430/296 |
| 2011/0236826 | A1 * | 9/2011 | Hatakeyama et al. | 430/270.1 |
| 2011/0236831 | A1 * | 9/2011 | Hasegawa et al. | 430/285.1 |
| 2011/0300485 | A1 | 12/2011 | Tsubaki et al. | |

(Continued)

FOREIGN PATENT DOCUMENTS

| | | |
|---|---|---|
| JP | 2002-148806 A | 5/2002 |
| JP | 2004-045448 A | 2/2004 |

(Continued)

OTHER PUBLICATIONS

Search Report (PCT/ISA/210) dated Aug. 27, 2013, issued by the International Searching Authority in counterpart International Application No. PCT/JP2013/070832.

(Continued)

*Primary Examiner* — Amanda C Walke

(74) *Attorney, Agent, or Firm* — Sughrue Mion, PLLC

(57) ABSTRACT

There is provided a pattern forming method comprising, in order, (1) a step of forming a film by using an actinic ray-sensitive or radiation-sensitive resin composition containing (Ab) a resin having specific repeating units, (2) a step of exposing the film by using an electron beam or an extreme-ultraviolet ray, and (3) a step of developing the exposed film by using an organic solvent-containing developer to form a negative pattern.

11 Claims, No Drawings

(56) References Cited

U.S. PATENT DOCUMENTS

| | | | | |
|---|---|---|---|---|
| 2012/0208124 | A1* | 8/2012 | Iwashita et al. | 430/270.1 |
| 2012/0328987 | A1* | 12/2012 | Hatakeyama et al. | 430/285.1 |
| 2013/0022911 | A1* | 1/2013 | Utsumi et al. | 430/270.1 |
| 2013/0084523 | A1* | 4/2013 | Nakamura et al. | 430/270.1 |
| 2013/0115556 | A1 | 5/2013 | Iwato et al. | |
| 2013/0189619 | A1* | 7/2013 | Komuro et al. | 430/270.1 |
| 2013/0209936 | A1* | 8/2013 | Hatakeyama et al. | 430/285.1 |
| 2013/0260312 | A1* | 10/2013 | Suzuki et al. | 430/270.1 |
| 2014/0186769 | A1* | 7/2014 | Kaiho et al. | 430/285.1 |

FOREIGN PATENT DOCUMENTS

| | | | |
|---|---|---|---|
| JP | 2008-268935 | A | 11/2008 |
| JP | 2010-217884 | A | 9/2010 |
| JP | 2010-286646 | A | 12/2010 |
| JP | 2011-180495 | A | 9/2011 |
| JP | 2011-197339 | A | 10/2011 |
| JP | 2012-008500 | A | 1/2012 |

OTHER PUBLICATIONS

Written Opinion (PCT/ISA/237) dated Aug. 27, 2013, issued by the International Searching Authority in counterpart International Application No. PCT/JP2013/070832.

Office Action issued on Aug. 25, 2015 by the Japanese Patent Office in counterpart Japanese Application No. 2013-054402.

* cited by examiner

PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE USING THE SAME, AND ELECTRONIC DEVICE

CROSS REFERENCE TO RELATED APPLICATION

This is a continuation of International Application No. PCT/JP2013/070832 filed on Jul. 25, 2013, and claims priority from Japanese Patent Application No. 2012-167815 filed on Jul. 27, 2012, U.S. Provisional Application No. 61/708,782 filed on Oct. 2, 2012, and Japanese Patent Application No. 2013-054402 filed on Mar. 15, 2013 the entire disclosures of which are incorporated therein by reference.

TECHNICAL FIELD

The present invention relates to a pattern forming method using a developer containing an organic solvent, which is suitably used for the ultramicrolithography process such as production of VLSI or high-capacity microchip or in other photofabrication processes, an actinic ray-sensitive or radiation-sensitive resin composition, a resist film, a manufacturing method of an electronic device using the same, and an electronic device. More specifically, the present invention relates to a resist pattern forming method using a developer containing an organic solvent, which can be suitably used for semiconductor microfabrication employing an electron beam or EUV light (wavelength: near 13 nm), an actinic ray-sensitive or radiation-sensitive resin composition, a resist film, a manufacturing method of an electronic device using the same, and an electronic device.

BACKGROUND ART

In the process of producing a semiconductor device such as IC and LSI, microfabrication by lithography using a photoresist composition has been conventionally performed. Recently, with the increase in integration degree of an integrated circuit, formation of an ultrafine pattern in the submicron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is also proceeding.

The lithography using electron beam, X-ray or EUV light is positioned as a next-generation or next-next-generation pattern formation technology and a high-sensitivity and high-resolution resist composition is being demanded.

Particularly, in order to shorten the wafer processing time, elevation of sensitivity is very important, but when higher sensitivity is pursued, the pattern profile or the resolution indicated by the limiting resolution line width is deteriorated, and development of a resist composition satisfying all of these properties at the same time is strongly demanded.

High sensitivity is in a trade-off relationship with high resolution and good pattern profile, and it is very important how to satisfy all of these properties at the same time.

The actinic ray-sensitive or radiation-sensitive resin composition generally includes "a positive type" using a resin sparingly-soluble or insoluble in an alkali developer, where the exposed area is solubilized in an alkali developer upon exposure to radiation and a pattern is thereby formed, and "a negative type" using a resin soluble in an alkali developer, where the exposed area is sparingly solubilized or insolubilized in an alkali developer upon exposure to radiation and a pattern is thereby formed.

As the actinic ray-sensitive or radiation-sensitive resin composition suitable for such a lithography process using electron beam, X-ray or EUV light, a chemical amplification positive resist composition utilizing an acid catalytic reaction is mainly studied from the standpoint of elevating the sensitivity, and a chemical amplification positive resist composition composed of, as main components, a phenolic resin having a property of being insoluble or sparingly soluble in an alkali developer but becoming soluble in an alkali developer by an action of an acid (hereinafter simply referred to as "phenolic acid-decomposable resin"), and an acid generator is being effectively used.

In the production of a semiconductor device or the like, patterns having various profiles such as line, trench and hole need to be formed. For meeting the requirement to form patterns having various profiles, not only a positive actinic ray-sensitive or radiation-sensitive resin composition but also a negative actinic ray-sensitive or radiation-sensitive resin composition are currently under development (see, for example, JP-A-2002-148806 (the term "JP-A" as used herein means an "unexamined published Japanese patent application"), JP-A-2008-268935).

In the formation of an ultrafine pattern, more improvements on the reduction of resolution and the pattern profile are demanded.

In order to solve this problem, there has been also proposed a method where an acid-decomposable resin is developed using a developer other than an alkali developer (see, for example, JP-A-2012-008500, JP-A-2011-197339).

However, in an ultrafine region (for example, a region of a line width or a space width on the order of tens of nm), it is required to satisfy high sensitivity, high resolution at the formation of an isolated line pattern and an isolated space pattern, good pattern profile and high dry etching resistance.

SUMMARY OF INVENTION

An object of the present invention is to solve the technical problem of enhancing the performance in semiconductor microfabrication using an electron beam or an extreme ultraviolet ray (EUV light) and provide a pattern forming method ensuring that particularly in the formation of a pattern having an ultrafine (for example, on the order of tens of nm) line width or space width, all of high sensitivity, high resolution at the formation of an isolated line pattern and an isolated space pattern, good pattern profile and high dry etching resistance are satisfied at the same time, an actinic ray-sensitive or radiation-sensitive resin composition, a resist film, a manufacturing method of an electronic device using the same, and an electronic device.

That is, the present invention is as follows.

[1] A pattern forming method comprising, in order, (1) a step of forming a film by using an actinic ray-sensitive or radiation-sensitive resin composition containing (Ab) a resin having a repeating unit represented by the following formula (Ab1) and a repeating unit represented by the following formula (A), (2) a step of exposing the film, and (3) a step of developing the exposed film by using an organic solvent-containing developer to form a negative pattern:

(Ab1)

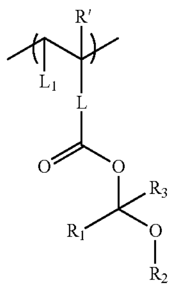

wherein in formula (Ab1),

R' represents a hydrogen atom or an alkyl group, $L_1$ represents a hydrogen atom or an alkyl group, $L_1$ may combine with L to form a ring and in this case, $L_1$ represents an alkylene group or a carbonyl group, L represents a single bond or a divalent linking group, and when $L_1$ and L combine to form a ring, L represents a trivalent linking group, $R_1$ represents a hydrogen atom or a monovalent substituent, $R_2$ represents a monovalent substituent, and $R_1$ and $R_2$ may combine with each other to form a ring, and $R_3$ represents a hydrogen atom, an alkyl group or a cycloalkyl group;

(A)

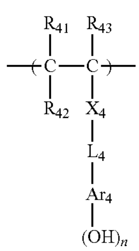

wherein in formula (A), each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ or $X_4$ to form a ring and in this case, $R_{42}$ represents a single bond or an alkylene group, $X_4$ represents a single bond, an alkylene group, —COO— or —$CONR_{64}$—, wherein $R_{64}$ represents a hydrogen atom or an alkyl group, $L_4$ represents a single bond, —COO— or an alkylene group, $Ar_4$ represents an (n+1)-valent aromatic ring group and in the case of combining with $R_{42}$ to form a ring, $Ar_4$ represents an (n+2)-valent aromatic ring group, and n represents an integer of 1 to 4.

[2] The pattern forming method as described in [1], wherein the repeating unit represented by formula (A) is a repeating unit represented by the following formula (A1) or (A2):

(A1)

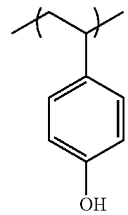

(A2)

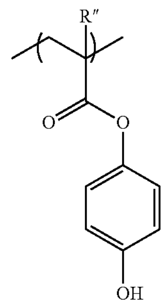

wherein in formula (A2),

R" represents a hydrogen atom or a methyl group.

[3] The pattern forming method as described in [1] or [2], wherein a content of the repeating unit represented by formula (A) is from 20 to 40 mol % based on all repeating units in the resin (Ab).

[4] The pattern forming method as described in any one of [1] to [3], wherein in formula (Ab1), $L_1$ represents a hydrogen atom.

[5] The pattern forming method as described in any one of [1] to [4], wherein in formula (Ab1), $R_2$ represents an alkyl group or a cycloalkyl group.

[6] The pattern forming method as described in any one of [1] to [5], wherein in formula (Ab1), $R_3$ represents a hydrogen atom.

[7] The pattern forming method as described in any one of [1] to [6], wherein in formula (Ab1), L represents a single bond, an aromatic ring group, a norbornane ring group or an adamantane ring group.

[8] The pattern forming method as described in any one of [1] to [3], wherein the repeating unit represented by formula (Ab1) is a repeating unit represented by any one of the following formulae (Ab1-1) to (Ab1-4):

(Ab1-1)

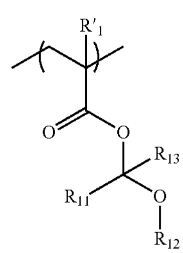

wherein in formula (Ab1-1), $R'_1$ represents a hydrogen atom or a methyl group, and $R_{11}$, $R_{12}$ and $R_{13}$ have the same meanings as $R_1$, $R_2$ and $R_3$ in formula (Ab1), respectively;

(Ab1-2)

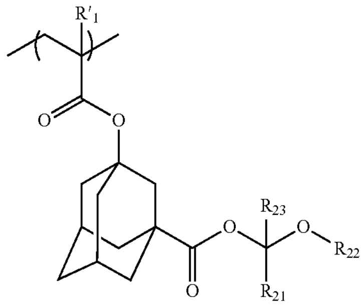

wherein in formula (Ab1-2), $R'_2$ represents a hydrogen atom or a methyl group, and $R_{21}$, $R_{22}$ and $R_{23}$ have the same meanings as $R_1$, $R_2$ and $R_3$ in formula (Ab1), respectively;

(Ab1-3)

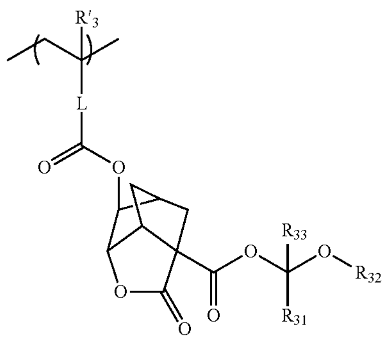

wherein in formula (Ab1-3), $R'_3$ represents a hydrogen atom or a methyl group, and $R_{31}$, $R_{32}$ and $R_{33}$ have the same meanings as $R_1$, $R_2$ and $R_3$ in formula (Ab1), respectively; and (Ab1-4)

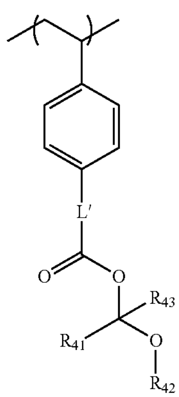

wherein in formula (Ab1-4),

L' represents a single bond or a divalent linking group, and $R_{41}$, $R_{42}$ and $R_{43}$ have the same meanings as $R_1$, $R_2$ and $R_3$ in formula (Ab1), respectively.

[9] The pattern forming method as described in any one of [1] to [8], wherein the exposure is exposure to an electron beam or an extreme-ultraviolet ray.

[10] The pattern forming method as described in any one of [1] to [9], wherein the actinic ray-sensitive or radiation-sensitive resin composition further contains a compound capable of generating an acid upon irradiation with an actinic ray or radiation.

[11] An actinic ray-sensitive or radiation-sensitive resin composition used in the pattern forming method described in any one of [1] to [10].

[12] A resist film formed using the actinic ray-sensitive or radiation-sensitive resin composition described in [11].

[13] A method for manufacturing an electronic device, comprising the pattern forming method described in any one of [1] to [10].

[14] An electronic device manufactured by the method for manufacturing an electronic device described in [13].

According to the present invention, a pattern forming method ensuring that in an ultrafine region (for example, a region where the line width or space width is on the order of tens of nm), all of high sensitivity, high resolution at the formation of an isolated line pattern and an isolated space pattern, good pattern profile and high dry etching resistance are satisfied at the same time, an actinic ray-sensitive or radiation-sensitive resin composition, a resist film, a manufacturing method of an electronic device using the same, and an electronic device can be provided.

DESCRIPTION OF EMBODIMENTS

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the description of the present invention, the "actinic ray" or "radiation" indicates, for example, a bright line spectrum of a mercury lamp, a far ultraviolet ray typified by an excimer laser, an extreme-ultraviolet (EUV) ray, an X-ray or an electron beam (EB). Also, in the present invention, the "light" means an actinic ray or radiation.

Furthermore, unless otherwise indicated, the "exposure" as used in the present invention encompasses not only exposure to a mercury lamp, a far ultraviolet ray typified by excimer laser, an X-ray, EUV light or the like but also lithography with a particle beam such as electron beam and ion beam.

[Pattern Forming Method]

The pattern forming method of the present invention is described below.

The pattern forming method of the present invention comprises, in order, (1) a step of forming a film by using an actinic ray-sensitive or radiation-sensitive resin composition containing (Ab) a resin having a repeating unit represented by the following formula (Ab1) and a repeating unit represented by the following formula (A), (2) a step of exposing the film, and (3) a step of developing the exposed film by using an organic solvent-containing developer to form a negative pattern:

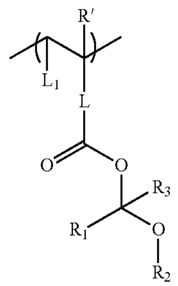

(Ab1)

In formula (Ab1), R' represents a hydrogen atom or an alkyl group. $L_1$ represents a hydrogen atom or an alkyl group. $L_1$ may combine with L to form a ring and in this case, $L_1$ represents an alkylene group or a carbonyl group.

L represents a single bond or a divalent linking group, and when $L_1$ and L combine to form a ring, L represents a trivalent linking group.

$R_1$ represents a hydrogen atom or a monovalent substituent.

$R_2$ represents a monovalent substituent, and $R_1$ and $R_2$ may combine with each other to form a ring.

$R_3$ represents a hydrogen atom, an alkyl group or a cycloalkyl group.

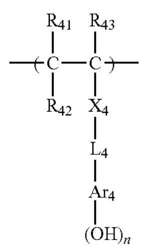

(A)

In formula (A), each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ to form a ring and in this case, $R_{42}$ represents a single bond or an alkylene group.

$X_4$ represents a single bond, —COO— or —CONR$_{64}$—, wherein $R_{64}$ represents a hydrogen atom or an alkyl group.

$L_4$ represents a single bond, —COO— or an alkylene group, $Ar_4$ represents an (n+1)-valent aromatic ring group and in the case of combining with $R_{42}$ to form a ring, $Ar_4$ represents a (n+2)-valent aromatic ring group.

n represents an integer of 1 to 4.

According to the pattern formation method of the present invention, a pattern forming method ensuring that in an ultrafine region (for example, a region where the line width or space width is on the order of tens of nm), all of high sensitivity, high resolution at the formation of an isolated line pattern and an isolated space pattern, and good pattern profile are satisfied at the same time, an actinic ray-sensitive or radiation-sensitive resin composition, a resist film a manufacturing method of an electronic device using the same, and an electronic device can be provided. The reasons therefor are not clearly known but are presumed as follows.

The actinic ray-sensitive or radiation-sensitive resin composition used in the pattern forming method of the present invention contains a resin having a repeating unit represented by formula (A), and this is considered to produce an effect that the adherence between a resist film formed of the actinic ray-sensitive or radiation-sensitive resin composition and a substrate is increased.

As a result, when forming an isolated line pattern or an isolated space pattern, the pattern collapse is suppressed, leading to enhancement of the resolution at the formation of an isolate line pattern.

Furthermore, the repeating unit represented by formula (A) has an aromatic group, and this is considered to produce an effect that the strength of a resist film formed of an actinic ray-sensitive or radiation-sensitive resin composition containing the repeating unit is enhanced and in turn, the dry etching resistance is increased.

In addition, the actinic ray-sensitive or radiation-sensitive resin composition used in the pattern forming method of the present invention contains (Ab) a resin having a repeating unit represented by formula (Ab1).

Thanks to this configuration, it is considered that the resin (Ab) having a repeating unit represented by formula (Ab1) is increased in its the reactivity with an acid and at the same time, the polarity change associated with decomposition of the resin by an acid becomes large.

This large change in polarity is considered to produce an effect that the dissolution contrast for an organic solvent-containing developer between the exposed area and the unexposed area as well as the sensitivity and resolution at the formation of an isolated line pattern and an isolated space pattern are enhanced and the pattern profile is improved.

These effects are considered to be pronounced particularly in the case of forming a fine pattern by exposure to an electron beam or an extreme-ultraviolet ray.

(1) Film Formation

The resist film of the present invention is a film formed of the above-described actinic ray-sensitive or radiation-sensitive resin composition.

More specifically, respective components described later of the actinic ray-sensitive or radiation-sensitive resin composition are dissolved in a solvent, and the solution is filtered through a filter, if desired, and then coated on a support (substrate), whereby the resist film can be formed. The filter is preferably a polytetrafluoroethylene-, polyethylene- or nylon-made filter having a pore size of 0.5 μm or less, more preferably 0.2 μm or less, still more preferably 0.1 μm or less.

The composition is coated on such a substrate as used in the production of an integrated circuit device (for example, a silicon- or silicon dioxide-coated substrate) by an appropriate coating method such as spin coater and then dried to form a photosensitive film. In the drying stage, heating (prebaking) is preferably performed.

The film thickness is not particularly limited but is preferably adjusted to a range of 10 to 500 nm, more preferably from 10 to 200 nm, still more preferably from 10 to 100 nm. In the case of coating the actinic ray-sensitive or radiation-sensitive resin composition by a spinner, the rotation speed of the spinner is usually from 500 to 3,000 rpm, preferably from 800 to 2,000 rpm, more preferably from 1,000 to 1,500 rpm.

The heating (prebaking) is preferably performed at a temperature of 60 to 200° C., more preferably at 80 to 150° C., still more preferably at 90 to 140° C.

The heating (prebaking) time is not particularly limited but is preferably from 30 to 300 seconds, more preferably from 30 to 180 seconds, still more preferably from 30 to 90 seconds.

The heating may be performed by means of a device usually attached to an exposure/developing machine or may be also performed using a hot plate or the like.

If desired, a commercially available inorganic or organic antireflection film may be used. Also, an antireflection film may be used by coating it as an underlying layer of the actinic ray-sensitive or radiation-sensitive resin composition. The antireflection film which can be used may be either an inorganic film type such as titanium, titanium dioxide, titanium nitride, chromium oxide, carbon and amorphous silicon, or an organic film type composed of a light absorber and a polymer material. Furthermore, a commercially available organic antireflection film such as DUV30 Series and DUV-40 Series produced by Brewer Science, Inc., or AR-2, AR-3 and AR-5 produced by Shipley Co., Ltd., can be used as the organic antireflection film.

(2) Exposure

The exposure is performed using an actinic ray or radiation. The actinic ray or radiation includes, for example, infrared light, visible light, ultraviolet light, far ultraviolet light, X-ray, extreme-ultraviolet ray (EUV light) and electron beam. An actinic ray or radiation having, for example, a wavelength of 250 nm or less, particularly 220 nm or less, is preferred. Examples of such an actinic ray or radiation include KrF excimer laser (248 nm), ArF excimer laser (193 nm), $F_2$ excimer laser (157 nm), X-ray, extreme-ultraviolet ray (EUV light and electron beam. The actinic ray or radiation is preferably, for example, KrF excimer laser, electron beam, X-ray or EUV light, more preferably electron beam, X-ray or EUV light, and further more preferably electron beam or EUV light.

(3) Baking

After the exposure, baking (heating) is preferably performed before performing development.

The heating is preferably performed at a temperature of 60 to 150° C., more preferably at 80 to 150° C., still more preferably at 90 to 140° C.

The heating time is not particularly limited but is preferably from 30 to 300 seconds, more preferably from 30 to 180 seconds, still more preferably from 30 to 90 seconds.

The heating may be performed by means of a device usually attached to an exposure/developing machine or may be also performed using a hot plate or the like.

The reaction of the exposed area is accelerated by the baking and in turn, the sensitivity or pattern profile is improved. It is also preferred to contain a heating step (post-baking) after the rinsing step. The heating temperature and the heating time are as described above. By the baking, the developer and rinsing solution remaining between patterns and in the inside of the pattern are removed.

(4) Development

In the present invention, development is performed using a developer containing an organic solvent.

Developer:

The vapor pressure of the developer (in the case of a mixed solvent, the vapor pressure as a whole) is, at 20° C., preferably 5 kPa or less, more preferably 3 kPa or less, still more preferably 2 kPa or less. By setting the vapor pressure of the organic solvent to 5 kPa or less, evaporation of the developer on a substrate or in a development cup is suppressed and the temperature uniformity in the wafer plane is enhanced, as a result, it is considered that the dimensional uniformity in the wafer plane is improved.

As the organic solvent used for the developer, various organic solvents may be widely used but, for example, a solvent such as ester-based solvent, ketone-based solvent, alcohol-based solvent, amide-based solvent, ether-based solvent and hydrocarbon-based solvent may be used.

In the present invention, the ester-based solvent is a solvent having an ester group in the molecule; the ketone-based solvent is a solvent having a ketone group in the molecule; the alcohol-based solvent is a solvent having an alcoholic hydroxyl group in the molecule; the amide-based solvent is a solvent having an amide group in the molecule; and the ether-based solvent is a solvent having an ether bond in the molecule. Some of these solvents have a plurality of kinds of the above-described functional groups per molecule, and in such a case, the solvent comes under all of solvent species containing the functional group that is contained in the solvent. For example, diethylene glycol monomethyl ether comes under both of the alcohol-based solvent and the ether-based solvent in the categories above. Also, the hydrocarbon-based solvent means a hydrocarbon solvent not having a substituent.

Above all, a developer containing at least one kind of a solvent selected from a ketone-based solvent, an ester-based solvent, an alcohol-based solvent and an ether-based solvent is preferred.

Examples of the ester-based solvent include methyl acetate, ethyl acetate, butyl acetate, pentyl acetate, isopropyl acetate, amyl acetate, isoamyl acetate, ethyl methoxyacetate, ethyl ethoxyacetate, propylene glycol monomethyl ether acetate (PGMEA; another name: 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, and γ-butyrolactone.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; a glycol-based solvent such as ethylene glycol, diethylene glycol and triethylene glycol; and a hydroxyl group-containing glycol ether-based solvent such as ethylene glycol monomethyl ether, propylene glycol monomethyl ether (PGME; another name: 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these, a glycol ether-based solvent is preferably used.

Examples of the ether-based solvent include, in addition to the hydroxyl group-containing glycol ether-based solvents above, a hydroxyl group-free glycol ether-based solvent such as propylene glycol dimethyl ether, propylene glycol diethyl ether, diethylene glycol dimethyl ether and diethylene glycol diethyl ether; an aromatic ether solvent such as anisole and phenetole; dioxane; tetrahydrofuran; tetrahydropyrane; perfluoro-2-butyltetrahydrofuran; perfluorotetrahydrofuran; and 1,4-dioxane. A glycol ether-based solvent or an aromatic ether solvent such as anisole is preferably used.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aliphatic hydrocarbon-based solvent such as pentane, hexane, octane, decane, 2,2,4-trimethylpentane, 2,2,3-trimethylhexane, perfluorohexane and perfluoroheptane, and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these, an aromatic hydrocarbon-based solvent is preferred.

A plurality of these solvents may be mixed, or the solvent may be mixed with a solvent other than those described above or with water and used. However, in order to sufficiently bring out the effects of the present invention, the percentage of water content in the entire developer is preferably less than 10 mass %, and it is more preferred to contain substantially no water. (In this specification, mass ratio is equal to weight ratio.)

The concentration of the organic solvent (in the case of mixing a plurality of kinds of organic solvents, the total concentration) in the developer is preferably 50 mass % or more, more preferably 70 mass % or more, still more preferably 90 mass % or more. Above all, the developer is preferably composed of substantially only an organic solvent. The expression "composed of substantially only an organic solvent" encompasses a case containing a slight amount of a surfactant, an antioxidant, a stabilizer, a defoaming agent or the like.

Among the solvents above, it is more preferred to contain one or more selected from the group consisting of butyl acetate, pentyl acetate, isopentyl acetate, propylene glycol monomethyl ether acetate, 2-heptanone and anisole.

The organic solvent used as the developer may be suitably an ester-based solvent. The ester-based solvent used here is preferably a solvent represented by formula (S1) described below or a solvent represented by formula (S2) described below, more preferably a solvent represented by formula (S1), still more preferably an alkyl acetate, and most preferably butyl acetate, pentyl acetate or isopentyl acetate.

R—C(═O)—O—R'    Formula (S1)

In formula (S1), each of R and R' independently represents a hydrogen atom, an alkyl group, a cycloalkyl group, an alkoxyl group, an alkoxycarbonyl group, a carboxyl group, a hydroxyl group, a cyano group or a halogen atom. R and R' may combine with each other to form a ring.

The carbon number of the alkyl group, alkoxy group and alkoxycarbonyl group of R and R' is preferably from 1 to 15, and the carbon number of the cycloalkyl group is preferably from 3 to 15.

Each of R and R' is preferably a hydrogen atom or an alkyl group, and the alkyl group, cycloalkyl group, alkoxyl group and alkoxycarbonyl group of R and R' and the ring formed by combining R and R' with each other may be substituted with a hydroxyl group, a carbonyl group-containing group (such as acyl group, aldehyde group and alkoxycarbonyl group), a cyano group or the like.

Examples of the solvent represented by formula (S1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, and ethyl 2-hydroxypropionate.

Among these, a solvent where R and R' are an unsubstituted alkyl group is preferred.

The solvent represented by formula (S1) is preferably an alkyl acetate, more preferably butyl acetate, pentyl acetate or isopentyl acetate.

The solvent represented by formula (S1) may be used in combination with one or more other organic solvents. In this case, the combined solvent is not particularly limited as long as it can be mixed with the solvent represented by formula (S1) without causing separation, and the solvents represented by formula (S1) may be used in combination or the solvent represented by formula (S1) may be used by mixing it with a solvent selected from other ester-based, ketone-based, alcohol-based, amide-based, ether-based and hydrocarbon-based solvents. As for the combined solvent, one or more kinds of solvents may be used, but from the standpoint of obtaining a stable performance, it is preferred to use one kind of a solvent. In the case where one kind of a combined solvent is mixed and used, the mixing ratio between the solvent represented by formula (S1) and the combined solvent is, in mass ratio, usually from 20:80 to 99:1, preferably from 50:50 to 97:3, more preferably from 60:40 to 95:5, and most preferably from 60:40 to 90:10.

R''—C(═O)—O—R'''—O—R''''    Formula (S2):

In formula (S2), each of R'' and R'''' independently represents a hydrogen atom, an alkyl group, a cycloalkyl group, an alkoxyl group, an alkoxycarbonyl group, a carboxyl group, a hydroxyl group, a cyano group or a halogen atom, and R'' and R'''' may combine with each other to form a ring.

Each of R'' and R'''' is preferably a hydrogen atom or an alkyl group. The carbon number of the alkyl group, alkoxyl group and alkoxycarbonyl group of R'' and R'''' is preferably from 1 to 15, and the carbon number of the cycloalkyl group is preferably from 3 to 15.

R''' represents an alkylene group or a cycloalkylene group. R''' is preferably an alkylene group. The carbon number of the alkylene group of R''' is preferably from 1 to 10, and the carbon number of the cycloalkylene group of R''' is preferably from 3 to 10.

The alkyl group, cycloalkyl group, alkoxyl group and alkoxycarbonyl group of R'' and R'''', the alkylene group and cycloalkylene group of R''', and the ring formed by combining R'' and R'''' with each other may be substituted with a hydroxyl group, a carbonyl group-containing group (such as acyl group, aldehyde group and alkoxycarbonyl group), a cyano group or the like.

In formula (S2), the alkylene group of R''' may have an ether bond in the alkylene chain.

Examples of the solvent represented by formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, and 4-methyl-4-methoxypentyl acetate, with propylene glycol monomethyl ether acetate being preferred.

Among others, a solvent where R'' and R'''' are an unsubstituted alkyl group and R''' is an unsubstituted alkylene group is preferred, a solvent where R'' and R'''' are either a methyl group or an ethyl group is more preferred, and a solvent where R'' and R'''' are a methyl group is still more preferred.

The solvent represented by formula (S2) may be used in combination with one or more other organic solvents. In this case, the combined solvent is not particularly limited as long as it can be mixed with the solvent represented by formula (S2) without causing separation, and the solvents represented by formula (S2) may be used in combination or the solvent represented by formula (S2) may be used by mixing it with a solvent selected from other ester-based, ketone-based, alcohol-based, amide-based, ether-based and hydrocarbon-based solvents. As for the combined solvent, one or more kinds of solvents may be used, but from the standpoint of obtaining a stable performance, it is preferred to use one kind of a solvent. In the case where one kind of a combined solvent is mixed and used, the mixing ratio between the solvent represented by formula (S2) and the combined solvent is, in mass ratio, usually from 20:80 to 99:1, preferably from 50:50 to 97:3, more preferably from 60:40 to 95:5, and most preferably from 60:40 to 90:10.

The organic solvent used as the developer may be also suitably an ether-based solvent.

The ether-based solvent which can be used includes the ether-based solvents described above. Among these, an ether-based solvent containing one or more aromatic rings is preferred, a solvent represented by the following formula (S3) is more preferred, and anisole is most preferred.

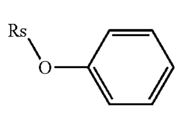

(S3)

In formula (S3), Rs represents an alkyl group. The alkyl group is preferably an alkyl group having a carbon number of 1 to 4, more preferably a methyl group or an ethyl group, and most preferably a methyl group.

In the present invention, the percentage of water content in the developer is usually 10 mass % or less, preferably 5 mass % or less, more preferably 1 mass % or less, and it is most preferred to contain substantially no water.

Surfactant:

Into the developer containing an organic solvent, an appropriate amount of a surfactant can be incorporated, if desired.

As the surfactant, the same as the later-described surfactant used in the actinic ray-sensitive or radiation-sensitive resin composition may be used.

The amount of the surfactant used is usually from 0.001 to 5 mass %, preferably from 0.005 to 2 mass %, more preferably from 0.01 to 0.5 mass %, based on the total amount of the developer.

Basic Compound

The developer containing organic solvent may contain a basic compound. Specific examples and preferred examples of the basic compound which can be contained in the developer for use in the present invention are the same as those of the later-described basic compound which can be contained in the actinic ray-sensitive or radiation-sensitive resin composition.

Developing Method:

As the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

Also, after the step of performing development, a step of stopping the development while replacing the developer with another solvent may be practiced.

The development time is not particularly limited as long as it is long enough to sufficiently dissolve the resin of the unexposed area, and the development time is usually from 10 to 300 seconds, preferably from 20 to 120 seconds.

The temperature of the developer is preferably from 0 to 50° C., more preferably from 15 to 35° C.

(5) Rinsing

The pattern forming method of the present invention may contain (5) a step of rinsing the film by using a rinsing solution containing an organic solvent, after the development step (4). However, it is preferable not to contain a rinsing step from the standpoint of throughput, used amount of the rinsing solution and the like.

Rinsing Solution:

The vapor pressure of the rinsing solution (in the case of a mixed solvent, the vapor pressure as a whole) used after development is, at 20° C., preferably from 0.05 to 5 kPa, more preferably from 0.1 to 5 kPa, and most preferably from 0.12 to 3 kPa. By setting the vapor pressure of the rinsing solution to from 0.05 to 5 kPa, the temperature uniformity in the wafer plane is enhanced and swelling ascribable to permeation of the rinsing solution is suppressed, as a result, the dimensional uniformity in the wafer plane is improved.

As the rinsing solution, various organic solvents may be used, but it is preferred to use a rinsing solution containing at least one kind of an organic solvent selected from a hydrocarbon-based solvent, a ketone-based solvent, an ester-based solvent, an alcohol-based solvent, an amide-based solvent and an ether-based solvent, or water.

More preferably, a step of washing the film by using a rinsing solution containing at least one kind of an organic solvent selected from a ketone-based solvent, an ester-based solvent, an alcohol-based solvent, an amide-based solvent and a hydrocarbon-based solvent is preformed after development. Still more preferably, a step of washing the film by using a rinsing solution containing an alcohol-based solvent or a hydrocarbon-based solvent is preformed after development.

Among others, a rinsing solution containing at least one or more members selected from the group consisting of a monohydric alcohol-based solvent and a hydrocarbon-based solvent is preferably used.

The monohydric alcohol used in the rinsing step after development includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, and 9-methyl-2-decanol. Of these, 1-hexanol, 2-hexanol, 1-pentanol, 3-methyl-1-butanol, 3-methyl-2-pentanol, 3-methyl-3-pentanol, 4-methyl-2-pentanol and 4-methyl-3-pentanol are preferred, and 1-hexanol and 4-methyl-2-pentanol are most preferred.

The hydrocarbon-based solvent includes an aromatic hydrocarbon-based solvent such as toluene and xylene, and an aliphatic hydrocarbon-based solvent such as octane and decane.

The rinsing solution preferably contains one or more members selected from 1-hexanol, 4-methyl-2-pentanol and decane.

As for these components, a plurality of components may be mixed, or the component may be used by mixing it with an organic solvent other than those described above. The above-described solvent may be mixed with water, but the percentage of water content in the rinsing solution is usually 60 mass % or less, preferably 30 mass % or less, more preferably 10 mass % or less, and most preferably 5 mass % or less. By setting the percentage of water content to 60 mass % or less, good rinsing characteristics can be obtained.

The rinsing solution may be also used after incorporating thereinto an appropriate amount of a surfactant.

As the surfactant, the same as the later-described surfactant used in the actinic ray-sensitive or radiation-sensitive resin composition may be used, and the amount used thereof is usually from 0.001 to 5 mass %, preferably from 0.005 to 2 mass %, more preferably from 0.01 to 0.5 mass %, based on the total amount of the rinsing solution.

Rinsing Method:

In the rinsing step, the developed wafer is washed using the above-described rinsing solution containing an organic solvent.

The method for washing treatment is not particularly limited but, for example, a method of continuously ejecting the rinsing solution on the substrate spinning at a constant speed (spin ejection method), a method of dipping the substrate in a bath filled with the rinsing solution for a fixed time (dipping method), and a method of spraying the rinsing solution on the substrate surface (spraying method) may be applied. Among others, it is preferred to perform the washing treatment by the spin ejection method and after the washing, remove the rinsing solution from the substrate surface by spinning the substrate at a rotation speed of 2,000 to 4,000 rpm.

The rinsing time is not particularly limited but is usually from 10 to 300 seconds, preferably from 10 to 180 seconds, and most preferably from 20 to 120 seconds.

The temperature of the rinsing solution is preferably from 0 to 50° C., more preferably from 15 to 35° C.

After the development or rinsing, a treatment for removing the developer or rinsing solution adhering on the pattern with a supercritical fluid may be performed.

Furthermore, after the development, rinsing or treatment with a supercritical fluid, a heating treatment for removing the solvent remaining in the pattern may be performed. The heating temperature is not particularly limited as long as a good resist pattern can be obtained, but the heating temperature is usually from 40 to 160° C., preferably from 50 to 150° C., and most preferably from 50 to 110° C. The heating time is not particularly limited as long as a good resist pattern can be obtained, but the heating time is usually from 15 to 300 seconds, preferably from 15 to 180 seconds.

Alkali Development:

The pattern forming method of the present invention may further include a step of performing development by using an aqueous alkali solution to form a resist pattern (alkali development step), and by this development, a finer pattern can be formed.

In the present invention, the portion of low exposure intensity is removed in the organic solvent development step (4), and by further performing the alkali development step, the portion of high exposure intensity is also removed. By virtue of the multiple development process of performing development a plurality of times in this way, a pattern can be formed by keeping only the region of intermediate exposure intensity from being dissolved, so that a finer pattern than usual can be formed (the same mechanism as disclosed in [0077] of JP-A-2008-292975).

The alkali development may be performed either before or after the step (4) of performing the development by using a developer containing an inorganic solvent but is preferably performed before the organic solvent development step (4).

Examples of the aqueous alkali solution which can be used for alkali development include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

The alkaline aqueous solution above may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

The alkali development time is not particularly limited and is usually from 10 to 300 seconds, preferably from 20 to 120 seconds.

The temperature of the alkali developer is preferably from 0 to 50° C., more preferably from 15 to 35° C.

After the development with an aqueous alkali solution, a rinsing treatment may be performed. The rinsing solution in the rinsing treatment is preferably pure water, and the rinsing solution may be also used after adding thereto an appropriate amount of a surfactant.

Moreover, after the development or rinsing, a heating treatment for removing water remaining in the pattern may be performed.

Furthermore, a treatment for removing the remaining developer or rinsing solution by heating may be performed. The heating temperature is not particularly limited as long as a good resist pattern can be obtained, but the heating temperature is usually from 40 to 160° C., preferably from 50 to 150° C., and most preferably from 50 to 110° C. The heating time is not particularly limited as long as a good resist pattern can be obtained, but the heating time is usually from 15 to 300 seconds, preferably from 15 to 180 seconds.

With respect to the film formed from the resist composition of the present invention, the exposure may be also performed by filling a liquid (immersion medium) having a refractive index higher than that of air between the film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film, and water is preferably used in view of easy availability and easy handleability in addition to the above-described aspects.

Furthermore, a medium having a refractive index of 1.5 or more can be also used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if an impurity greatly differing in the refractive index from water is mingled, this incurs distortion of the optical image projected on the resist film. Therefore, the water used is preferably distilled water. Pure water obtained by further filtering the distilled water through an ion exchange filter or the like may be also used.

The electrical resistance of water is preferably 18.3 MΩkm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or heavy water ($D_2O$) may be used in place of water.

In order to prevent the film from directly contacting with the immersion liquid, a film (hereinafter, sometimes referred to as a “topcoat”) sparingly soluble in the immersion liquid may be provided between the film formed of the composition of the present invention and the immersion liquid. The functions required of the topcoat are suitability for coating as an overlayer of the composition film and sparing solubility in the immersion liquid. The topcoat is preferably unmixable with the composition film and capable of being uniformly coated as an overlayer of the composition film.

Specific examples of the topcoat include a hydrocarbon polymer, an acrylic acid ester polymer, a polymethacrylic acid, a polyacrylic acid, a polyvinyl ether, a silicon-containing polymer, and a fluorine-containing polymer. If an impurity is dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent hardly permeating the film. From the standpoint that the peeling step can be performed simultaneously with the development step of the film, the topcoat is preferably peelable with an organic solvent-containing developer.

With no difference in the refractive index between the topcoat and the immersion liquid, the resolution is enhanced. In the case of using water as the immersion liquid, the topcoat preferably has a refractive index close to that of the immersion liquid. From the standpoint of having a refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and at the same time, is insoluble in water. In the case where the immersion liquid is an organic solvent, the topcoat may be either water-soluble or water-insoluble.

On the other hand, when performing EUV exposure or EB exposure, for the purpose of outgas inhibition or blob defect suppression or for preventing, for example, worsening of the collapse performance resulting from improvement of the reverse taper profile or worsening of LWR due to surface roughening, a topcoat layer may be formed on the resist film formed of the actinic ray-sensitive or radiation-sensitive resin composition of the present invention. The topcoat composition used for formation of the topcoat layer is described below.

In the topcoat composition for use in the present invention, the solvent is preferably water or an organic solvent, more preferably water or an alcohol-based solvent.

In the case where the solvent is an organic solvent, a solvent incapable of dissolving the resist film is preferred. As the solvent which can be used, it is preferred to use an alcohol-based solvent, a fluorine-based solvent or a hydrocarbon-based solvent, and it is more preferred to use a fluorine-free alcohol-based solvent. The alcohol-based solvent is, in view of coatability, preferably a primary alcohol, more preferably a primary alcohol having a carbon number of 4 to 8. As the primary alcohol having a carbon number of 4 to 8, a linear, branched or cyclic alcohol may be used, but a linear or branched alcohol is preferred. Specific examples thereof include 1-butanol, 1-hexanol, 1-pentanol, and 3-methyl-1-butanol.

In the case where the solvent of the topcoat composition for use in the present invention is water, an alcohol-based solvent or the like, the composition preferably contains a water-soluble resin. It is considered that the uniformity of solubility in the developer can be more enhanced by containing a water-soluble resin. Preferred examples of the water-soluble resin include polyacrylic acid, polymethacrylic acid, polyhydroxystyrene, polyvinylpyrrolidone, polyvinyl alcohol, polyvinyl ether, polyvinyl acetal, polyacrylimide, polyethylene glycol, polyethylene oxide, polyethyleneimine, polyester polyol, polyether polyol, and polysaccharides. Among these, polyacrylic acid, polymethacrylic acid, polyhydroxystyrene, polyvinylpyrrolidone and polyvinyl alcohol are preferred. Incidentally, the water-soluble resin is not limited only to a homopolymer and may be a copolymer, for example, may be a copolymer having a monomer corresponding to the repeating unit of the homopolymer described above and another monomer unit. Specifically, an acrylic acid-methacrylic acid copolymer, an acrylic acid-hydroxystyrene copolymer, and the like may be also used in the present invention.

As the resin for the topcoat composition, a resin having an acidic group described in JP-A-2009-134177 and JP-A-2009-91798 may be also preferably used.

The weight average molecular weight of the water-soluble resin is not particularly limited but is preferably from 2,000 to 1,000,000, more preferably from 5,000 to 500,000, still more preferably from 10,000 to 100,000. The weight average molecular weight of the resin as used herein indicates a molecular weight in terms of polystyrene measured by GPC (carrier: THF or N-methyl-2-pyrrolidone (NMP)).

The pH of the topcoat composition is not particularly limited but is preferably from 0 to 10, more preferably from 0 to 8, still more preferably from 1 to 7.

In the case where the solvent of the topcoat composition is an organic solvent, the topcoat composition may contain a hydrophobic resin such as the hydrophobic resin (HR) described above in the paragraph of an actinic ray-sensitive or radiation-sensitive resin composition. As the hydrophobic resin, it is also preferred to use a hydrophobic resin described in JP-A-2008-209889.

The concentration of the resin in the topcoat composition is preferably from 0.1 to 10 mass %, more preferably from 0.2 to 5 mass %, still more preferably from 0.3 to 3 mass %.

The topcoat material may contain a component other than the resin, but the proportion of the resin in the solid content of the topcoat composition is preferably form 80 to 100 mass %, more preferably from 90 to 100 mass %, still more preferably from 95 to 100 mass %.

The solid content concentration of the topcoat composition for use in the present invention is preferably from 0.1 to 10 mass %, more preferably from 0.2 to 6 mass %, still more preferably from 0.3 to 5 mass %. By adjusting the solid content concentration to fall in the range above, the topcoat composition can be uniformly coated on the resist film.

Examples of the component other than the resin, which can be added to the topcoat material, include a surfactant, a photoacid generator, and a basic compound. Specific examples of the photoacid generator and basic compound include the same compounds as those of the above-described compound capable of generating an acid upon irradiation with an actinic ray or radiation and the basic compound.

In the case of using a surfactant, the amount of the surfactant used is preferably from 0.0001 to 2 mass %, more preferably from 0.001 to 1 mass %, based on the total amount of the topcoat composition.

Addition of a surfactant to the topcoat composition makes it possible to enhance the coatability when coating the topcoat composition. The surfactant includes nonionic, anionic, cationic and amphoteric surfactants.

Examples of the nonionic surfactant which can be used include Plufarac Series produced by BASF; ELEBASE Series, Finesurf Series, and Blaunon Series produced by Aoki Oil Industrial Co., Ltd.; Adeka Pluronic P-103 produced by Asahi Denka Co., Ltd.; Emulgen Series, Amiet Series, Aminon PK-025, Emanon CH-25, and Rheodol Series produced by Kao Corporation; Surflon S-141 produced by AGC Seimi Chemical Co., Ltd.); Noigen Series produced by Daiichi Kogyo Seiyaku Co., Ltd.; Newcalgen Series produced by Takemoto Oil & Fat Co., Ltd.; DYNOL 604, EnviroGem AD01, Olfine EXP Series, and Surfynol Series produced by Nisshin Chemical Industry Co., Ltd.; and Ftergent 300 produced by Ryoko Chemical Co., Ltd.

Examples of the anionic surfactant which can be used include Emal 20T and Poiz 532A produced by Kao Corporation; Phosphanol ML-200 produced by Toho Chemical Industry Co., Ltd.; EMULSOGEN Series produced by Clariant Japan K.K.; Surflon S-111N and Surflon S-211 produced by AGC Seimi Chemical Co., Ltd.; Plysurf Series produced by Dai-ichi Kogyo Seiyaku Co., Ltd.; Pionin Series produced by Takemoto Oil & Fat Co., Ltd.; Olfine PD-201 and Olfine PD-202 produced by Nisshin Chemical Industry Co., Ltd.; AKYPO RLM45 and ECT-3 produced by Nihon Surfactant Kogyo K.K.; and Lipon produced by Lion Corporation.

Examples of the cationic surfactant which can be used include Acetamin 24 and Acetamin 86 produced by Kao Corporation.

Examples of the amphoteric surfactant which can be used include Surflon S-131 produced by AGC Seimi Chemical Co., Ltd.; and Enagicol C-40H and Lipomin LA produced by Kao Corporation.

Also, these surfactants may be mixed and used.

In the pattern forming method of the present invention, a resist film can be formed on a substrate by using the actinic ray-sensitive or radiation-sensitive resin composition, and a topcoat layer can be formed on the resist film by using the topcoat composition. The thickness of the resist film is preferably from 10 to 100 nm, and the thickness of the topcoat layer is preferably from 10 to 200 nm, more preferably from 20 to 100 nm, still more preferably from 40 to 80 nm.

The method for coating the actinic ray-sensitive or radiation-sensitive resin composition on a substrate is preferably spin coating, and the rotation speed thereof is preferably from 1,000 to 3,000 rpm.

For example, the actinic ray-sensitive or radiation-sensitive resin composition is coated on such a substrate (e.g., silicon/silicon dioxide-coated substrate) as used in the production of a precision integrated circuit device by an appropriate coating method such as spinner and coater and then dried to form a resist film. Incidentally, a known antireflection film may be previously provided by coating. Also, the resist film is preferably dried before forming a topcoat layer.

On the resist film obtained, a topcoat composition is coated by the same method as the resist film forming method and dried, whereby a topcoat layer can be formed.

The resist film having thereon a topcoat layer is irradiated with an electron beam (EB), an X-ray or EUV light usually through a mask, then preferably baked (heated), and further subjected to development, whereby a good pattern can be obtained.

[1] Actinic Ray-Sensitive or Radiation-Sensitive Resin Composition

The actinic ray-sensitive or radiation-sensitive resin composition which can be used in the present invention is described below.

The actinic ray-sensitive or radiation-sensitive resin composition according to the present invention is used for negative development (development where the solubility for developer is decreased upon exposure and while the exposed area remains as a pattern, the unexposed area is removed). That is, the actinic ray-sensitive or radiation-sensitive resin composition according to the present invention can be an actinic ray-sensitive or radiation-sensitive resin composition for organic solvent development, which is used for development using an organic solvent-containing developer. The term "for organic solvent development" as used herein means usage where the composition is subjected to at least a step of performing development by using an organic solvent-containing developer.

In this way, the present invention also relates to an actinic ray-sensitive or radiation-sensitive resin composition for use in the above-described pattern forming method of the present invention.

The actinic ray-sensitive or radiation-sensitive resin composition of the present invention is typically a resist composition and is preferably a negative resist composition (that is, a resist composition for organic solvent development), because particularly high effects can be obtained. Also, the composition according to the present invention is typically a chemical amplification resist composition.

The composition for use in the present invention is an actinic ray-sensitive or radiation-sensitive resin composition containing (Ab) a resin having a repeating unit represented by the following formula (Ab1) and a repeating unit represented by the following formula (A):

(Ab1)

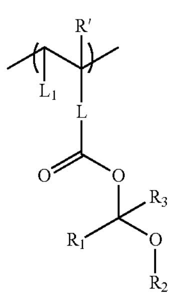

In formula (Ab1), R' represents a hydrogen atom or an alkyl group.

$L_1$ represents a hydrogen atom or an alkyl group. $L_1$ may combine with L to form a ring and in this case, $L_1$ represents an alkylene group or a carbonyl group.

L represents a single bond or a divalent linking group, and when $L_1$ and L combine to form a ring, L represents a trivalent linking group.

$R_1$ represents a hydrogen atom or a monovalent substituent.

$R_2$ represents a monovalent substituent, and $R_1$ and $R_2$ may combine with each other to form a ring.

$R_3$ represents a hydrogen atom, an alkyl group or a cycloalkyl group.

(A)

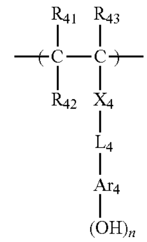

In formula (A), each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ to form a ring and in this case, $R_{42}$ represents a single bond or an alkylene group.

$X_4$ represents a single bond, —COO— or —CONR$_{64}$—, wherein $R_{64}$ represents a hydrogen atom or an alkyl group.

$L_4$ represents a single bond, —COO— or an alkylene group.

$Ar_4$ represents an (n+1)-valent aromatic ring group and in the case of combining with $R_{42}$ to form a ring, $Ar_4$ represents a (n+2)-valent aromatic ring group.

n represents an integer of 1 to 4.

The resin (Ab) is described below.

[1] Resin (Ab)

The resin (Ab) contains an acid-decomposable repeating unit. Thanks to this repeating unit, the resin (Ab) becomes a resin capable of decreasing in the solubility for an organic solvent-containing developer by the action of an acid. The acid-decomposable repeating unit is, for example, a repeating unit having a group capable of decomposing by the action of an acid (hereinafter sometimes referred to as "acid-decomposable group"), on either one or both of the main chain and the side chain of the resin. The group produced by the decomposition is preferably a polar group, because the affinity for an organic solvent-containing developer is reduced and insolubilization or difficult solubilization (negative conversion) proceeds. More specifically, the resin (Ab) contains, as the acid-decomposable repeating unit, a repeating unit represented by formula (Ab1) capable of generating a carbonyl group by the action of an acid.

The repeating unit represented by formula (Ab1) is described below.

(Ab1)

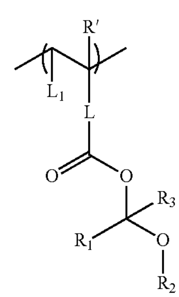

In formula (Ab1), R' represents a hydrogen atom or an alkyl group.

$L_1$ represents a hydrogen atom or an alkyl group. $L_1$ may combine with L to form a ring and in this case, $L_1$ represents an alkylene group or a carbonyl group.

L represents a single bond or a divalent linking group, and when $L_1$ and L combine to form a ring, L represents a trivalent linking group.

$R_1$ represents a hydrogen atom or a monovalent substituent.

$R_2$ represents a monovalent substituent, and $R_1$ and $R_2$ may combine with each other to form a ring.

$R_3$ represents a hydrogen atom, an alkyl group or a cycloalkyl group.

In formula (Ab1), the alkyl group of R' is preferably an alkyl group having a carbon number of 1 to 10, more preferably an alkyl group having a carbon number of 1 to 5, still more preferably an alkyl group having a carbon number of 1 to 3, yet still more preferably an alkyl group having a carbon number of 1 or 2 (that is, a methyl group or an ethyl group). Specific examples of the alkyl group of R' include a methyl group, an ethyl group, an n-propyl group, an isopropyl group, an n-butyl group, an isobutyl group, a sec-butyl group, and a tert-butyl group.

R' is preferably a hydrogen atom or an alkyl group having a carbon number of 1 to 5, more preferably a hydrogen atom or an alkyl group having a carbon number of 1 to 3, still more preferably a hydrogen atom, a methyl group or an ethyl group, yet still more preferably a hydrogen atom.

The alkyl group of $L_1$ may have a substituent (preferably a fluorine atom) and is preferably an alkyl group having a carbon number of 1 to 5, more preferably an alkyl group having a carbon number of 1 to 3, still more preferably a methyl group.

$L_1$ is preferably a hydrogen atom or a methyl group, more preferably a hydrogen atom.

The alkylene group of $L_1$ when $L_1$ and L combine with each other to form a ring is preferably an alkylene group having a carbon number of 1 to 3, more preferably an alkylene group having a carbon number of 1 or 2.

Examples of the divalent linking group represented by L include an alkylene group, an aromatic ring group, a cycloalkylene group, —COO-$L_1$'-, —O-$L_1$'-, —CONH—, and a group formed by combining two or more thereof. Here, $L_1$' represents an alkylene group (preferably having a carbon number of 1 to 20), a cycloalkylene group (preferably having a carbon number of 3 to 20), an aromatic ring group, and a group formed by combining an alkylene group and an aromatic ring group.

The alkylene group as the divalent linking group represented by L is preferably an alkylene group having a carbon number of 1 to 8, such as methylene group, ethylene group, propylene group, butylene group, hexylene group and octylene group, more preferably an alkylene group having a carbon number of 1 to 4, still more preferably an alkylene group having a carbon number of 1 or 2.

The cycloalkylene group as the divalent linking group represented by L is preferably a cycloalkylene group having a carbon number of 3 to 20, and examples thereof include a cyclopropylene group, a cyclobutylene group, a cyclopentylene group, a cyclohexylene group, a cycloheptylene group, a cyclooctylene group, a norbornylene group, and an adamantylene group.

The aromatic ring group as the divalent linking group represented by L is preferably, for example, an aromatic ring group having a carbon number of 6 to 18 (more preferably a carbon number of 6 to 10), such as benzene ring and naphthyl ring, or an aromatic ring group containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring, more preferably a benzene ring group.

The definitions and preferred ranges of the alkylene group, cycloalkylene group and aromatic ring group represented by $L_1$' are the same as those of the alkylene group, cycloalkylene group and aromatic ring group as the divalent linking group represented by L.

The definitions and preferred ranges of the alkylene group and aromatic group in a group formed by combining an alkylene group and an aromatic ring group, represented by $L_1$', are the same as those of the alkylene group and aromatic ring group as the divalent linking group represented by L.

L is preferably a single bond, an aromatic ring group, a norbornane ring group or an adamantane ring group, more preferably a single bond, a norbornane ring group or an adamantane ring group, still more preferably a single bond or a norbornane ring group, yet still more preferably a single bond.

Suitable examples of the trivalent linking group represented by L when L combines with $L_1$ to form a ring include groups formed by removing one arbitrary hydrogen atom from specific examples recited above for the divalent linking group represented by L.

The monovalent substituent of $R_1$ is preferably a group represented by $C(R_{111})(R_{112})(R_{1113})$. * indicates a bond connected to a carbon atom in the repeating unit represented by formula (Ab1). Each of $R_{111}$ to $R_{113}$ independently represents a hydrogen atom, an alkyl group, a cycloalkyl group, an aryl group, an aralkyl group or a heterocyclic group.

The alkyl group of $R_{111}$ to $R_{113}$ is preferably an alkyl group having a carbon number of 1 to 15, more preferably an alkyl group having a carbon number of 1 to 10, still more preferably an alkyl group having a carbon number of 1 to 6. Specific examples of the alkyl group of $R_{111}$ to $R_{113}$ include a methyl group, an ethyl group, a propyl group, an isopropyl group, an n-butyl group, a sec-butyl group, a tert-butyl group, a neopentyl group, a hexyl group, a 2-ethylhexyl group, an octyl group, and a dodecyl group. The alkyl group of $R_{111}$ to $R_{113}$ is preferably a methyl group, an ethyl group, a propyl group, an isopropyl group or a tert-butyl group.

Each of at least two members of $R_{111}$ to $R_{113}$ independently represents an alkyl group, a cycloalkyl group, an aryl group, an aralkyl group or a heterocyclic group, and it is preferred that all of $R_{111}$ to $R_{113}$ represent an alkyl group, a cycloalkyl group, an aryl group, an aralkyl group or a heterocyclic group.

The cycloalkyl group of $R_{111}$ to $R_{113}$ may be monocyclic or polycyclic and is preferably a cycloalkyl group having a carbon number of 3 to 15, more preferably a cycloalkyl group having a carbon number of 3 to 10, still more preferably a cycloalkyl group having a carbon number of 3 to 6. Specific examples of the cycloalkyl group of $R_{111}$ to $R_{113}$ include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of $R_{111}$ to $R_{113}$ is preferably a cyclopropyl group, a cyclopentyl group or a cyclohexyl group.

The aryl group of $R_{111}$ to $R_{113}$ is preferably an aryl group having a carbon number of 6 to 15, more preferably an aryl group having a carbon number of 6 to 12, and encompasses a structure where a plurality of aromatic rings are connected to each other through a single bond (for example, a biphenyl group and a terphenyl group). Specific examples of the aryl group of $R_{111}$ to $R_{113}$ include a phenyl group, a naphthyl group, an anthranyl group, a biphenyl group, and a terphenyl group. The aryl group of $R_{111}$ to $R_{113}$ is preferably a phenyl group, a naphthyl group or a biphenyl group.

The aralkyl group of $R_{111}$ to $R_{113}$ is preferably an aralkyl group having a carbon number of 6 to 20, more preferably an aralkyl group having a carbon number of 7 to 12. Specific examples of the aralkyl group of $R_{111}$ to $R_{113}$ include a benzyl group, a phenethyl group, a naphthylmethyl group, and a naphthylethyl group.

The heterocyclic group of $R_{111}$ to $R_{113}$ is preferably a heterocyclic group having a carbon number of 6 to 20, more preferably a heterocyclic group having a carbon number of 6 to 12. Specific examples of the heterocyclic group of $R_{111}$ to $R_{113}$ include a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

The alkyl group, cycloalkyl group, aryl group, aralkyl group and heterocyclic group of $R_{111}$ to $R_{113}$ may further have a substituent.

Examples of the substituent which the alkyl group of $R_{111}$ to $R_{113}$ may further have include a cycloalkyl group, an aryl group, an amino group, an amido group, a ureido group, a urethane group, a hydroxy group, a carboxy group, a halogen atom, an alkoxy group, an aralkyloxy group, a thioether group, an acyl group, an acyloxy group, an alkoxycarbonyl group, a cyano group, and a nitro group. These substituents may combine with each other to form a ring and when the substituents combine with each other to form a ring, the ring is a cycloalkyl group having a carbon number of 3 to 10 or a phenyl group.

Examples of the substituent which the cycloalkyl group of $R_{111}$ to $R_{113}$ may further have include an alkyl group and the groups recited above as specific examples of the substituent which the alkyl group may further have.

Incidentally, each of the carbon number of the alkyl group and the carbon number of the substituent which the cycloalkyl group may further have is preferably from 1 to 8.

Examples of the substituent which the aryl group, aralkyl group and heterocyclic group of $R_{111}$ to $R_{113}$ may further have include a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

At least two of $R_{111}$ to $R_{113}$ may combine with each other to form a ring.

In the case where at least two of $R_{111}$ to $R_{113}$ combine with each other to form a ring, examples of the ring formed include a tetrahydropyrane ring, a cyclopentane ring, a cyclohexane ring, an adamantane ring, a norbornene ring, and a norbornane ring. These rings may have a substituent, and examples of the substituent which the ring may have include an alkyl group and the groups recited above as specific examples of the substituent which the alkyl group may further have.

In the case where all of $R_{111}$ to $R_{113}$ combine with each other to form a ring, examples of the ring formed include an adamantane ring, a norbornane ring, a norbornene ring, a bicyclo[2,2,2]octane ring, and a bicyclo[3,1,1]heptane ring. Among these, an adamantane ring is preferred. These rings may have a substituent, and examples of the substituent which the ring may have include an alkyl group and the groups recited above as specific examples of the substituent which the alkyl group may further have.

The monovalent substituent of $R_2$ is preferably a group represented by *-M-Q. * indicates a bond connected to the oxygen atom of formula (Ab1). M represents a single bond or a divalent linking group. Q represents an alkyl group, a cycloalkyl group, an aryl group or a heterocyclic group.

The divalent linking group of M is, for example, an alkylene group (preferably an alkylene group having a carbon number of 1 to 8, such as methylene group, ethylene group, propylene group, butylene group, hexylene group or octylene group), a cycloalkylene group (preferably a cycloalkylene group having a carbon number of 3 to 15, such as cyclopentylene group or cyclohexylene group), —S—, —O—, —CO—, —CS—, —$SO_2$—, —N($R_0$)—, or a combination of two or more thereof, and a linking group having a total carbon number of 20 or less is preferred. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group, and an octyl group).

M is preferably a single bond, an alkylene group or a divalent linking group formed by a combination of an alkylene group and at least one of —O—, —CO—, —CS— and —N($R_0$)—, more preferably a single bond, an alkylene group or a divalent linking group formed by a combination of an alkylene group and —O—. Here, $R_0$ has the same meaning as $R_0$ above.

M may further have a substituent, and examples of the substituent which M may further have are the same as those recited above for the substituent which the alkyl group of $R_{111}$ to $R_{113}$ may have.

Specific examples and preferred examples of the alkyl group of Q are the same, for example, as those recited above for the alkyl group of $R_{111}$ to $R_{113}$.

The cycloalkyl group of Q may be monocyclic or polycyclic. The carbon number of the cycloalkyl group is preferably from 3 to 10. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[$6.2.1.1^{3,6}.0^{2,7}$]dodecyl group, a 8-tricyclo[$5.2.1.0^{2,6}$]decyl group, and a 2-bicyclo[2.2.1]heptyl group. Among these, a cyclopentyl group, a cyclohexyl group, a 2-adamantyl group, a 8-tricyclo[$5.2.1.0^{2,6}$]decyl group and a 2-bicyclo[2.2.1]heptyl group are preferred.

Specific examples and preferred examples of the aryl group of Q are the same, for example, as those recited above for the aryl group of $R_{111}$ to $R_{113}$.

Specific examples and preferred examples of the heterocyclic group of Q are the same, for example, as those recited above for the heterocyclic group of $R_{111}$ to $R_{113}$.

The alkyl group, cycloalkyl group, aryl group and heterocyclic group of Q may have a substituent, and examples of the substituent include an alkyl group, a cycloalkyl group, a cyano group, a halogen atom, a hydroxyl group, an alkoxy group, a carboxyl group, and an alkoxycarbonyl group.

$R_2$ is preferably an alkyl group, a cycloalkyl group-substituted alkyl group, a cycloalkyl group, an aralkyl group, an aryloxyalkyl group or a heterocyclic group, more preferably an alkyl group or a cycloalkyl group. Specific examples and preferred examples of the alkyl group of $R_2$, the "cycloalkyl group" and the cycloalkyl group in the "cycloalkyl group-substituted alkyl group" of $R_2$, and the aryl group in the "aralkyl group (arylalkyl group)" and "aryloxyalkyl group" as the group represented by $R_2$ are the same as those recited for the alkyl group, the cycloalkyl group and the aryl group of Q, respectively.

Specific examples and preferred examples of the alkyl moiety in the "cycloalkyl group-substituted alkyl group", "aralkyl group (arylalkyl group)" and "aryloxyalkyl group" of $R_2$ are the same as those recited for the alkylene group of M.

Specific examples and preferred examples of the heterocyclic group of $R_2$ are the same as those recited for the heterocyclic group of Q.

Specific examples of the group represented by $R_2$ include a methyl group, an ethyl group, an isopropyl group, a cyclopentyl group, a cyclohexyl group, a cyclohexylethyl group, a 2-adamantyl group, a 8-tricyclo[$5.2.1.0^{2,6}$]decyl group, a 2-bicyclo[2.2.1]heptyl group, a benzyl group, a 2-phenethyl group, and a 2-phenoxyethylene group.

$R_1$ and $R_2$ may combine with each other to form a ring, and the ring formed by combining $R_1$ and $R_2$ with each other is preferably an oxygen-containing heterocyclic ring. The oxygen-containing heterocyclic structure may be monocyclic, polycyclic or spirocyclic and is preferably a monocyclic oxygen-containing heterocyclic structure, and the carbon number thereof is preferably from 3 to 10, more preferably 4 or 5.

Also, as described above, when M is a divalent linking group, Q may combine with M through a single bond or another linking group to form a ring. The another linking group includes an alkylene group (preferably an alkylene group having a carbon number of 1 to 3), and the ring formed is preferably a 5- or 6-membered ring.

$R_3$ is preferably a hydrogen atom or an alkyl group having a carbon number of 1 to 5, more preferably a hydrogen atom or an alkyl group having a carbon number of 1 to 3, still more preferably a hydrogen atom, a methyl group or an ethyl group, yet still more preferably a hydrogen atom.

The repeating unit represented by formula (Ab1) is preferably a repeating unit represented by any one of the following formulae (Ab1-1) to (Ab1-4):

(Ab1-1)

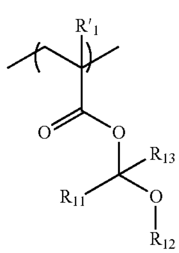

In formula (Ab1-1), $R'_1$ represents a hydrogen atom or a methyl group.

$R_{11}$, $R_{12}$ and $R_{13}$ have the same meanings as $R_1$, $R_2$ and $R_3$ in formula (Ab1), respectively.

(Ab1-2)

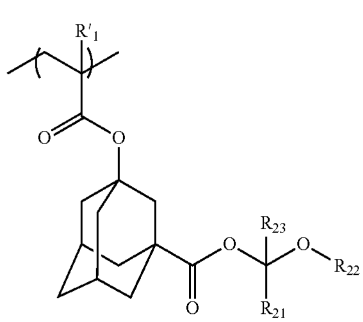

In formula (Ab1-2), $R'_2$ represents a hydrogen atom or a methyl group.

$R_{21}$, $R_{22}$ and $R_{23}$ have the same meanings as $R_1$, $R_2$ and $R_3$ in formula (Ab1), respectively.

(Ab1-3)

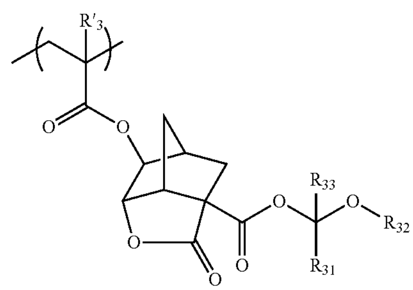

In formula (Ab1-3), $R'_3$ represents a hydrogen atom or a methyl group.

$R_{31}$, $R_{32}$ and $R_{33}$ have the same meanings as $R_1$, $R_2$ and $R_3$ in formula (Ab1), respectively.

(Ab1-4)

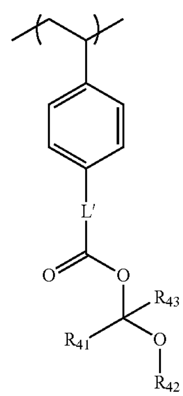

In formula (Ab1-4), L' represents a single bond or a divalent linking group.

$R_{41}$, $R_{42}$ and $R_{43}$ have the same meanings as $R_1$, $R_2$ and $R_3$ in formula (Ab1), respectively.

In formula (Ab1-1), $R'_1$ represents a hydrogen atom or a methyl group and preferably represents a methyl group.

In formulae (Ab1-2) and (Ab1-3), specific examples and preferred examples of $R'_2$ and $R'_3$ are the same as those of $R'_1$ in formula (Ab1-1).

In formula (Ab1-1), $R_{11}$, $R_{12}$ and $R_{13}$ have the same meanings as $R_1$, $R_2$ and $R_3$ in formula (Ab1), respectively, and preferred ranges thereof are also the same.

In formula (Ab1-2), $R_{21}$, $R_{22}$ and $R_{23}$ have the same meanings as $R_1$, $R_2$ and $R_3$ in formula (Ab1), respectively, and preferred ranges thereof are also the same.

In formula (Ab1-3), $R_{31}$, $R_{32}$ and $R_{33}$ have the same meanings as $R_1$, $R_2$ and $R_3$ in formula (Ab1), respectively, and preferred ranges thereof are also the same.

In formula (Ab1-4), $R_{41}$, $R_{42}$ and $R_{43}$ have the same meanings as $R_1$, $R_2$ and $R_3$ in formula (Ab1), respectively, and preferred ranges thereof are also the same. L' has the same meaning as L in formula (Ab1), and the preferred range thereof is also the same.

The repeating unit represented by formula (Ab1) is preferably a repeating unit represented by any one of formulae (Ab1-1) to (Ab1-4), more preferably a repeating unit represented by any one of formulae (Ab1-1) to (Ab1-3), still more preferably a repeating unit represented by formula (Ab1-1) or (Ab1-3), yet still more preferably a repeating unit represented by formula (Ab1-3).

It is also preferred that the repeating unit represented by formula (Ab1) is a repeating unit represented by any one of the following formulae (Ab1-a) to (Ab1-f):

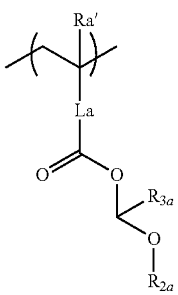

(Ab1-a)

In formula (Ab1-a), $R_a'$, $L_a$, $R_{2a}$ and $R_{3a}$ have the same meanings as R', L, $R_2$ and $R_3$ in formula (Ab1), respectively, and preferred ranges thereof are also the same.

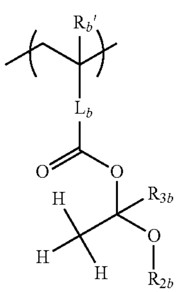

(Ab1-b)

In formula (Ab1-b), $R_b'$, $L_b$, $R_{2b}$ and $R_{3b}$ have the same meanings as R', L, $R_2$ and $R_3$ in formula (Ab1), respectively, and preferred ranges thereof are also the same.

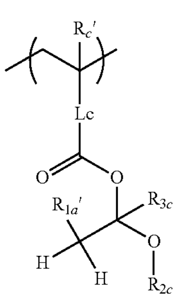

(Ab1-c)

In formula (Ab1-c), $R_c'$, $L_c$, $R_{2c}$ and $R_{3c}$ have the same meanings as R', L, $R_2$ and $R_3$ in formula (Ab1), respectively, and preferred ranges thereof are also the same.

$R_{1a}'$ has the same meaning as $R_{111}$ in formula (Ab1), and the preferred range thereof is also the same.

$R_{1a}'$ and $R_{2c}$ may combine with each other to form a ring, and specific examples and preferred examples of the ring formed are the same as those of the ring formed by combining $R_1$ and $R_2$ with each other in formula (Ab1).

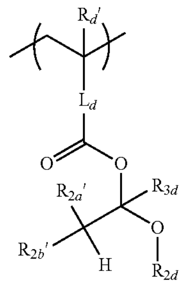

(Ab1-d)

In formula (Ab1-d), $R_d'$, $L_d$, $R_{2d}$ and $R_{3d}$ have the same meanings as R', L, $R_2$ and $R_3$ in formula (Ab1), respectively, and preferred ranges thereof are also the same.

$R_{2a}'$ and $R_{2b}'$ have the same meanings as $R_{111}$ and $R_{112}$ in formula (Ab1), respectively, and preferred ranges thereof are also the same.

At least one of $R_{2a}'$ and $R_{2b}'$ may combine with $R_{2d}$ to form a ring, and specific examples and preferred examples of the ring formed are the same as those of the ring formed by combining $R_1$ and $R_2$ with each other in formula (Ab1).

$R_{2a}'$ and $R_{2b}'$ may combine with each other to form a ring, and specific examples and preferred examples of the ring formed are the same as those of the ring formed by combining at least two of $R_{111}$ to $R_{113}$ with each other which are described as the monovalent substituent of $R_1$ in formula (Ab1).

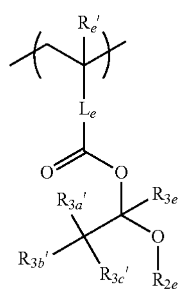

(Ab1-e)

In formula (Ab1-e), $R_e$, $L_e$, $R_{2e}$ and $R_{3e}$ have the same meanings as R', L, $R_2$ and $R_3$ in formula (Ab1), respectively, and preferred ranges thereof are also the same.

$R_{3a}'$ to $R_{3c}'$ have the same meanings as $R_{111}$ to $R_{113}$ in formula (Ab1), respectively, and preferred ranges thereof are also the same.

At least one of $R_{3a}'$ to $R_{3c}'$ may combine with $R_{2e}$ to form a ring, and specific examples and preferred examples of the ring formed are the same as those of the ring formed by combining $R_1$ and $R_2$ with each other in formula (Ab1).

At least two of $R_{3a}'$ to $R_{3c}'$ may combine with each other to form a ring, and specific examples and preferred examples of the ring formed are the same as those of the ring formed by combining at least two of $R_{111}$ to $R_{113}$ with each other which are described as the monovalent substituent of $R_1$ in formula (Ab1). ¥

(Ab1-f)

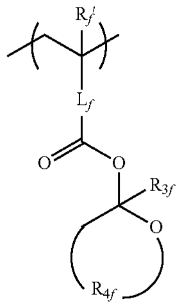

In formula (Ab1-f), $R_f'$ and $L_f$ have the same meanings as R' and L in formula (Ab1), respectively, and preferred ranges thereof are also the same.

$R_{3f}$ has the same meanings as $R_{3a}$ in formula (Ab1-a), and the preferred range thereof are also the same.

$R_{4f}$ represents an atomic group necessary to form an oxygen-containing heterocyclic ring together with the carbon atom. The oxygen-containing heterocyclic structure formed by $R_{4f}$ together with the carbon atom is preferably a monocyclic oxygen-containing heterocyclic structure, and the carbon number of the oxygen-containing heterocyclic ring formed by $R_{4f}$ together with the carbon atom is preferably from 3 to 10, more preferably 4 or 5.

The repeating unit represented by formula (Ab1) is preferably a repeating unit represented by any one of formulae (Ab1-a) to (Ab1-f), more preferably a repeating unit represented by any one of formulae (Ab1-c) to (Ab1-e), still more preferably a repeating unit represented by formula (Ab1-c).

Specific preferred examples of each partial structure and each group in formula (Ab1) are described below.

Specific preferred examples of the partial structure represented by the following formula (Ab1') in formula (Ab1) are illustrated below. * indicates a bond connected to the carbon atom to which $R_1$ and $R_3$ in formula (Ab1) are bonded.

(Ab1')

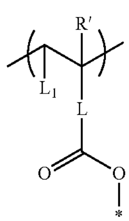

In formula (Ab1'), * indicates a bond connected to the carbon atom to which $R_1$ and $R_3$ in formula (Ab1) are bonded. R', L and $L_1$ are the same as those in formula (Ab1).

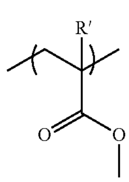

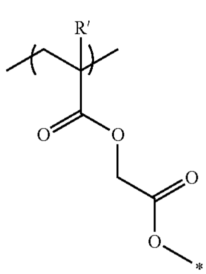

-continued

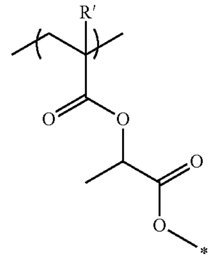

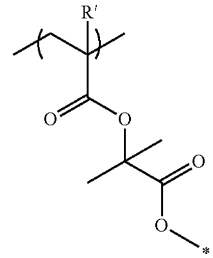

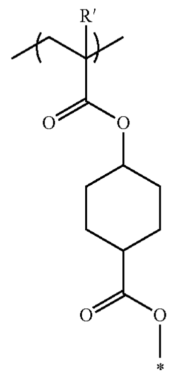

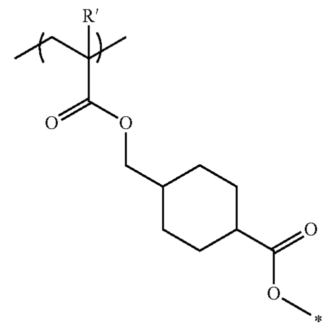

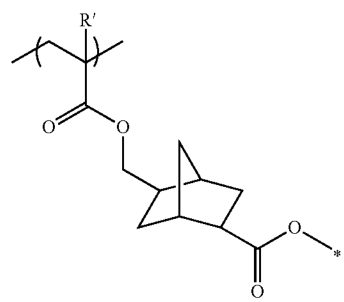

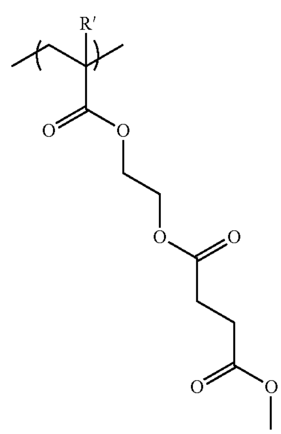

-continued
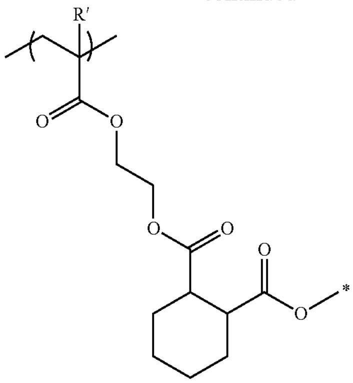
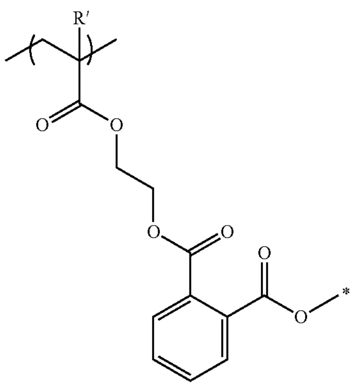
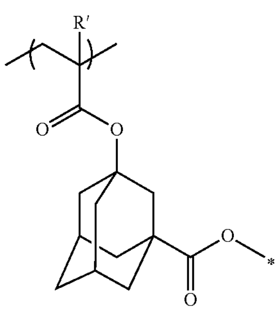
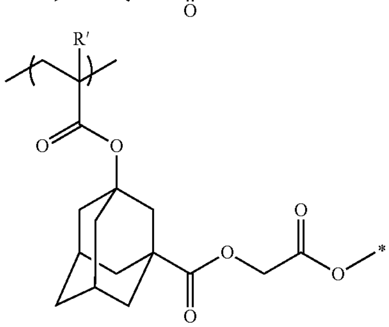
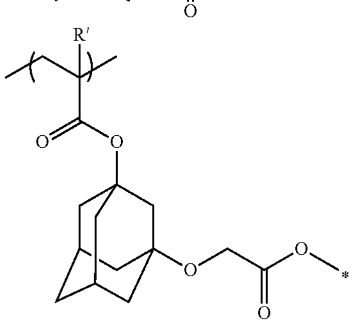
-continued
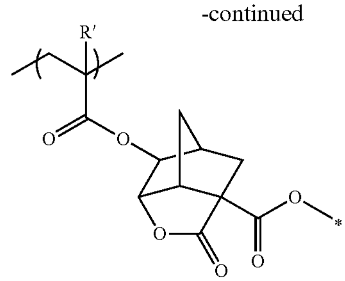
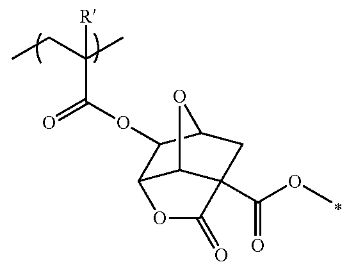
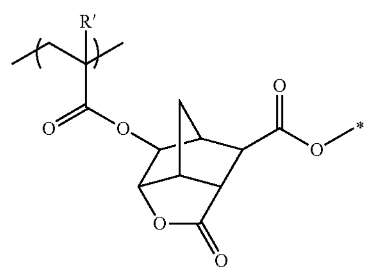
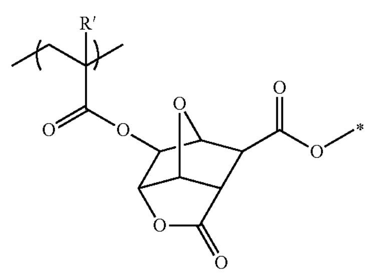
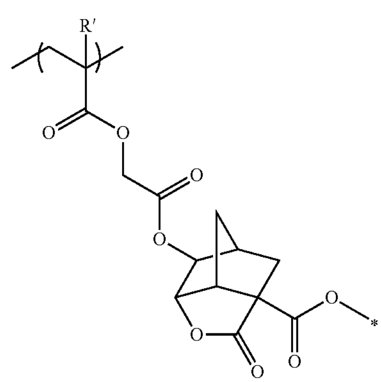

-continued
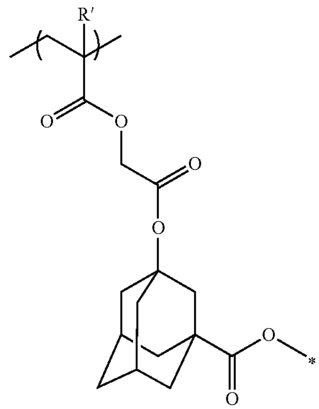
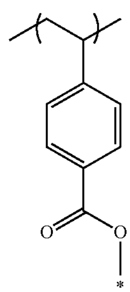
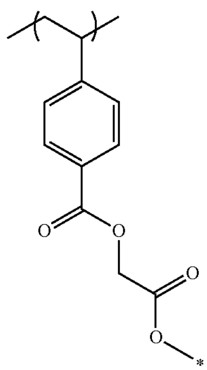
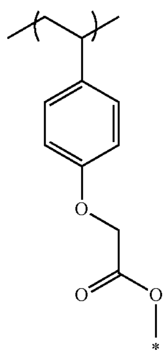
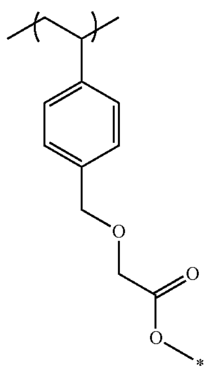
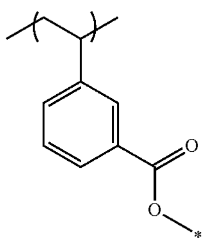
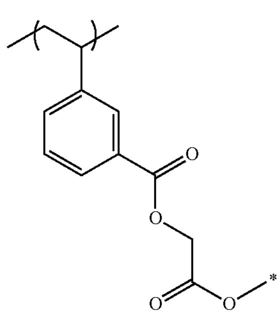
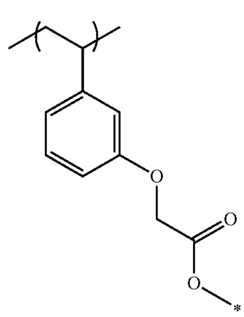
-continued
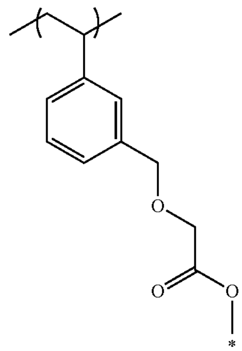
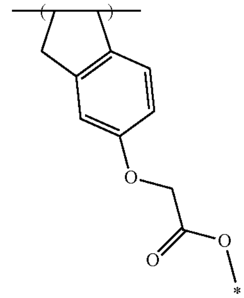
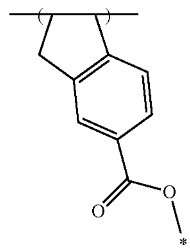
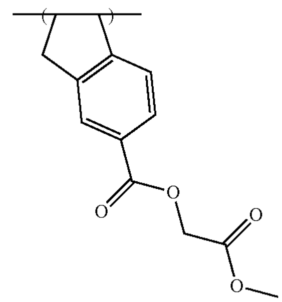
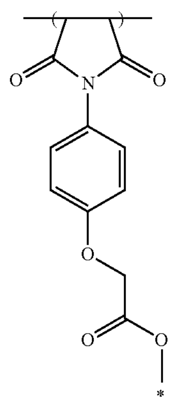
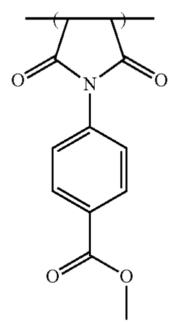
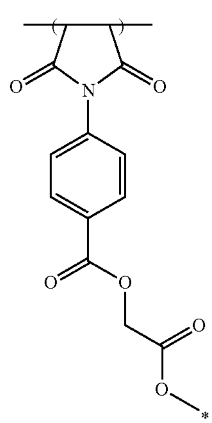
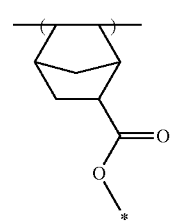

-continued
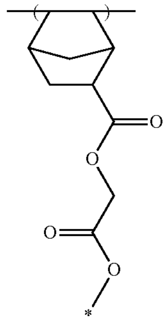
Specific examples of the monovalent substituent of $R_1$ in formula (Ab1) are illustrated below. * indicates a bond connected to the carbon atom in formula (Ab).
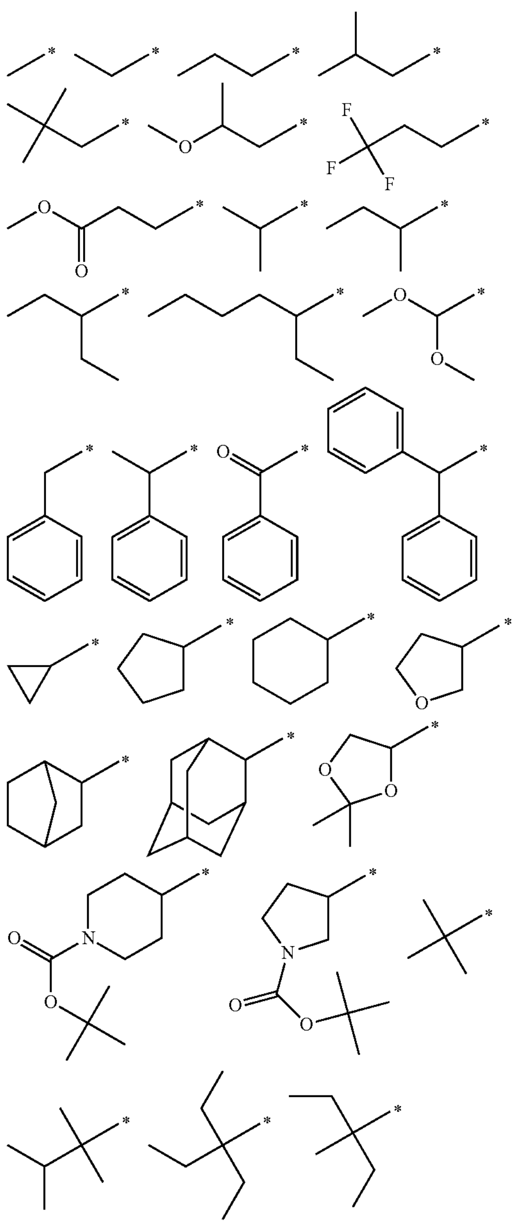
-continued
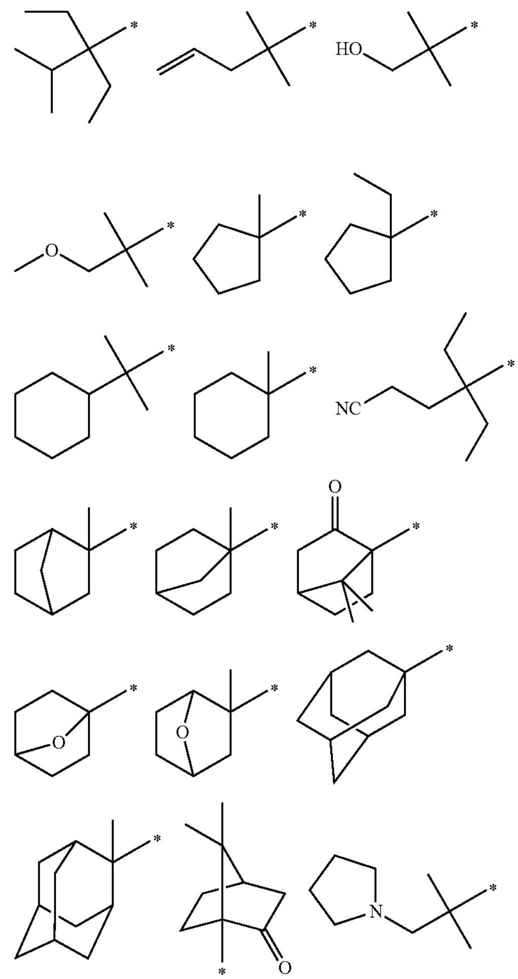
Specific examples of $R_2$ in formula (Ab1) are illustrated below. In the following specific examples, * indicates a bond connected to the oxygen atom in formula (Ab).
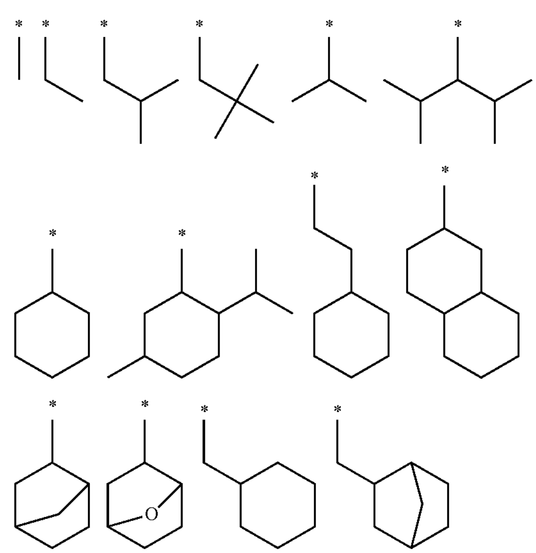

-continued

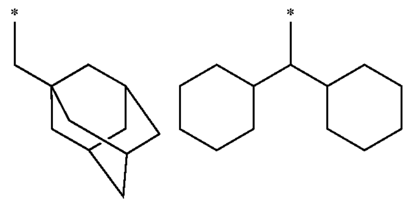

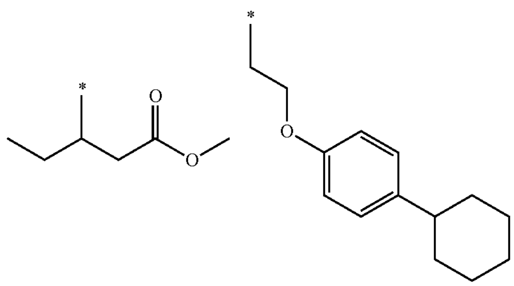

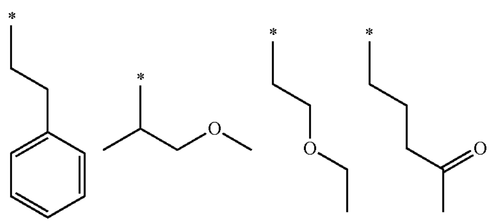

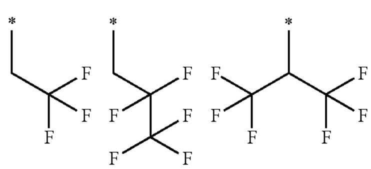

Specific examples of the oxygen-containing heterocyclic ring formed by $R_{4f}$ together with the carbon atom when the repeating unit represented by formula (Ab1) is a repeating unit represented by formula (Ab1-f) are illustrated below. * indicates a bond connected to the oxygen atom in formula (Ab1-f). $R_4$ is the same as that in formula (Ab1-f).

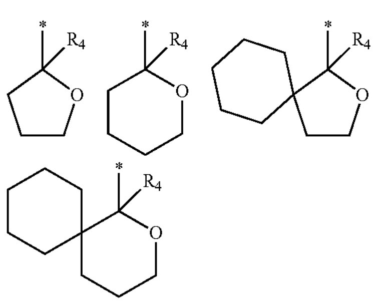

Specific examples of the repeating unit represented by formula (Ab1) are illustrated below, but the present invention is not limited thereto.

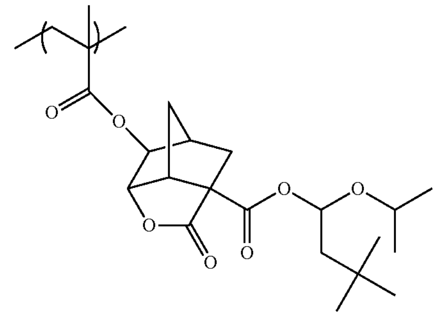

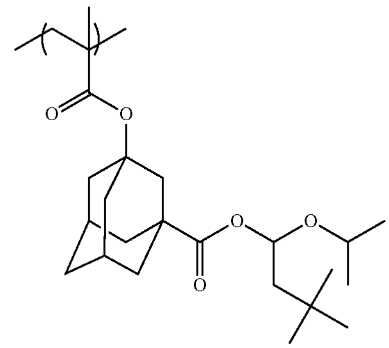

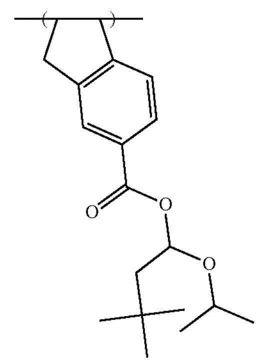

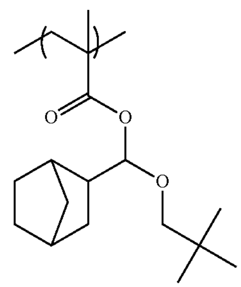

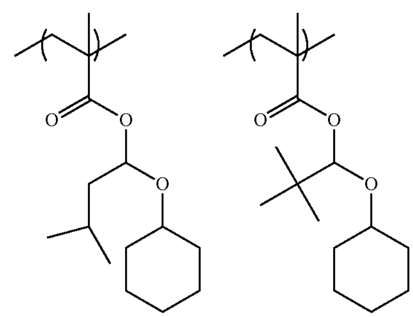

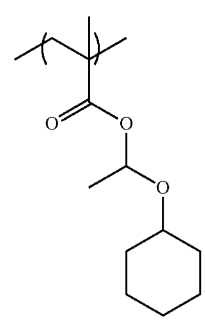

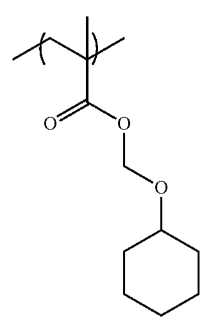

-continued
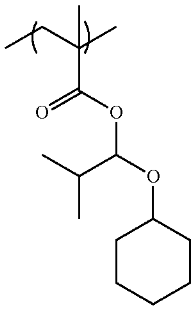
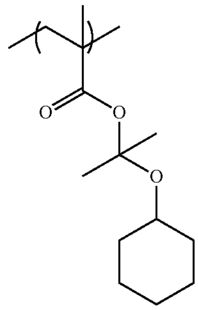
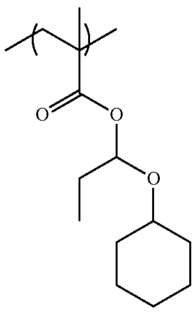
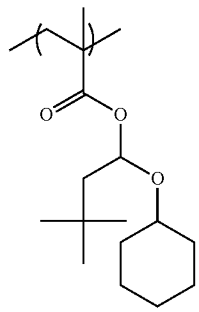
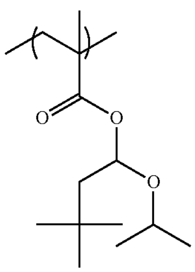
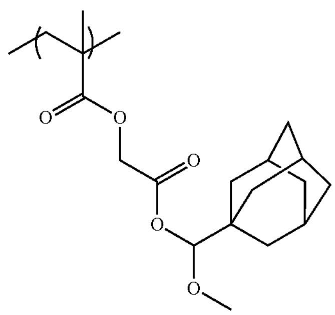
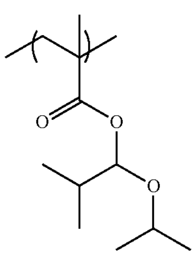
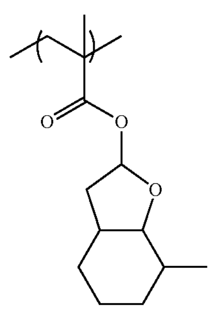
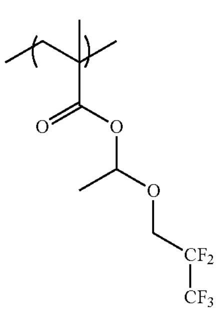
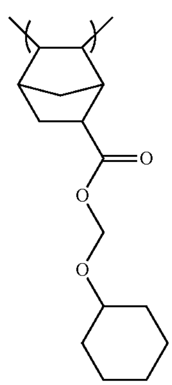
-continued
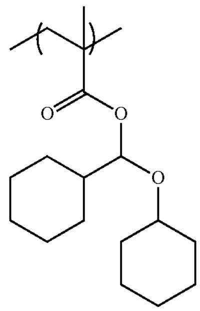
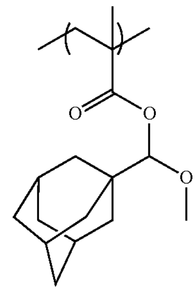
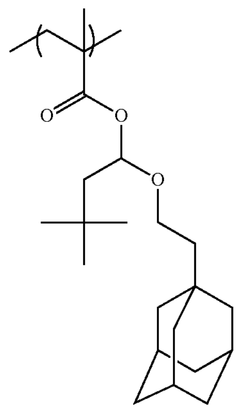
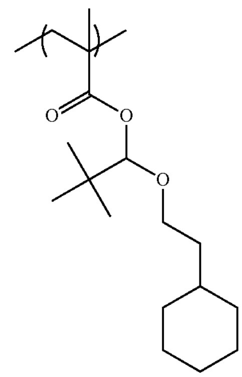
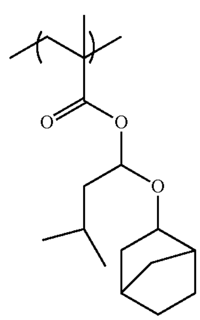
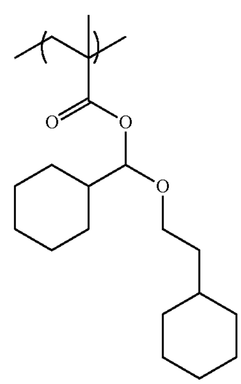
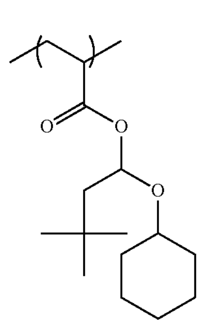
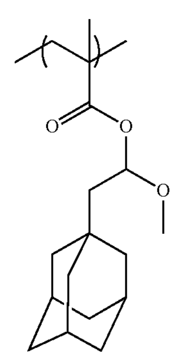

-continued

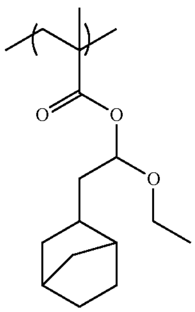
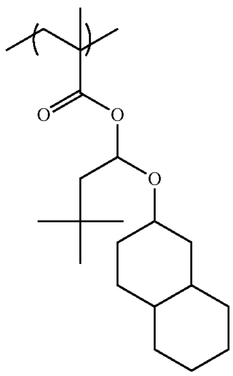
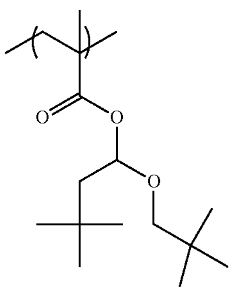
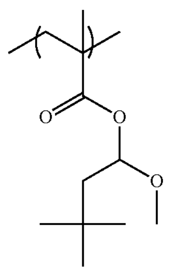
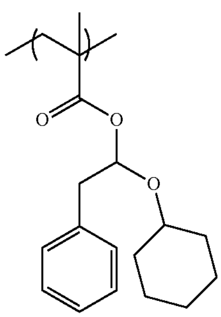
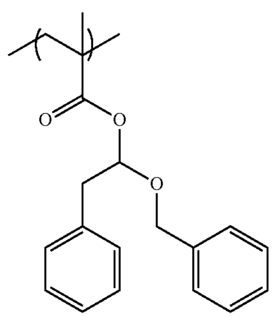
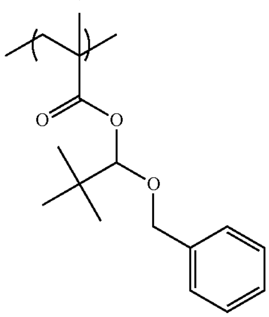
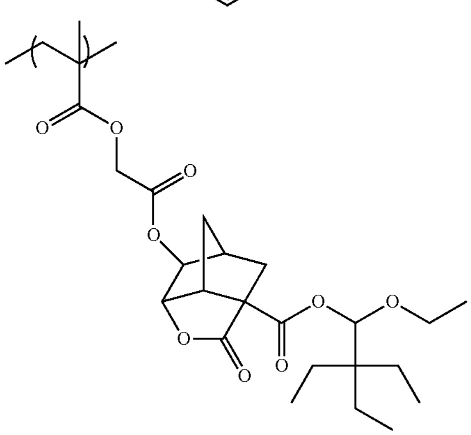

-continued

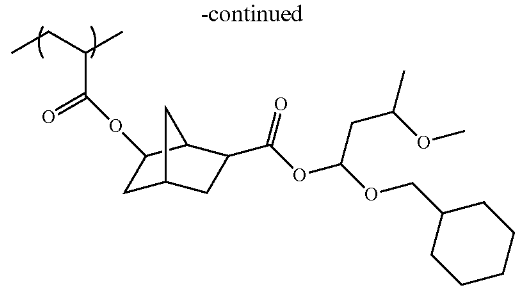
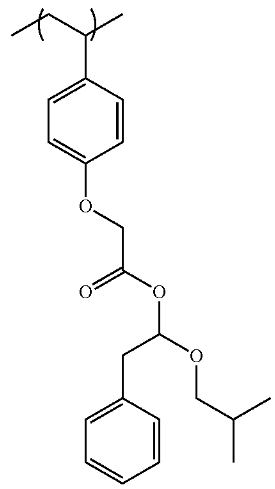
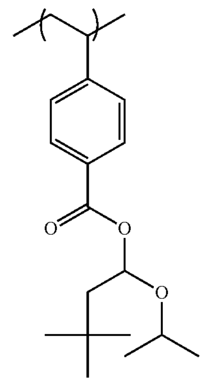

The content of the repeating unit represented by formula (Ab1) in the resin (Ab) (in the case of containing a plurality of repeating units, the total thereof) is preferably from 10 to 90 mol %, more preferably from 30 to 80 mol %, still more preferably from 50 to 70 mol %, based on all repeating units in the resin (Ab).

The resin (Ab) may further contain a repeating unit represented by the following formula (A5):

(A5)

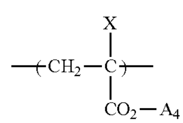

In formula (A5), X represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

$A_4$ represents a hydrocarbon group incapable of leaving by the action of an acid.

The hydrocarbon group of $A_4$ incapable of leaving by the action of an acid in formula (A5) includes a hydrocarbon group except for the above-described acid-decomposable group, and examples thereof include an alkyl group (preferably having a carbon number of 1 to 15) incapable of leaving by the action of an acid, a cycloalkyl group (preferably having a carbon number of 3 to 15) incapable of leaving by the action of an acid, and an aryl group (preferably having a carbon number of 6 to 15) incapable of leaving by the action of an acid.

The hydrocarbon group of $A_4$ incapable of leaving by the action of an acid may be further substituted with a hydroxyl group, an alkyl group, a cycloalkyl group, an aryl group or the like.

Specific examples of the repeating unit represented by formula (A5) are illustrated below, but the present invention is not limited thereto.

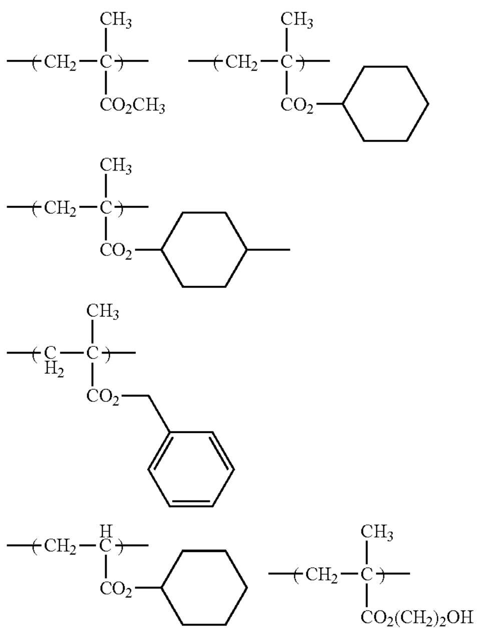

As an embodiment of the acid-decomposable group-containing repeating unit different from the repeating units exemplified above, the resin (Ab) may have a repeating unit capable of producing an alcoholic hydroxyl group. In this case, the repeating unit capable of producing an alcoholic hydroxy group is preferably represented by at least one formula selected from the group consisting of the following formulae (I-1) to (I-10). The repeating unit capable of producing an alcoholic hydroxyl group is more preferably represented by at least one formula selected from the group consisting of the following formulae (I-1) to (I-3), still more preferably represented by the following formula (I-1).

(I-1)

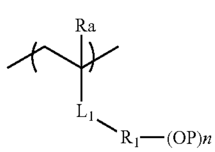

(I-2)

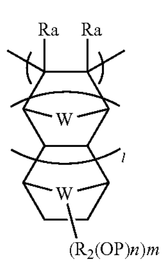

-continued (I-3)

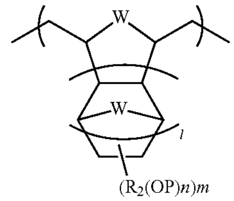

(I-4)

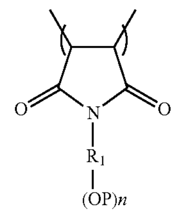

(I-5)

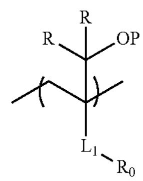

(I-6)

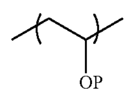

(I-7)

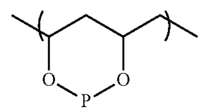

(I-8)

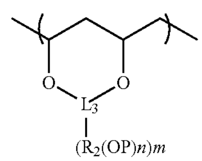

(I-9)

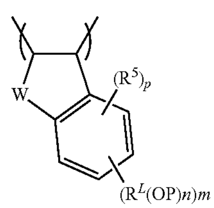

(I-10)

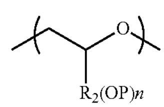

In the formulae, each Ra independently represents a hydrogen atom, an alkyl group or a group represented by —$CH_2$—O—$Ra_2$, wherein $Ra_2$ represents a hydrogen atom, an alkyl group or an acyl group.

$R_1$ represents an (n+1)-valent organic group.

$R_2$ represents, when m≥2, each independently represents, a single bond or an (n+1)-valent organic group.

Each OP independently represents the above-described group capable of decomposing by the action of an acid to produce an alcoholic hydroxy group, and when n≥2 and/or m≥2, two or more OP may combine with each other to form a ring.

W represents a methylene group, an oxygen atom or a sulfur atom, n and m represent an integer of 1 or more. Incidentally, in the case where $R_2$ in formula (I-2), (I-3) or (I-8) represents a single bond, n is 1.

l represents an integer of 0 or more.

$L_1$ represents a linking group represented by —COO—, —COO—, —CONH—, —O—, —Ar—, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents an (m+2)-valent linking group.

$R^L$ represents, when m≥2, each independently represents, an (n+1)-valent linking group.

$R^S$ represents, when p≥2, each independently represents, a substituent, and when p≥2, the plurality of $R^S$ may combine with each other to form a ring.

p represents an integer of 0 to 3.

Ra represents a hydrogen atom, an alkyl group or a group represented by —$CH_2$—O—$Ra_2$. Ra is preferably a hydrogen atom or an alkyl group having a carbon number of 1 to 10, more preferably a hydrogen or a methyl group.

W represents a methylene group, an oxygen atom or a sulfur atom. W is preferably a methylene group or an oxygen atom.

$R_1$ represents an (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or an (n+1)-valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ are a chain hydrocarbon group, this chain hydrocarbon group may be linear or branched. The carbon number of the chain hydrocarbon group is preferably from 1 to 8. For example, when $R_1$ and/or $R_2$ are an alkylene group, $R_1$ and/or $R_2$ are preferably a methylene group, an ethylene group, an n-propylene group, an isopropylene group, an n-butylene group, an isobutylene group or a sec-butylene group.

In the case where $R_1$ and/or $R_2$ are an alicyclic hydrocarbon group, this alicyclic hydrocarbon group may be monocyclic or polycyclic. The alicylcic hydrocarbon group has, for example, a monocyclo, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(═O)—], a sulfonyl group [—S(═O)$_2$—], a sulfinyl group [—S(═O)—] or an imino group [—N(R)—] (wherein R is a hydrogen atom or an alkyl group).

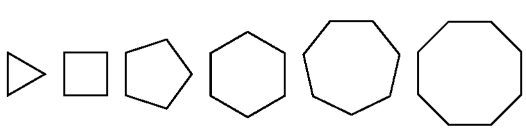

-continued

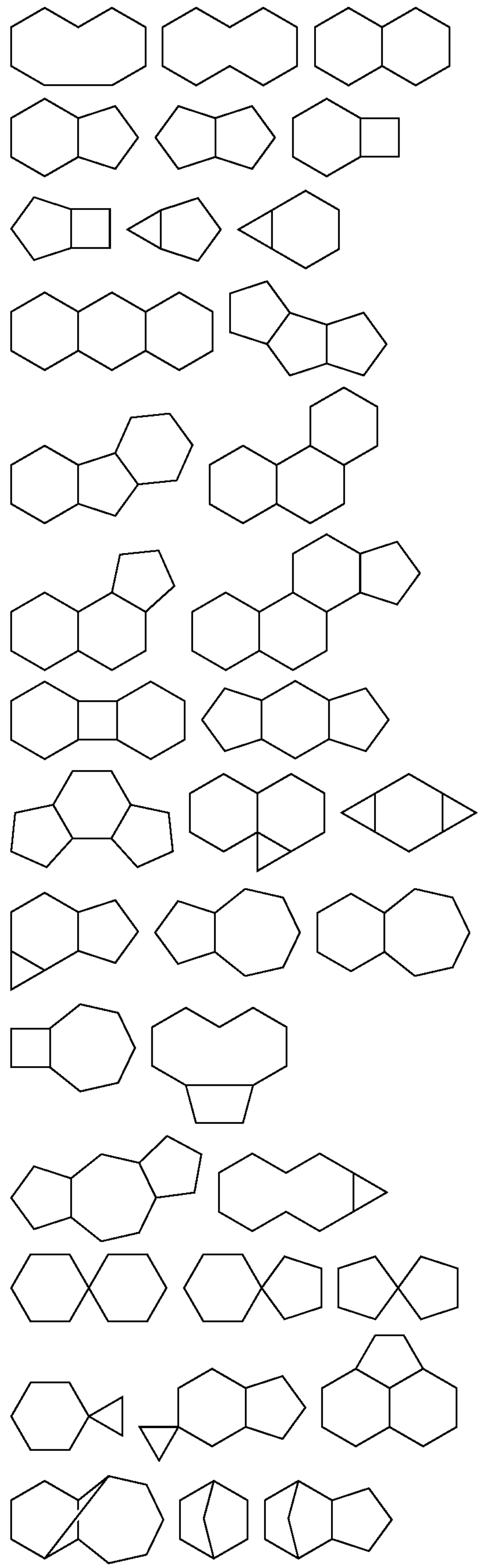

-continued

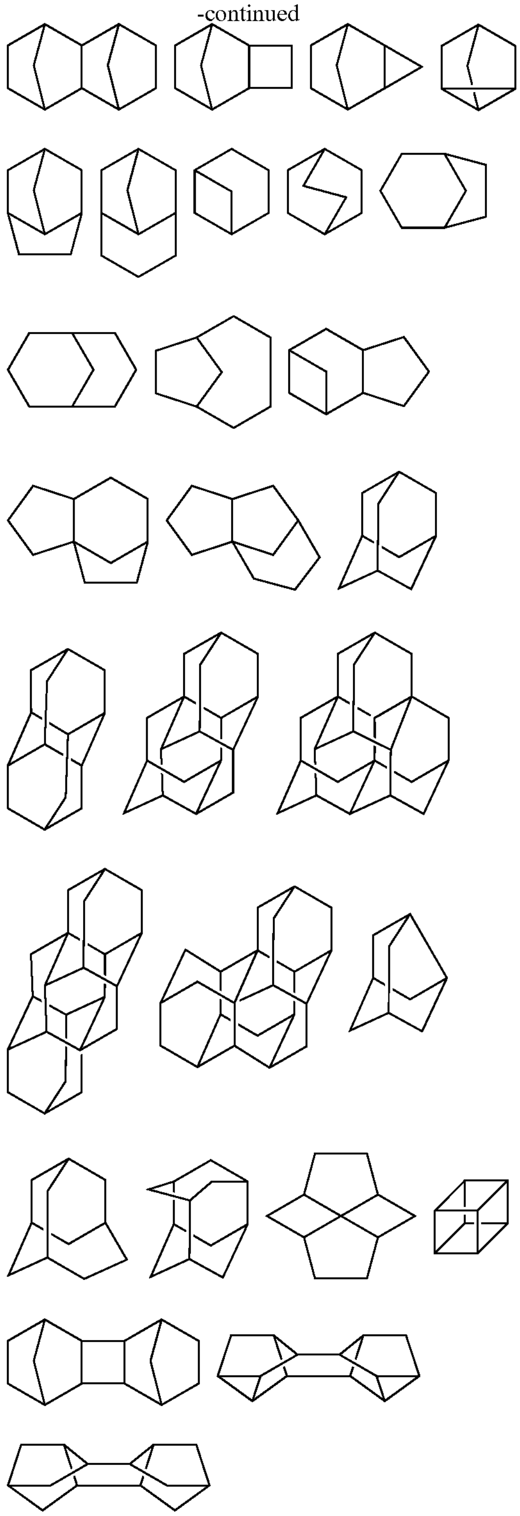

For example, when $R_1$ and/or $R_2$ are a cycloalkylene group, $R_1$ and/or $R_2$ are preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ and/or $R_2$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom and an alkoxy group.

$L_1$ represents a linking group represented by —COO—, —COO—, —CONH—, —O—, —Ar—, —$SO_3$— or —$SO_2$NH—, wherein Ar represents a divalent aromatic ring group. $L_1$ is preferably a linking group represented by —COO—, —CONH— or —Ar—, more preferably a linking group represented by —COO— or —CONH—.

R represents a hydrogen atom or an alkyl group. The alkyl group may be linear or branched. The carbon number of this alkyl group is preferably from 1 to 6, more preferably from 1 to 3. R is preferably a hydrogen atom or a methyl group, more preferably a hydrogen atom.

$R_0$ represents a hydrogen atom or an organic group. Examples of the organic group include an alkyl group, a cycloalkyl group, an aryl group, an alkynyl group, and an alkenyl group. $R_0$ is preferably a hydrogen atom or an alkyl group, more preferably a hydrogen atom or a methyl group.

$L_3$ represents an (m+2)-valent linking group. That is, $L_3$ represents a trivalent or higher valent linking group. Examples of such a linking group include corresponding groups in specific examples illustrated later.

$R^L$ represents an (n+1)-valent linking group. That is, $R^L$ represents a divalent or higher valent linking group. Examples of such a linking group include an alkylene group, a cycloalkylene group, and corresponding groups in specific examples illustrated later. $R^L$ may combine with another $R^L$ or $R^S$ to form a ring structure.

$R^S$ represents a substituent. The substituent includes, for example, an alkyl group, an alkenyl group, an alkynyl group, an aryl group, an alkoxy group, an acyloxy group, an alkoxycarbonyl group, and a halogen atom.

n is an integer of 1 or more. n is preferably an integer of 1 to 3, more preferably 1 or 2. Also, when n is an integer of 2 or more, the dissolution contrast for an organic solvent-containing developer can be more enhanced and in turn, the limiting resolution and roughness characteristics can be more improved.

m is an integer of 1 or more. m is preferably an integer of 1 to 3, more preferably 1 or 2.

l is an integer of 0 or more. l is preferably 0 or 1.

p is an integer of 0 to 3.

The repeating unit capable of producing an alcoholic hydroxyl group is preferably a repeating unit having a group capable of decomposing by the action of an acid to produce an alcoholic hydroxy group.

Specific examples of the repeating unit having a group capable of decomposing by the action of an acid to produce an alcoholic hydroxy group are illustrated below. In specific examples, Ra and OP have the same meanings as those in formulae (I-1) to (1-3). In the case where a plurality of OP combine with each other to form a ring, the corresponding ring structure is conveniently denoted by "O—P—O".

-continued
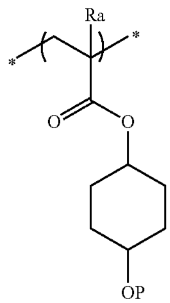
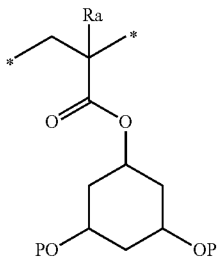
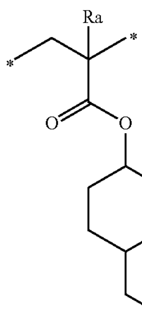
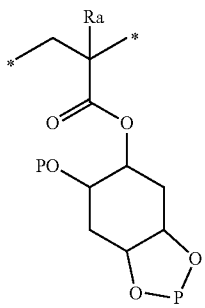
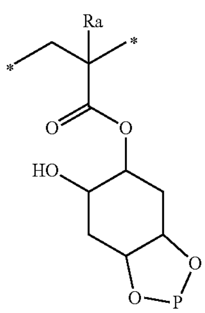
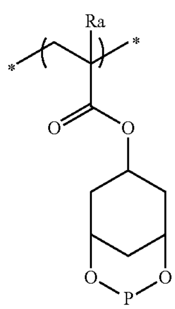
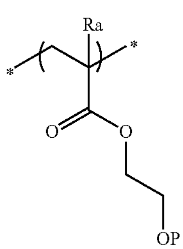
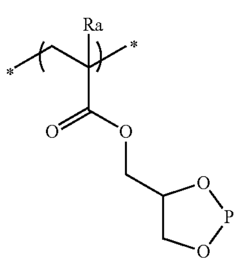
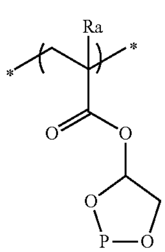
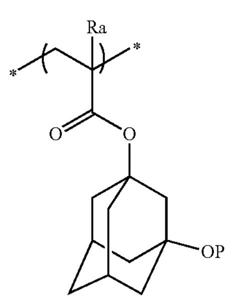
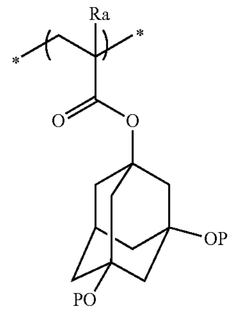
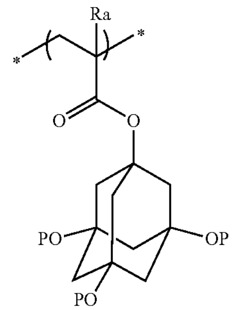
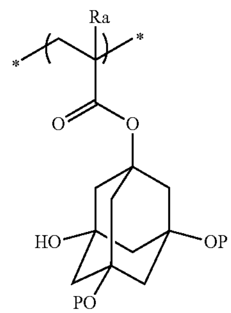
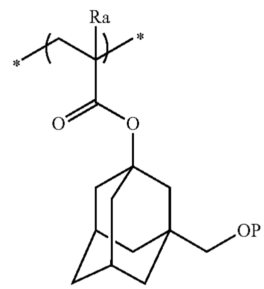
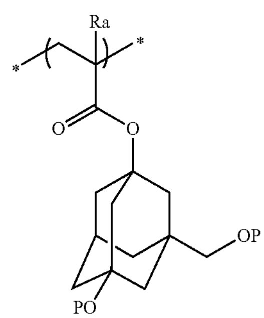
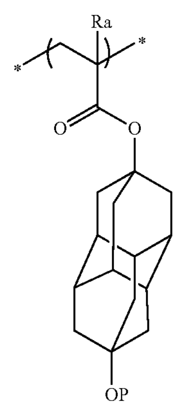
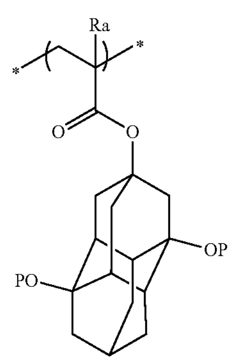
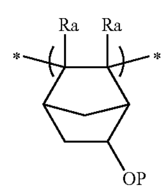
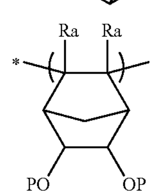
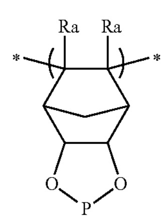
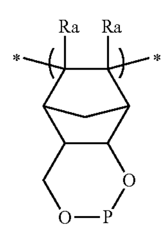

-continued

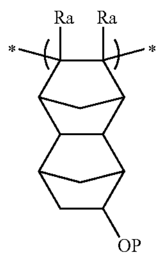
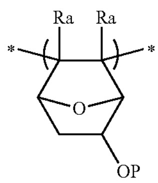
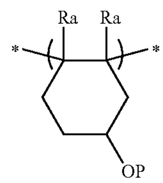

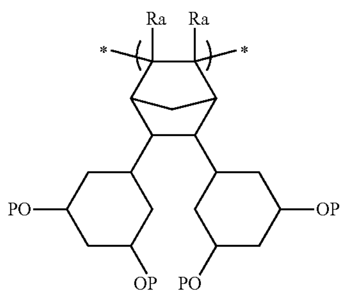

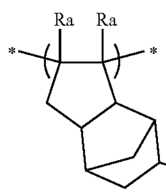
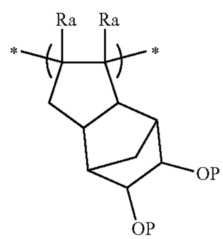

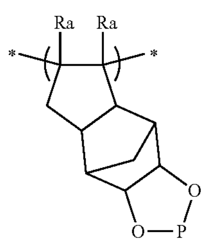
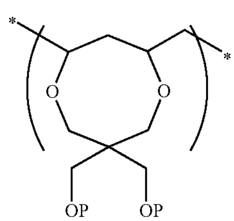

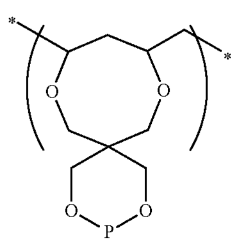

The group capable of decomposing by the action of an acid to produce an alcoholic hydroxy group is preferably represented by at least one formula selected from the group consisting of the following formulae (II-1) to (II-4):

(II-1)

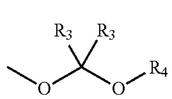

(II-2)

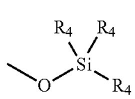

-continued (II-3)

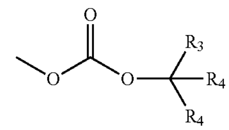

(II-4)

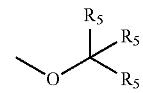

In the formulae, each $R_3$ independently represents a hydrogen atom or a monovalent organic group. $R_3$s may combine with each other to form a ring.

Each $R_4$ independently represents a monovalent organic group. $R_4$s may combine with each other to form a ring. $R_3$ and $R_4$ may combine with each other to form a ring.

Each $R_5$ independently represents a hydrogen atom, an alkyl group, a cycloalkyl group, an aryl group, an alkenyl group or an alkynyl group. At least two $R_5$s may combine with each other to form a ring, provided that when one or two of three $R_5$s are a hydrogen atom, at least one of the remaining $R_5$s represents an aryl group, an alkenyl group or an alkynyl group.

The group capable of decomposing by the action of an acid to produce an alcoholic hydroxy group is also preferably represented by at least one formula selected from the group consisting of the following formulae (II-5) to (II-9):

(II-5)

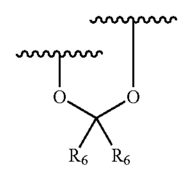

(II-6)

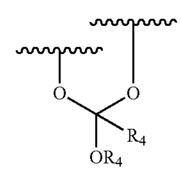

(II-7)

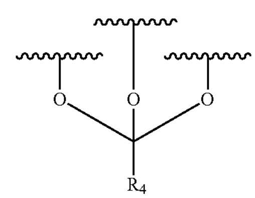

(II-8)

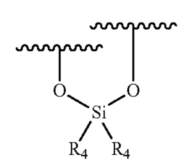

(II-9)

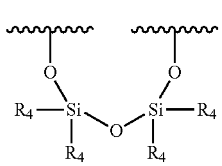

In the formulae, $R_4$ has the same meaning as in formulae (II-1) to (II-3).

Each $R_6$ independently represents a hydrogen atom or a monovalent organic group. $R_6$s may combine with each other to form a ring.

The group capable of decomposing by the action of an acid to produce an alcoholic hydroxy group is more preferably represented by at least one formula selected from formulae (II-1) to (II-3), still more preferably represented by formula (II-1) or (II-3), yet still more preferably represented by formula (II-1).

$R_3$ represents a hydrogen atom or a monovalent organic group as described above. $R_3$ is preferably a hydrogen atom, an alkyl group or a cycloalkyl group, more preferably a hydrogen atom or an alkyl group.

The alkyl group of $R_3$ may be linear or branched. The carbon number of the alkyl group of $R_3$ is preferably from 1 to 10, more preferably from 1 to 3. Examples of the alkyl group of $R_3$ include a methyl group, an ethyl group, an n-propyl group, an isopropyl group, and an n-butyl group.

The cycloalkyl group of $R_3$ may be monocyclic or polycyclic. The carbon number of the cycloalkyl group of $R_3$ is preferably 3 to 10, more preferably 4 to 8. Examples of the cycloalkyl group of $R_3$ include a cyclopropyl group, a cyclobutyl group, a cyclopentyl group, a cyclohexyl group, a norbornyl group, and an adamantyl group.

In formula (II-1), at least either one $R_3$ is preferably a monovalent organic group. When such a configuration is employed, high sensitivity can be achieved among others.

$R_4$ represents a monovalent organic group. $R_4$ is preferably an alkyl group or a cycloalkyl group, more preferably an alkyl group. These alkyl group and cycloalkyl group may have a substituent.

The alkyl group of $R_4$ preferably has no substituent or has one or more aryl groups and/or one or more silyl groups as the substituent. The carbon number of the unsubstituted alkyl group is preferably from 1 to 20. The carbon number of the alkyl group moiety in the alkyl group substituted with one or more aryl groups is preferably from 1 to 25. The carbon number of the alkyl group moiety in the alkyl group substituted with one or more silyl groups is preferably from 1 to 30. Also, in the case where the cycloalkyl group of $R_4$ does not have a substituent, the carbon number thereof is preferably from 3 to 20.

$R_5$ represents a hydrogen atom, an alkyl group, a cycloalkyl group, an aryl group, an alkenyl group or an alkynyl group. However, when one or two of three $R_5$s are a hydrogen atom, at least one of the remaining $R_5$s represents an aryl group, an alkenyl group or an alkynyl group. $R_5$ is preferably a hydrogen atom or an alkyl group. The alkyl group may or may not have a substituent. When the alkyl group does not have a substituent, the carbon number thereof is preferably from 1 to 6, more preferably from 1 to 3.

$R_6$ represents a hydrogen atom or a monovalent organic group as described above. $R_6$ is preferably a hydrogen atom, an alkyl group or a cycloalkyl group, more preferably a hydrogen atom or an alkyl group, still more preferably a hydrogen atom or an alkyl group having no substituent. $R_6$ is preferably a hydrogen atom or an alkyl group having a carbon number of 1 to 10, more preferably a hydrogen atom or an alkyl group having a carbon number of 1 to 10 and having no substituent.

Examples of the alkyl group and cycloalkyl group of $R_4$, $R_5$ and $R_6$ are the same as those described for $R_3$ above.

Specific examples of the group capable of decomposing by the action of an acid to produce an alcoholic hydroxy group are illustrated below.

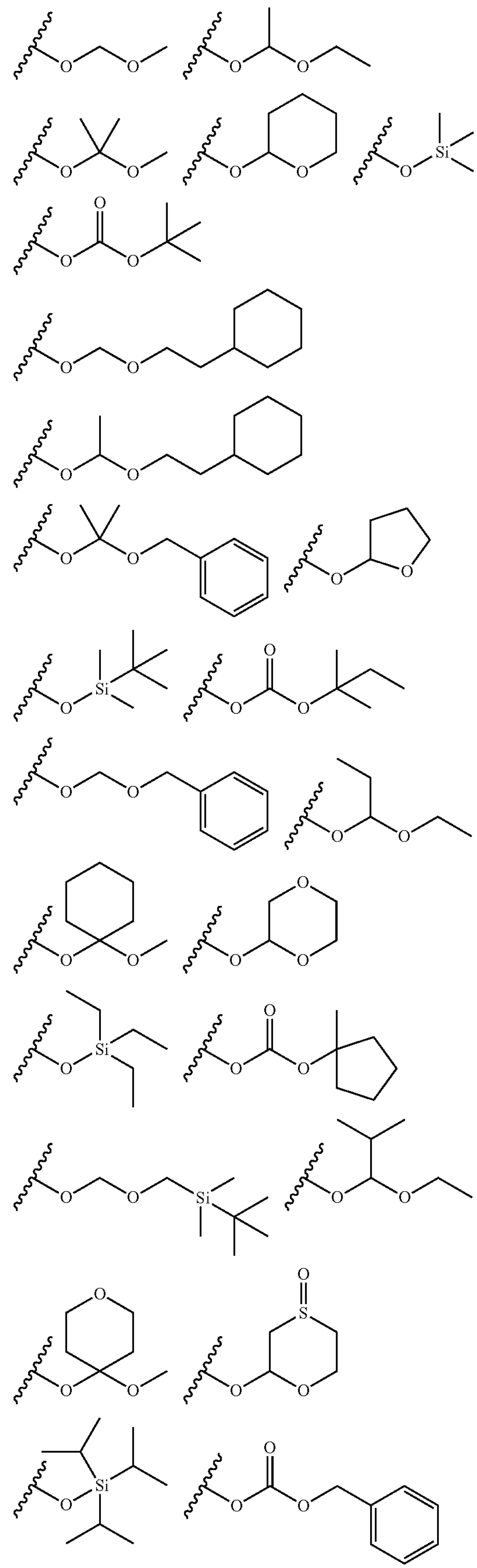

-continued
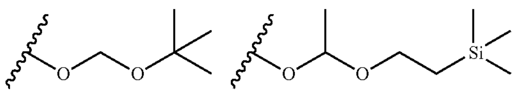
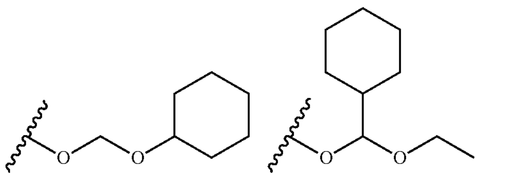
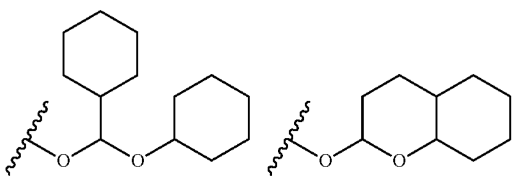
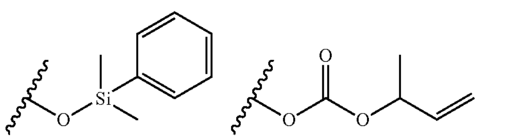
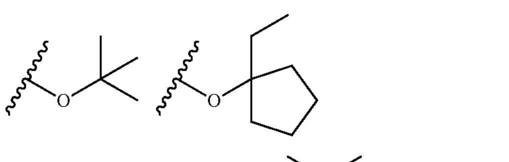
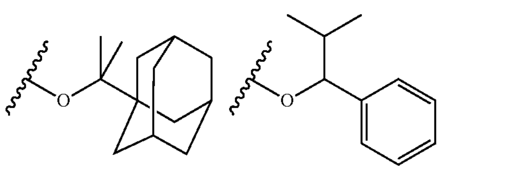
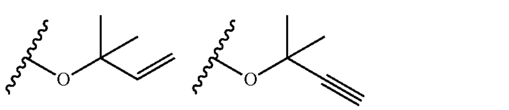
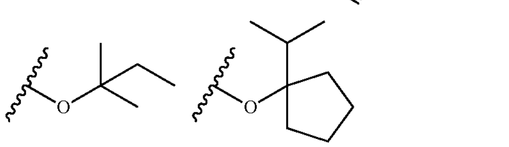
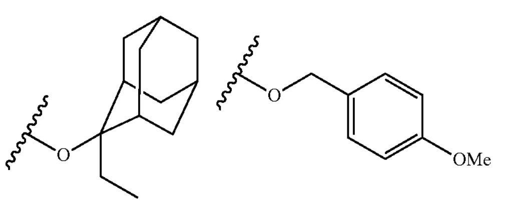
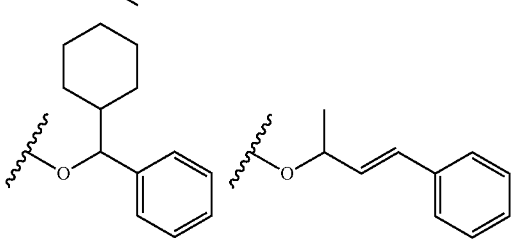
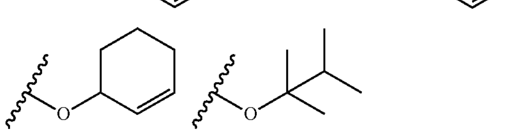
-continued
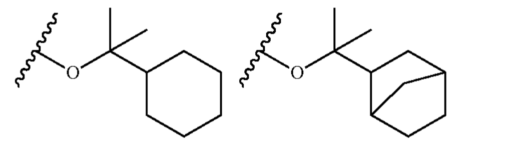
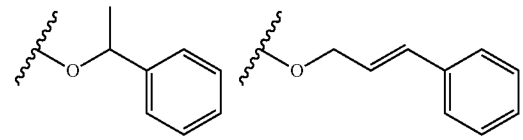
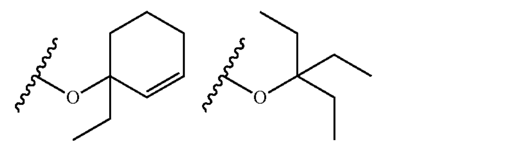
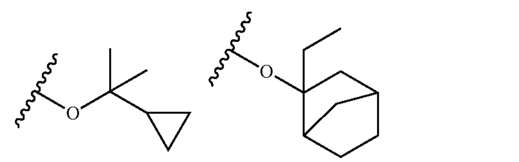
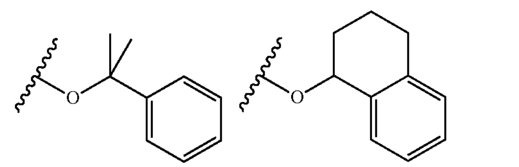
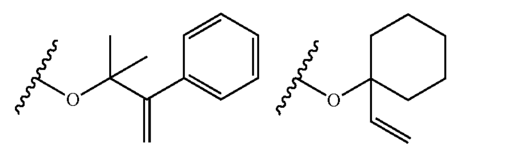
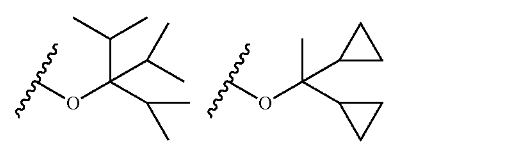
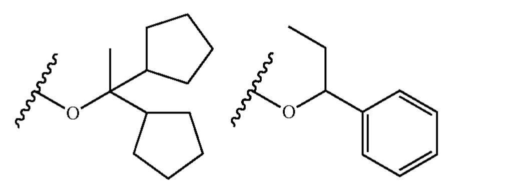
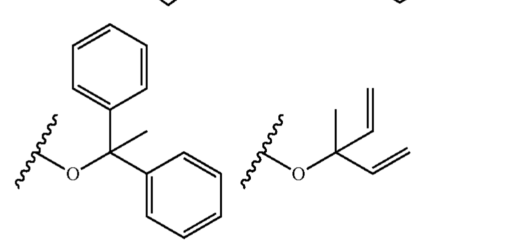
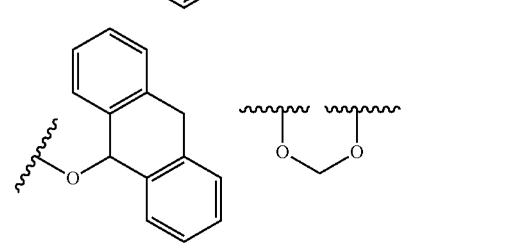

-continued
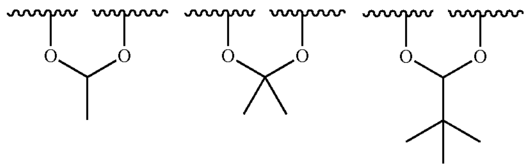
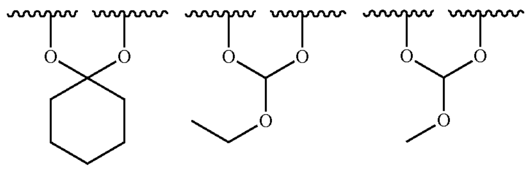
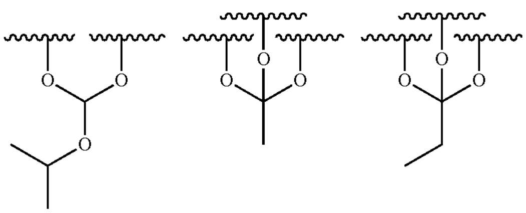
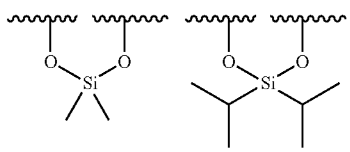
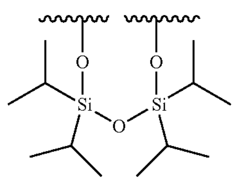
Specific examples of the repeating unit having a group capable of decomposing by the action of an acid to produce an alcoholic hydroxy group are illustrated below. In specific examples, $Xa_1$ represents a hydrogen atom, $CH_3$, $CF_3$ or $CH_2OH$.
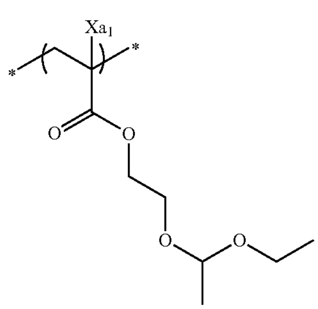
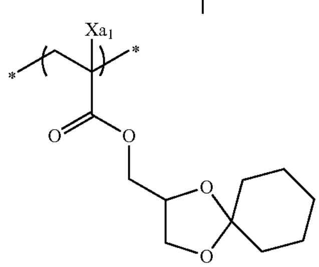
-continued
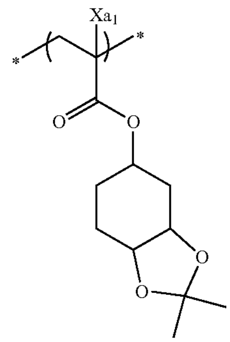
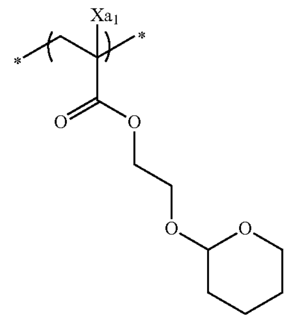
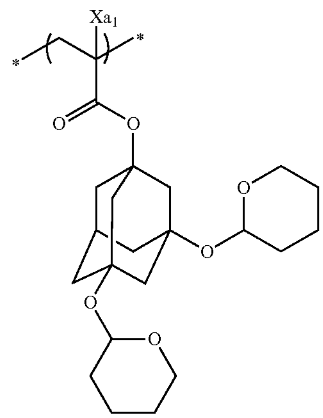
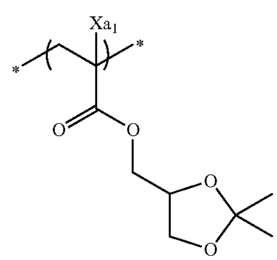
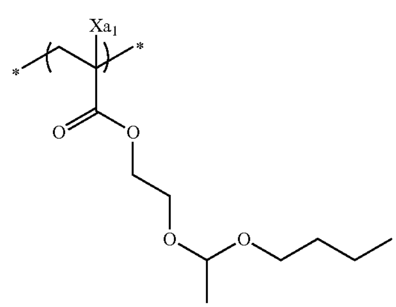
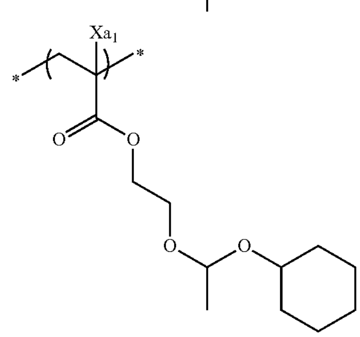

-continued

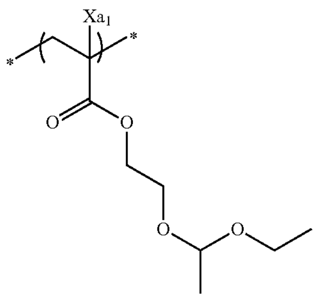

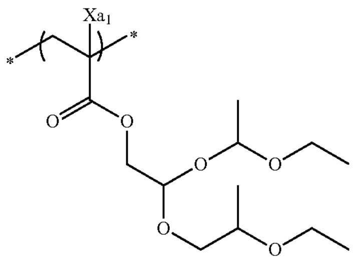

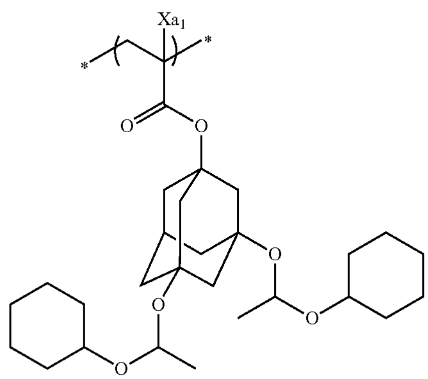

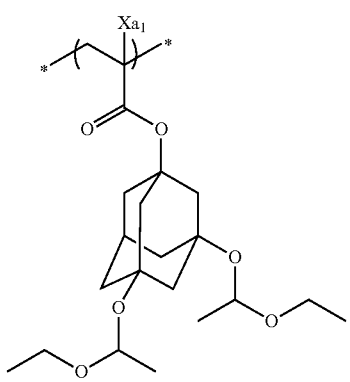

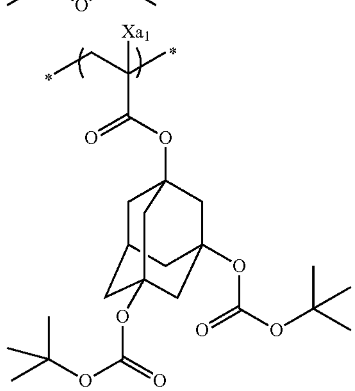

-continued

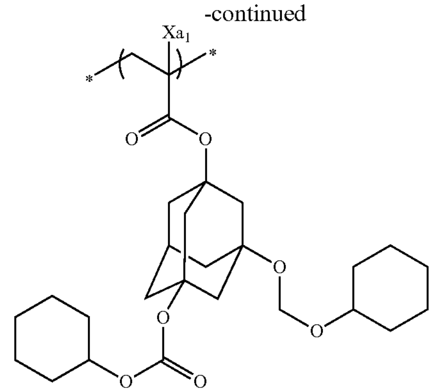

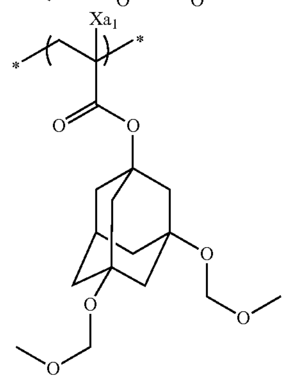

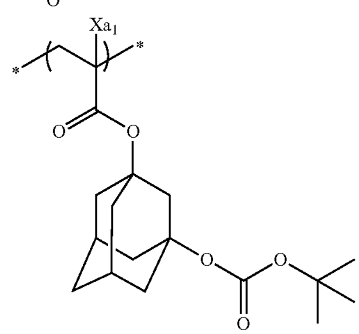

As for the repeating unit having an acid-decomposable group, one kind may be used alone, or two or more kinds may be used in combination.

The content of the repeating unit having an acid-decomposable group (in the case of containing a plurality of kinds of repeating units, the total thereof) in the resin (Ab) is preferably from 10 to 90 mol %, more preferably from 30 to 80 mol %, and most preferably from 50 to 70 mol %, based on all repeating units in the resin (Ab).

The resin (Ab) may further contain a repeating unit represented by the following formula (4):

(4)

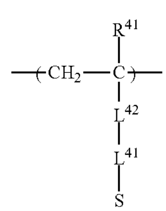

$R^{41}$ represents a hydrogen atom or a methyl group. $L^{41}$ represents a single bond or a divalent linking group. $L^{42}$ represents a divalent linking group. S represents a structural moiety capable of decomposing upon irradiation with an actinic ray or radiation to generate an acid on the side chain.
Specific examples of the repeating unit represented by formula (4) are illustrated below, but the present invention is not limited thereto.
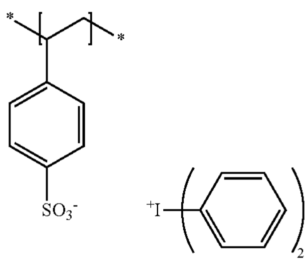
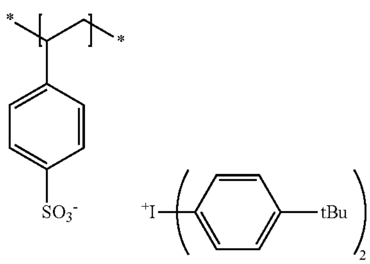
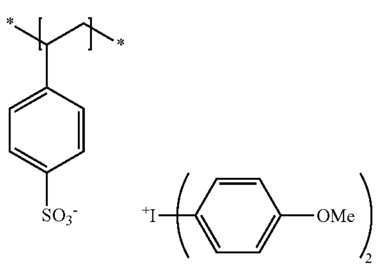
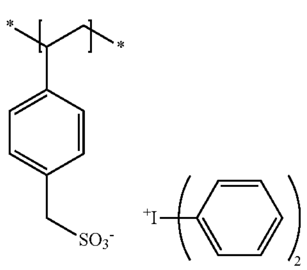
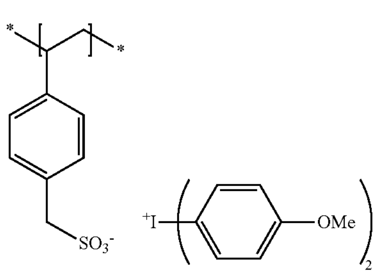
-continued
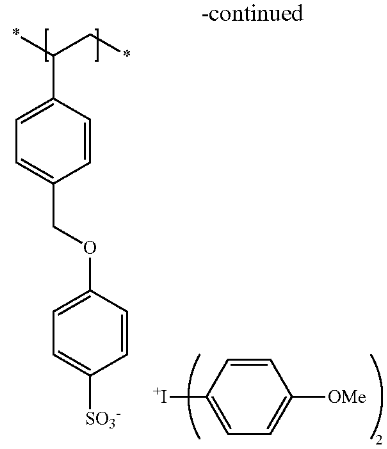
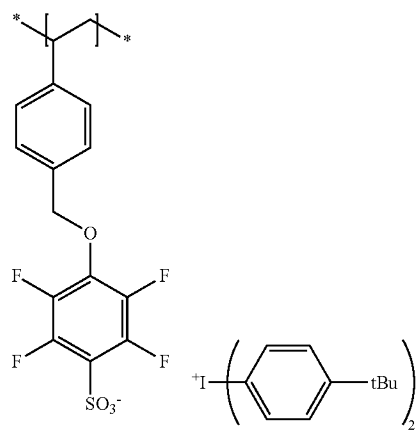
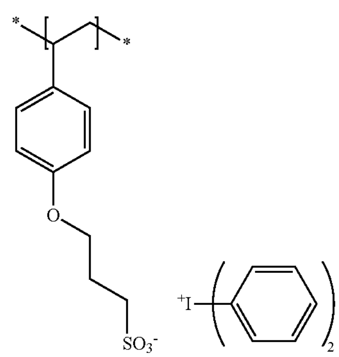
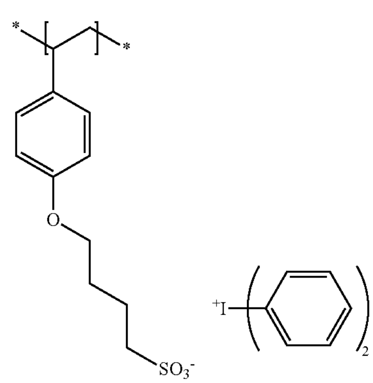

-continued
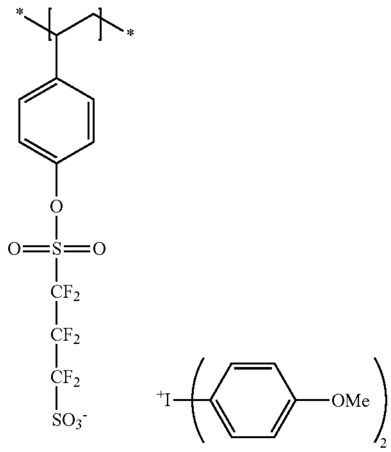
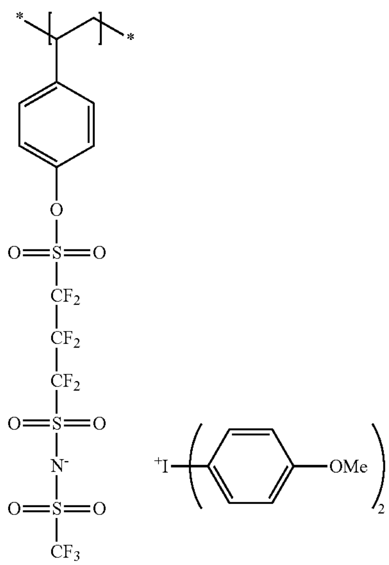
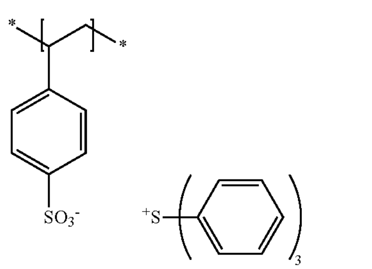
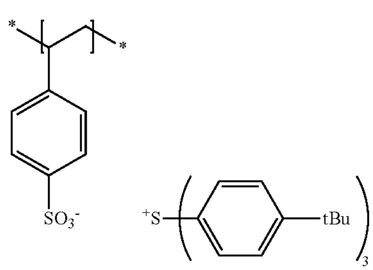
-continued
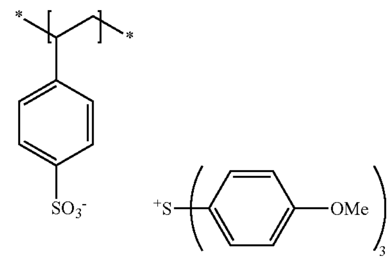
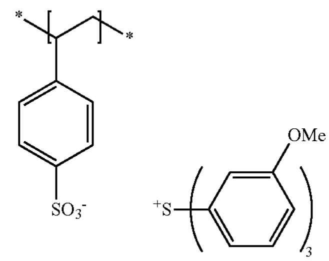
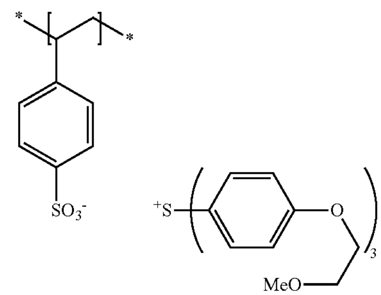
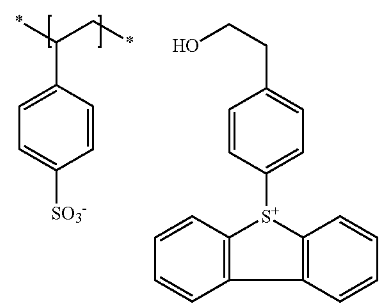
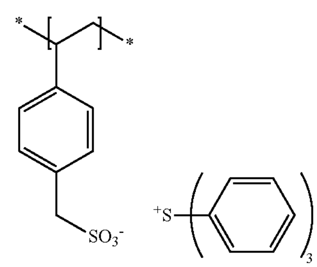
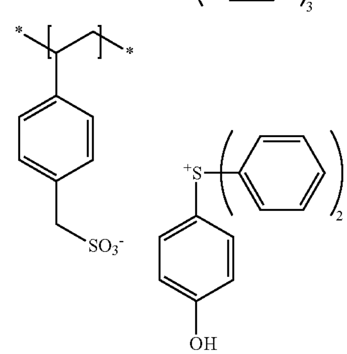

-continued
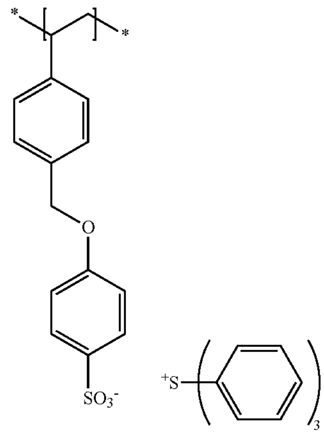
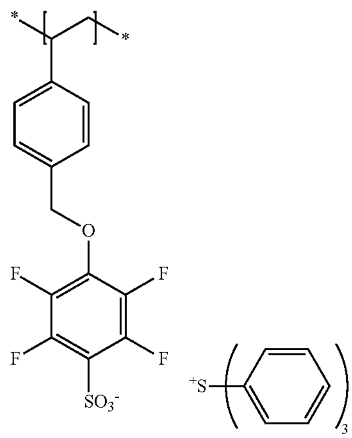
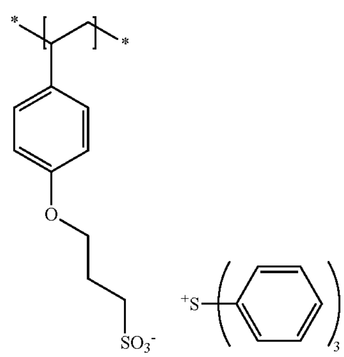
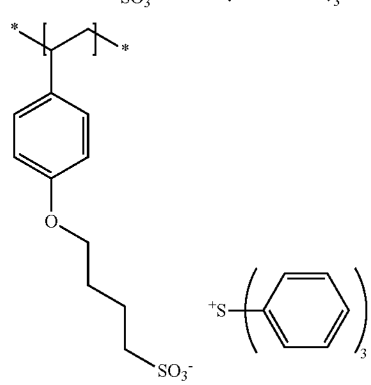
-continued
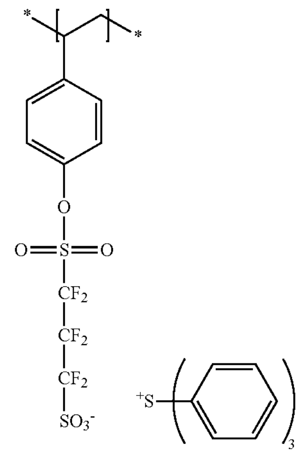
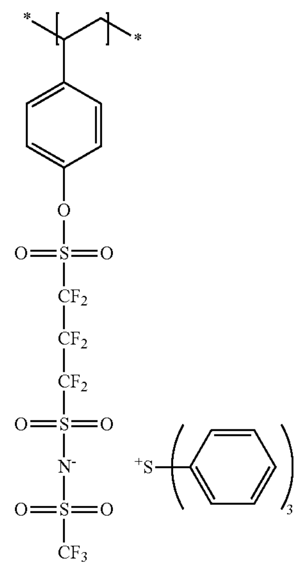
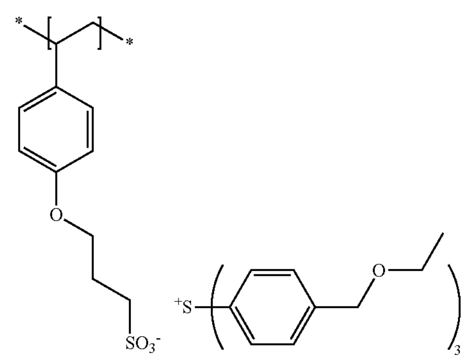
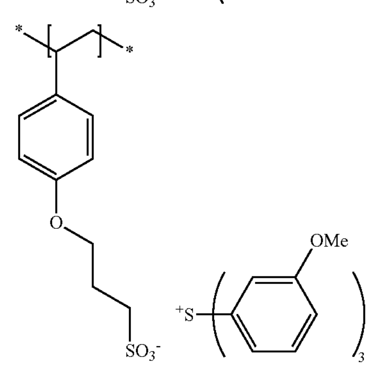

-continued
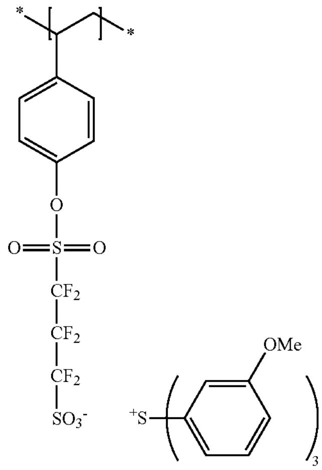
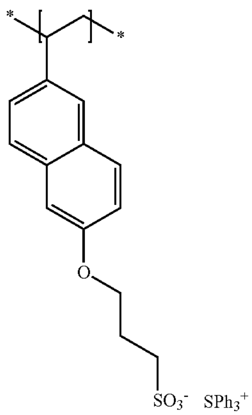
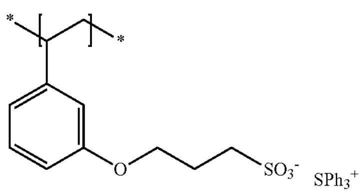
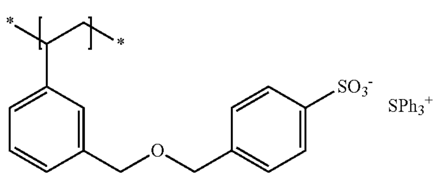
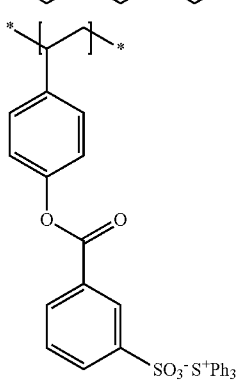
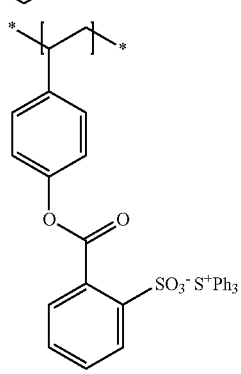
-continued
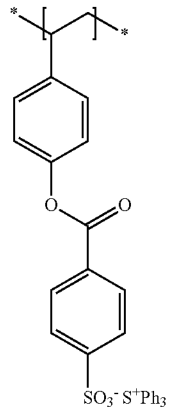
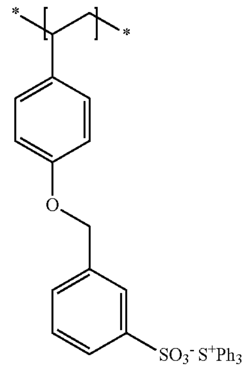
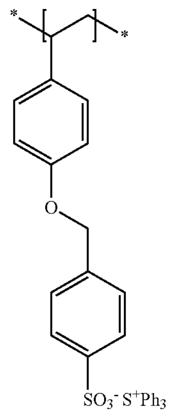
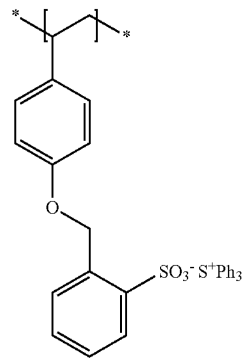
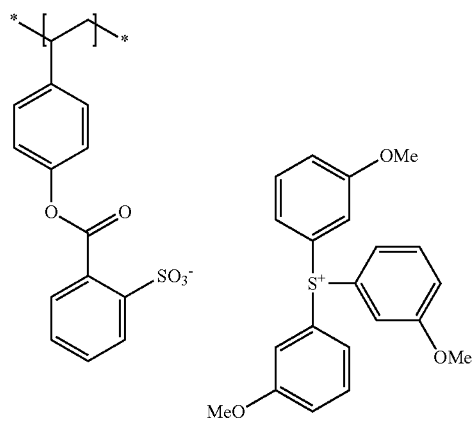
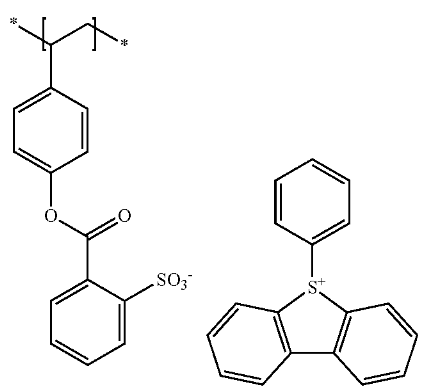

-continued
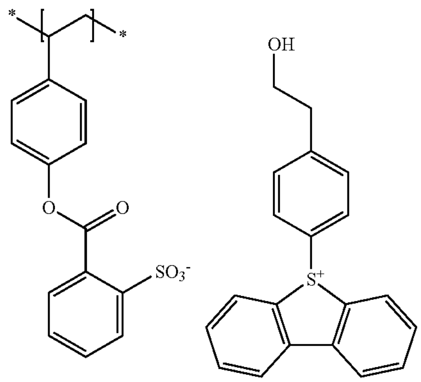
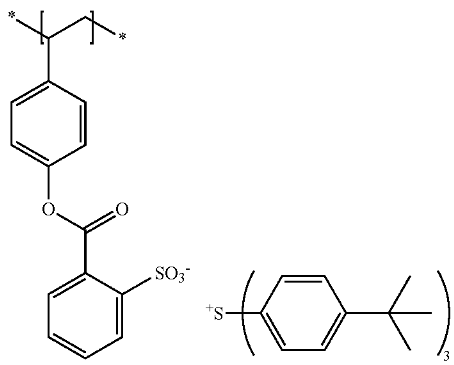
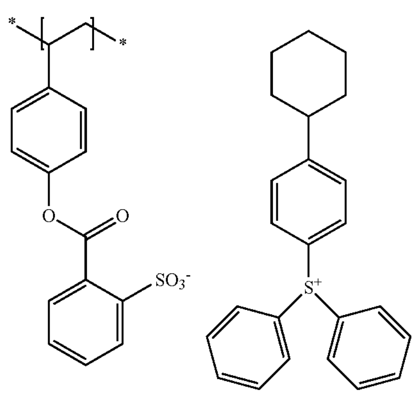
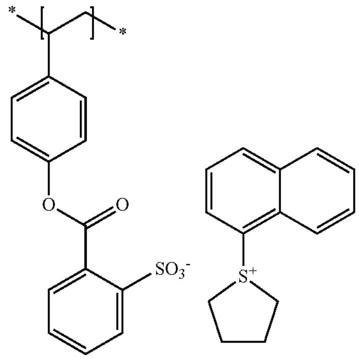
-continued
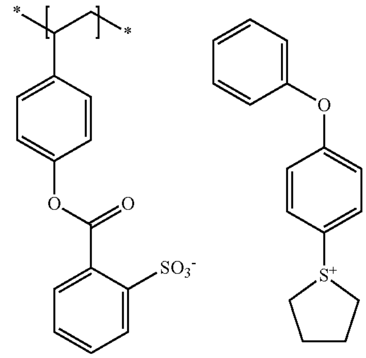
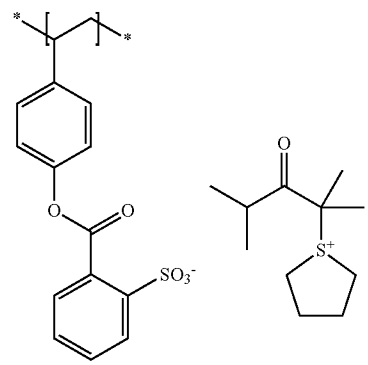
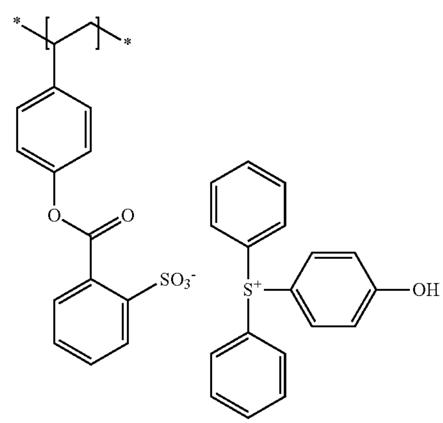
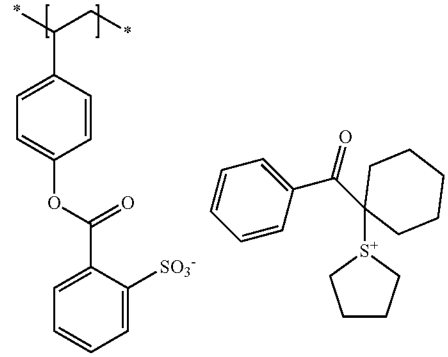

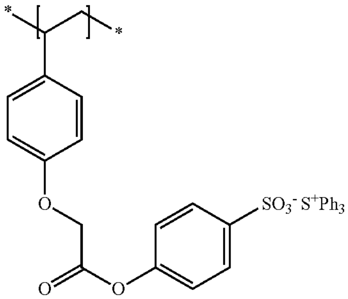
SO3- S+Ph3
O
O
O
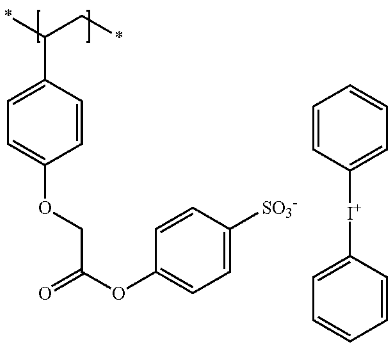
SO3-
I+
O
O
O
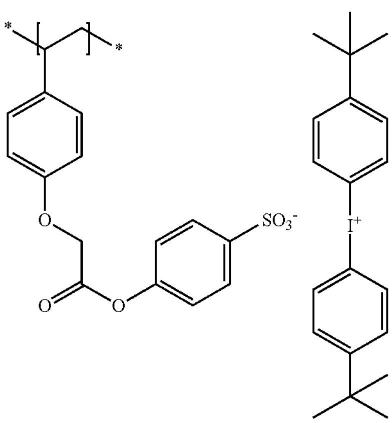
SO3-
I+
O
O
O
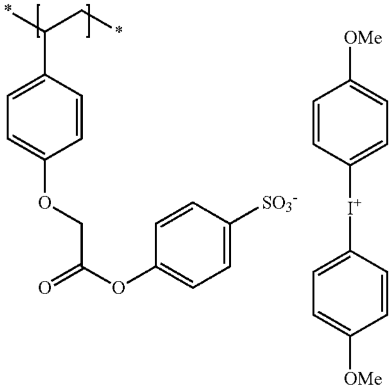
OMe
SO3-
I+
OMe
O
O
O
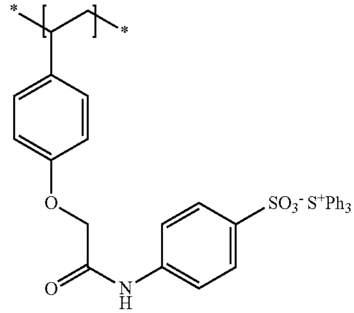
SO3- S+Ph3
O
O
N
H
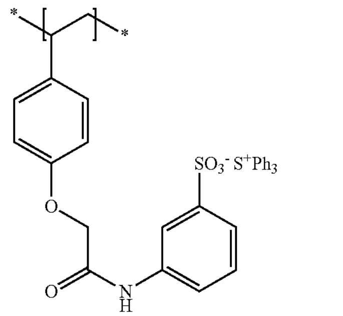
SO3- S+Ph3
O
O
N
H
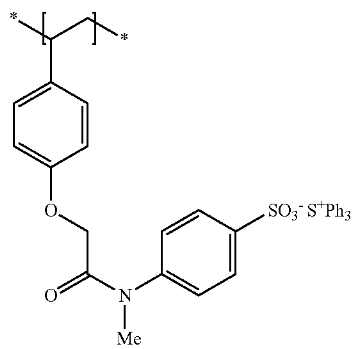
SO3- S+Ph3
O
O
N
Me
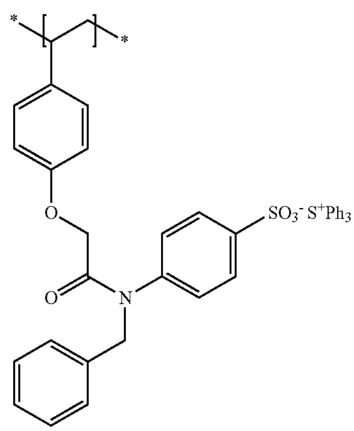
SO3- S+Ph3
O
O
N -continued
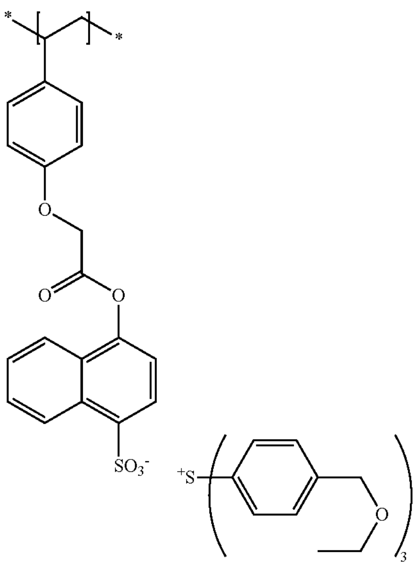
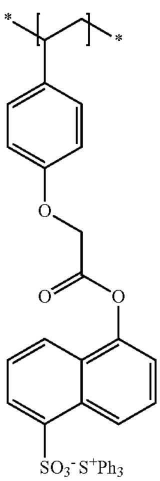
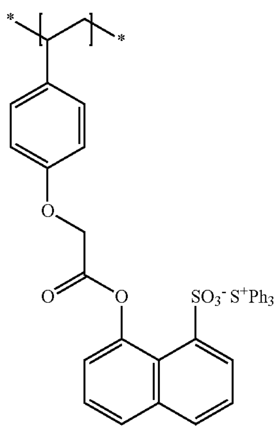
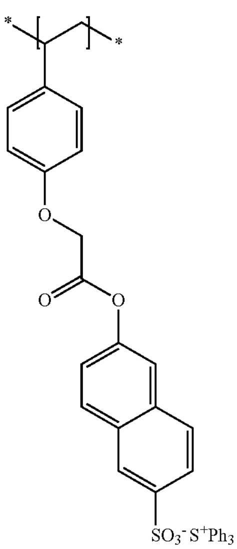
-continued
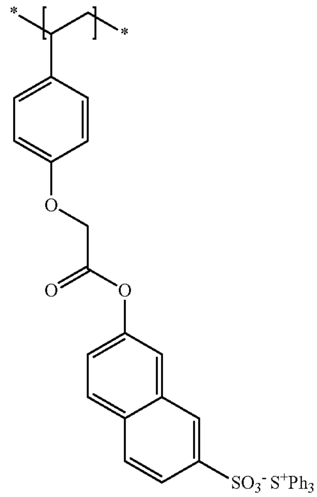
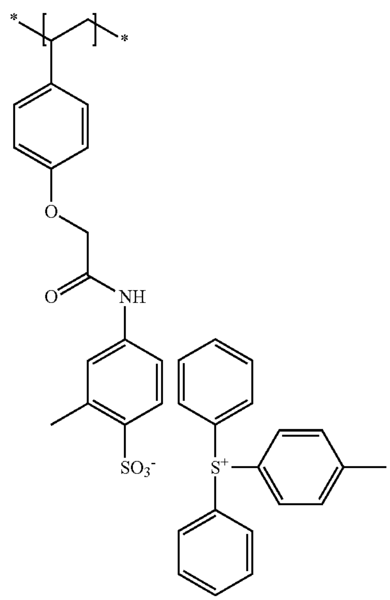
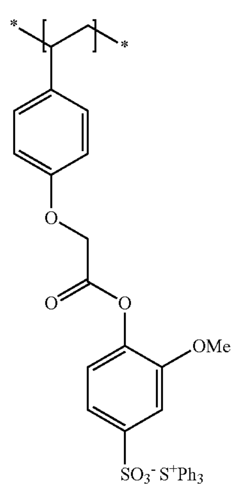
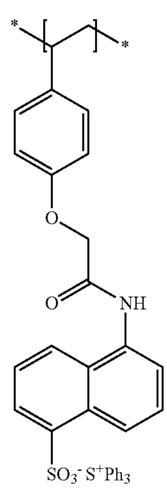

-continued
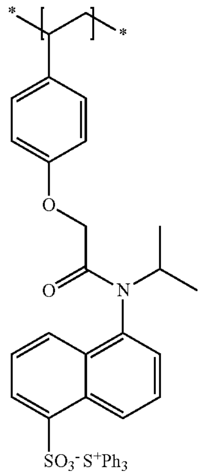
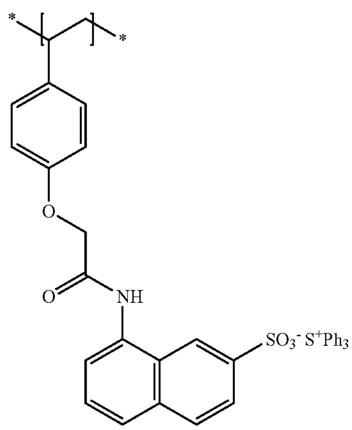
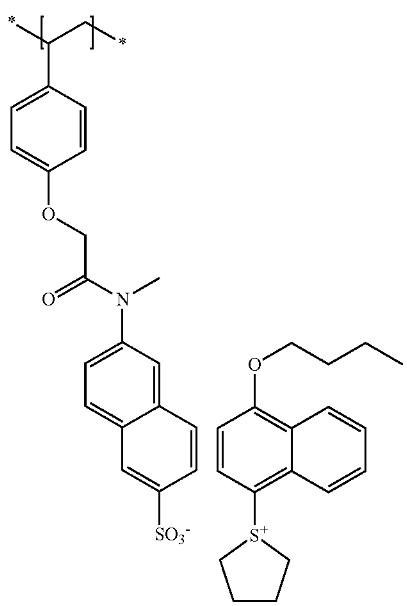
-continued
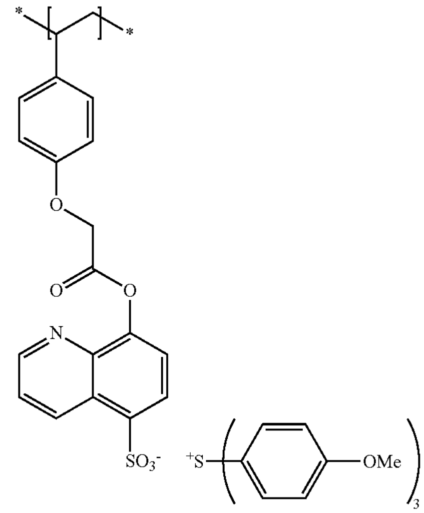
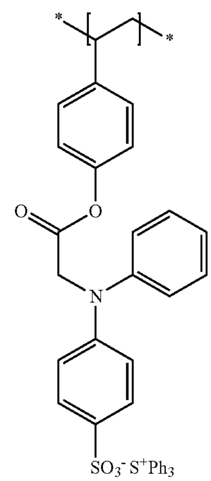
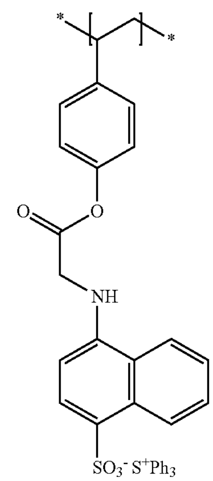
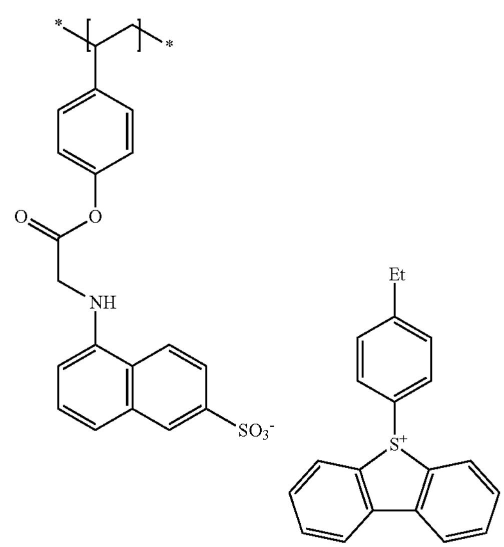

-continued
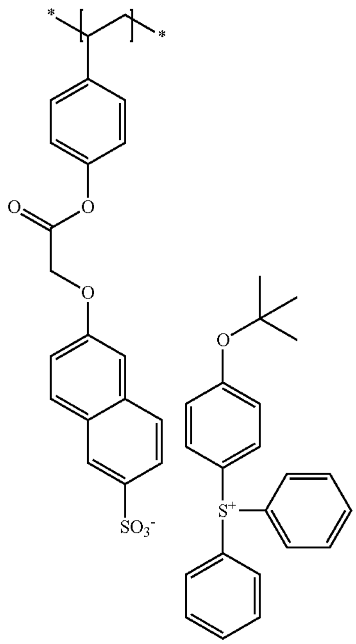
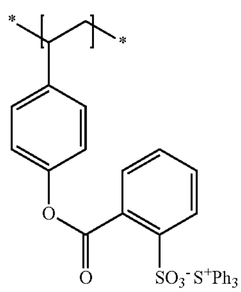
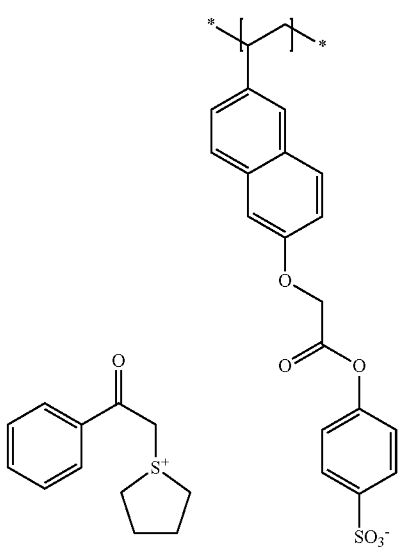
-continued
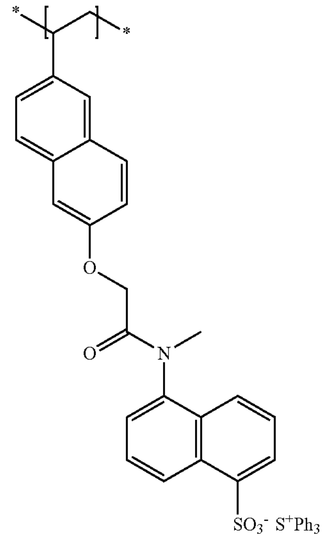
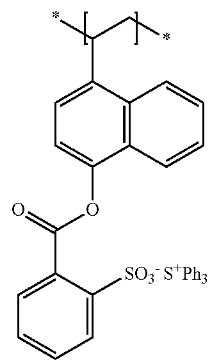
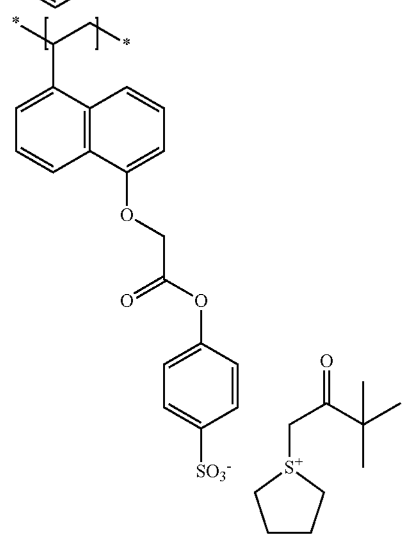
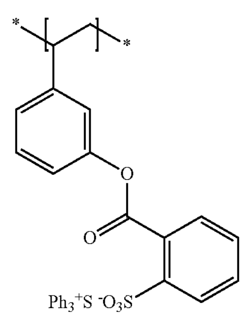
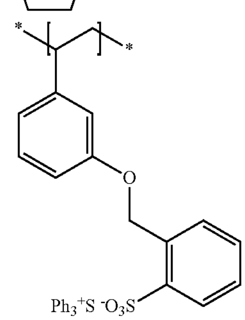

-continued
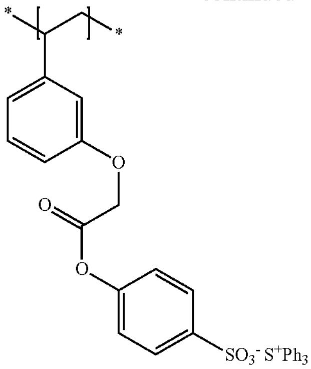
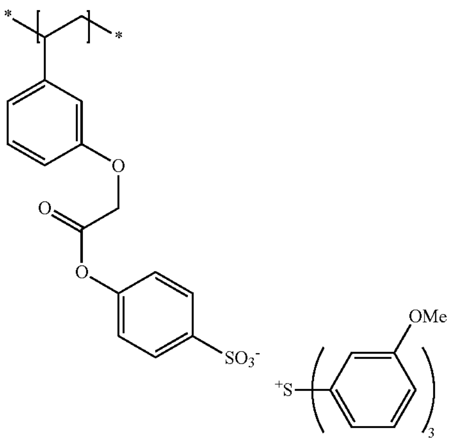
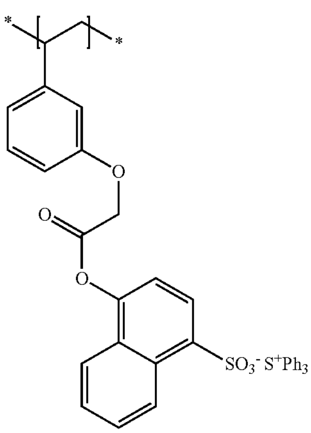
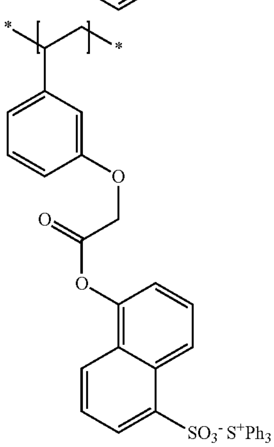
-continued
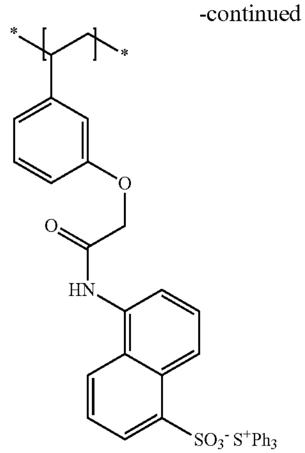
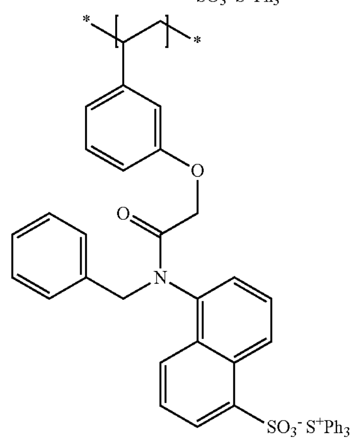
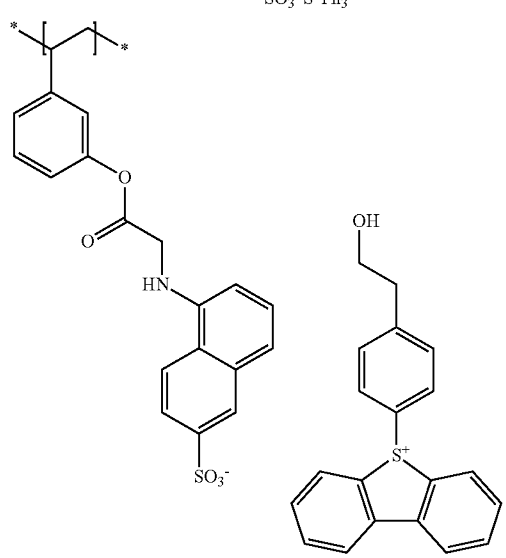
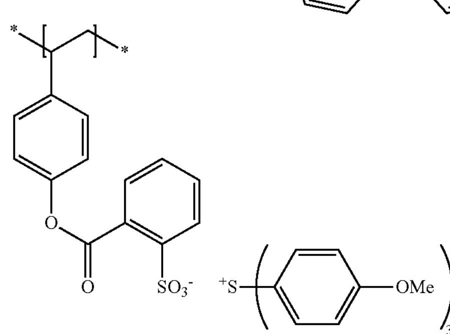

-continued
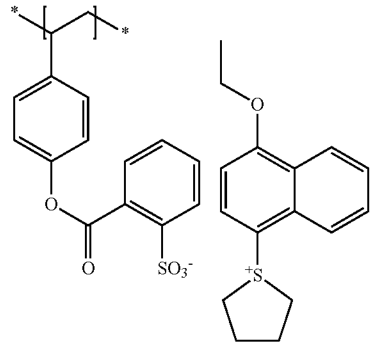
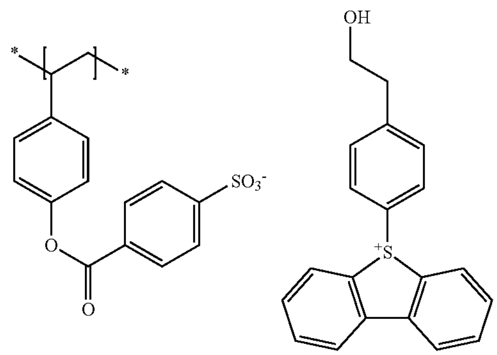
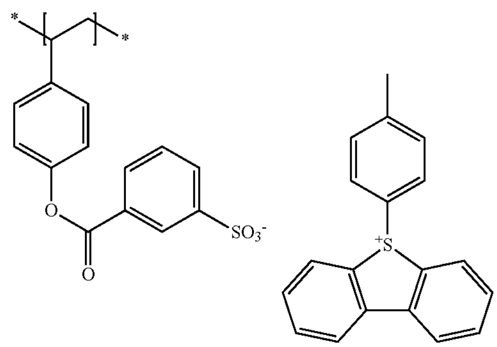
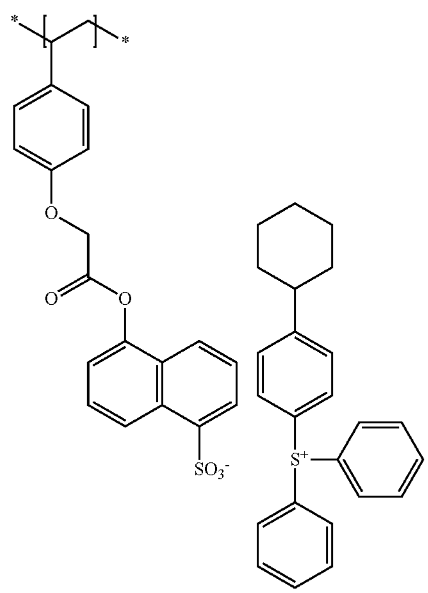
-continued
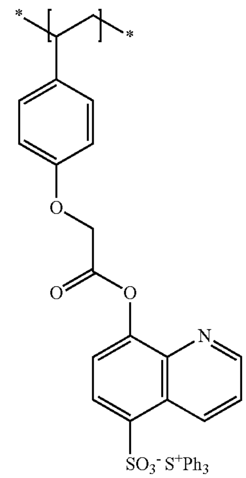
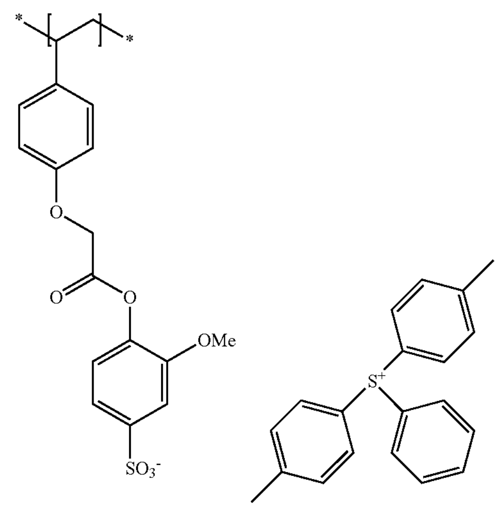
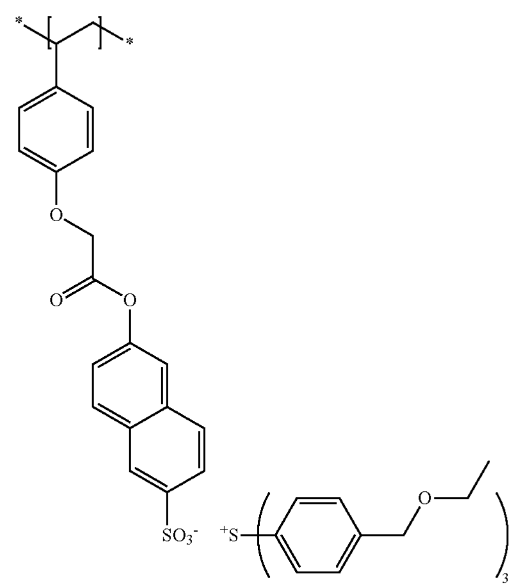

-continued
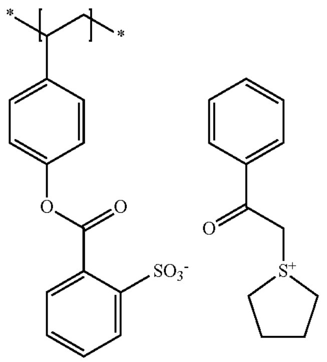
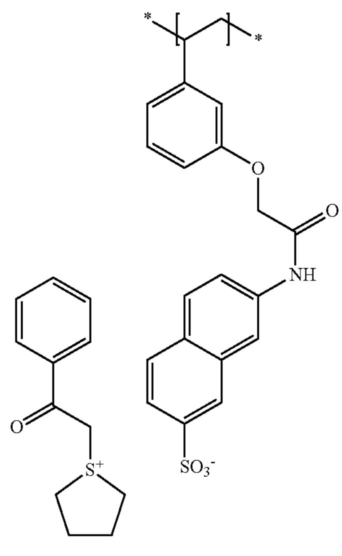
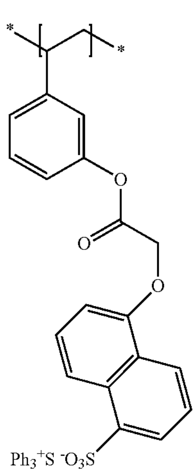
-continued
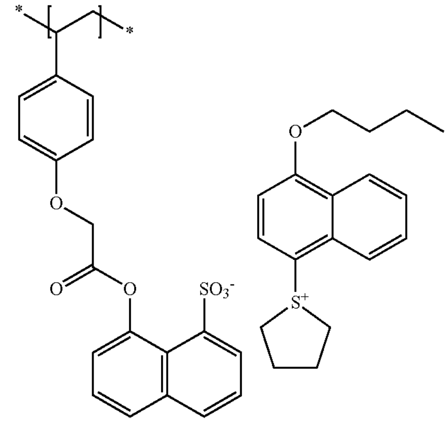
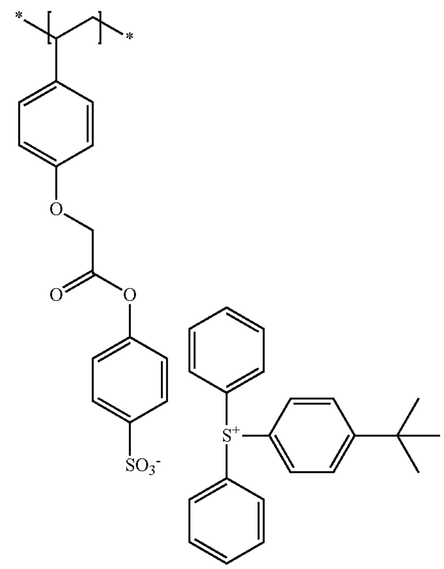
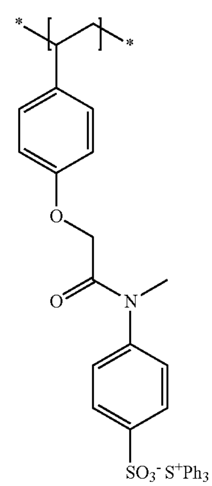

-continued
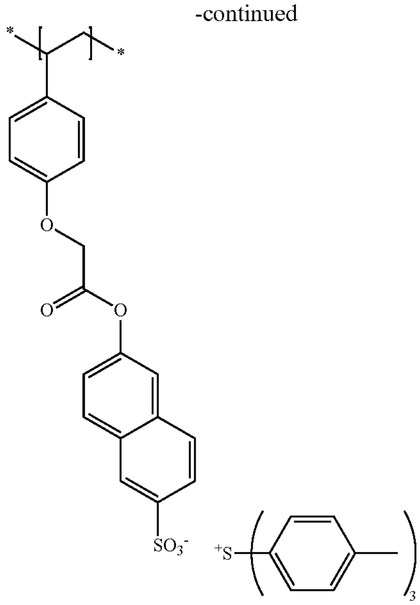
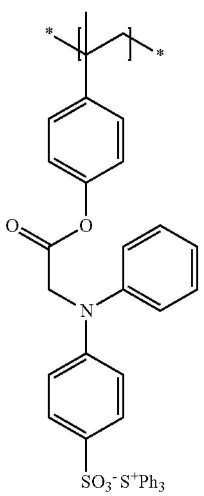
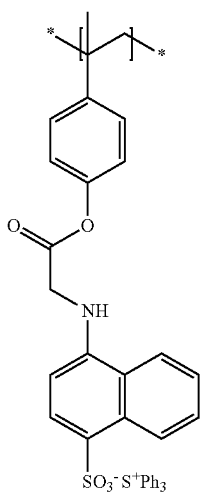
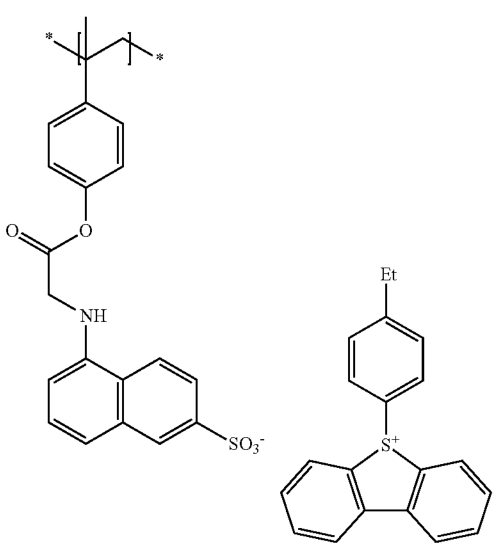
-continued
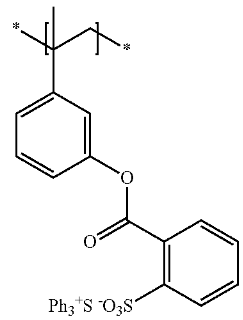
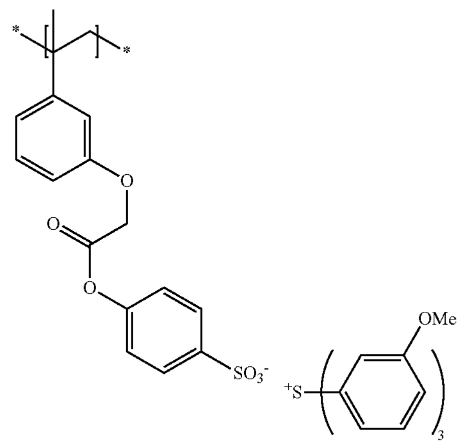
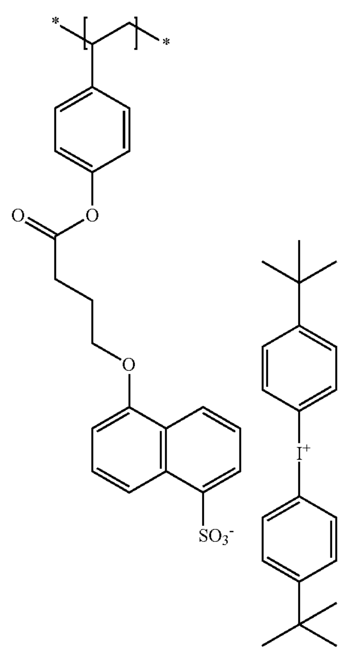

-continued
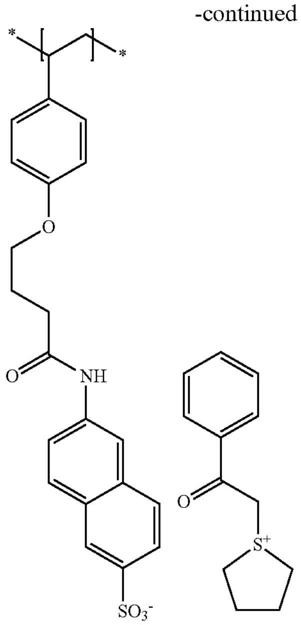
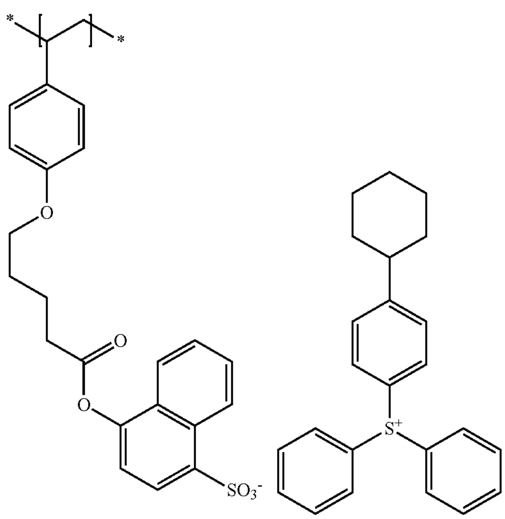
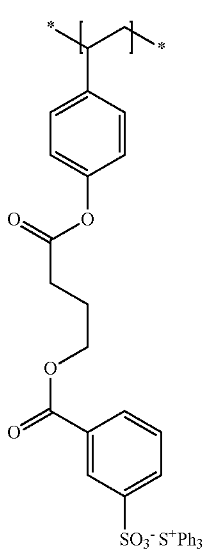
-continued
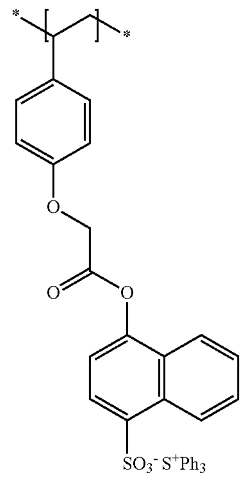
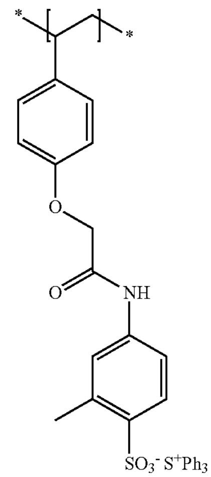
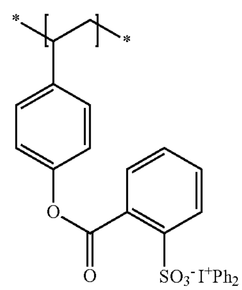
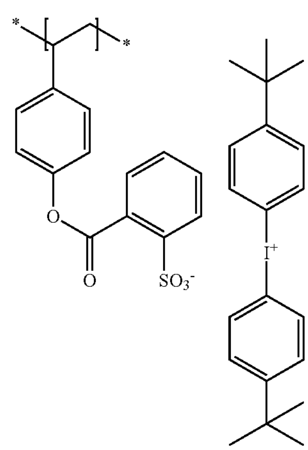
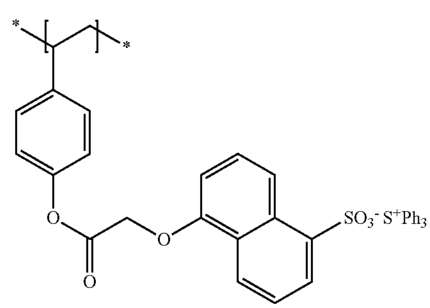

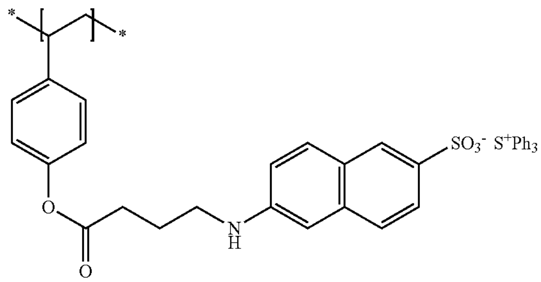
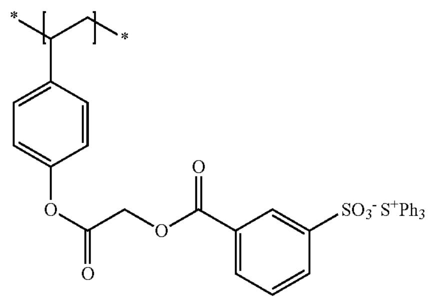
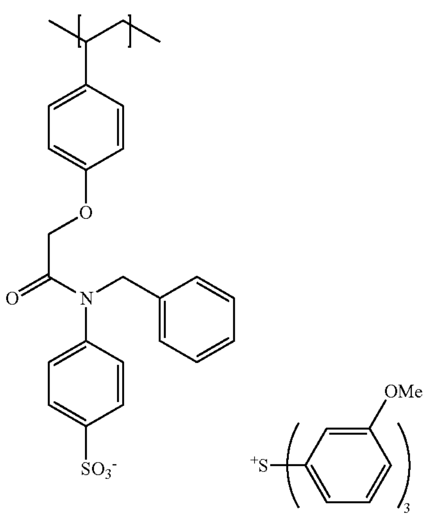
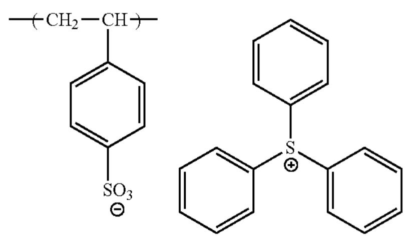
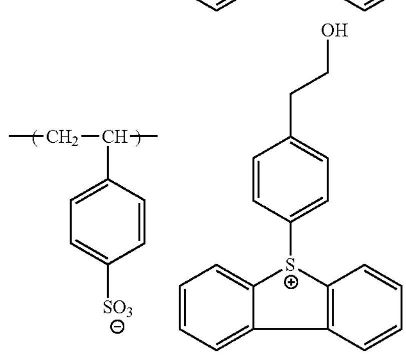
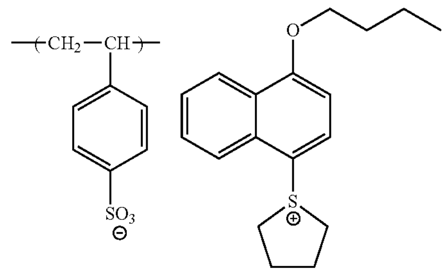
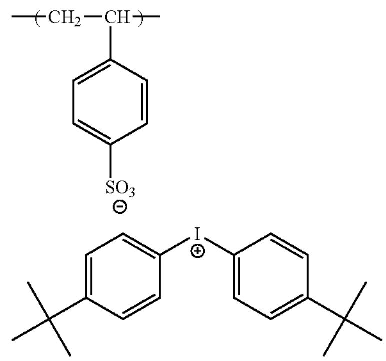
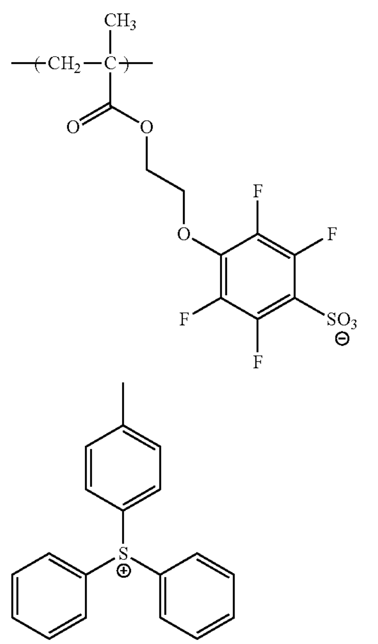
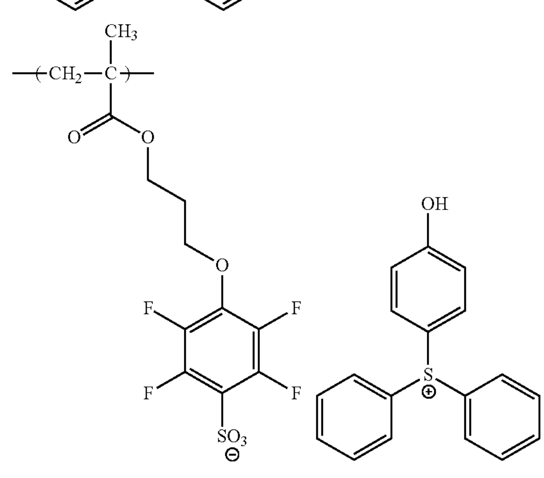

-continued
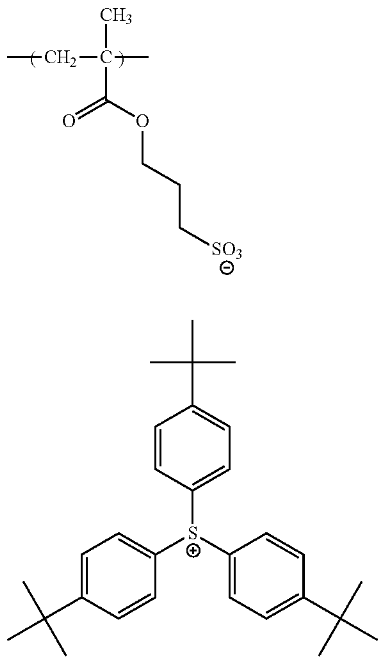
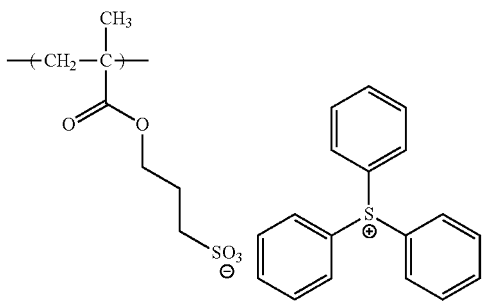
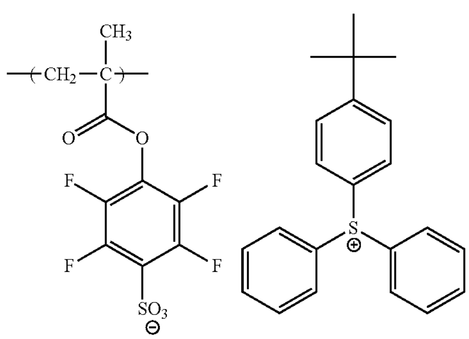
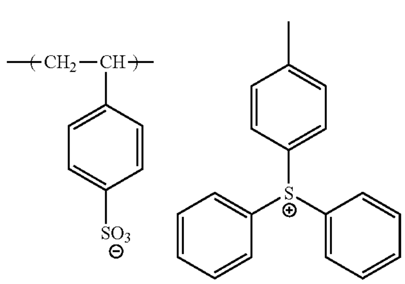
-continued
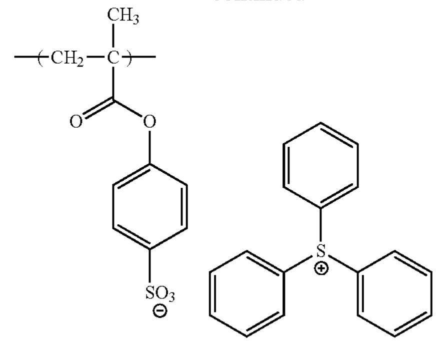
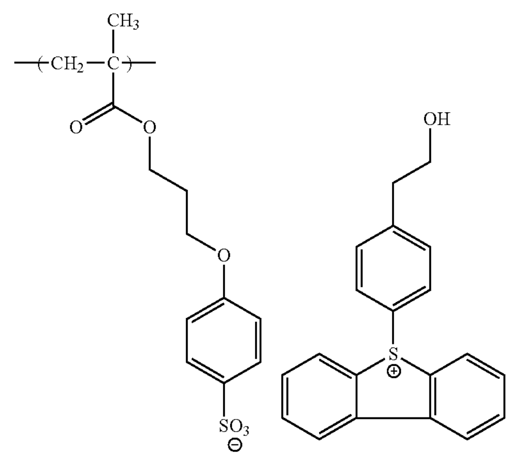
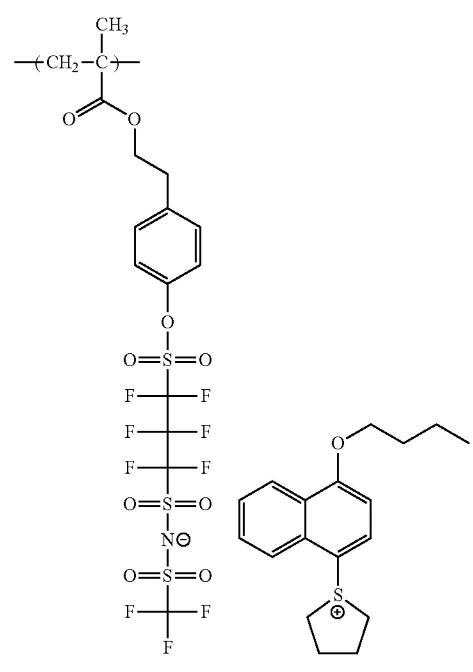

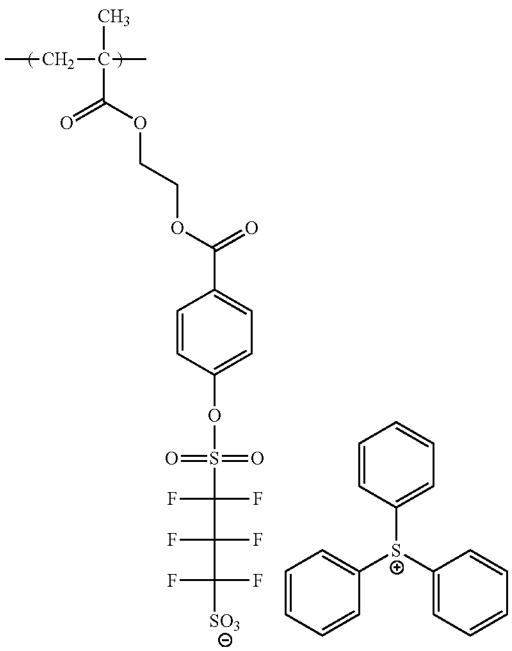
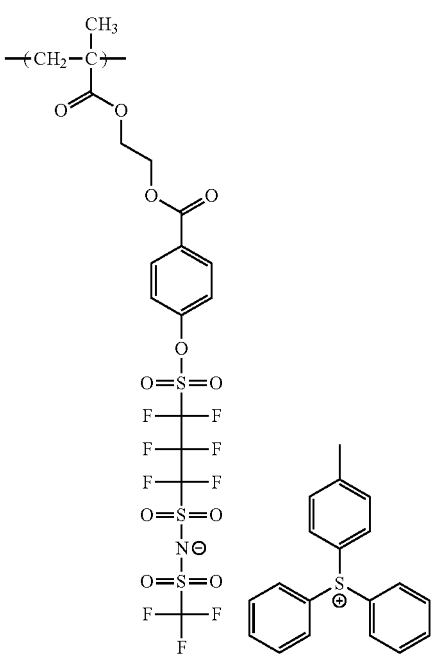
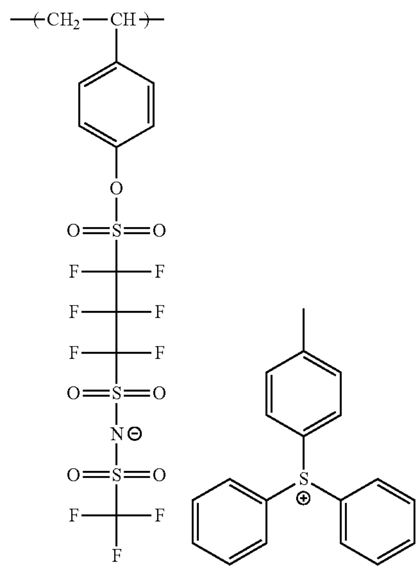
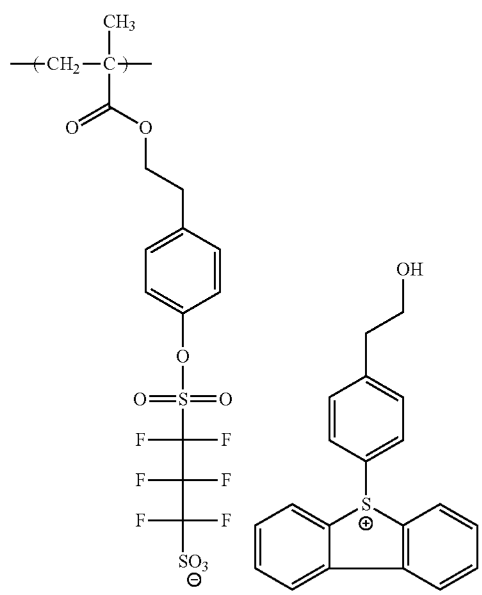
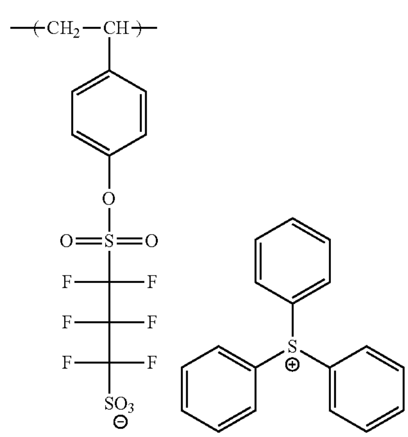

-continued
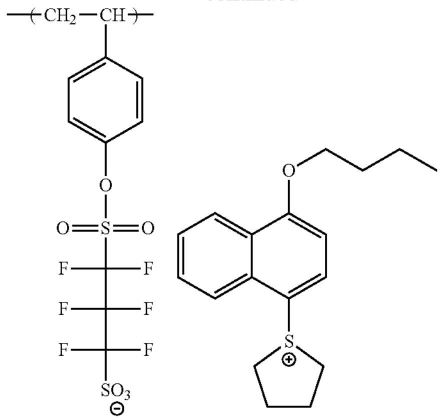
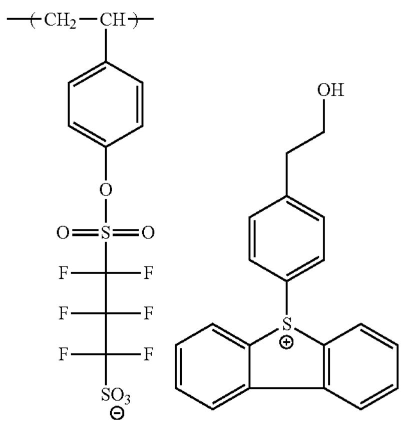
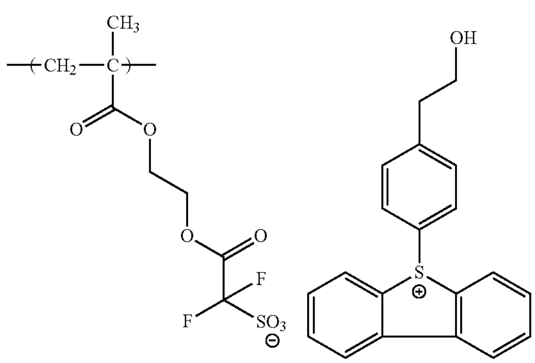
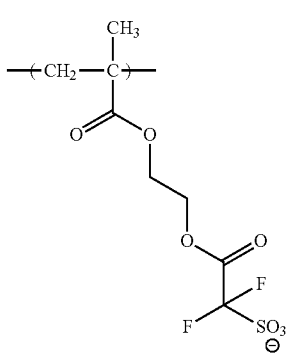
-continued
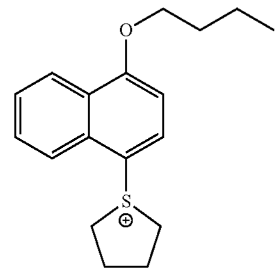
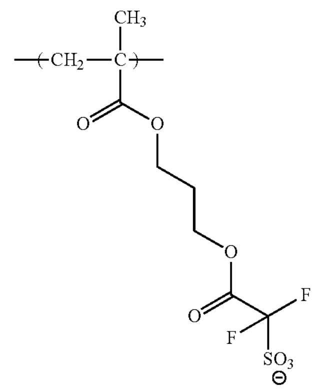
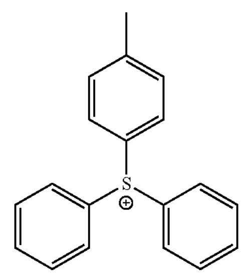
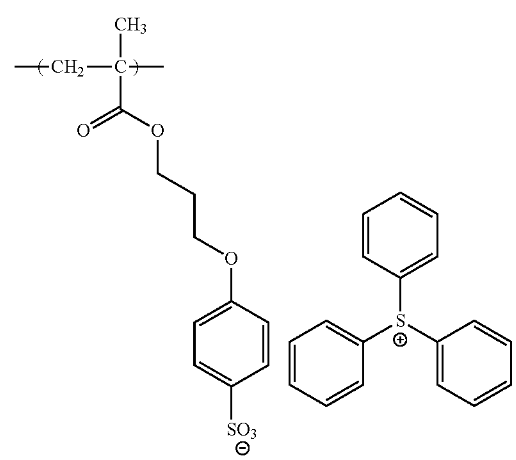
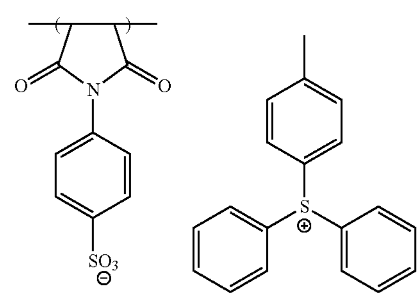

-continued
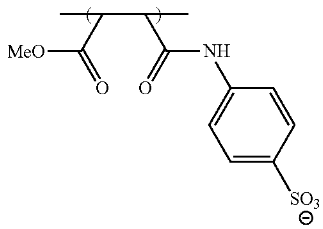
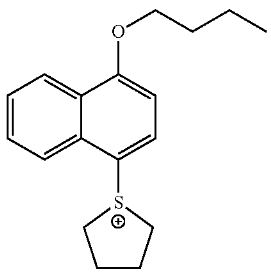
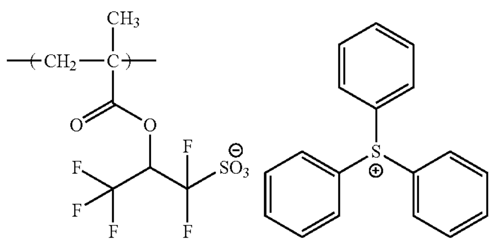
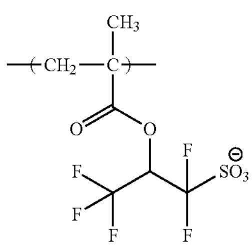
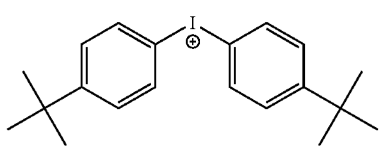
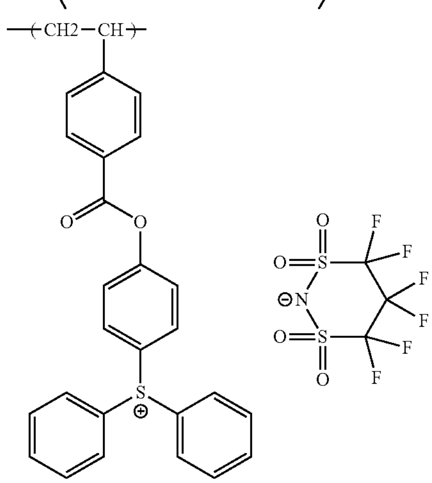
-continued
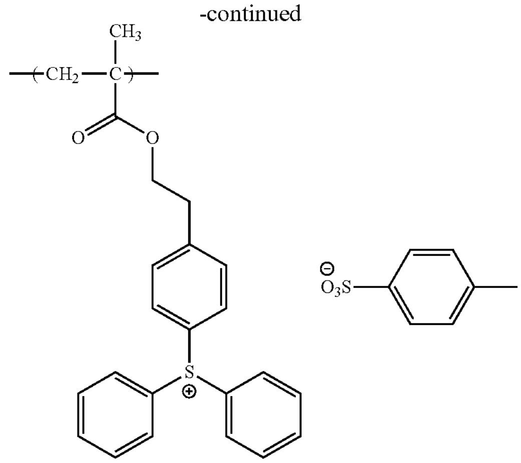
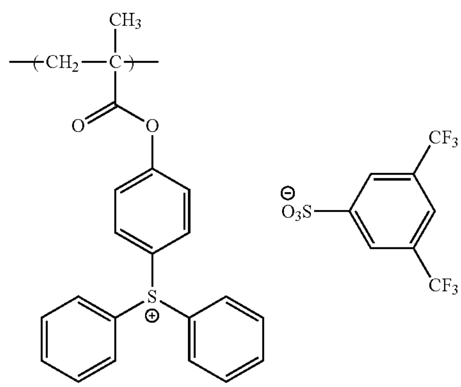
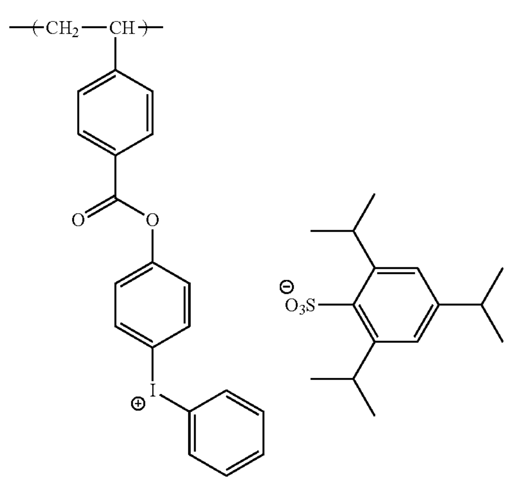

-continued
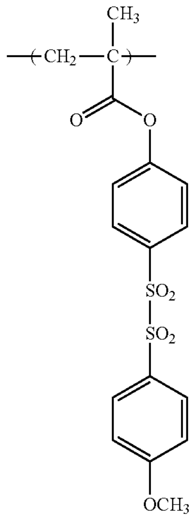
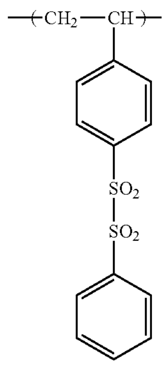
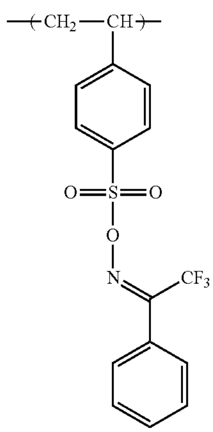
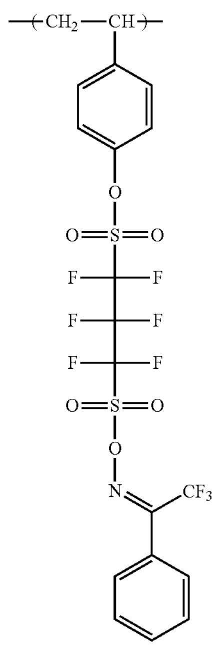
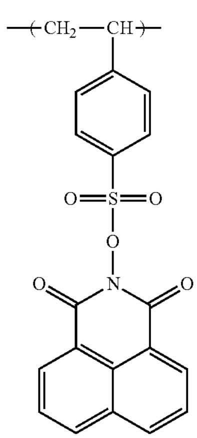
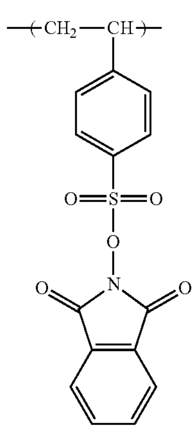
-continued
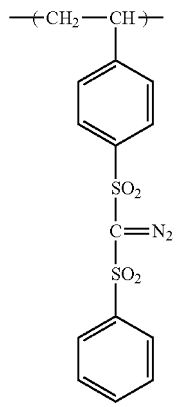
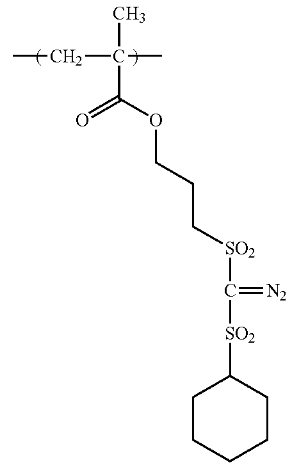
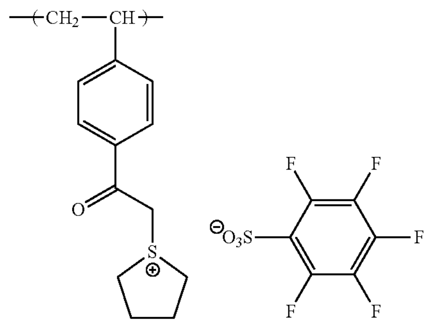
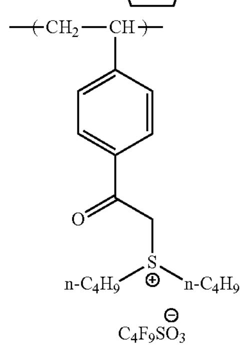
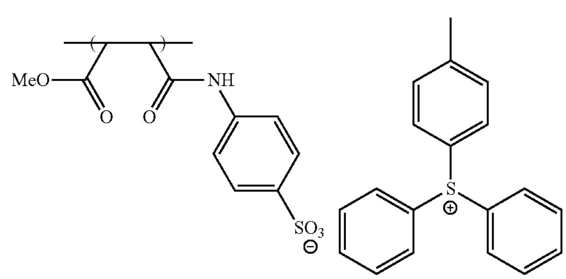
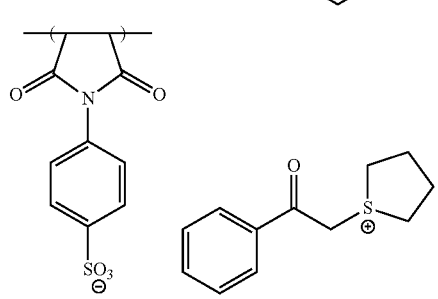

-continued
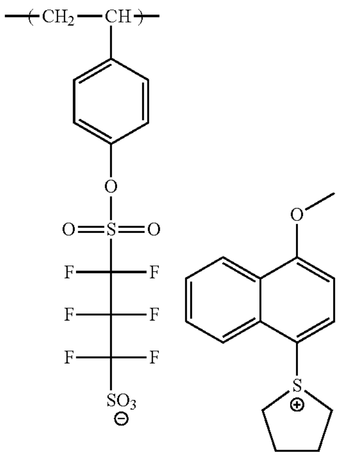
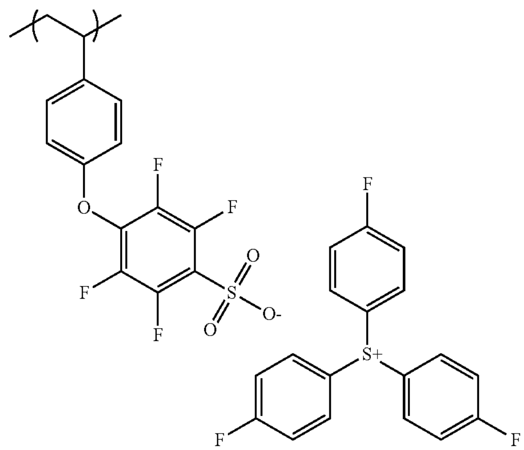
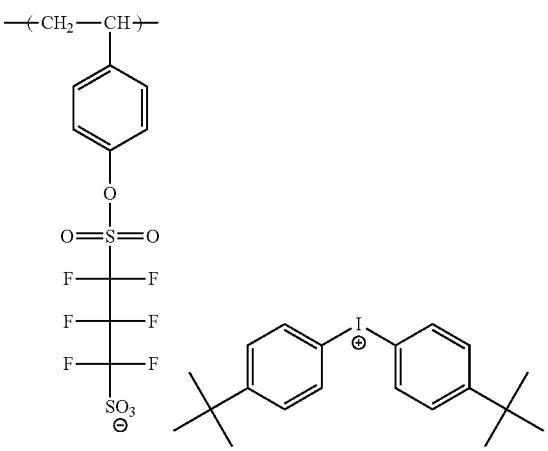
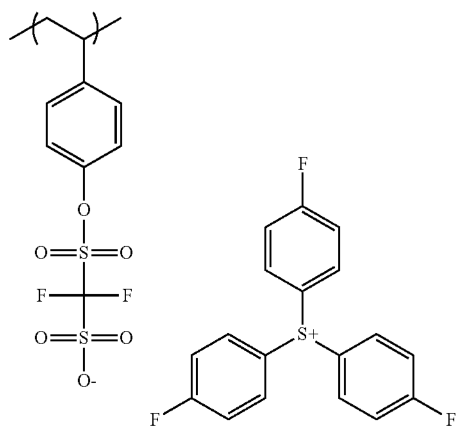
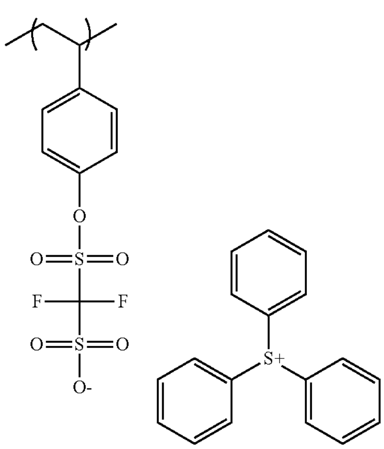
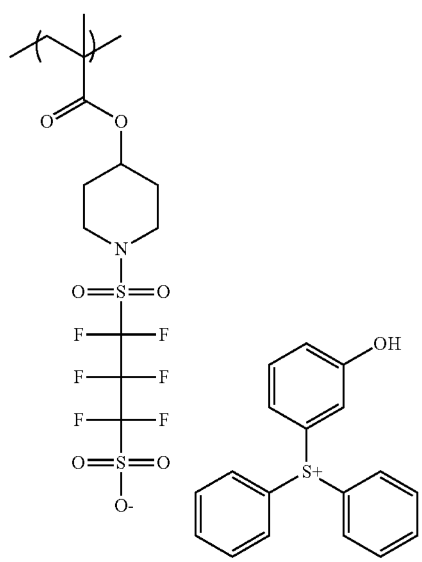

-continued
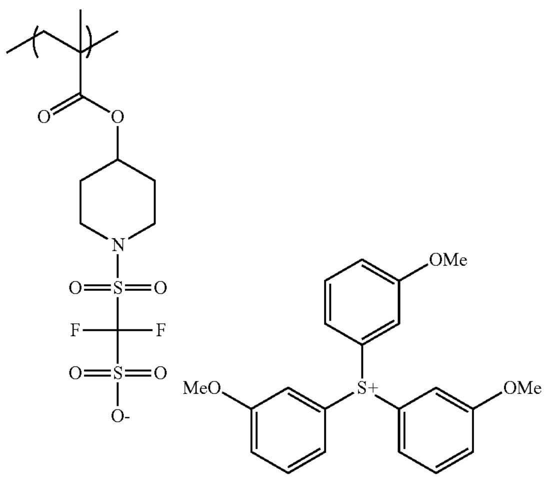
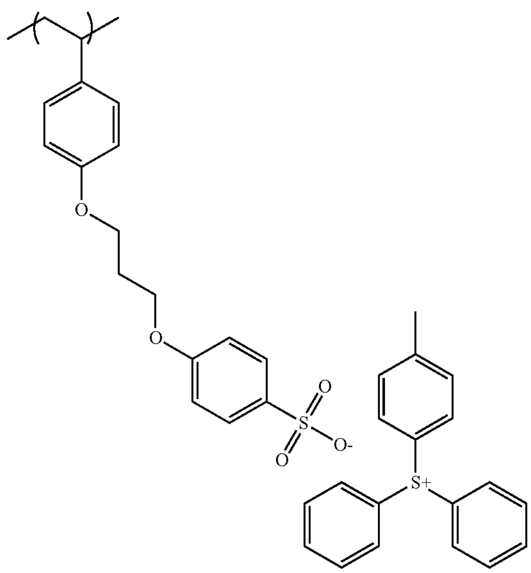
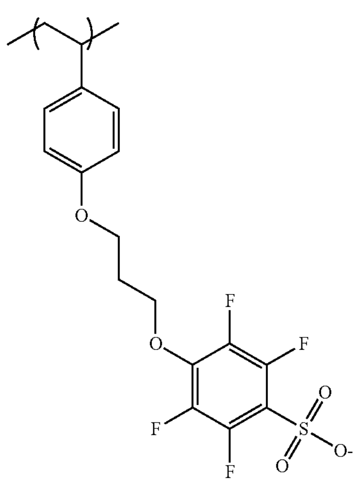
-continued
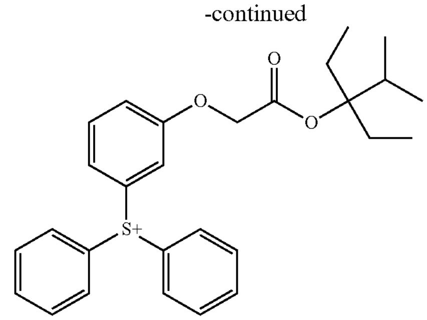
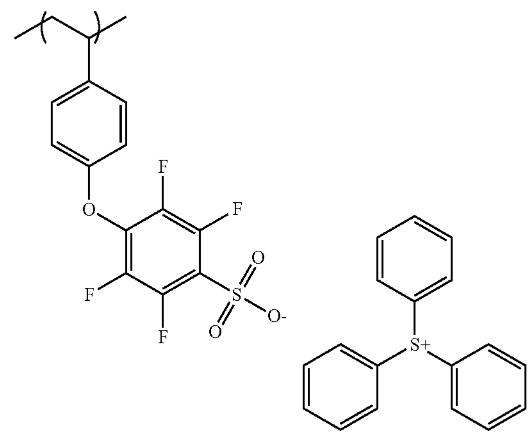
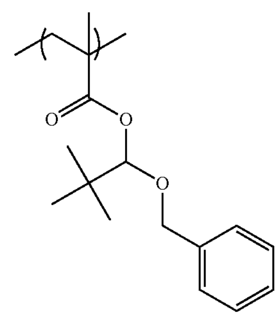
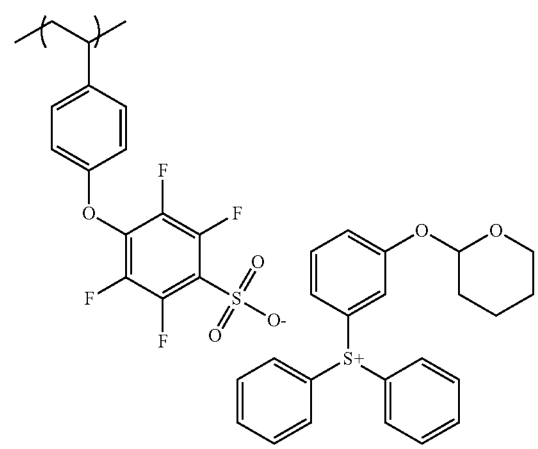

-continued

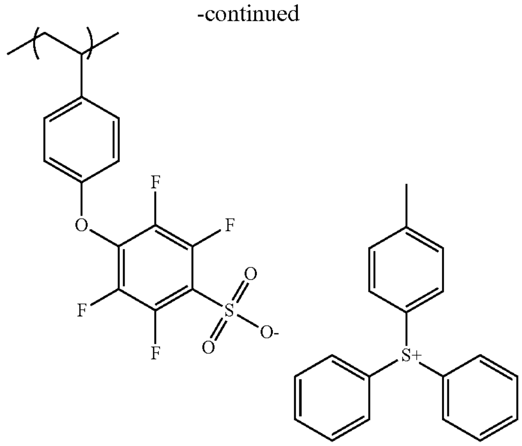

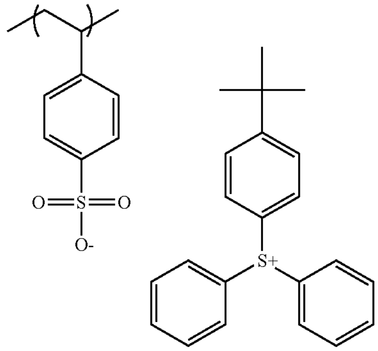

The content of the repeating unit represented by formula (4) in the resin (Ab) is preferably from 1 to 40 mol %, more preferably from 2 to 30 mol %, still more preferably from to 25 mol %, based on all repeating units in the resin (Ab).

The resin (Ab) for use in the present invention contains a repeating unit represented by the following formula (A):

(A)

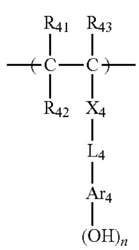

In formula (A), each of $R_{41}$, $R_{42}$ and $R_{43}$ independently represents a hydrogen atom, an alkyl group, a halogen atom, a cyano group or an alkoxycarbonyl group (provided that $R_{42}$ may combine with $Ar_4$ or $X_4$ to form a ring and in this case, $R_{42}$ represents a single bond or an alkylene group).

$X_4$ represents a single bond, —COO— or —CONR$_{64}$— (wherein $R_{64}$ represents a hydrogen atom or an alkyl group).

$L_4$ represents a single bond, —COO— or an alkylene group.

$Ar_4$ represents an (n+1)-valent aromatic ring group, and in the case of combining with $R_{42}$ to form a ring, $Ar_4$ represents an (n+2)-valent aromatic ring group.

n represents an integer of 1 to 4.

The alkyl group of $R_{41}$, $R_{42}$ and $R_{43}$ is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent, more preferably an alkyl group having a carbon number of 8 or less, still more preferably an alkyl group having a carbon number of 3 or less.

Specific examples and preferred examples of the alkyl group contained in the alkoxycarbonyl group of $R_{41}$, $R_{42}$ and $R_{43}$ are the same as those recited above for the alkyl group of $R_{41}$, $R_{42}$ and $R_{43}$.

The halogen atom of $R_{41}$, $R_{42}$ and $R_{43}$ includes fluorine atom, chlorine atom, bromine atom and iodine atom, with fluorine atom being preferred.

$Ar_4$ represents an (n+1)-valent aromatic ring group. The divalent aromatic ring group when n is 1 may have a substituent, and preferred examples of the divalent aromatic ring group include an arylene group having a carbon number of 6 to 18, such as phenylene group, tolylene group, naphthylene group and anthracenylene group, and an aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

The alkylene group of $L_4$ is preferably an alkylene group having a carbon number of 1 to 8, such as methylene group, ethylene group, propylene group, butylene group, hexylene group and octylene group, which may have a substituent.

Examples of the alkylene group represented by $X_4$ are the same as those of the alkylene group as the divalent linking group represented by L in formula (Ab), and the preferred range thereof is also the same.

In the case where $R_{42}$ combines with $Ar_4$ or $X_4$ to form a ring, the alkylene group of $R_{42}$ may be linear or branched and is preferably an alkylene group having a carbon atom of 1 to 5.

In the case where $R_{42}$ combines with $X_4$ to form a ring, the alkylene group of $X_4$ may be linear or branched and is preferably an alkylene group having a carbon atom of 1 to 5.

Examples of the alkyl group of $R_{64}$ in —CONR$_{64}$— ($R_{64}$ represents a hydrogen atom or an alkyl group) represented by $X_4$ are the same as those of the alkyl group of $R_{41}$ to $R_{43}$.

$X_4$ is preferably a single bond, an alkylene group, —COO— or —CONH—, more preferably a single bond or —COO—.

$Ar_4$ is preferably an aromatic ring group having a carbon number of 6 to 18, which may have a substituent, more preferably a benzene ring group, a naphthalene ring group or a biphenylene ring group.

The repeating unit (b) preferably has a hydroxystyrene structure, that is, $Ar_4$ is preferably a benzene ring group.

Preferred examples of the substituent on each of the groups above include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The repeating unit represented by formula (A) is preferably a repeating unit represented by the following formula (A1) or (A2). R" represents a hydrogen atom or a methyl group.

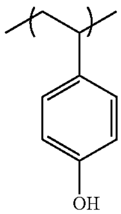
(A1)
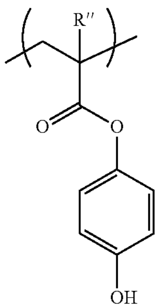
(A2)
Specific examples of the repeating unit (b) represented by formula (A) are illustrated below, but the present invention is not limited thereto. In the formulae, a represents an integer of 1 or 2.
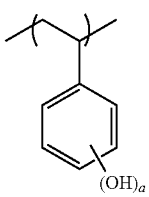
(B-1)
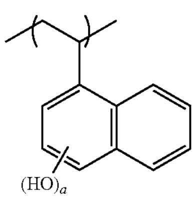
(B-2)
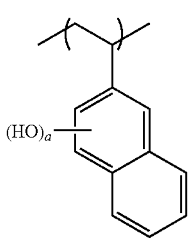
(B-3)
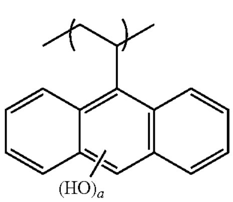
(B-4)
-continued
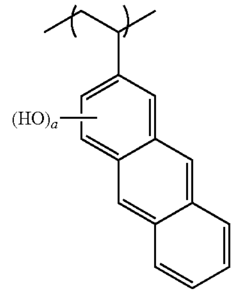
(B-5)
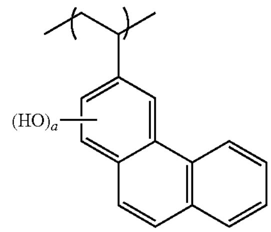
(B-6)
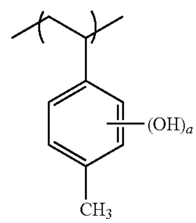
(B-7)
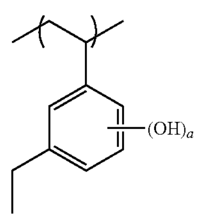
(B-8)
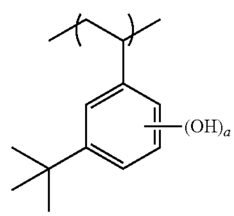
(B-9)
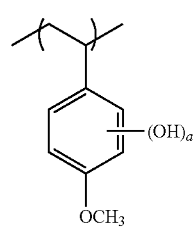
(B-10)
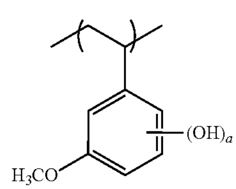
(B-11)

-continued
(B-12)
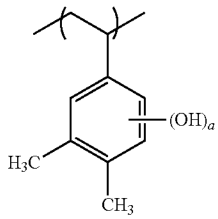
(B-13)
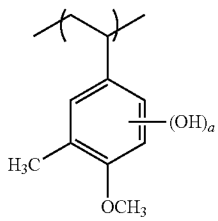
(B-14)
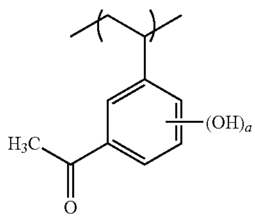
(B-15)
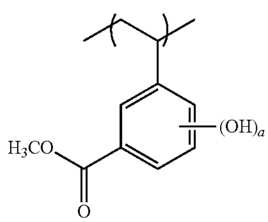
(B-16)
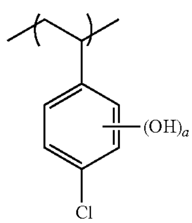
(B-17)
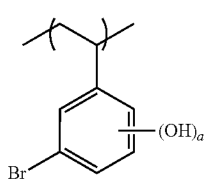
(B-18)
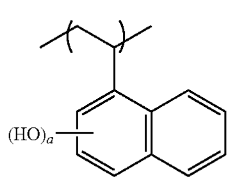
-continued
(B-19)
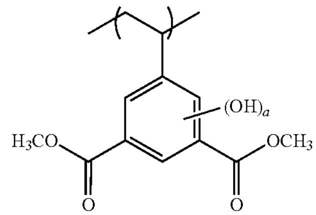
(B-20)
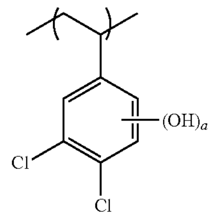
(B-21)
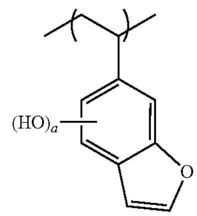
(B-22)
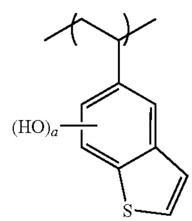
(B-23)
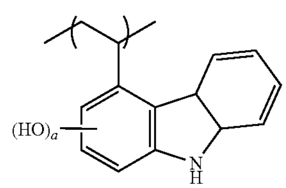
(B-24)
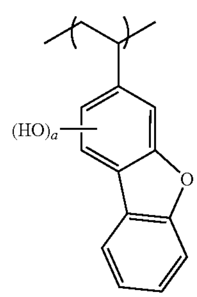
(B-25)
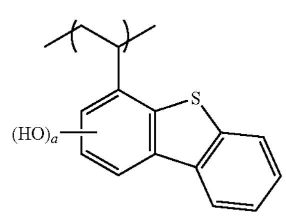

-continued (B-26)

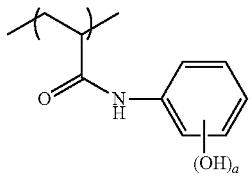

(B-27)

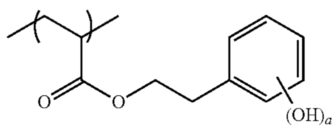

(B-28)

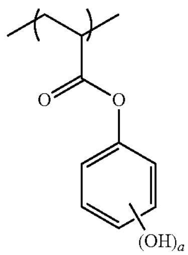

(B-29)

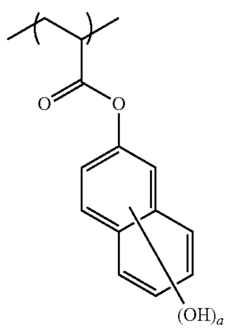

(B-30)

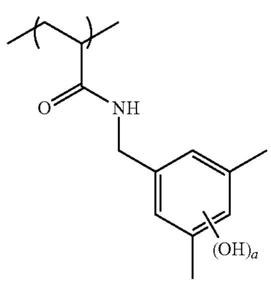

The resin (Ab) may contain two or more kinds of repeating units represented by formula (A).

The content of the repeating unit represented by formula (A) (in the case of containing a plurality of kinds of repeating units, the total thereof) in the resin (Ab) is, from the standpoint of enhancing the dissolution contrast of the resist film for an organic solvent-containing developer, preferably from 10 to 70 mol %, more preferably from 15 to 55 mol %, and most preferably from 20 to 40 mol %, based on all repeating units in the resin (Ab).

The resin (Ab) preferably contains (b') a repeating unit having a polar group, which is different from the repeating unit represented by formula (A). By containing the repeating unit (b'), for example, the sensitivity of the composition containing the resin can be enhanced. The repeating unit (b') is preferably a non-acid-decomposable repeating unit (that is, has no acid-decomposable group).

The "polar group" which can be contained in the repeating unit (b') includes, for example, the following (1) to (4). In the following, the "electronegativity" means a Pauling's value.

(1) A Functional Group Containing a Structure where an Oxygen Atom and an Atom with the Electronegativity Difference from Oxygen Atom being 1.1 or More are Bonded Through a Single Bond Examples of this polar group include a group containing a structure represented by O—H, such as hydroxy group.

(2) A Functional Group Containing a Structure where a Nitrogen Atom and an Atom with the Electronegativity Difference from Nitrogen Atom being 0.6 or More are Bonded Through a Single Bond Examples of this polar group include a group containing a structure represented by N—H, such as amino group.

(3) A Functional Group Containing a Structure where Two Atoms Differing in the Electronegativity by 0.5 or More are Bonded Through a Double Bond or a Triple Bond Examples of this polar group include a group containing a structure represented by C≡N, C═O, N═O, S═O or C═N.

(4) A Functional Group Having an Ionic Moiety

Examples of this polar group include a group having a moiety represented by $N^+$ or $S^+$.

Specific examples of the partial structure which can be contained in the "polar group" are illustrated below.

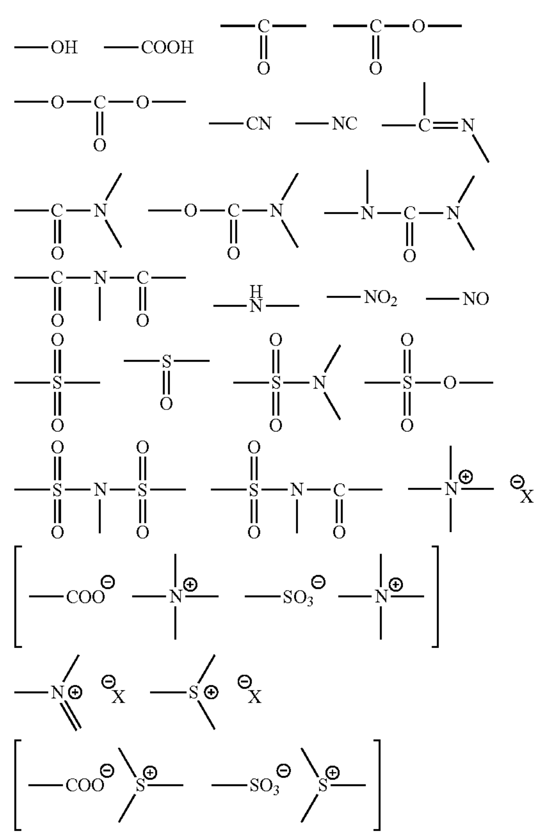

The polar group which may be contained in the repeating unit (b') is preferably selected from a hydroxyl group, a cyano group, a lactone group, a sultone group, a carboxylic acid group, a sulfonic acid group, an amide group, a sulfonamide group, an ammonium group, a sulfonium group, a carbonate group (—O—CO—O—) (for example, a cyclic carbonic acid ester structure), and a group formed by combining two or more thereof, more preferably an alcoholic hydroxy group, a cyano group, a lactone group, a sultone group or a cyanolactone structure-containing group.

When a repeating unit having an alcoholic hydroxy group is further incorporated into the resin, the exposure latitude (EL) of a composition containing the resin can be more enhanced.

When a repeating unit having a cyano group is further incorporated into the resin, the sensitivity of a composition containing the resin can be more enhanced.

When a repeating unit having a lactone group is further incorporated into the resin, the dissolution contrast for an organic solvent-containing developer can be more enhanced. Also, a composition containing the resin can be more improved in the dry etching resistance, coatability and adherence to substrate.

When a repeating unit having a group containing a cyano group-containing lactone structure is further incorporated into the resin, the dissolution contrast for an organic solvent-containing developer can be more enhanced. Also, a composition containing the resin can be more improved in the sensitivity, dry etching resistance, coatability and adherence to substrate. In addition, functions attributable to a cyano group and a lactone group, respectively, can be undertaken by a single repeating unit and the latitude in designing the resin can be more broadened.

In the case where the polar group contained in the repeating unit (b') is an alcoholic hydroxyl group, the repeating unit is preferably represented by at least one of the following formulae (I-1H) to (I-10H), more preferably represented by at least one of the following formulae (I-1H) to (I-3H), still more preferably represented by the following formula (I-1H).

(I-1H)

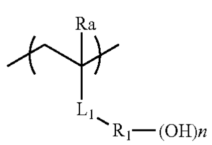

(I-2H)

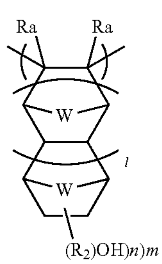

(I-3H)

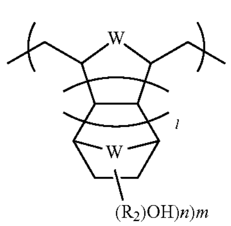

-continued (I-4H)

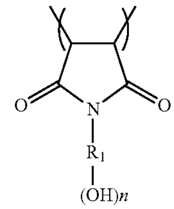

(I-5H)

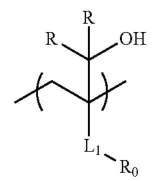

(I-6H)

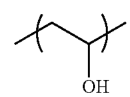

(I-7H)

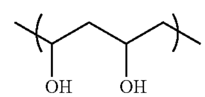

(I-8H)

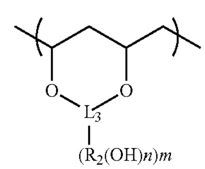

(I-9H)

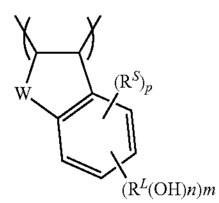

(I-10H)

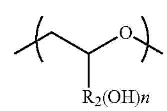

In the formulae, Ra, $R_1$, $R_2$, W, n, m, l, $L_1$, R, $R_0$, $L_3$, $R^L$, $R^S$ and p have the same meanings as in formulae (I-1) to (I-10).

When a repeating unit having a group capable of decomposing by the action of an acid to produce an alcoholic hydroxy group and a repeating unit represented by at least one formula selected from the group consisting of formulae (I-1H) to (I-10H) are used in combination, for example, thanks to suppression of acid diffusion by the alcoholic hydroxy group and increase in the sensitivity brought about by the group capable of decomposing by the action of an acid to produce an alcoholic hydroxy group, the exposure latitude (EL) can be improved without deteriorating other performances.

In the case of having an alcoholic hydroxyl group, the content of the repeating unit is preferably from 1 to 60 mol %, more preferably from 3 to 50 mol %, still more preferably from 5 to 40 mol %, based on all repeating units in the resin (Ab).

Specific examples of the repeating unit represented by any one of formulae (I-1H) to (I-10H) are illustrated below. In specific examples, Ra has the same meaning as in formulae (I-1H) to (I-10H).

-continued
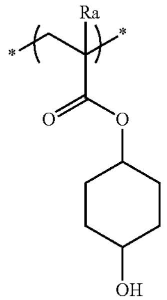
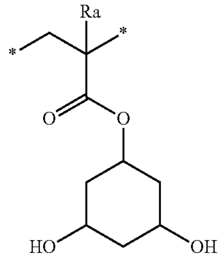
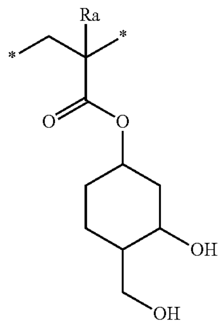
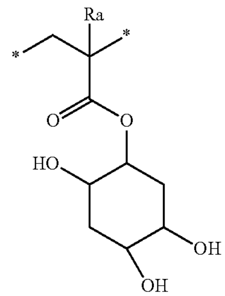
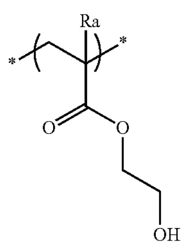
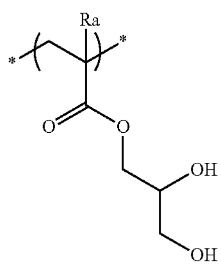
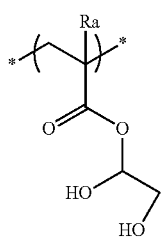
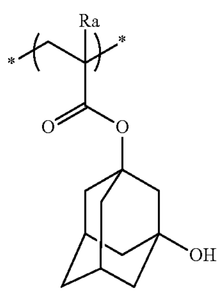
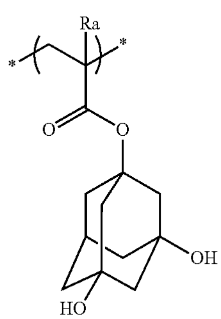
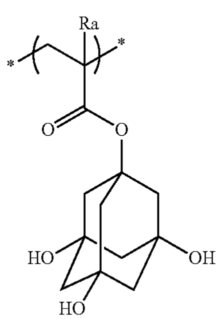
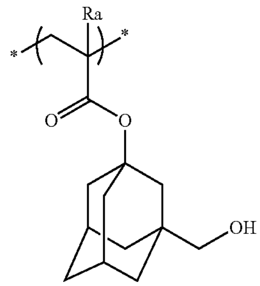
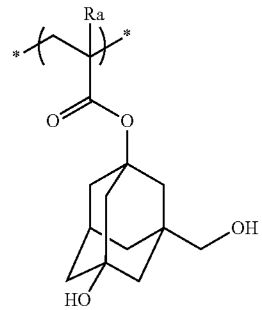
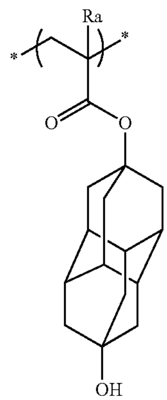
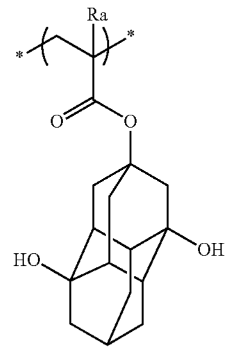
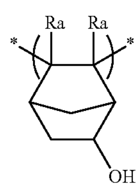
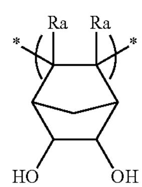
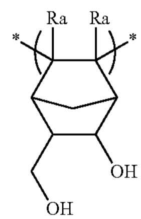
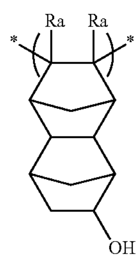
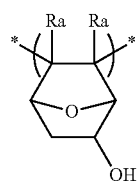
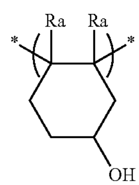
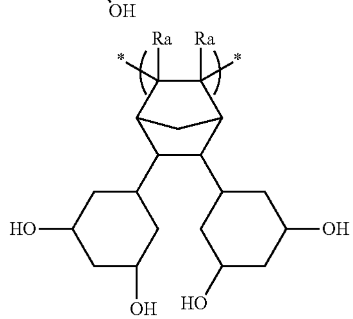
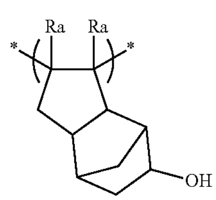
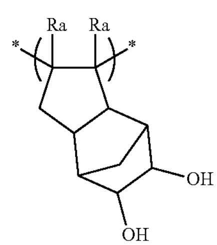

-continued

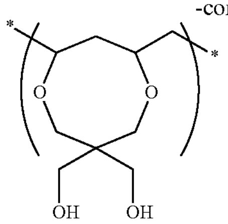

In the case where the polar group contained in the repeating unit (b') is an alcoholic hydroxy group or a cyano group, one preferred embodiment of the repeating unit is a repeating unit having an alicyclic hydrocarbon structure substituted with a hydroxyl group or a cyano group. At this time, it is preferred to have no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIIc). Thanks to this repeating unit, adherence to substrate and affinity for developer are enhanced.

(VIIa)

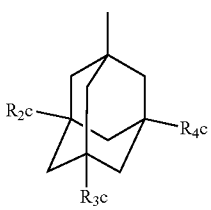

(VIIb)

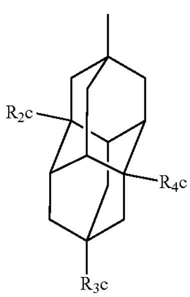

(VIIc)

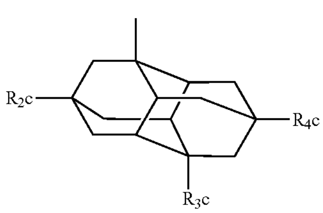

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group. A structure where one or two members of $R_2c$ to $R_4c$ are a hydroxyl group with the remaining being a hydrogen atom is preferred. In formula (VIIa), it is more preferred that two members of $R_2c$ to $R_4c$ are a hydroxyl group and the remaining is a hydrogen atom.

The repeating unit having a partial structure represented by formulae (VIIa) to (VIIc) includes repeating units represented by the following formulae (AIIa) to (AIIc):

(AIIa)

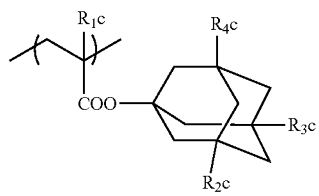

(AIIb)

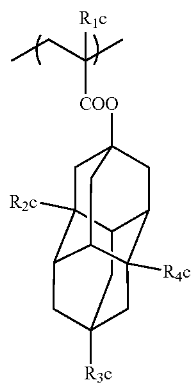

(AIIc)

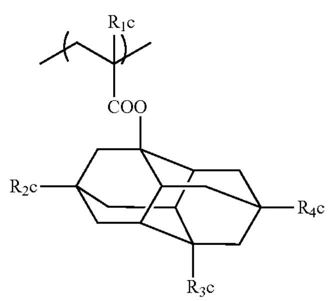

In formulae (AIIa) to (AIIc), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The resin (Ab) may or may not contain a repeating unit having a hydroxyl group or a cyano group, but in the case of containing a repeating unit having a hydroxyl group or a cyano group, the content thereof is preferably from 1 to 60 mol %, more preferably from 3 to 50 mol %, still more preferably from 5 to 40 mol %, based on all repeating units in the resin (Ab).

Specific examples of the repeating unit having a hydroxyl group or a cyano group are illustrated below, but the present invention is not limited thereto.

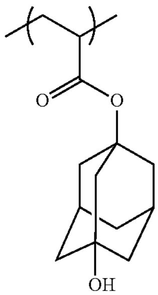

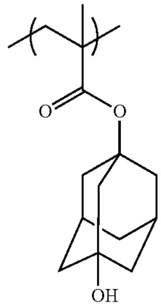

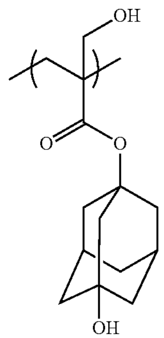

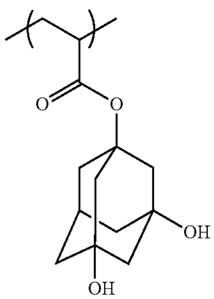

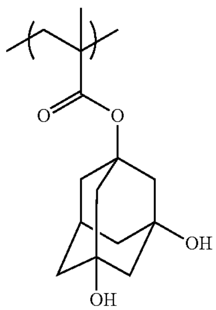

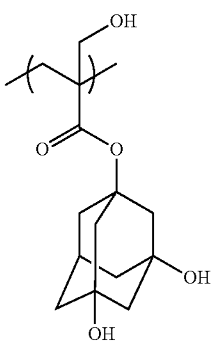

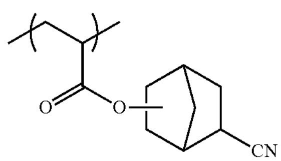

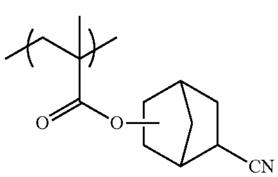

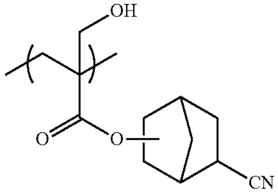

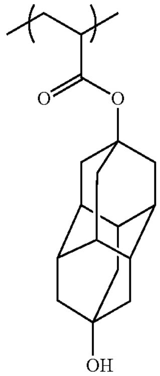

-continued

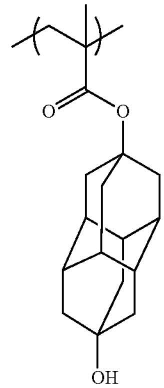

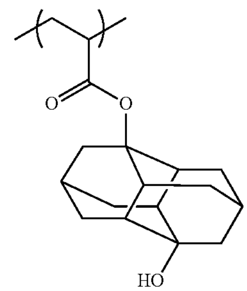

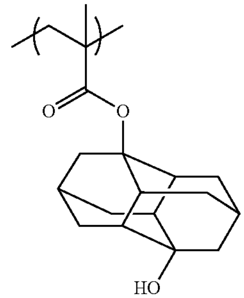

The repeating unit (b') may be a repeating unit having a lactone structure as the polar group.

The repeating unit having a lactone structure is preferably a repeating unit represented by the following formula (AII):

(AII)

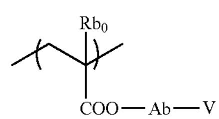

In formula (AII), $Rb_0$ represents a hydrogen atom, a halogen atom or an alkyl group (preferably having a carbon number of 1 to 4) which may have a substituent.

Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these. Ab is preferably a single bond or a divalent linking group represented by $-Ab_1-CO_2-$.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-8), (LC1-13) and (LC1-14).
LC1-1
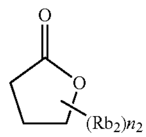
LC1-2
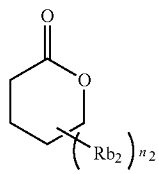
LC1-3
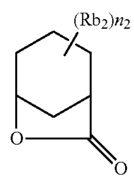
LC1-4
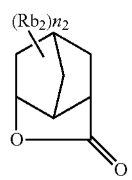
LC1-5
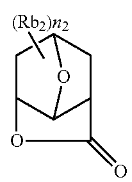
LC1-6
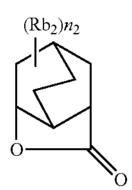
LC1-7
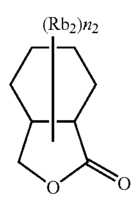
LC1-8
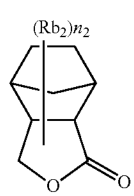
-continued
LC1-9
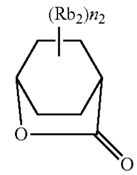
LC1-10
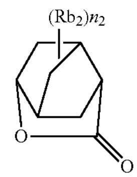
LC1-11
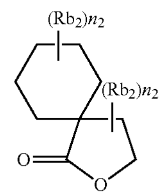
LC1-12
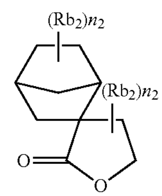
LC1-13
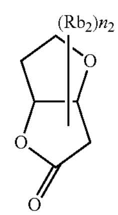
LC1-14
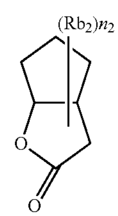
LC1-15
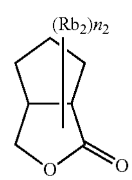
LC1-16
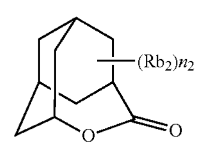

-continued

LC1-17

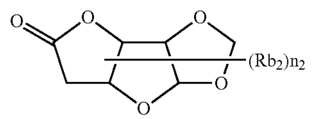

The lactone structure moiety may or may not have a substituent ($Rb_2$). Preferred examples of the substituent ($Rb_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituents ($Rb_2$) and also, the plurality of substituents ($Rb_2$) may combine with each other to form a ring.

The repeating unit having a lactone group usually has an optical isomer, and any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The resin (Ab) may or may not contain a repeating unit having a lactone structure, but in the case of containing a repeating unit having a lactone structure, the content of the repeating unit in the resin (Ab) is preferably from 1 to 70 mol %, more preferably from 3 to 65 mol %, still more preferably from 5 to 60 mol %, based on all repeating units.

Specific examples of the lactone structure-containing repeating unit in the resin (Ab) are illustrated below, but the present invention is not limited thereto. In the formulae, Rx represents H, $CH_3$, $CH_2OH$ or $CF_3$.

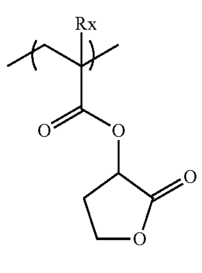

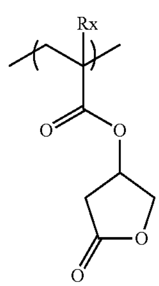

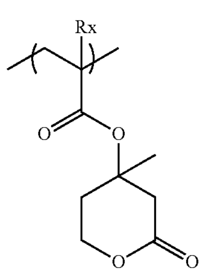

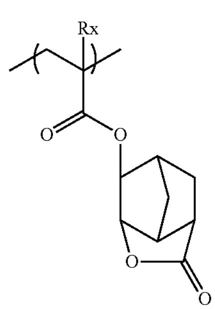

-continued

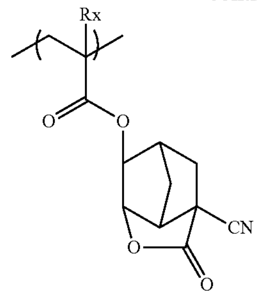

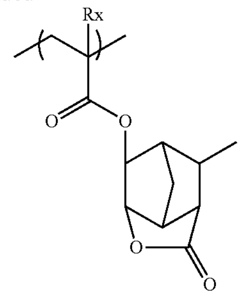

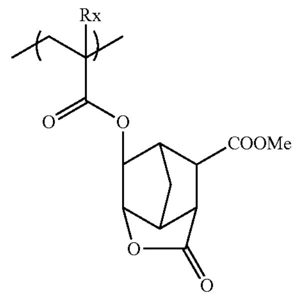

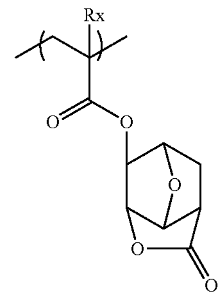

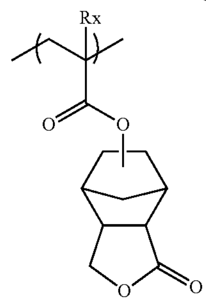

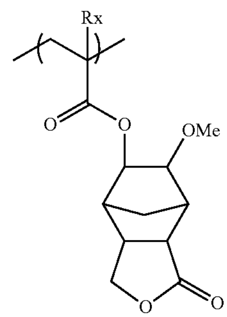

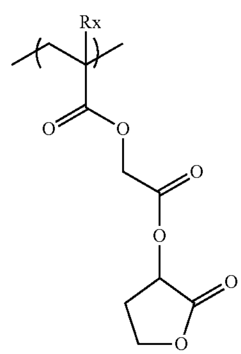

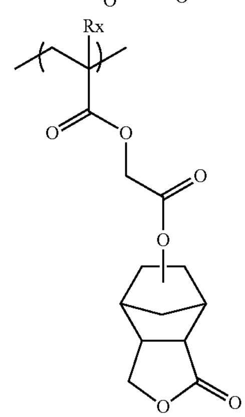

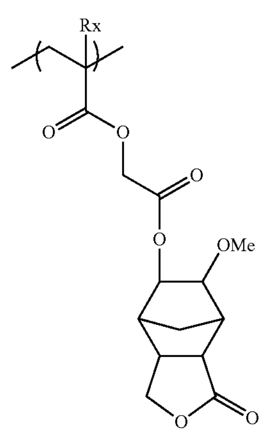

-continued

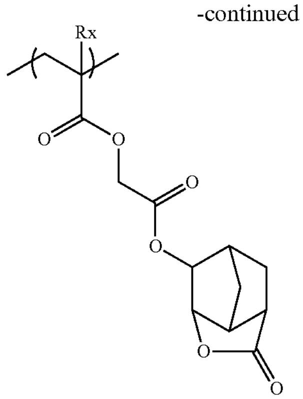

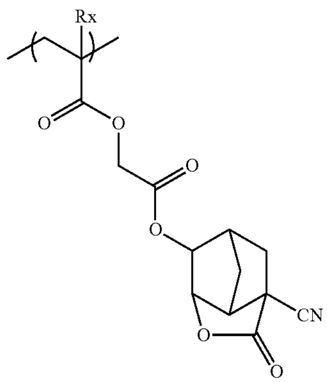

The sultone group which may be contained in the resin (Ab) is preferably a sultone group represented by the following formula (SL-1) or (SL-2). In the formulae, $Rb_2$ and $n_2$ have the same meanings as in formulae (LC1-1) to (LC1-17).

SL1-1

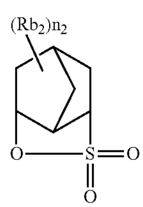

SL1-2

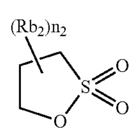

The sultone group-containing repeating unit which may be contained in the resin (Ab) is preferably a repeating unit where the lactone group in the above-described lactone group-containing repeating unit is replaced by a sultone group.

It is also one of particularly preferred embodiments that the polar group which can be contained in the repeating unit (b') is an acidic group. Preferred acidic groups include a phenolic hydroxyl group, a carboxylic acid group, a sulfonic acid group, a fluorinated alcohol group (such as hexafluoroisopropanol group), a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group. Among others, the repeating unit (b') is preferably a repeating unit having a carboxyl group. By virtue of containing a repeating unit having an acidic group, the resolution increases in usage of forming contact holes. As the repeating unit having an acidic group, all of a repeating unit where an acidic group is directly bonded to the main chain of the resin, such as repeating unit by an acrylic acid or a methacrylic acid, a repeating unit where an acidic group is bonded to the main chain of the resin through a linking group, and a repeating unit where an acidic group is introduced into the polymer chain terminal by using an acidic group-containing polymerization initiator or chain transfer agent at the polymerization, are preferred. In particular, a repeating unit by an acrylic acid or a methacrylic acid is preferred.

The acidic group which can be contained in the repeating unit (b') may or may not contain an aromatic ring. In the case where the repeating unit (b') contains an acidic group, the content of the repeating unit having an acidic group is preferably 30 mol % or less, more preferably 20 mol % or less, based on all repeating units in the resin (Ab). In the case where the resin (Ab) contains a repeating unit having an acidic group, the content of the repeating unit having an acidic group in the resin (Ab) is usually 1 mol % or more.

Specific examples of the repeating unit having an acidic group are illustrated below, but the present invention is not limited thereto.

In specific examples, Rx represents H, $CH_3$, $CH_2OH$ or $CF_3$.

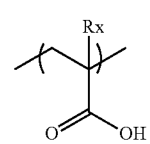

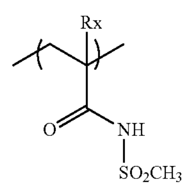

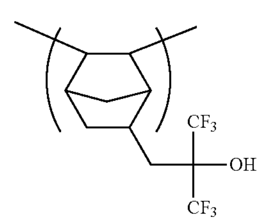

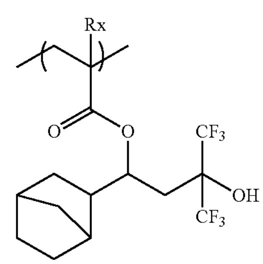

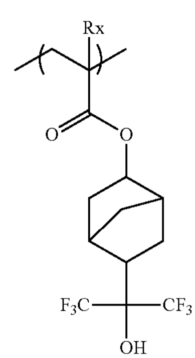

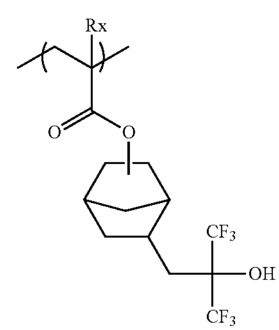

-continued

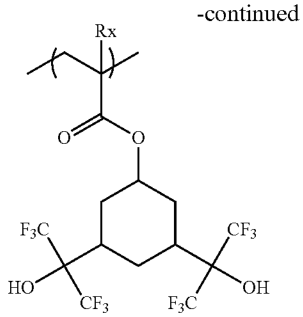

The resin (Ab) may contain (c) a repeating unit having a plurality of aromatic rings represented by the following formula (c1):

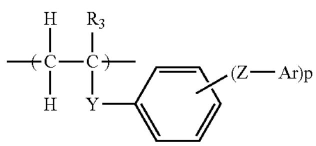

(c1)

In formula (c1), $R_3$ represents a hydrogen atom, an alkyl group, a halogen atom, a cyano group or a nitro group;

Y represents a single bond or a divalent linking group;

Z represents a single bond or a divalent linking group;

Ar represents an aromatic ring group; and p represents an integer of 1 or more.

The alkyl group as $R_3$ may be either linear or branched, and examples thereof include a methyl group, an ethyl group, an n-propyl group, an i-propyl group, an n-butyl group, a sec-butyl group, a tert-butyl group, an n-pentyl group, an n-hexyl group, an n-heptyl group, an n-octyl group, an n-nonyl group, an n-decanyl group, and an i-butyl group. The alkyl group may further have a substituent, and preferred examples of the substituent include an alkoxy group, a hydroxyl group, a halogen atom, and a nitro group. Among others, the alkyl group having a substituent is preferably, for example, a $CF_3$ group, an alkyloxycarbonylmethyl group, an alkylcarbonyloxymethyl group, a hydroxymethyl group or an alkoxymethyl group.

The halogen atom as $R_3$ includes fluorine atom, chlorine atom, bromine atom and iodine atom, with fluorine atom being preferred.

Y represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, $—SO_2NH—$, $—CF_2—$, $—CF_2CF_2—$, $—OCF_2O—$, $—CF_2OCF_2—$, —SS—, $—CH_2SO_2CH_2—$, $—CH_2COCH_2—$, $—COCF_2CO—$, —COCO—, —OCOO—, $—OSO_2O—$, an amino group (nitrogen atom), an acyl group, an alkylsulfonyl group, —CH═CH—, —C≡C—, an aminocarbonylamino group, an aminosulfonylamino group, and a group formed by a combination thereof. Y preferably has a carbon number of 15 or less, more preferably a carbon number of 10 or less.

Y is preferably a single bond, a —COO— group, a —COS— group or a —CONH— group, more preferably a —COO— group or a —CONH— group, still more preferably a —COO— group.

Z represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, $—SO_2NH—$, an amino group (nitrogen atom), an acyl group, an alkylsulfonyl group, —CH═CH—, an aminocarbonylamino group, an aminosulfonylamino group, and a group formed by a combination thereof.

Z is preferably a single bond, an ether group, a carbonyl group or —COO—, more preferably a single bond or an ether group, still more preferably a single bond.

Ar represents an aromatic ring group, and specific examples thereof include a phenyl group, a naphthyl group, an anthracenyl group, a phenanthrenyl group, a quinolinyl group, a furanyl group, a thiophenyl group, a fluorenyl-9-on-yl group, an anthraquinolinyl group, a phenanthraquinolinyl group, and a pyrrole group, with a phenyl group being preferred. Such an aromatic ring group may further have a substituent, and preferred examples of the substituent include an alkyl group, an alkoxy group, a hydroxy group, a halogen atom, a nitro group, an acyl group, an acyloxy group, an acylamino group, a sulfonylamino group, an aryl group such as phenyl group, an aryloxy group, an arylcarbonyl group, and a heterocyclic residue. Among these, from the standpoint of preventing deterioration of the exposure latitude or pattern profile due to out-of-band light, a phenyl group is preferred.

p is an integer of 1 or more and is preferably an integer of 1 to 3.

The repeating unit (c) is more preferably a repeating unit represented by the following formula (c2):

(c2)

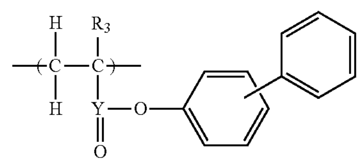

In formula (c2), $R_3$ represents a hydrogen atom or an alkyl group. Preferred examples of the alkyl group as $R_3$ are the same as in formula (c1).

Here, as concerns the extreme-ultraviolet (EUV) exposure, leakage light (out-of-band light) generated in the ultraviolet region at a wavelength of 100 to 400 nm worsens the surface roughness, as a result, the resolution and LWR performance tend to be impaired due to bridge between patterns or disconnection of pattern.

However, the aromatic ring in the repeating unit (c) functions as an internal filter capable of absorbing the above-described out-of-band light. Accordingly, in view of high resolution and low LWR, the resin (Ab) preferably contains the repeating unit (c).

In this connection, from the standpoint of obtaining high resolution, the repeating unit (c) is preferably free from a phenolic hydroxyl group (a hydroxyl group bonded directly on an aromatic ring).

Specific examples of the repeating unit (c) are illustrated below, but the present invention is not limited thereto.

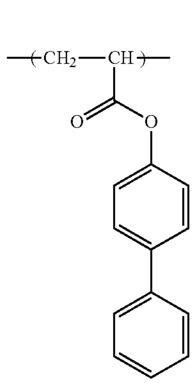
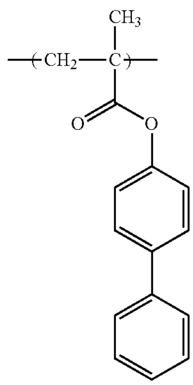
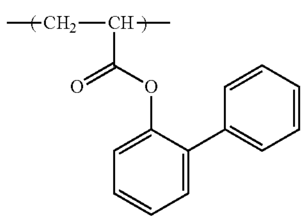
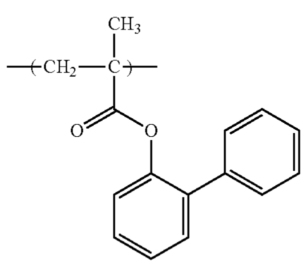
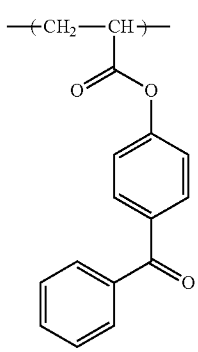
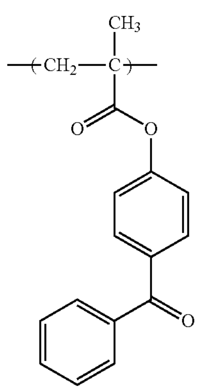
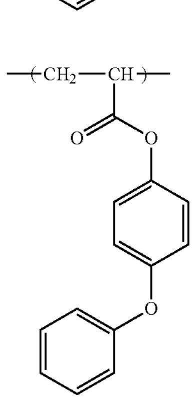
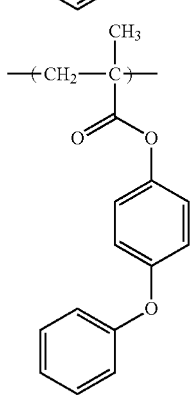
-continued
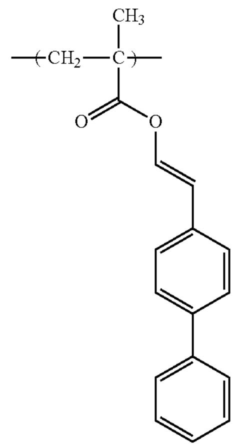
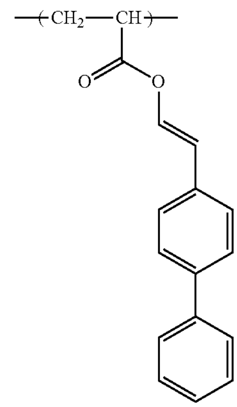
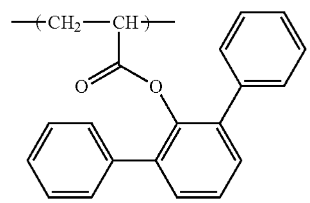
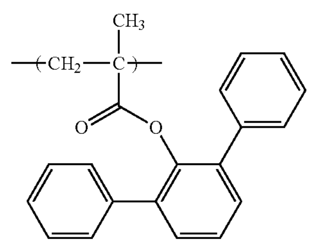
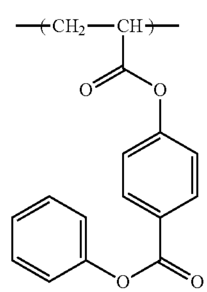
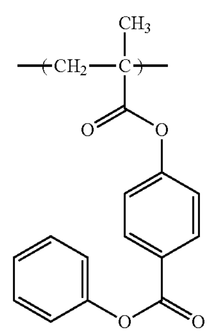
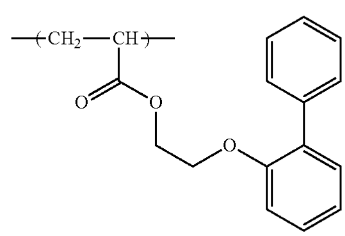
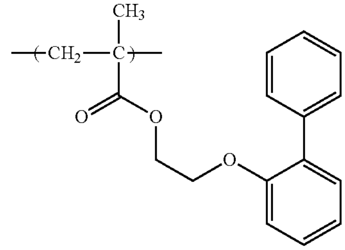

-continued
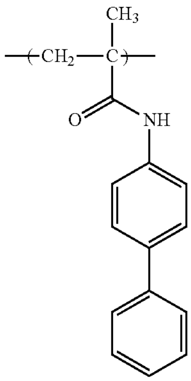
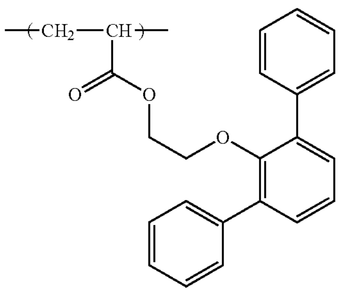
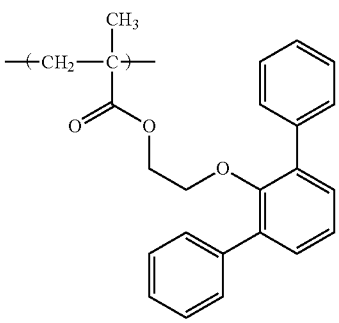
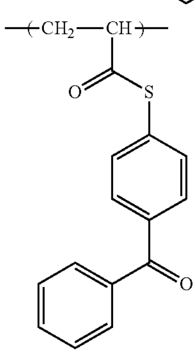
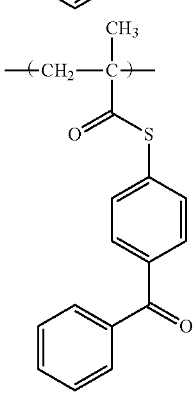
-continued
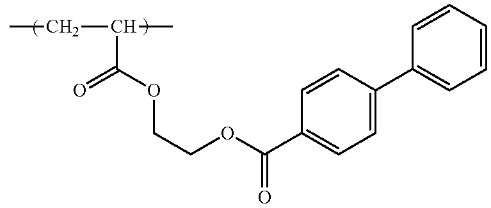
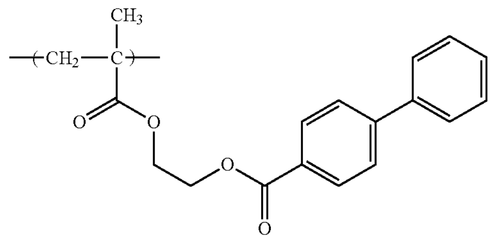
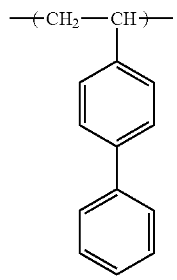
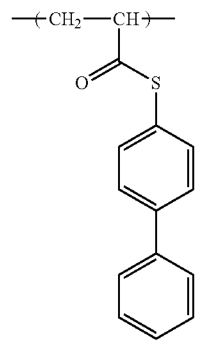
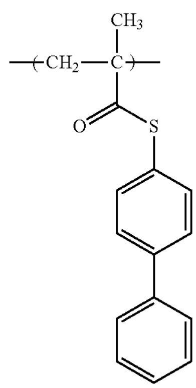
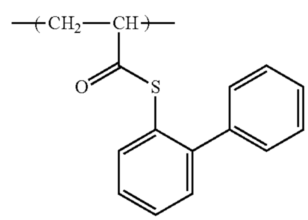
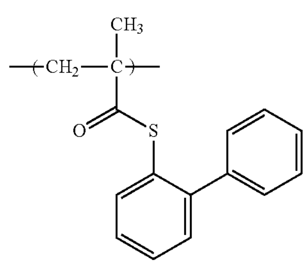
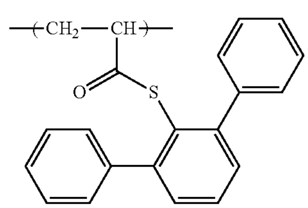

-continued
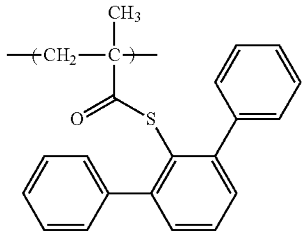
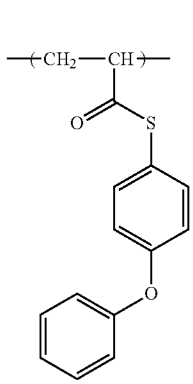
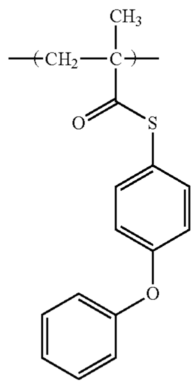
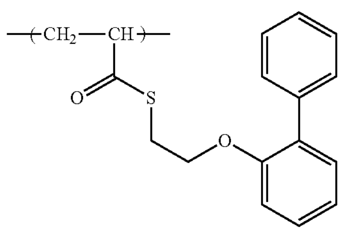
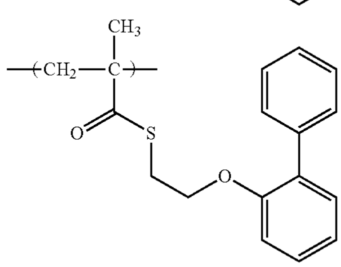
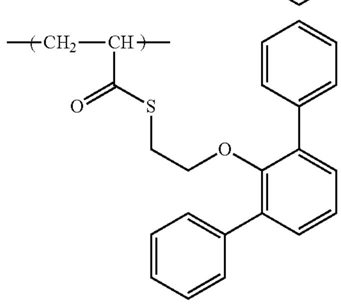
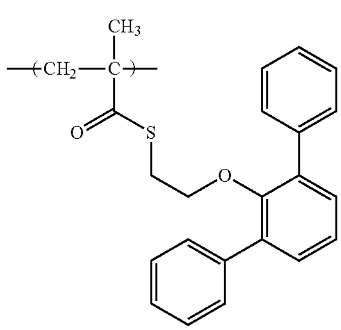
-continued
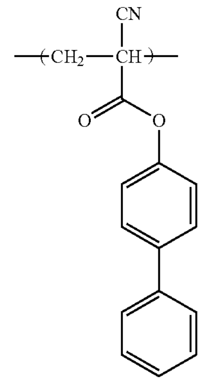
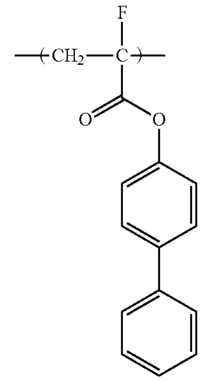
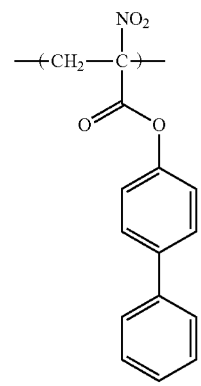
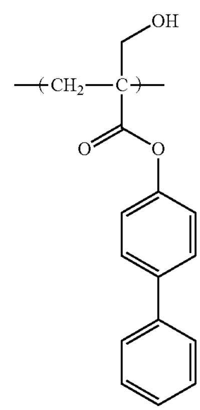
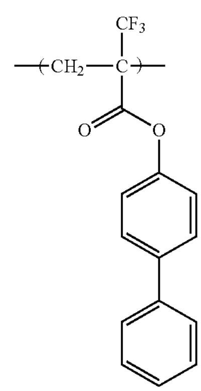
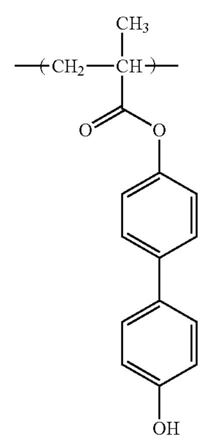
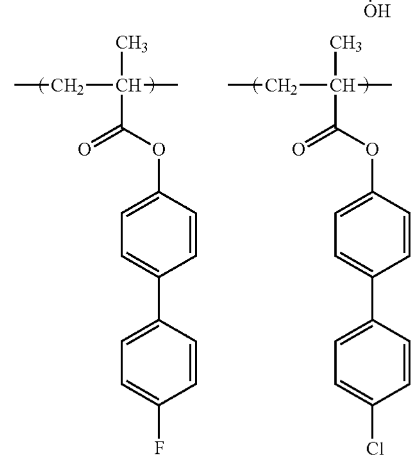

-continued

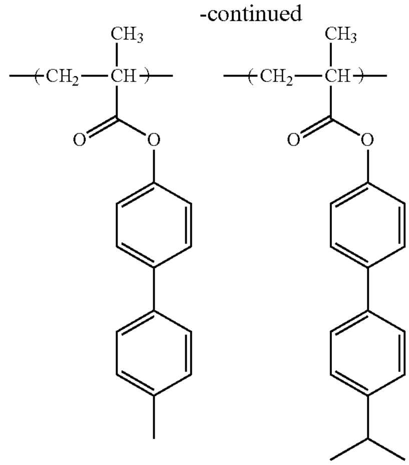

The resin (Ab) may or may not contain the repeating unit (c), but in the case containing the repeating unit (c), the content thereof is preferably from 1 to 30 mol %, more preferably from 1 to 20 mol %, still more preferably from 1 to 15 mol %, based on all repeating units in the resin (Ab). As for the repeating unit (c) contained in the resin (Ab), two or more kinds of repeating units may be contained in combination.

The resin (Ab) for use in the present invention may appropriately contain a repeating unit other than the above-described repeating units (a) to (c). As an example of such a repeating unit, the resin may contain a repeating unit having an alicyclic hydrocarbon structure free from a polar group (for example, the above-described acid group, a hydroxyl group or a cyano group) and not exhibiting acid decomposability. Thanks to this configuration, the solubility of the resin at the development using an organic solvent-containing developer can be appropriately adjusted. Such a repeating unit includes a repeating unit represented by formula (IV):

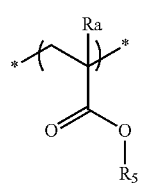

(IV)

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[$5.2.1.0^{2,6}$]decane ring and tricyclo[$4.3.1.1^{2,5}$]undecane ring, and a tetracyclic hydrocarbon ring such as tetracyclo[$4.4.0.1^{2,5}.1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group, and a tricyclo[$5,2,1,0^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (Ab) may or may not contain a repeating unit having an alicyclic hydrocarbon structure free from a polar group and not exhibiting acid decomposability, but in the case of containing this repeating unit, the content thereof is preferably from 1 to 20 mol %, more preferably from 5 to 15 mol %, based on all repeating units in the resin (Ab).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

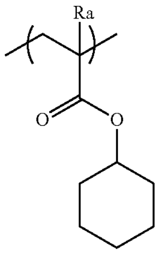
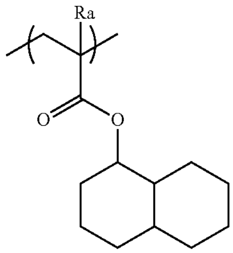
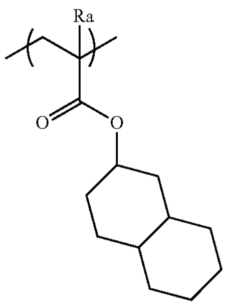
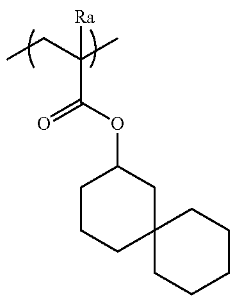
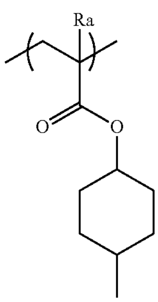
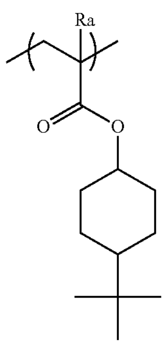
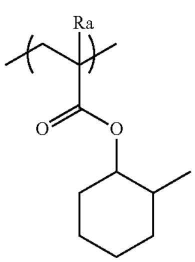
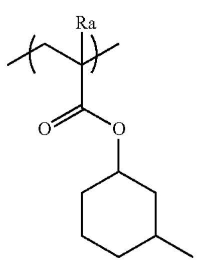
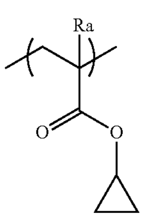
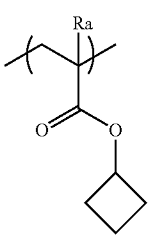
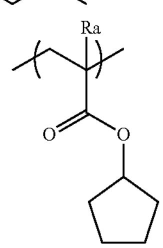
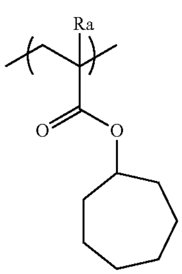
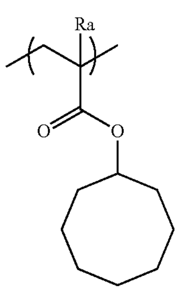
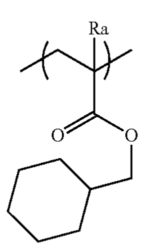
-continued
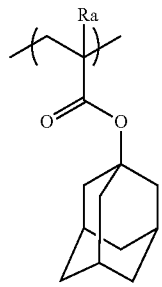
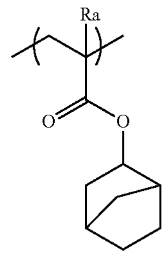
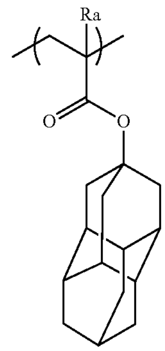
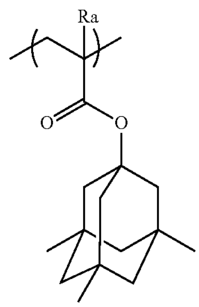
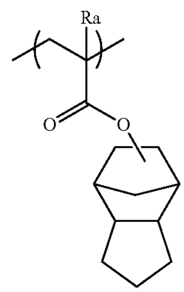
From the standpoint of elevating Tg, improving dry etching resistance and producing an effect such as internal filter for out-of-band-light, the resin (Ab) may contain the following monomer component.
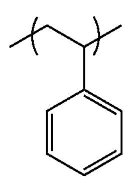
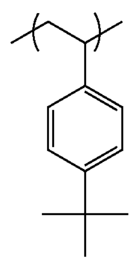
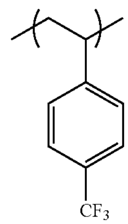
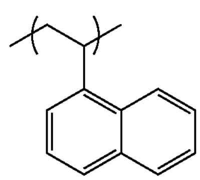
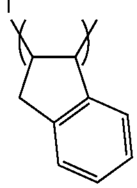
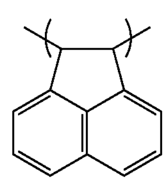
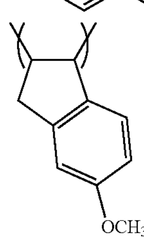
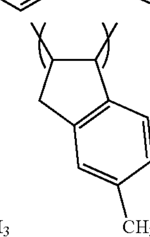
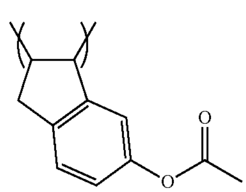
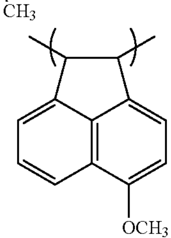

-continued

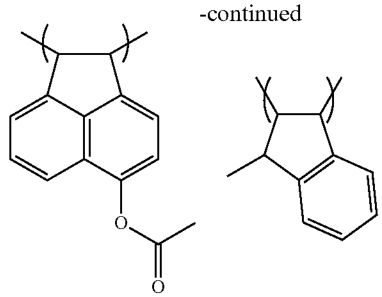

Also, the resin (Ab) may contain a repeating unit having a cyclic carbonic acid ester structure.

The repeating unit having a cyclic carbonic acid ester structure is preferably a repeating unit represented by the following formula (A-1):

(A-1)

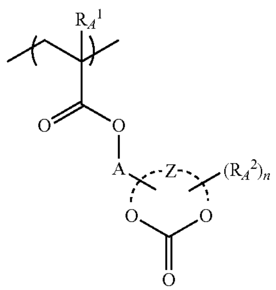

In formula (A-1), $R_A^1$ represents a hydrogen atom or an alkyl group.

$R_A^2$ represents, when n is 2 or more, each independently represents, a substituent.

A represents a single bond or a divalent linking group.

Z represents an atomic group necessary for forming a monocyclic or polycyclic structure together with the group represented by —O—C(═O)—O— in the formula.

n represents an integer of 0 or more.

Formula (A-1) is described in detail below.

The alkyl group represented by $R_A^1$ may have a substituent such as fluorine atom. $R_A^1$ preferably represents a hydrogen atom, a methyl group or a trifluoromethyl group, more preferably represents a methyl group.

The substituent represented by $R_A^2$ is, for example, an alkyl group, a cycloalkyl group, a hydroxyl group, an alkoxy group, an amino group or an alkoxycarbonyl group and is preferably an alkyl group having a carbon number of 1 to 5, and examples thereof include a linear alkyl group having a carbon number of 1 to 5, such as methyl group, ethyl group, propyl group and butyl group, and a branched alkyl group having a carbon number of 3 to 5, such as isopropyl group, isobutyl group and tert-butyl group. The alkyl may have a substituent such as hydroxyl group.

n represents the number of substituents and is an integer of 0 or more. For example, n is preferably from 0 to 4, more preferably 0.

The divalent linking group represented by A includes, for example, an alkylene group, a cycloalkylene group, an ester bond, an amido bond, an ether bond, a urethane bond, a urea bond, and a combination thereof. The alkylene group is preferably an alkylene group having a carbon number of 1 to 10, more preferably an alkylene group having a carbon number of 1 to 5, and examples thereof include a methylene group, an ethylene group, and a propylene group.

In one embodiment of the present invention, A is preferably a single bond or an alkylene group.

The monocyclic ring containing —O—C(═O)—O— represented by Z includes, for example, a 5- to 7-membered ring where in the cyclic carbonic acid ester represented by the following formula (a), $n_A$ is from 2 to 4, and is preferably a 5- or 6-membered ring ($n_A$ is 2 or 3), more preferably a 5-membered ring ($n_A$ is 2).

The polycyclic ring containing —O—C(═O)—O— represented by Z includes, for example, a structure where the cyclic carbonic acid ester represented by the following formula (a) forms a condensed ring together with one other ring structure or two or more other ring structures, and a structure where a spiro ring is formed. The "other ring structure" capable of forming a condensed ring or a spiro ring may be an alicyclic hydrocarbon group or an aromatic hydrocarbon group or may be a heterocyclic ring.

(a)

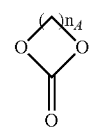

The monomer corresponding to the repeating unit represented by formula (A-1) can be synthesized by a conventionally known method described, for example, in *Tetrahedron Letters*, Vol. 27, No. 32, page 3741 (1986), and *Organic Letters*, Vol. 4, No. 15, page 2561 (2002).

In the resin (Ab), one of repeating units represented by formula (A-1) may be contained alone, or two or more thereof may be contained.

Specific examples of the repeating unit having a cyclic carbonic acid ester structure are illustrated below, but the present invention is not limited thereto.

In specific examples, $R_A^1$ has the same meaning as $R_A^1$ in formula (A-1).

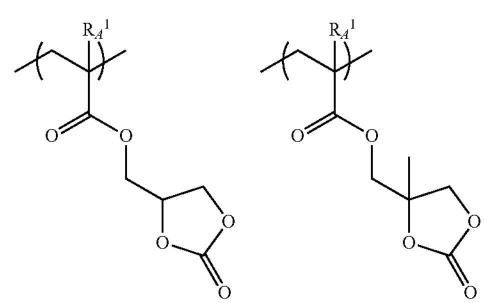

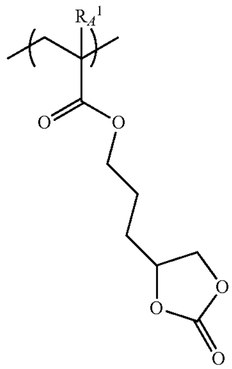
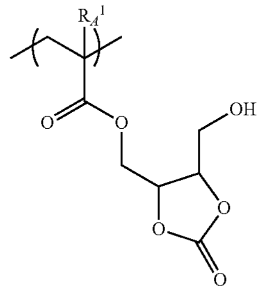
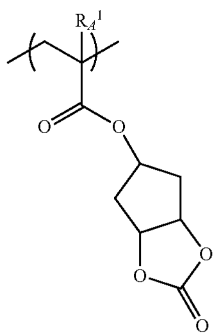
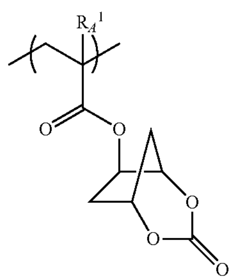
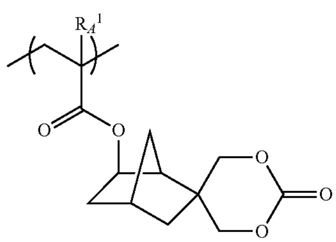
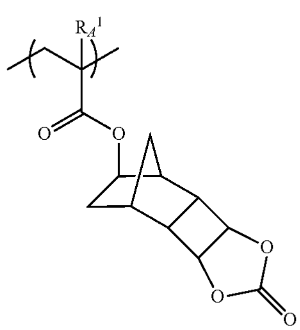
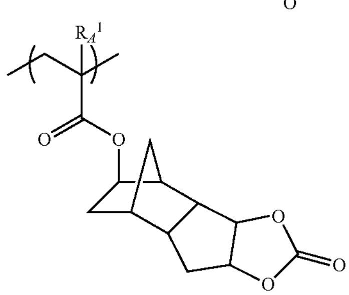
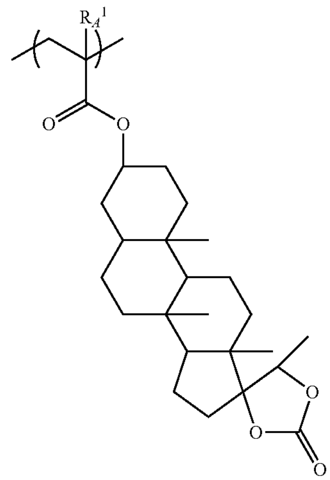
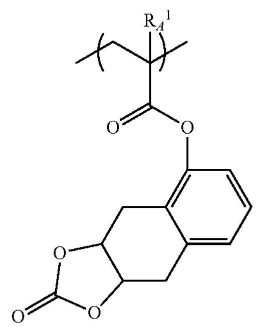
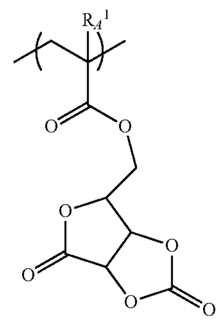
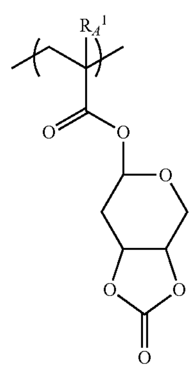
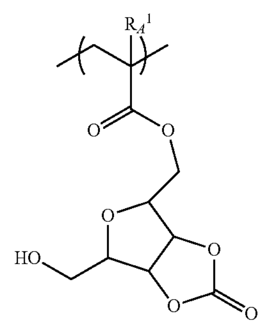
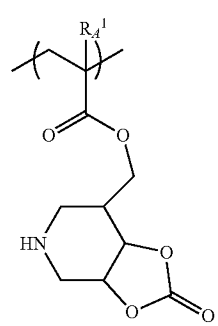
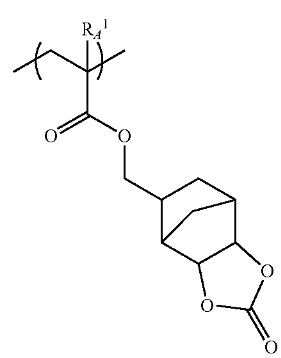

-continued

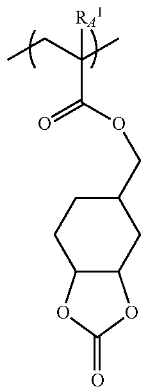

As for the repeating unit having a cyclic carbonic acid ester structure, the resin (Ab) may contain one repeating unit or may contain two or more repeating units.

In the case where the resin (Ab) contains a repeating unit having a cyclic carbonic acid ester structure, the content of the repeating unit having a cyclic carbonic acid ester structure is preferably from 5 to 60 mol %, more preferably from 5 to 55 mol %, still more preferably from 10 to 50 mol %, based on all repeating units in the resin (Ab).

In the resin (Ab) for use in the composition of the present invention, the molar ratio of respective repeating structural units contained is appropriately set so as to control the dry etching resistance of resist, the suitability for standard developer, the adherence to substrate, the resist profile, and performances generally required of the resist, such as resolution, heat resistance and sensitivity.

Specific examples of the resin (Ab) are illustrated below, but the present invention is not limited thereto.

(Ab-1)

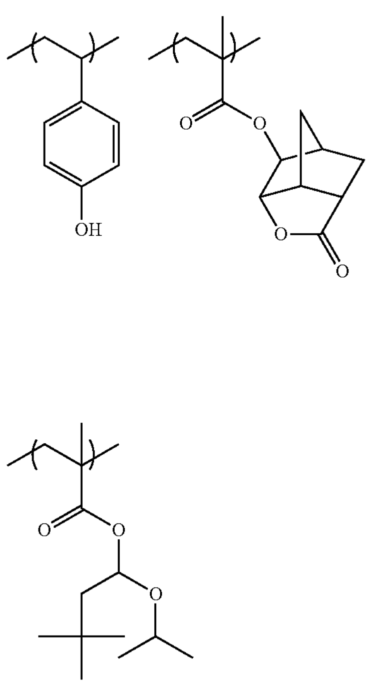

-continued (Ab-2)

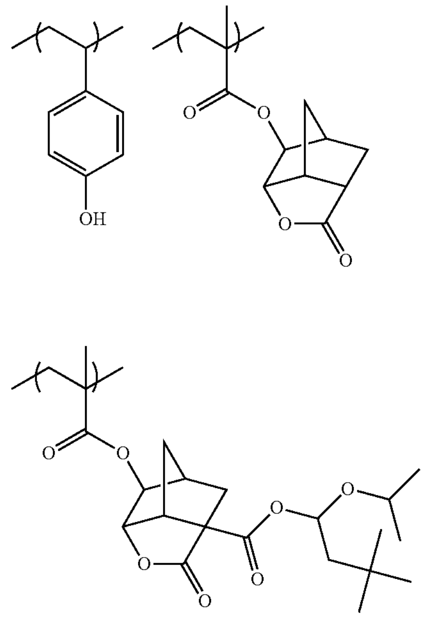

(Ab-3)

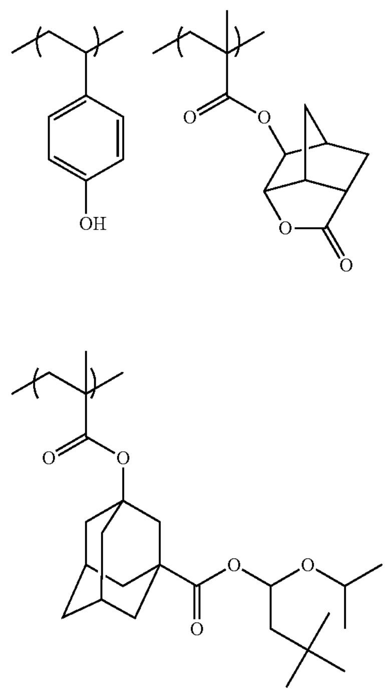

(Ab-4)

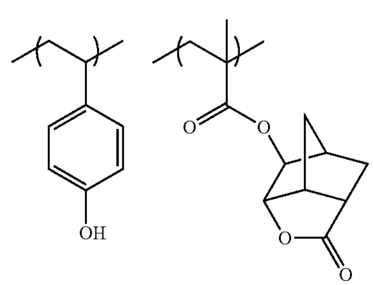

-continued
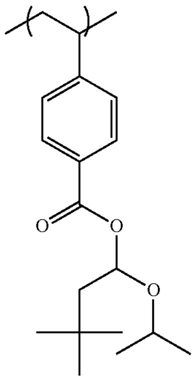
(Ab-5)
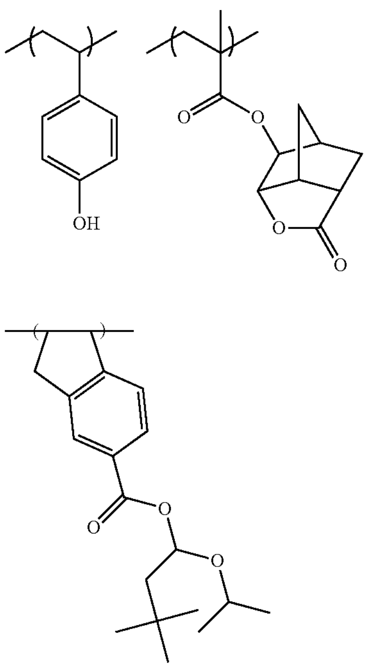
(Ab-6)
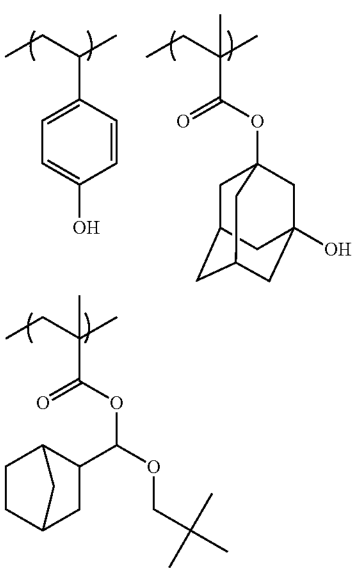
-continued
(Ab-7)
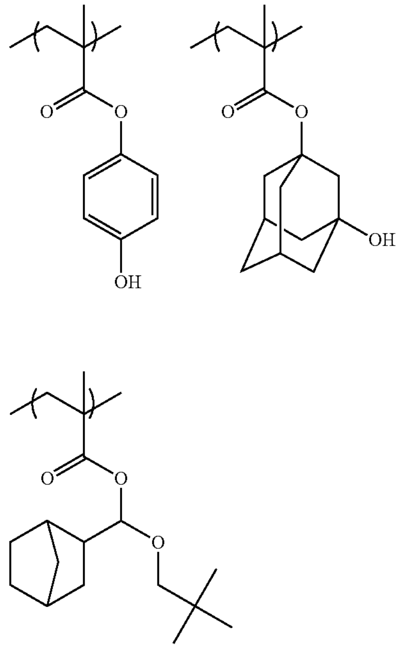
(Ab-8)
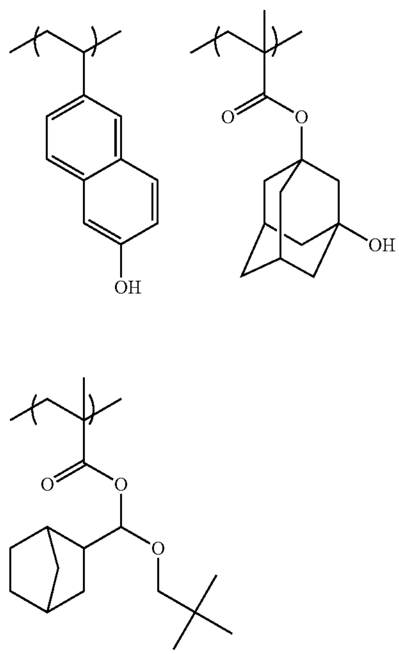
(Ab-9)
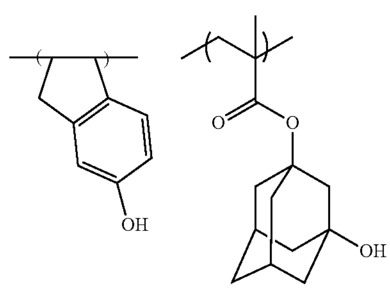

-continued
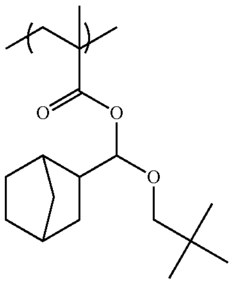
(Ab-10)
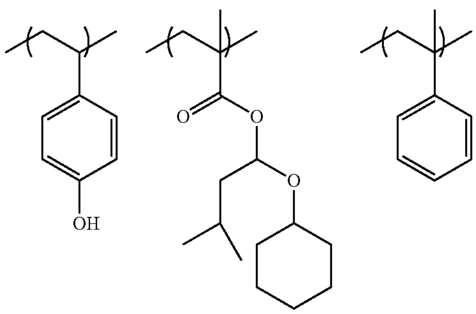
(Ab-11)
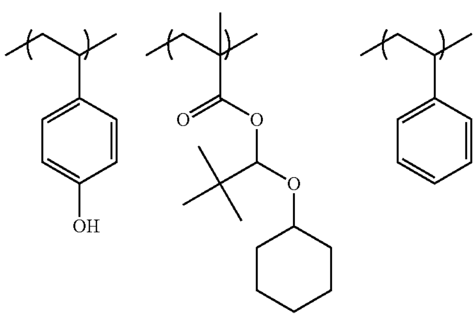
(Ab-12)
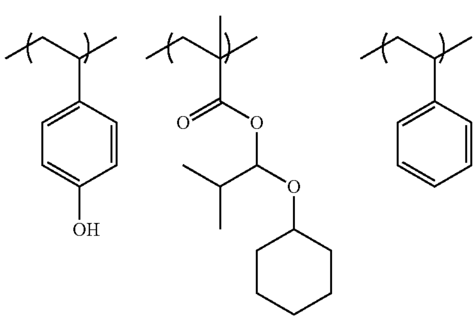
(Ab-13)
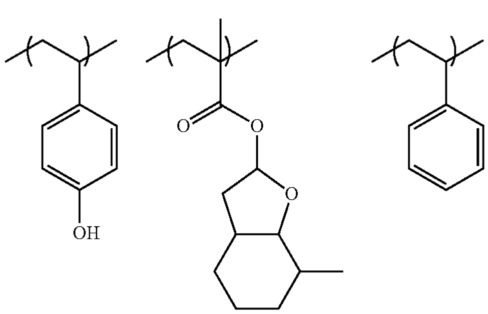
-continued
(Ab-14)
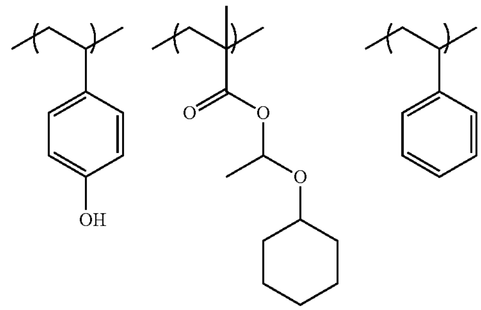
(Ab-15)
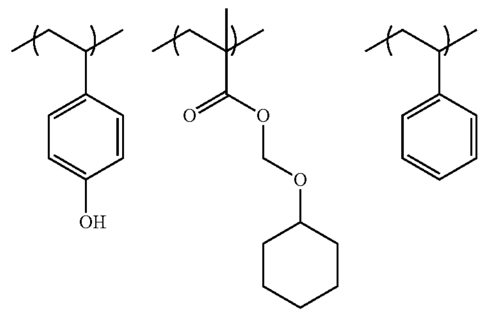
(Ab-16)
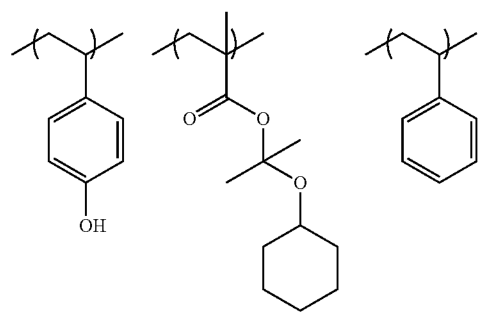
(Ab-17)
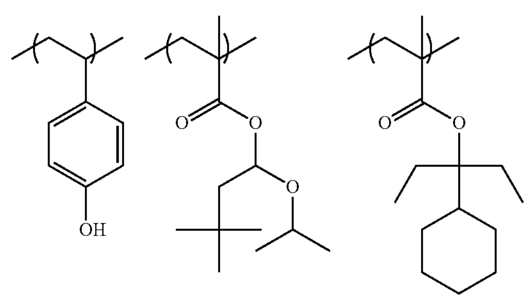
(Ab-18)
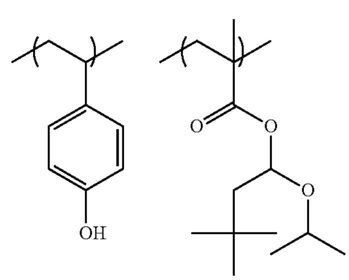

-continued
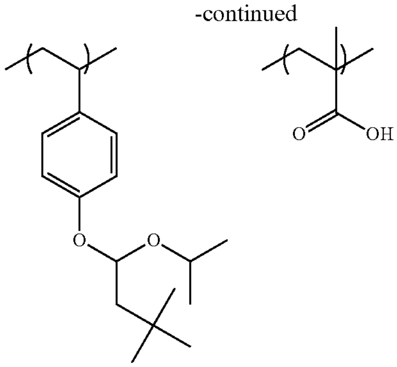
(Ab-19)
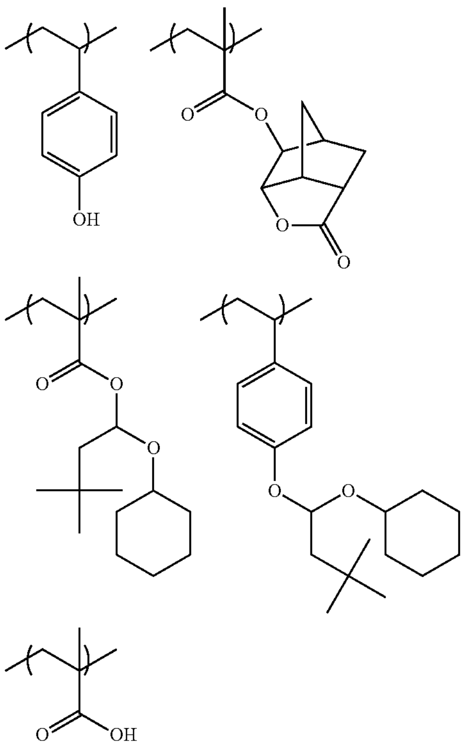
(Ab-20)
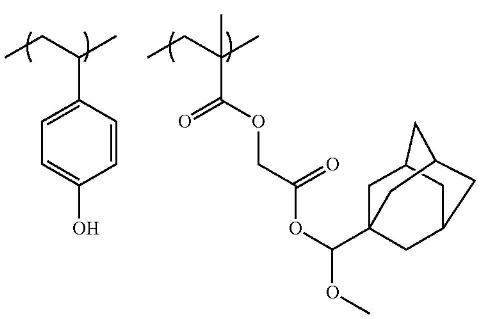
(Ab-21)
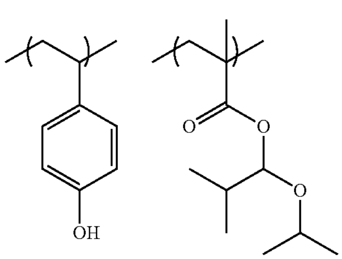
-continued
(Ab-22)
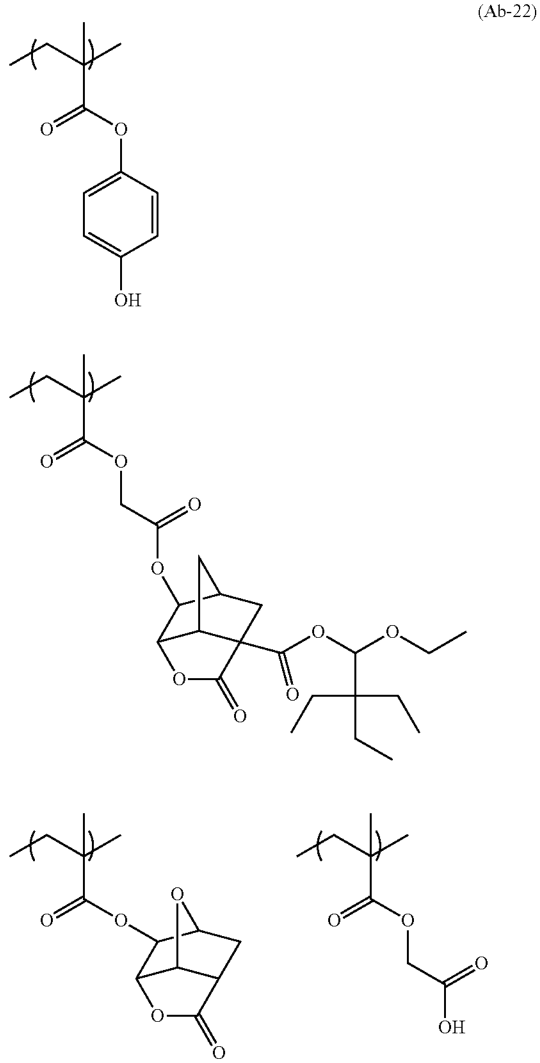
(Ab-23)
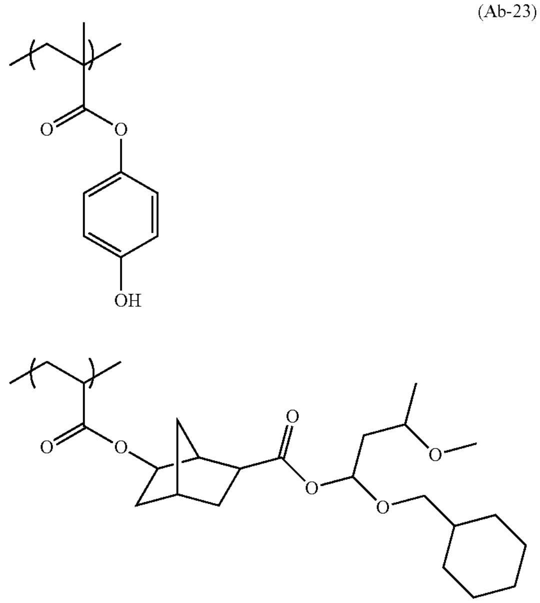

-continued
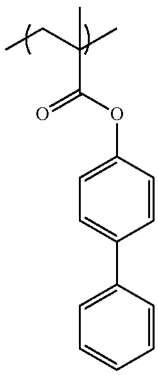
(Ab-24)
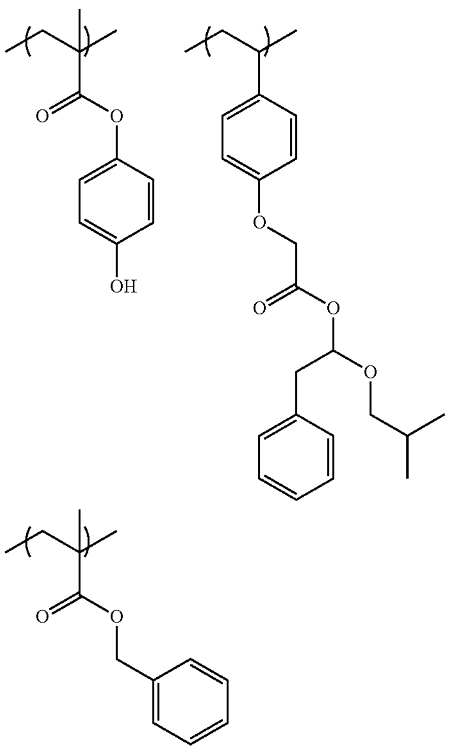
(Ab-25)
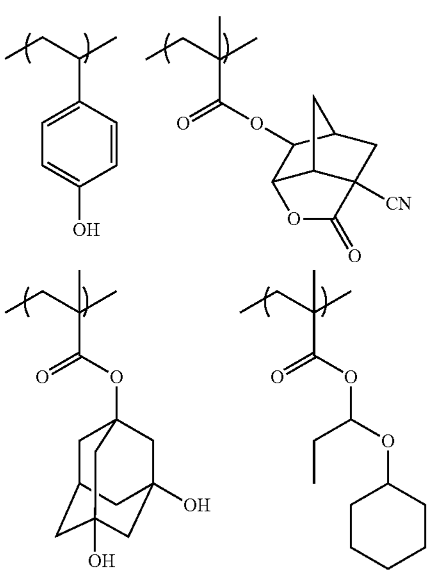
-continued
(Ab-26)
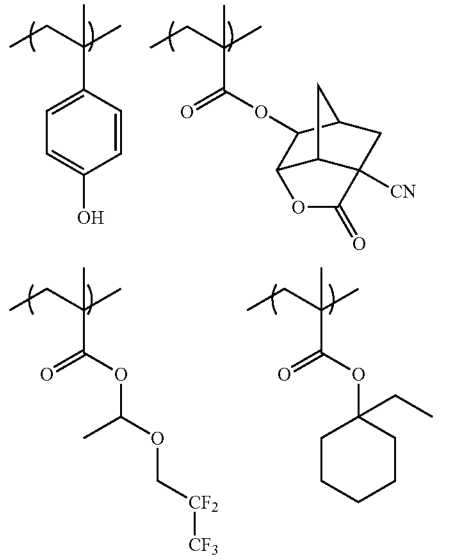
(Ab-27)
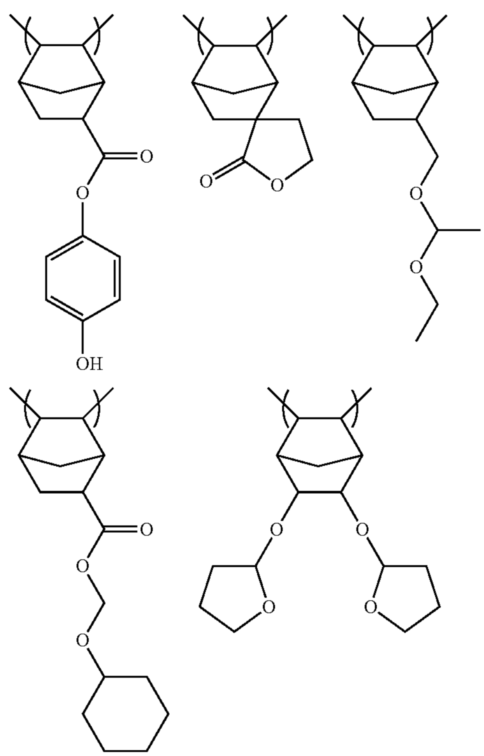
(Ab-28)
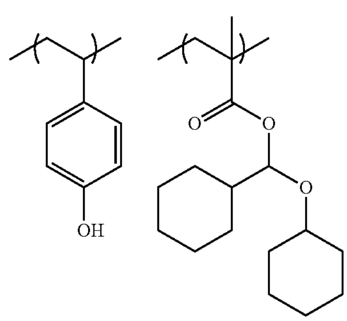

-continued
(Ab-29)
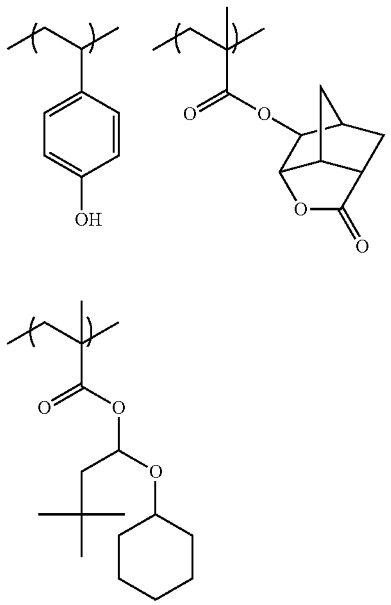
(Ab-30)
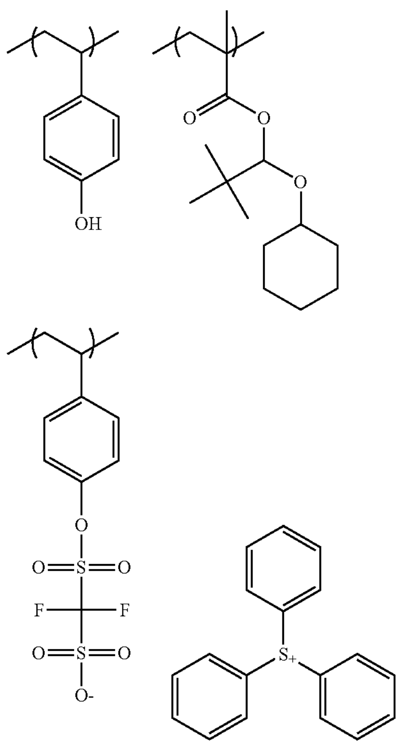
(Ab-31)
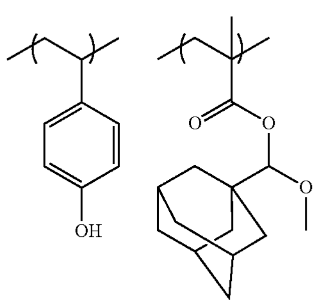
-continued
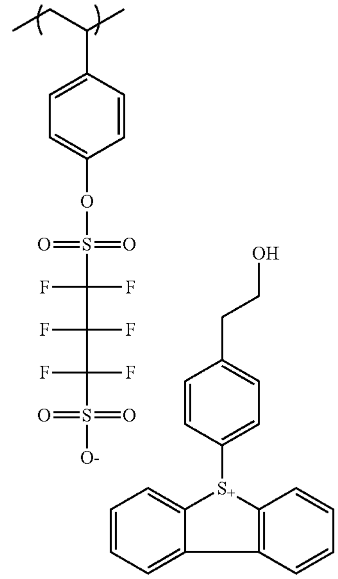
(Ab-32)
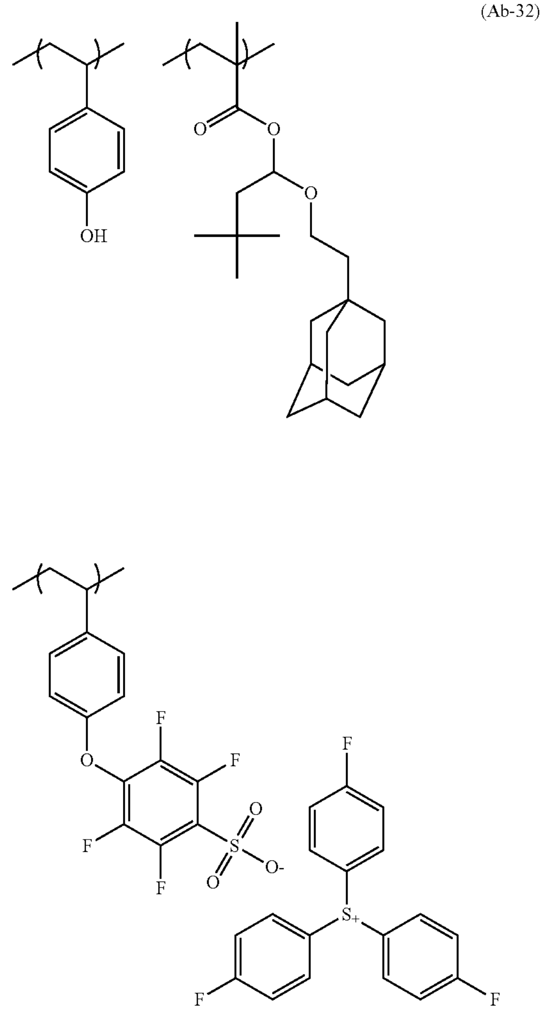

-continued
(Ab-33)
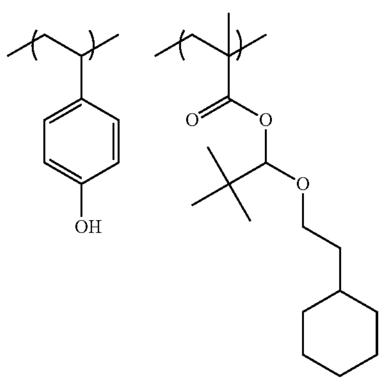
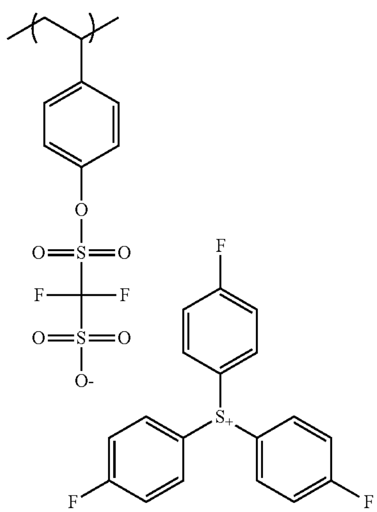
(Ab-34)
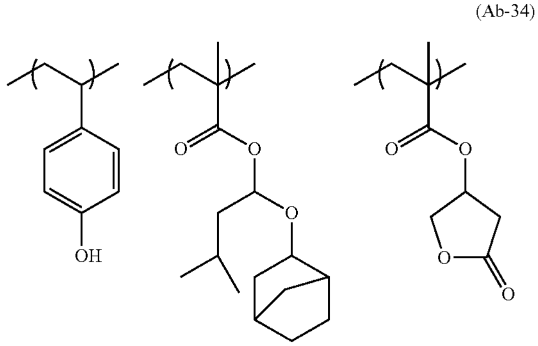
-continued
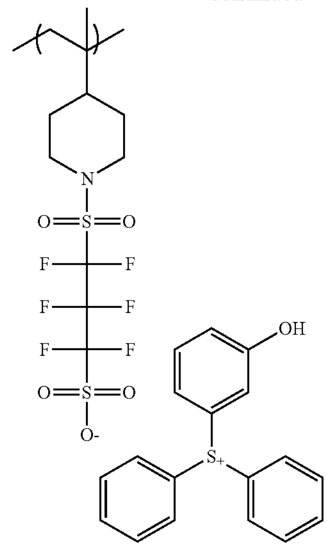
(Ab-35)
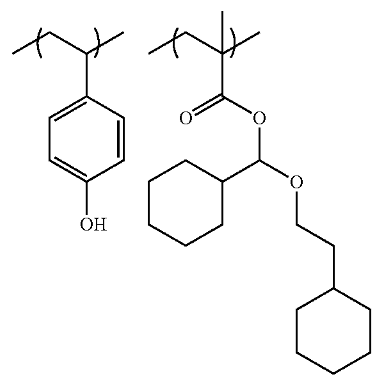
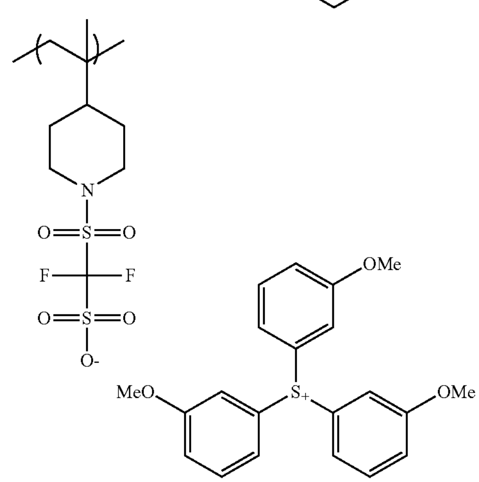
(Ab-36)
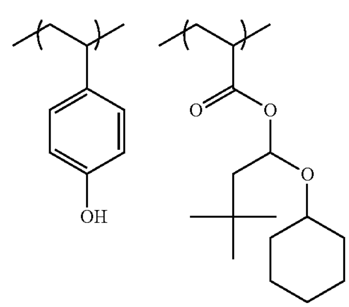

-continued
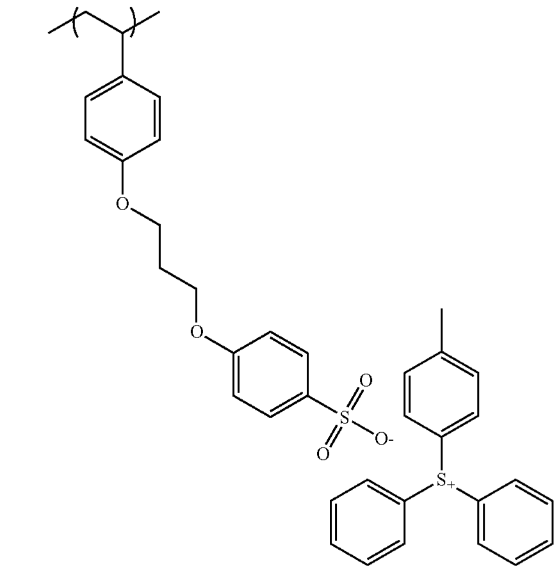
(Ab-37)
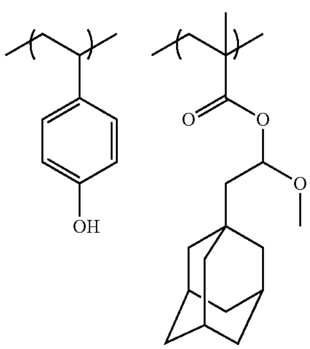
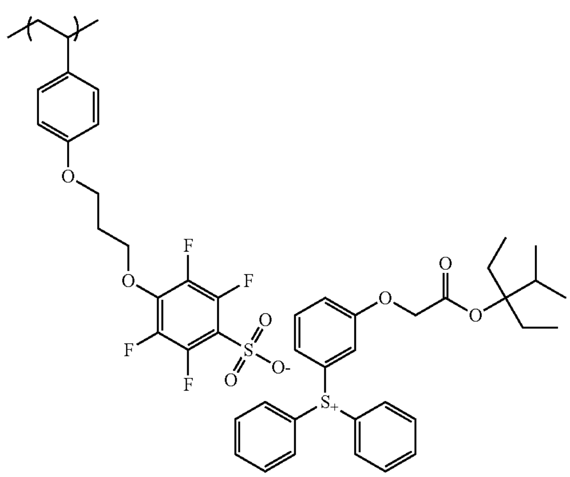
-continued
(Ab-38)
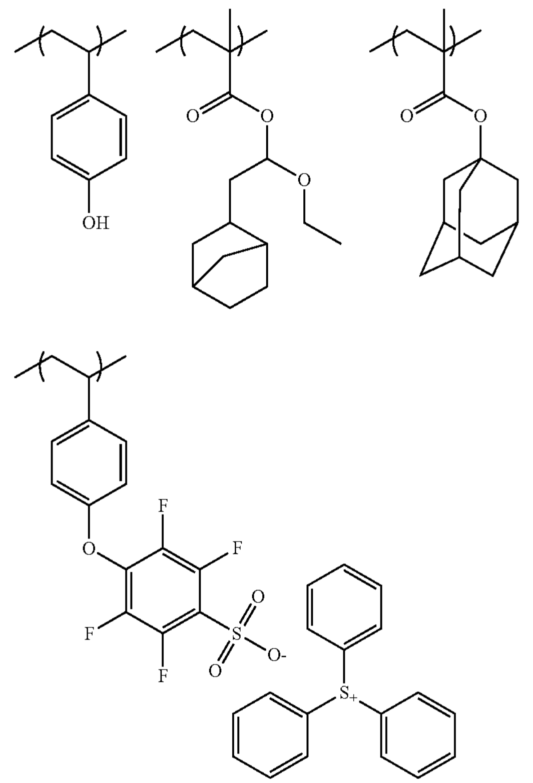
(Ab-39)
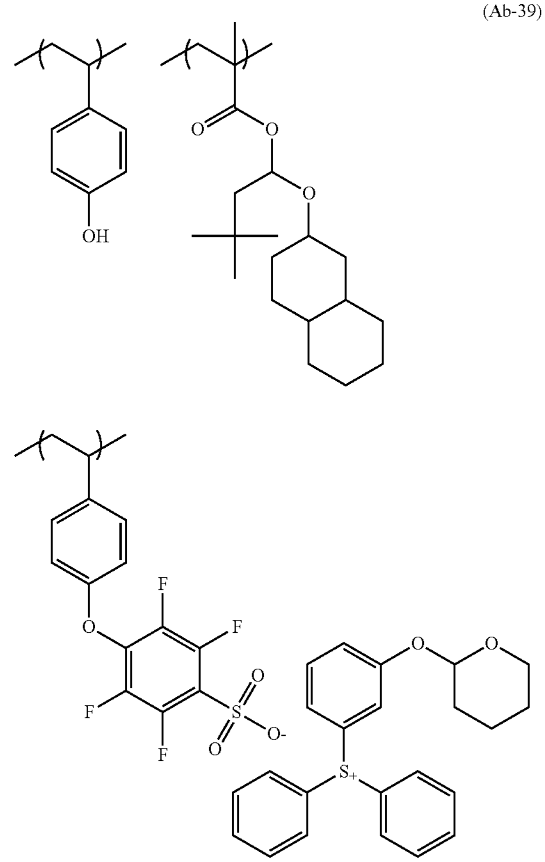

-continued
(Ab-40)
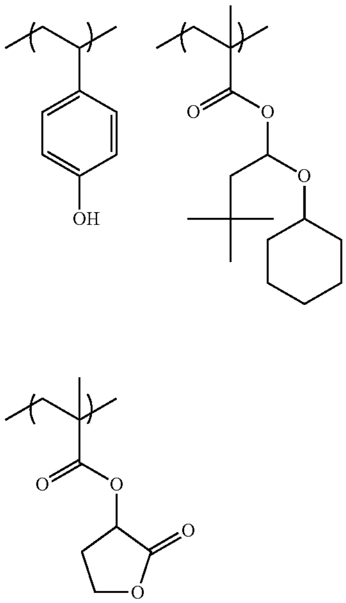
(Ab-41)
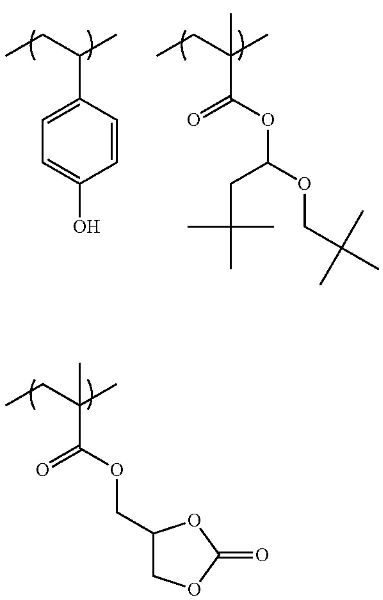
(Ab-42)
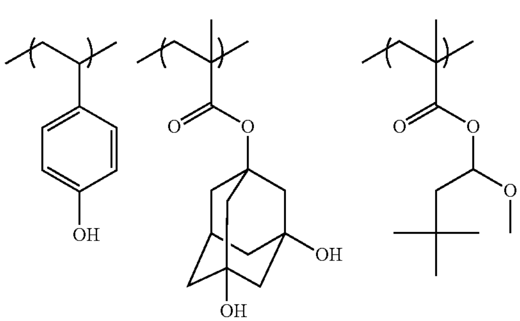
-continued
(Ab-43)
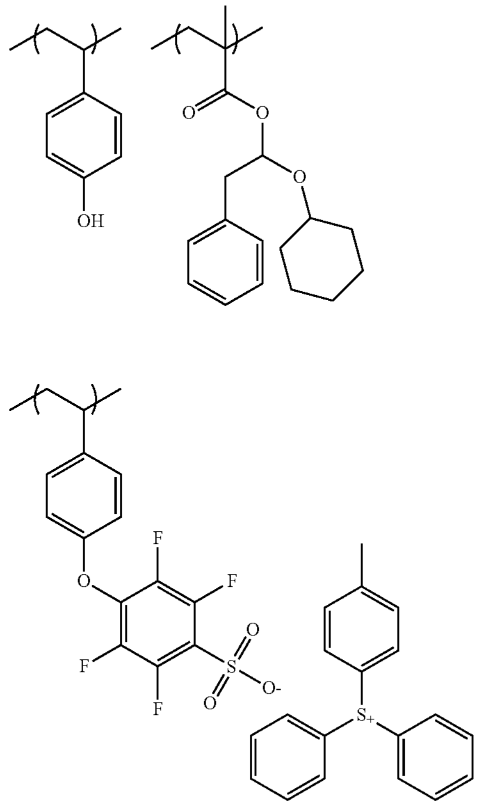
(Ab-44)
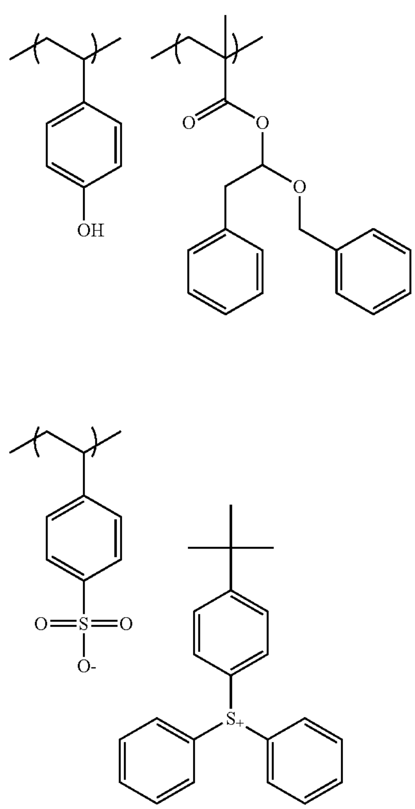

-continued
(Ab-45)
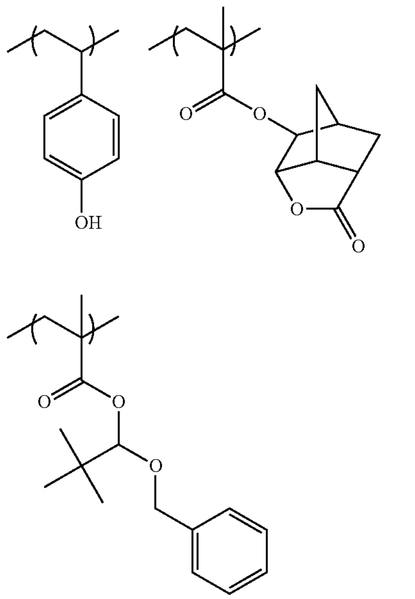
(Ab-46)
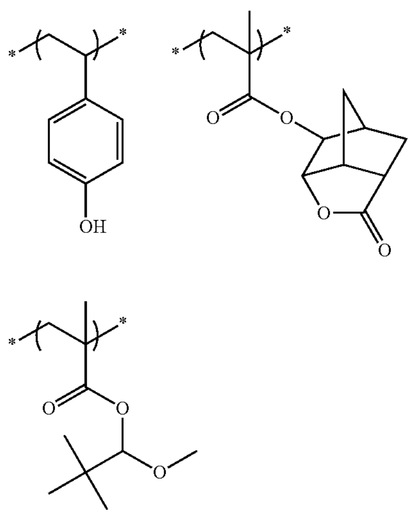
(Ab-47)
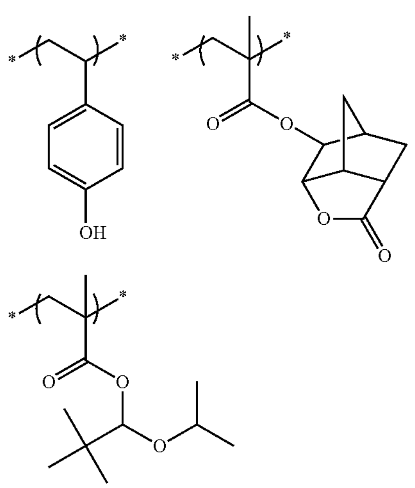
-continued
(Ab-48)
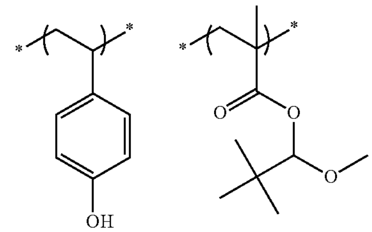
(Ab-49)
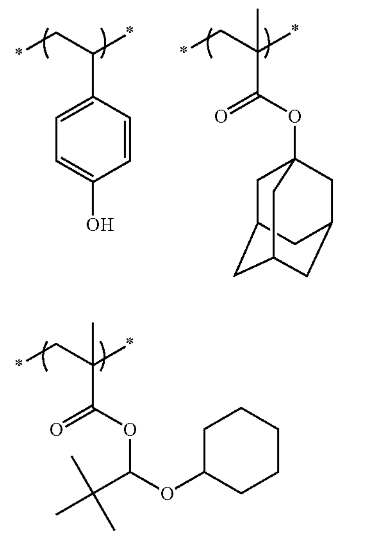
(Ab-50)
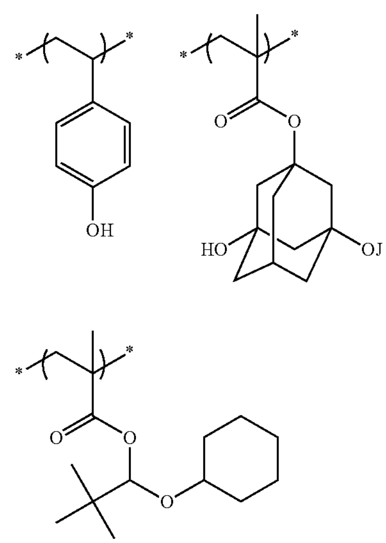
(Ab-51)
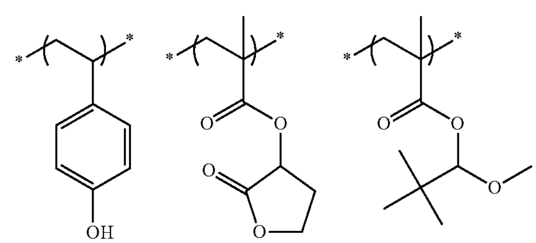

(Ab-52)
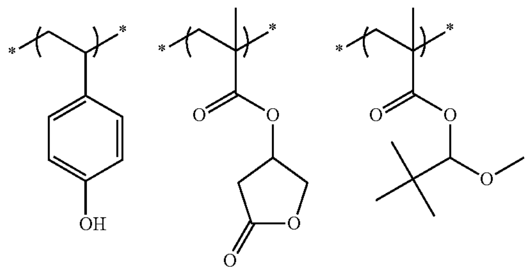
(Ab-53)
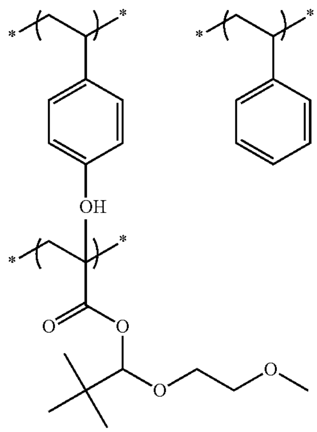
(Ab-54)
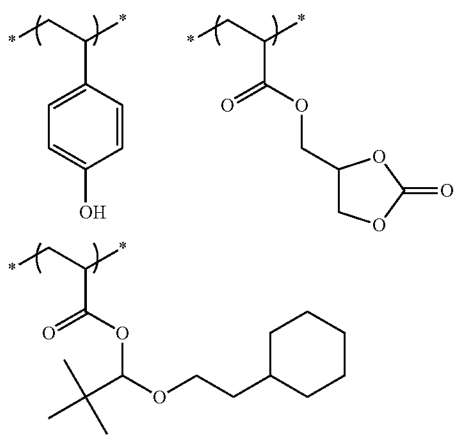
(Ab-55)
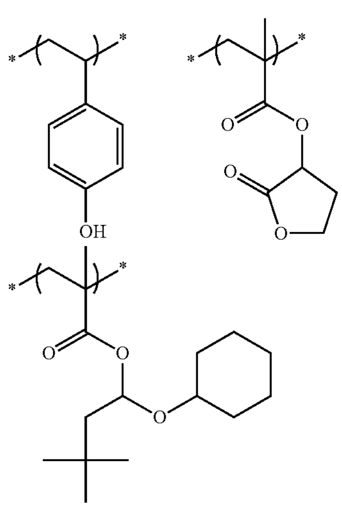
(Ab-56)
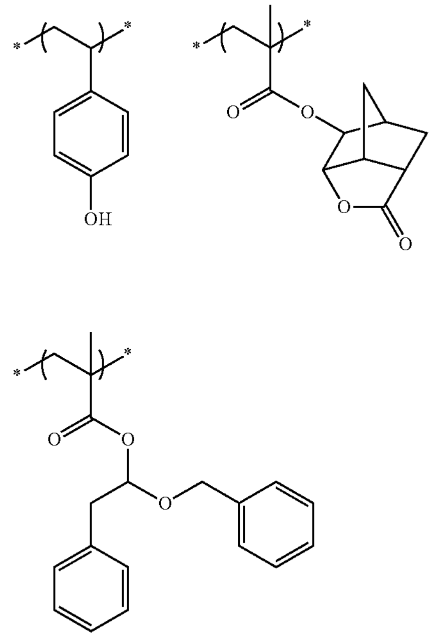
(Ab-57)
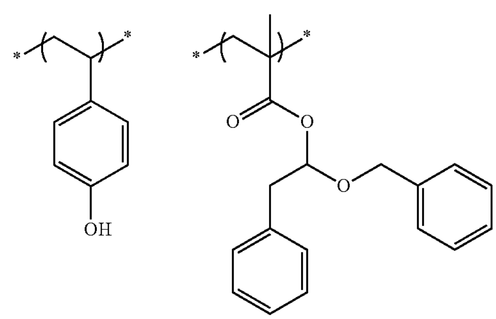
(Ab-58)
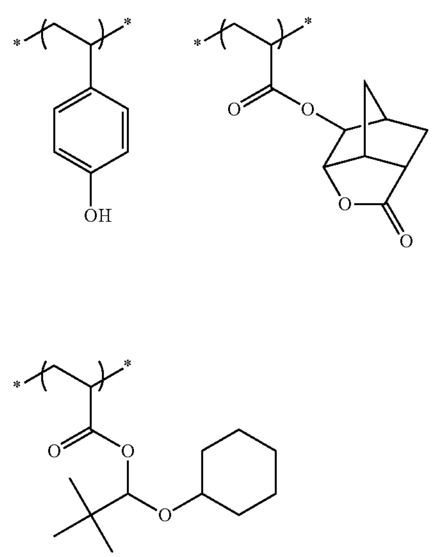

-continued

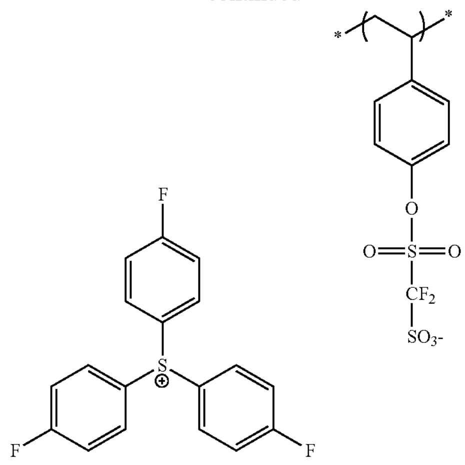

(Ab-59)

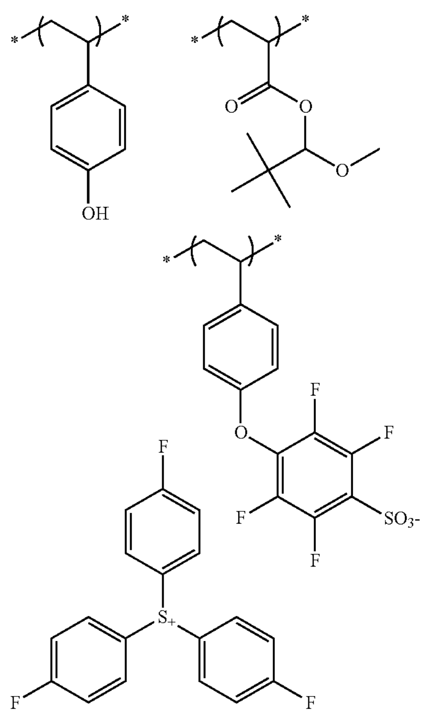

(Ab-60)

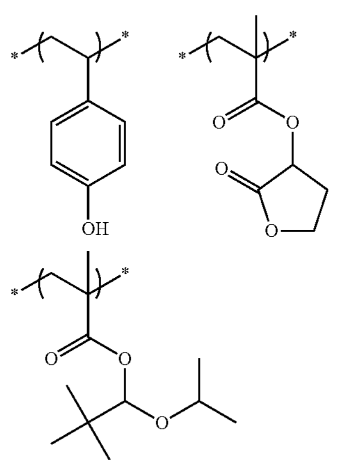

-continued

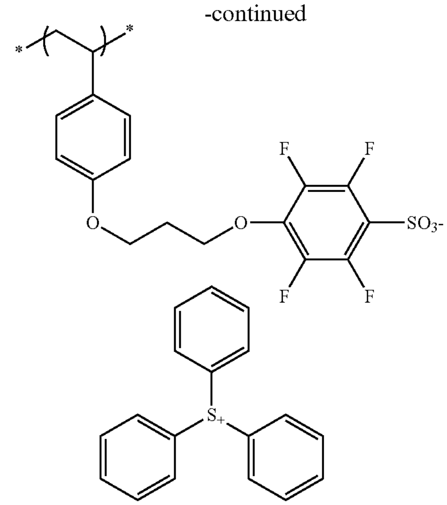

(Ab-61)

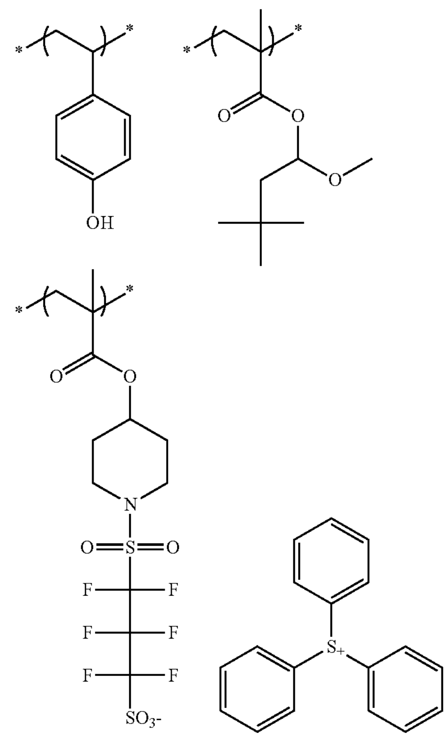

The form of the resin (Ab) for use in the present invention may be any of random type, block type, comb type and star type.

The resin (Ab) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

Examples of the general synthesis method include a batch polymerization method of dissolving unsaturated monomers and a polymerization initiator in a solvent and heating the solution, thereby effecting the polymerization, and a dropping polymerization method of adding dropwise a solution containing unsaturated monomers and a polymerization initiator to a heated solvent over 1 to 10 hours. A dropping polymerization method is preferred.

The solvent used for the polymerization includes, for example, a solvent which can be used when preparing the later-described actinic ray-sensitive or radiation-sensitive resin composition, and it is more preferred to perform the polymerization by using the same solvent as the solvent used in the composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, and dimethyl 2,2'-azobis (2-methylpropionate). If desired, the polymerization may be performed in the presence of a chain transfer agent (e.g., alkylmercaptan).

The concentration during the reaction is from 5 to 70 mass %, preferably from 10 to 50 mass %, and the reaction temperature is usually from 10 to 150° C., preferably from 30 to 120° C., more preferably from 40 to 100° C.

The reaction time is usually from 1 to 48 hours, preferably from 1 to 24 hours, more preferably from 1 to 12 hours.

After the completion of reaction, the reaction solution is allowed to cool to room temperature and purified. In the purification, a conventional method, for example, a liquid-liquid extraction method of applying water washing or combining an appropriate solvent to remove residual monomers or oligomer components, a purification method in a solution sate, such as ultrafiltration of removing by extraction only polymers having a molecular weight lower than a specific molecular weight, a reprecipitation method of adding dropwise the resin solution to a poor solvent to solidify the resin in the poor solvent and thereby remove residual monomers or the like, or a purification method in a solid state, such as washing of the resin slurry with a poor solvent after separation of the slurry by filtration, may be applied. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, and dimethyl 2,2'-azobis (2-methylpropionate). The initiator is added additionally or in parts, if desired. After the completion of reaction, the reaction product is poured in a solvent, and the desired polymer is collected, for example, by a method for powder or solid recovery. The concentration during the reaction is from 5 to 50 mass %, preferably from 10 to 30 mass %, and the reaction temperature is usually from 10 to 150° C., preferably from 30 to 120° C., more preferably from 60 to 100° C.

The molecular weight of the resin (Ab) according to the present invention is not particularly limited, but the weight average molecular weight is preferably from 1,000 to 100,000, more preferably from 1,500 to 60,000, still more preferably from 2,000 to 30,000. When the weight average molecular weight is from 1,000 to 100,000, the heat resistance and dry etching resistance can be kept from deterioration and at the same time, the film-forming property can be prevented from becoming poor due to impairment of developability or increase in the viscosity. Here, the weight average molecular weight of the resin indicates a molecular weight in terms of polystyrene measured by GPC (carrier: THF (tetrahydrofuran) or N-methyl-2-pyrrolidone (NMP)).

The polydispersity (Mw/Mn) is preferably from 1.00 to 5.00, more preferably from 1.03 to 3.50, still more preferably from 1.05 to 2.50. As the molecular weight distribution is narrower, the resolution and resist profile are more excellent, the side wall of the resist pattern is smoother, and the roughness is more improved.

As for the resin (Ab) used in the present invention, one kind of a resin may be used alone, or two or more kinds of resins may be used in combination. The content of the resin (Ab) is preferably from 20 to 99 mass %, more preferably from 30 to 89 mass %, still more preferably from 40 to 79 mass %, based on the total solid content in the actinic ray-sensitive or radiation-sensitive resin composition of the present invention.

[2] (B) Resin Capable of Decomposing by the Action of an Acid to Change in the Solubility for a Developer, which is Different from the Resin (Ab)

The actinic ray-sensitive or radiation-sensitive resin composition of the present invention may contain a resin capable of decomposing by the action of an acid to change in the solubility for a developer, which is different from the resin (Ab) (hereinafter, the resin is sometimes referred to as "resin (B)").

The resin (B) is a resin having a structure where a polar group is protected by a leaving group capable of decomposing and leaving by the action of an acid (hereinafter, sometimes referred to as "acid-decomposable group").

The resin (B) preferably contains a repeating unit having an acid-decomposable group.

Examples of the polar group include a carboxyl group, a phenolic hydroxyl group, an alcoholic hydroxyl group, a sulfonic acid group, and a thiol group.

Examples of the group capable of leaving by the action of an acid include —$C(R_{36})(R_{37})(R_{38})$, —$C(R_{36})(R_{37})(OR_{39})$, —C(=O)—O—$C(R_{36})(R_{37})(R_{38})$, —$C(R_{01})(R_{02})(OR_{39})$, and —$C(R_{01})(R_{02})$—C(=O)—O—$C(R_{36})(R_{37})(R_{38})$.

In the formulae above, each of $R_{36}$ to $R_{39}$ independently represents an alkyl group, a cycloalkyl group, an aryl group, an aralkyl group or an alkenyl group, and $R_{36}$ and $R_{37}$ may combine with each other to form a ring. Each of $R_{01}$ and $R_{02}$ independently represents a hydrogen atom, an alkyl group, a cycloalkyl group, an aryl group, an aralkyl group or an alkenyl group.

The resin (B) can be synthesized by a conventional method (for example, radical polymerization).

The weight average molecular weight of the resin (B) is preferably from 1,000 to 200,000, more preferably from 2,000 to 20,000, still more preferably from 3,000 to 15,000, yet still more preferably from 3,000 to 10,000, in terms of polystyrene as measured by the GPC method. When the weight average molecular weight is from 1,000 to 200,000, the heat resistance and dry etching resistance can be kept from deterioration and at the same time, the film-forming property can be prevented from becoming poor due to impairment of developability or increase in the viscosity.

The polydispersity (molecular weight distribution) is usually from 1 to 3, preferably from 1 to 2.6, more preferably from 1 to 2, still more preferably from 1.4 to 1.7. As the molecular weight distribution is narrower, the resolution and resist profile are more excellent, the side wall of the resist pattern is smoother, and the roughness is more improved.

As for the resin (B), two or more kinds of resins may be used in combination.

The actinic ray-sensitive or radiation-sensitive resin composition of the present invention may or may not contain the resin (B), but in the case of containing the resin (B), the content thereof is usually from 1 to 50 mass %, preferably from 1 to 30 mass %, more preferably from 1 to 15 mass %, based on the total solid content of the actinic ray-sensitive or radiation-sensitive resin composition.

Examples of the resin (B) include those described in paragraphs [0059] to [0169] of JP-A-2010-217884 and paragraphs [0214] to [0594] of Japanese Patent Application No. 2011-217048.

[3] (B) Compound Capable of Generating an Acid Upon Irradiation with an Actinic Ray or Radiation The composition of the present invention preferably contains a compound capable of generating an acid upon irradiation with an actinic ray or radiation (hereinafter, sometimes referred to as "acid generator" or "photoacid generator").

The acid generator is not particularly limited as long as it is a known acid generator, but a compound capable of generating an organic acid, for example, at least any one of a sulfonic acid, a bis(alkylsulfonyl)imide and a tris(alkylsulfonyl)methide, upon irradiation with an actinic ray or radiation is preferred.

The (B) compound capable of generating an acid upon irradiation with an actinic ray or radiation may be in a low molecular compound form or in a form of being incorporated into a part of a polymer. Also, a low molecular compound form and a form of being incorporated into a part of a polymer may be used in combination.

In the case where the (B) compound capable of generating an acid upon irradiation with an actinic ray or radiation is in a low molecular compound form, the molecular weight is preferably 3,000 or less, more preferably 2,000 or less, still more preferably 1,000 or less.

In the case where the (B) compound capable of generating an acid upon irradiation with an actinic ray or radiation is in a form of being incorporated into a part of a polymer, the compound may be incorporated into a part of the above-described acid-decomposable resin or may be incorporated into a resin different from the acid-decomposable resin.

More preferred compounds include compounds represented by the following formulae (ZI), (ZII) and (ZIII):

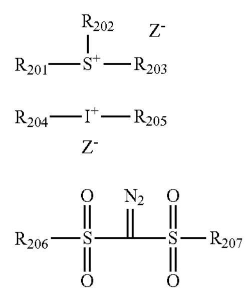

(ZI)

(ZII)

(ZIII)

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. The group formed by combining two members out of $R_{201}$ to $R_{203}$ includes an alkylene group (e.g., butylene group, pentylene group).

$Z^-$ represents a non-nucleophilic anion (an anion having an extremely low ability of causing a nucleophilic reaction).

Examples of the non-nucleophilic anion include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples of the substituent include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group or ring structure, which each group has, may further have an alkyl group (preferably having a carbon number of 1 to 15) as a substituent.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Also, the alkyl groups in the bis(alkylsulfonyl)imide anion may combine with each other to form a ring structure. In this case, the acid strength is increased.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl) benzenesulfonate anion.

As regards the acid strength, the pKa of the acid generated is preferably −1 or less for enhancing the sensitivity.

An anion represented by the following formula (AN1) is also a preferred embodiment of the non-nucleophilic anion:

(AN1)

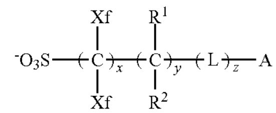

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$s or $R^2$s are present, each $R^1$ or $R^2$ may be the same as or different from every other $R^1$ or $R^2$.

L represents a divalent linking group, and when a plurality of L's are present, each L may be the same as or different from every other L.

A represents a cyclic organic group.

x represents an integer of 1 to 20, y represents an integer of 0 to 10, and z represents an integer of 0 to 10.

Formula (AN1) is described in more detail.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

x is preferably from 1 to 10, more preferably from 1 to 5.

y is preferably from 0 to 4, more preferably 0.

z is preferably from 0 to 5, more preferably from 0 to 3.

The divalent linking group of L is not particularly limited and includes, for example, —COO—, —OCO—, —CO—, —O—, —S—, —SO—, —$SO_2$—, an alkylene group, a cycloalkylene group, an alkenylene group, and a linking group formed by combining a plurality thereof. A linking group having a total carbon number of 12 or less is preferred. Among these, —COO—, —COO—, —CO— and —O— are preferred, and —COO—, —COO— are more preferred.

The cyclic organic group of A is not particularly limited as long as it has a cyclic structure, and examples thereof include an alicyclic group, an aryl group and a heterocyclic group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film during heating after exposure can be suppressed and MEEF can be improved.

The aryl group includes a benzene ring, a naphthalene ring, a phenanthrene ring, and an anthracene ring.

The heterocyclic group includes those derived from a furan ring, a thiophene ring, a benzofuran ring, a benzothiophene ring, a dibenzofuran ring, a dibenzothiophene ring and a pyridine ring. Among these, heterocyclic groups derived from a furan ring, a thiophene ring and a pyridine ring are preferred.

The cyclic organic group also includes a lactone structure. Specific examples thereof include lactone structures represented by formulae (LC1-1) to (LC1-17) which may be contained in the resin (Ab).

The cyclic organic group may have a substituent, and examples of the substituent include an alkyl group (may be any of linear, branched or cyclic; preferably having a carbon number of 1 to 12), a cycloalkyl group (may be any of monocyclic, polycyclic or spirocyclic; preferably having a carbon number of 3 to 20), an aryl group (preferably having a carbon number of 6 to 14), a hydroxy group, an alkoxy group, an ester group, an amide group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

Examples of the organic group of $R_{201}$, $R_{202}$ and $R_{203}$ include an aryl group, an alkyl group, and a cycloalkyl group.

At least one of three members $R_{201}$, $R_{202}$ and $R_{203}$ is preferably an aryl group, and it is more preferred that all of these three members are an aryl group. The aryl group may be a heteroaryl group such as indole residue and pyrrole residue, other than a phenyl group, a naphthyl group and the like. The alkyl group and cycloalkyl group of $R_{201}$ to $R_{203}$ may be preferably a linear or branched alkyl group having a carbon number of 1 to 10 and a cycloalkyl group having a carbon number of 3 to 10. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

In the case where two members out of $R_{201}$ to $R_{203}$ are combined to form a ring structure, the ring structure is preferably a structure represented by the following formula (A1):

(A1)

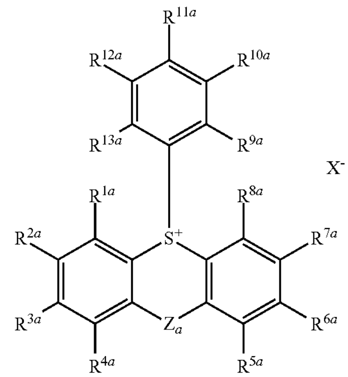

In formula (A1), each of $R^{1a}$ to $R^{13a}$ independently represents a hydrogen atom or a substituent.

It is preferred that from one to three members out of $R^{1a}$ to $R^{13a}$ are not a hydrogen atom; and it is more preferred that any one of $R^{9a}$ to $R^{13a}$ is not a hydrogen atom.

Za represents a single bond or a divalent linking group.

$X^-$ has the same meaning as $Z^-$ in formula (ZI).

Specific examples of $R^{1a}$ to $R^{13a}$ when these are not a hydrogen atom include a halogen atom, a linear, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$), and other known substituents.

In the case where $R^{1a}$ to $R^{13a}$ are not a hydrogen atom, each of $R^{1a}$ to $R^{13a}$ is preferably a linear, branched or cyclic alkyl group substituted with a hydroxyl group.

Examples of the divalent linking group of Za include an alkylene group, an arylene group, a carbonyl group, a sulfonyl group, a carbonyloxy group, a carbonylamino group, a sulfonylamide group, an ether bond, a thioether bond, an amino group, a disulfide group, $—(CH_2)_n—CO—$, $—(CH_2)_n—SO_2—$, $—CH{=}CH—$, an aminocarbonylamino group, and an aminosulfonylamino group (n is an integer of 1 to 3).

Incidentally, when at least one of $R_{201}$, $R_{202}$ and $R_{203}$ is not an aryl group, the preferred structure includes a cation structure such as compounds described in paragraphs 0047 and 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI).

The aryl group, alkyl group and cycloalkyl group of $R_{204}$ to $R_{207}$ may have a substituent. Examples of the substituent include those of the substituent which may be substituted on the aryl group, alkyl group and cycloalkyl group of $R_{201}$ to $R_{203}$ in the compound (ZI).

$Z^-$ represents a non-nucleophilic anion, and examples thereof are the same as those of the non-nucleophilic anion of $Z^-$ in formula (ZI).

The acid generator further includes compounds represented by the following formulae (ZIV), (ZV) and (ZVI):

(ZIV)

$$Ar_3—SO_2—SO_2—Ar_4$$

(ZV)

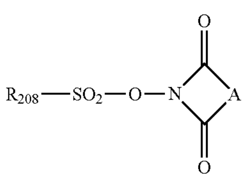

-continued (ZVI)

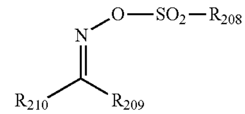

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

Out of the acid generators, particularly preferred examples are illustrated below.

(z1)

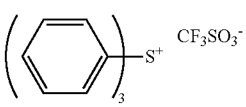

(z2)

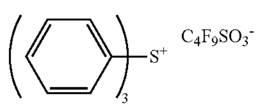

(z3)

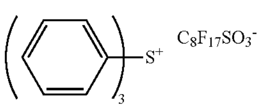

(z4)

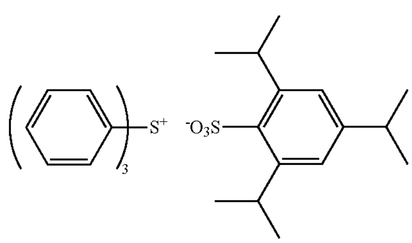

(z5)

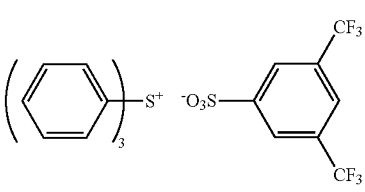

(z6)

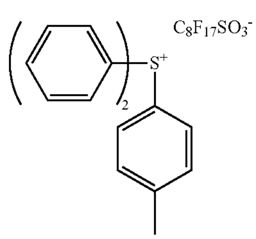

(z7)

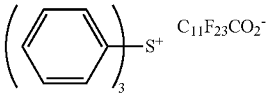

(z8)

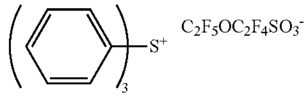

-continued
(z9)
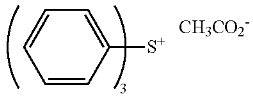
(z10)
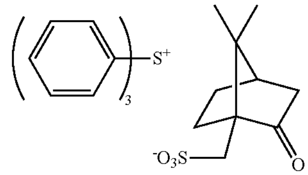
(z11)
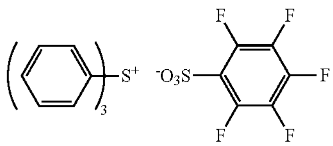
(z12)
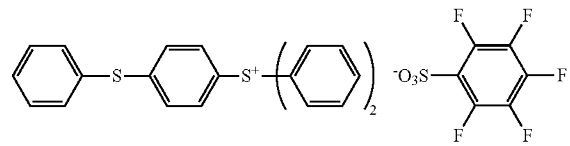
(z13)
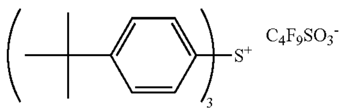
(z14)
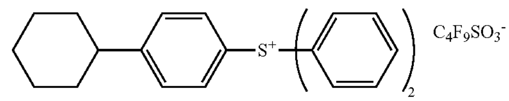
(z15)
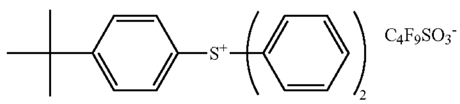
(z16)
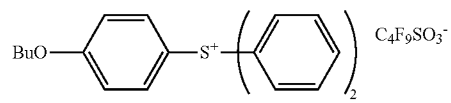
(z17)
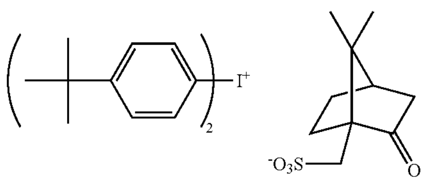
(z18)
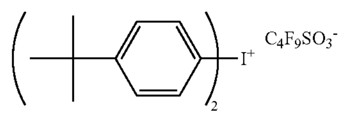
(z19)
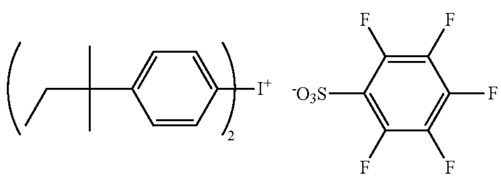
(z20)
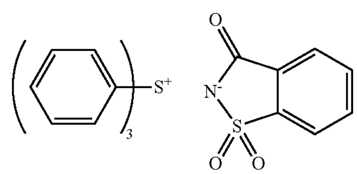
(z21)
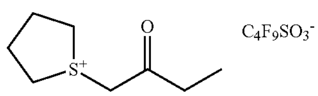
(z22)
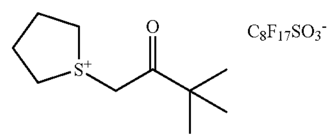
(z23)
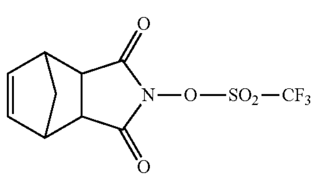
(z24)
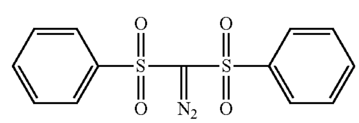
(z25)
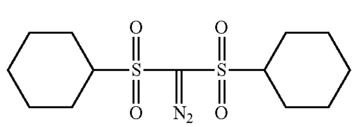
(z26)
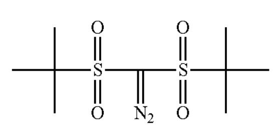
(z27)
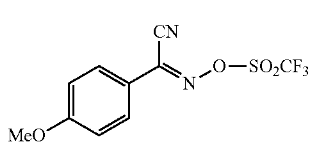
(z28)
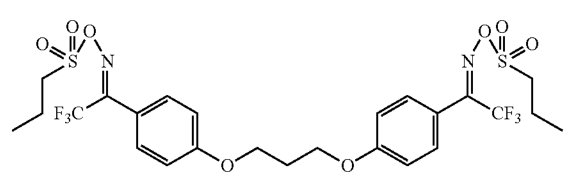

-continued
(z29)
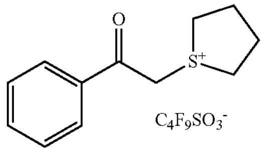
(z30)
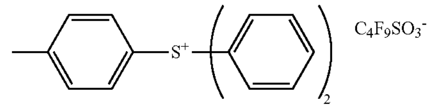
(z31)
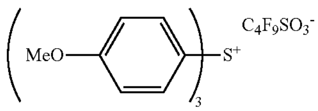
(z32)
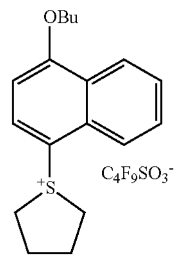
(z33)
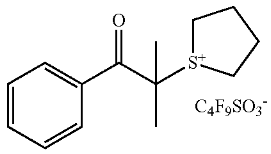
(z34)
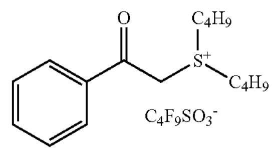
(z35)
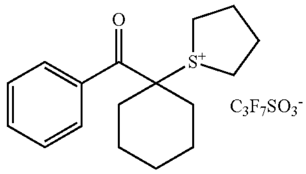
(z36)
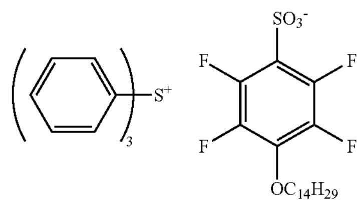
(z37)
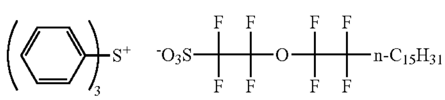
(z38)
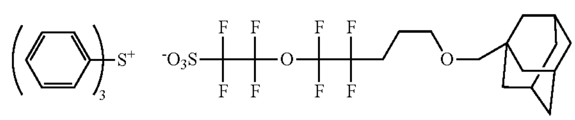
(z39)
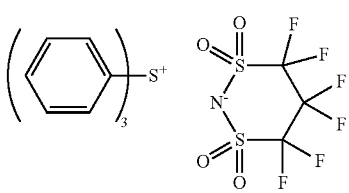
(z40)
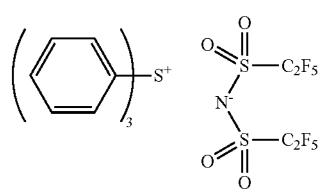
(z41)
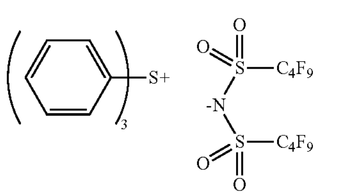
(z42)
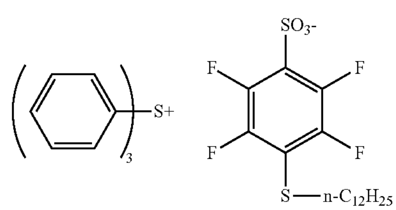
(z43)
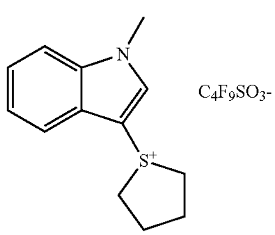
(z44)
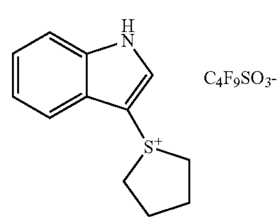

-continued
(z45)
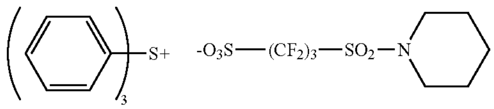
(z46)
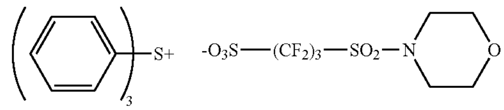
(z47)
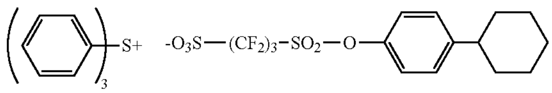
(z48)
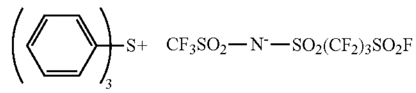
(z49)
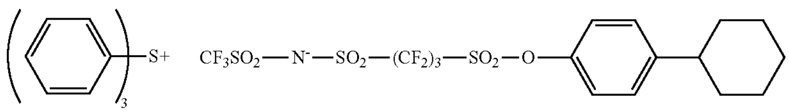
(z50)
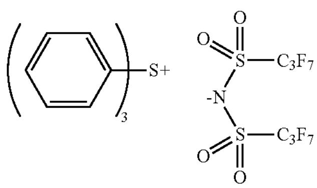
(z51)
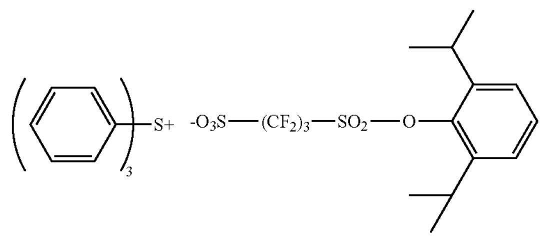
(z52)
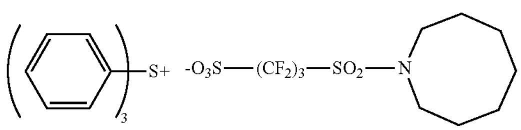
(z53)
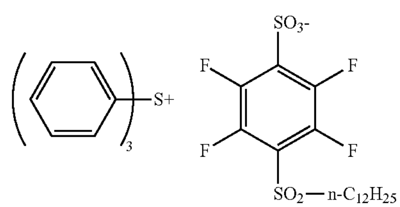
(z54)
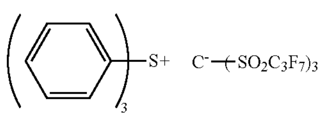
(z55)
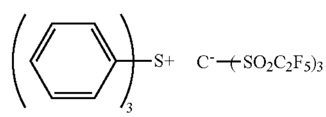
(z56)
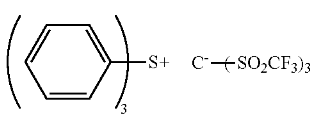
(z57)
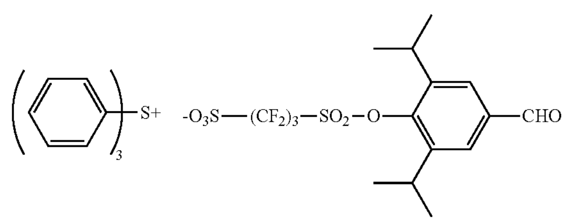
(z58)
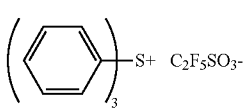
(z59)
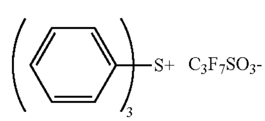
(z60)
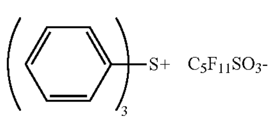
(z61)
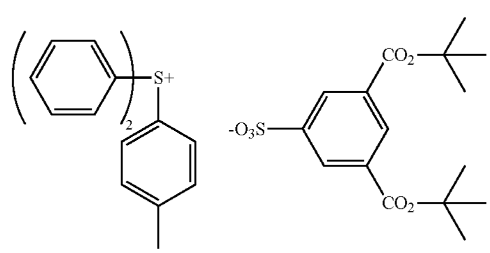

-continued
(z62)
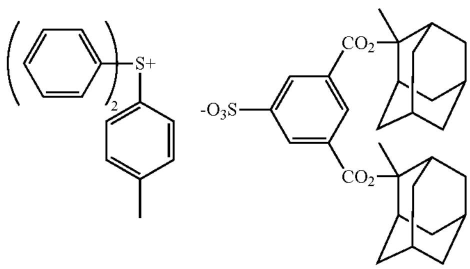
(z63)
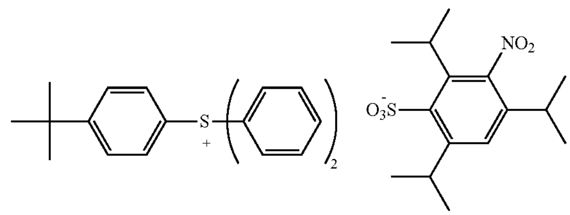
(z64)
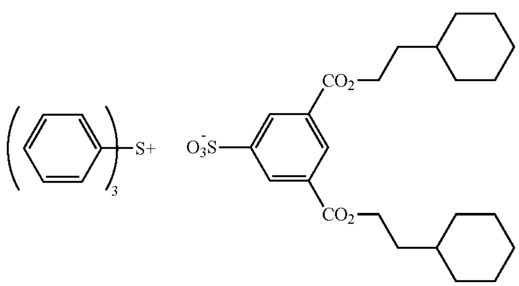
(z65)
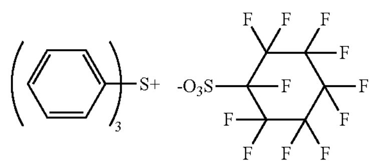
(z66)
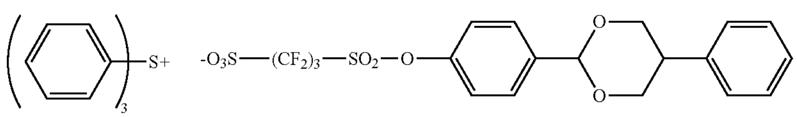
(z67)
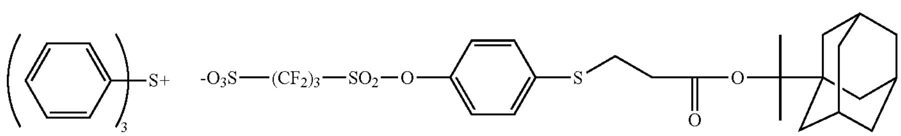
(z68)
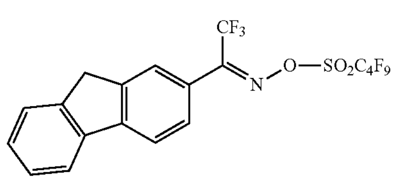
(z69)
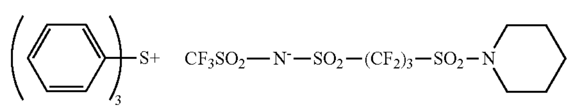
(z70)
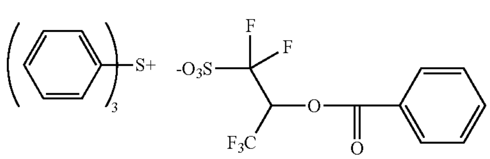
(z71)
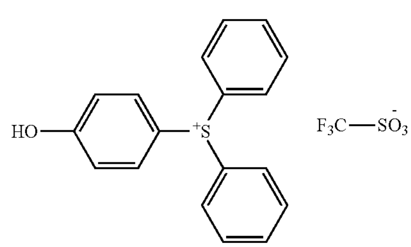
(z72)
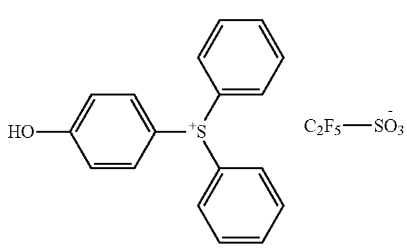
(z73)
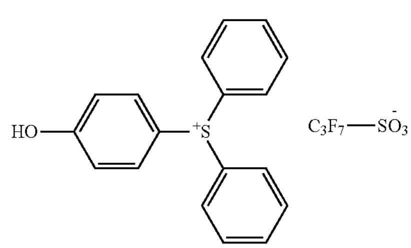

-continued
(z74)
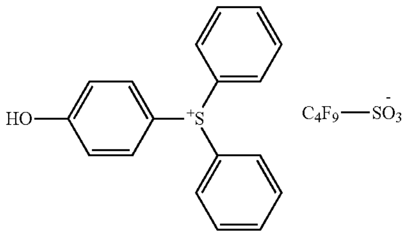
(z75)
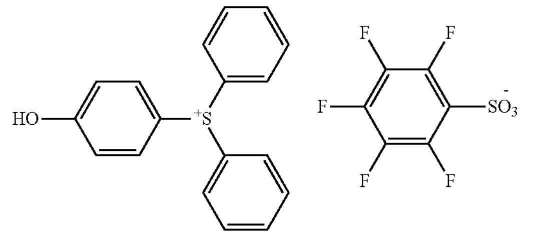
(z76)
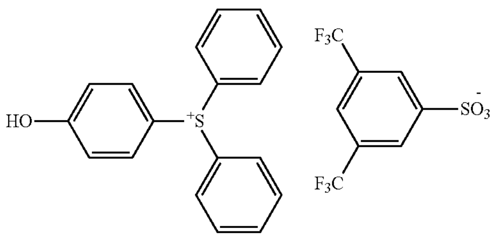
(z77)
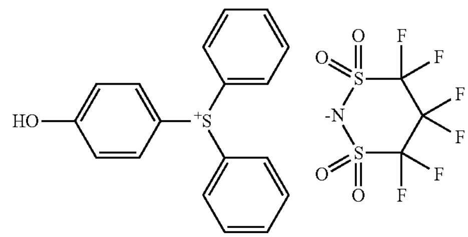
(z78)
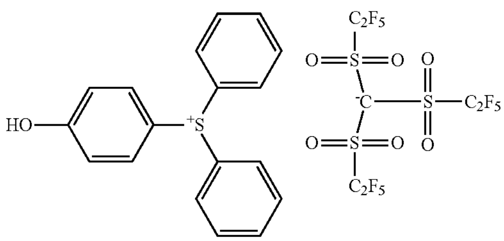
(z79)
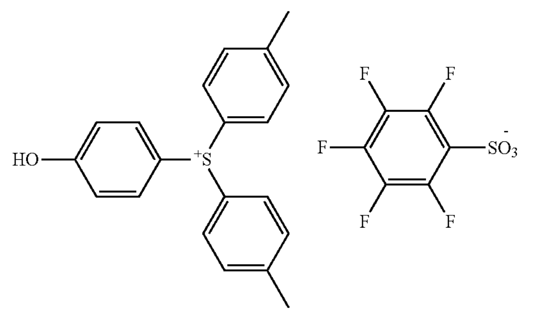
(z80)
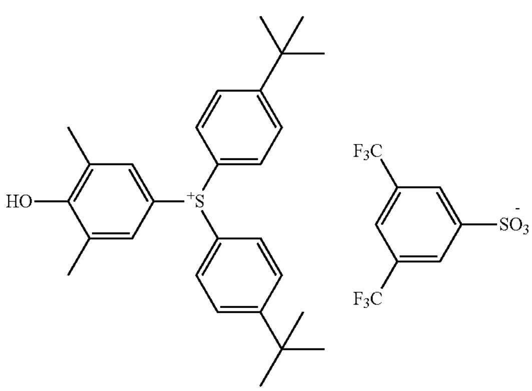
(z81)
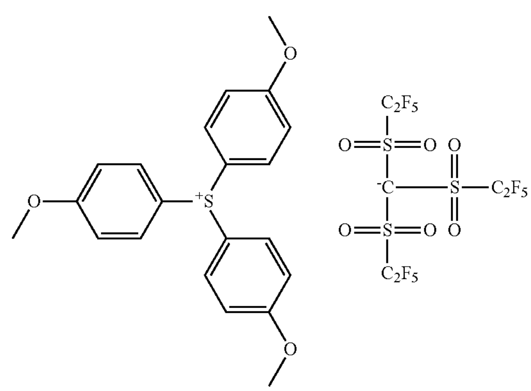
(z82)
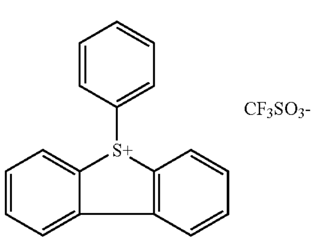
(z83)
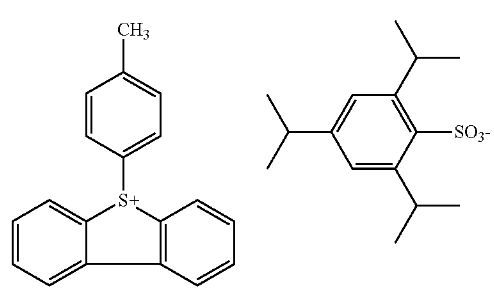

-continued
(z84)
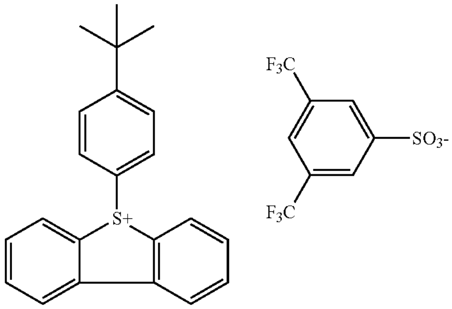
(z85)
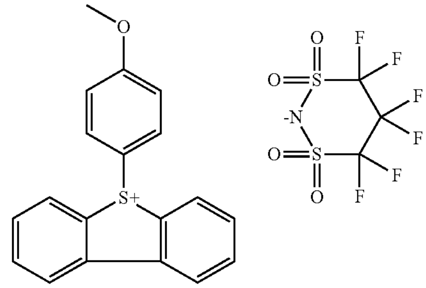
(z86)
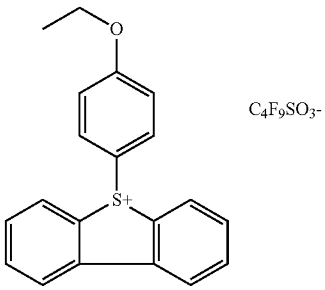
(z87)
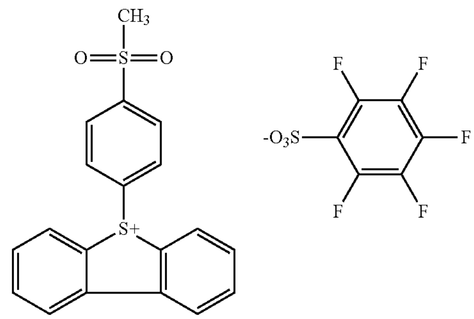
(z88)
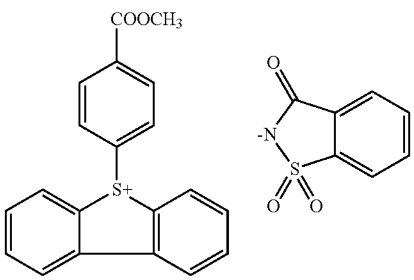
(z89)
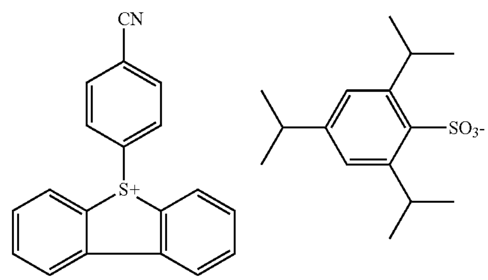
(z90)
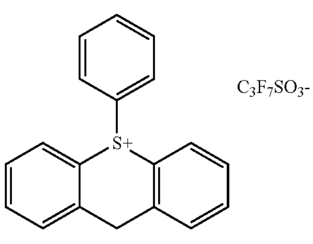
(z91)
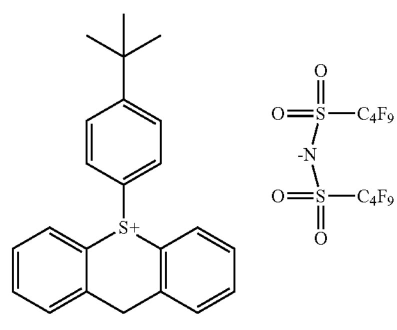
(z92)
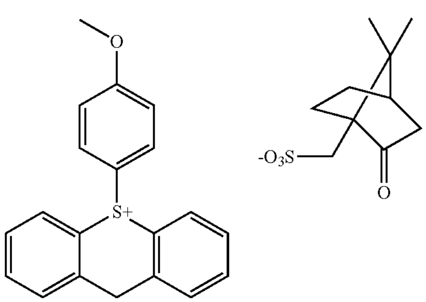
(z93)
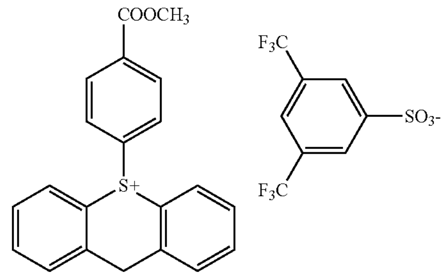

-continued
(z94)
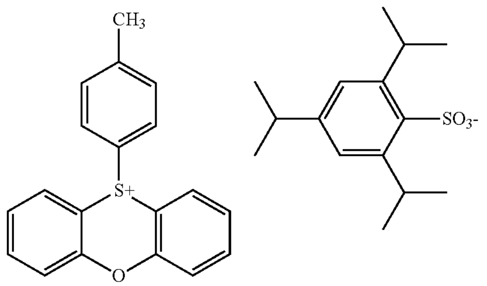
(z95)
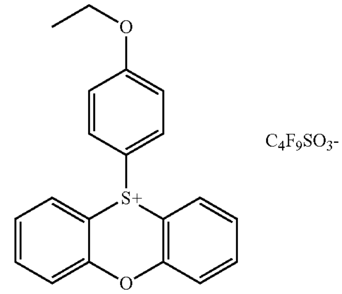
(z96)
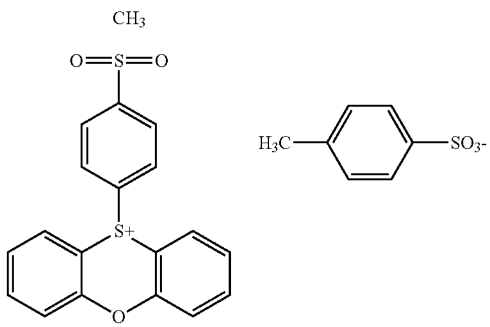
(z97)
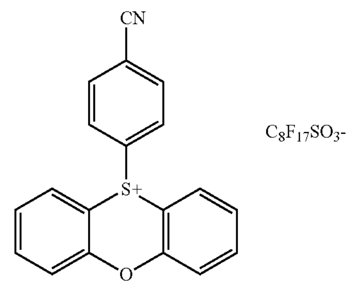
(z98)
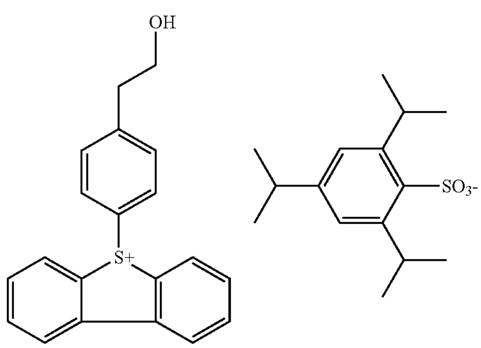
(z99)
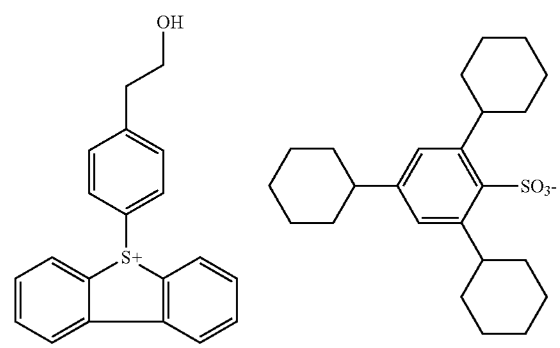
(z100)
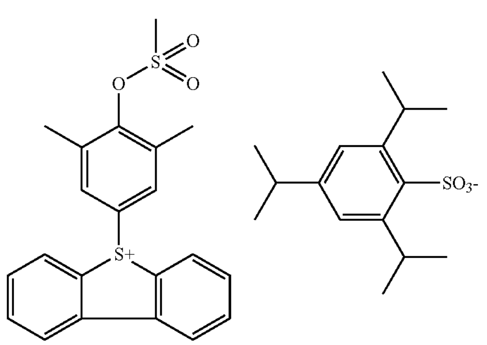
(z101)
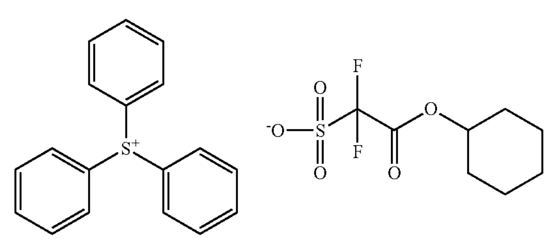
(z102)
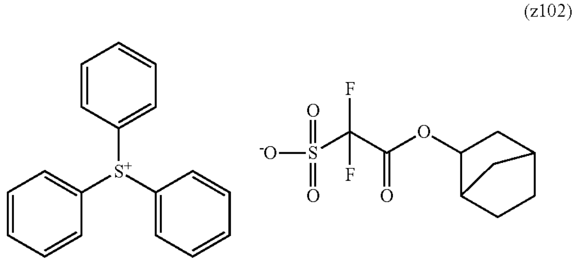
(z103)
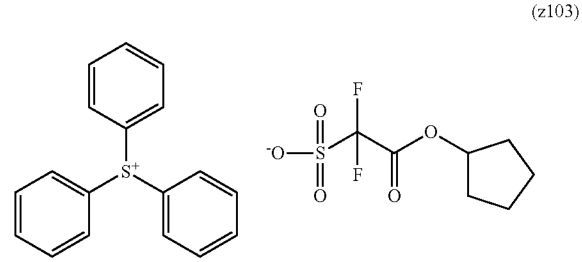

-continued
(z104)
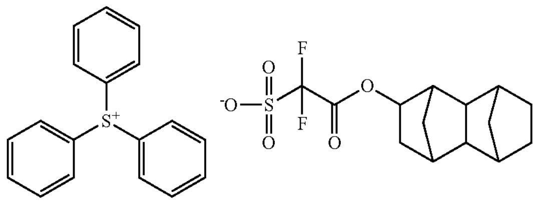
(z105)
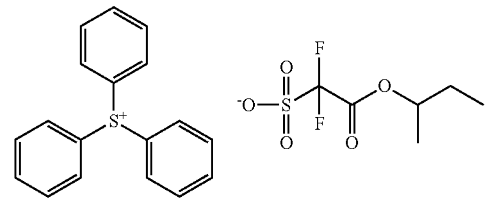
(z106)
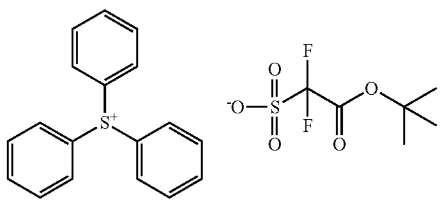
(z107)
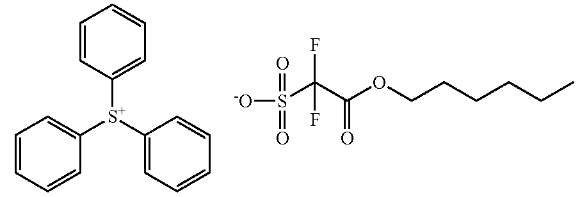
(z108)
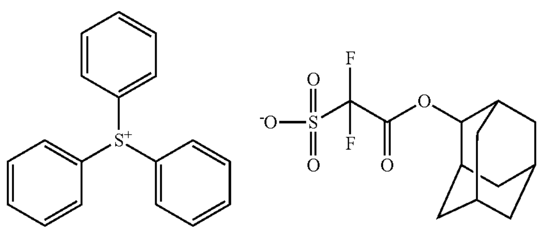
(z109)
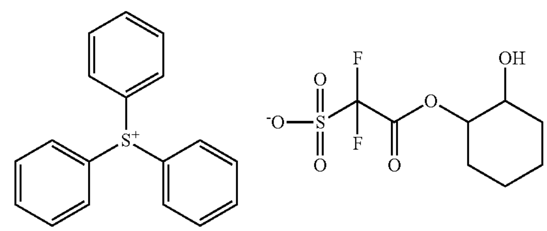
(z110)
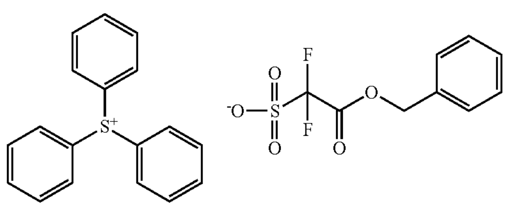
(z111)
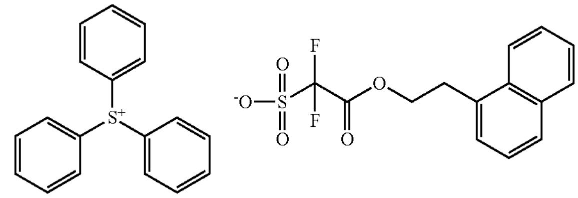
(z112)
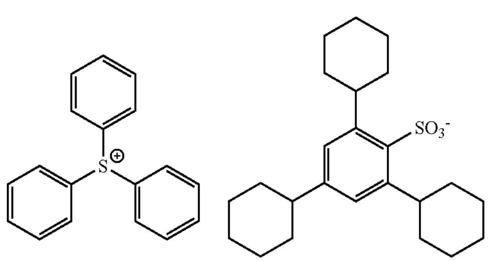
(z113)
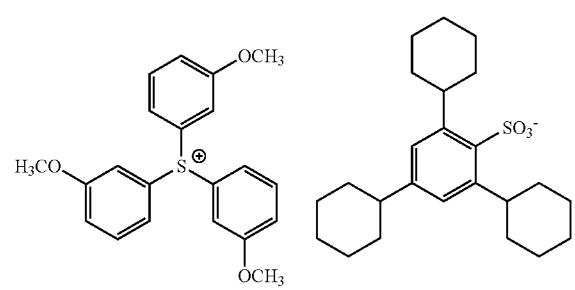
(z114)
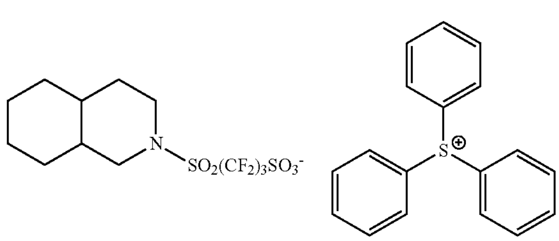

-continued
(z115)
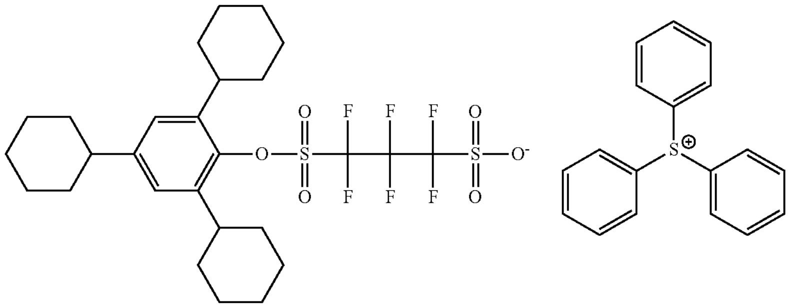
(z116)
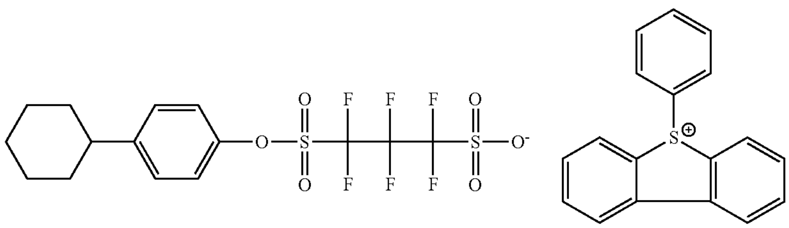
(z117)
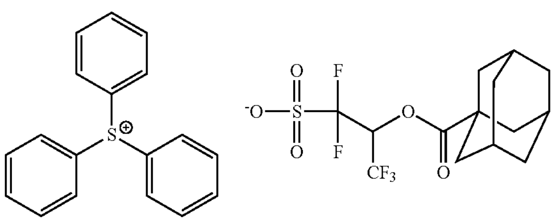
(z118)
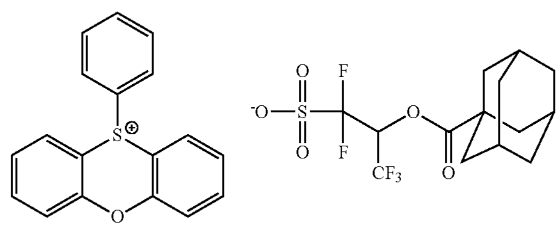
(z119)
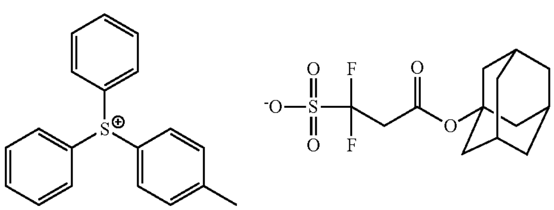
(z120)
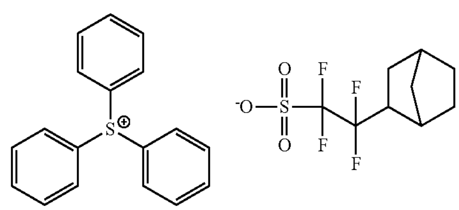
(z121)
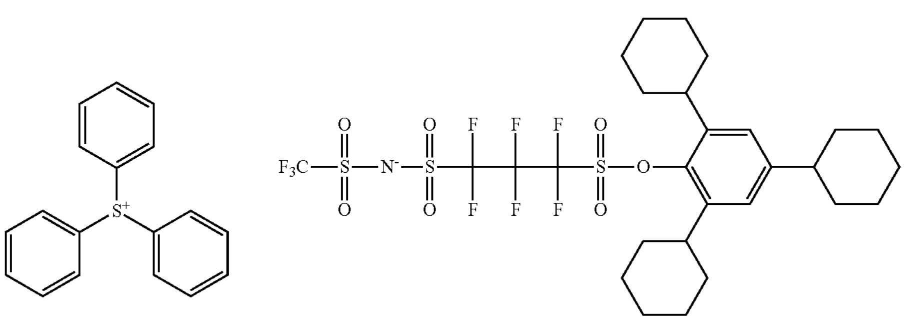

-continued
(z122)
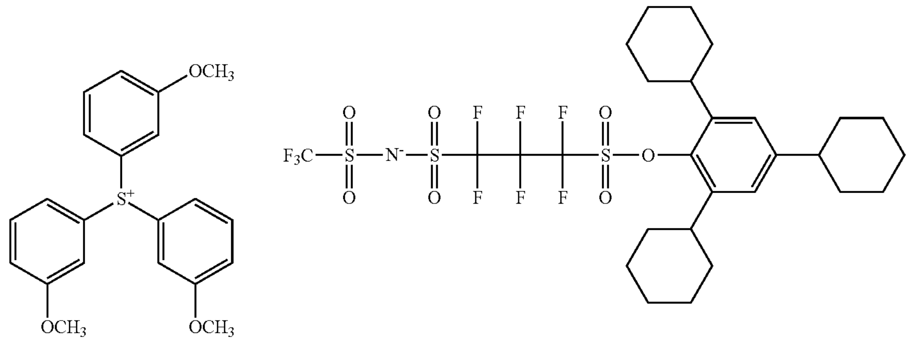
(z123)
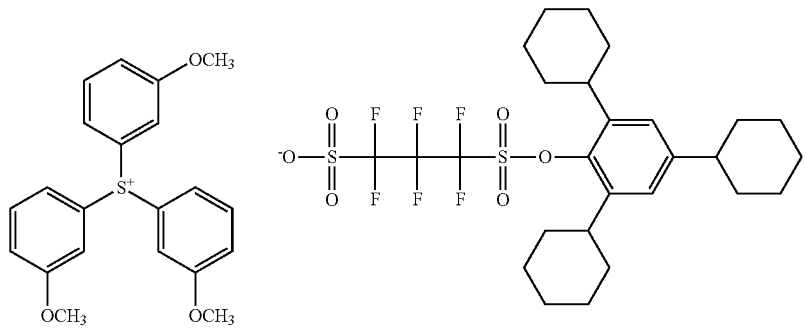
(z124)
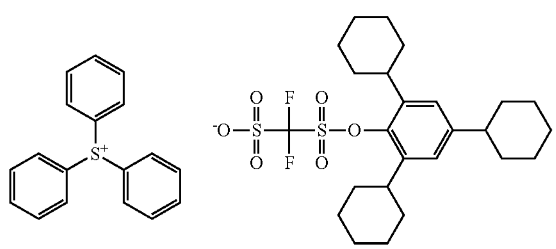
(z125)
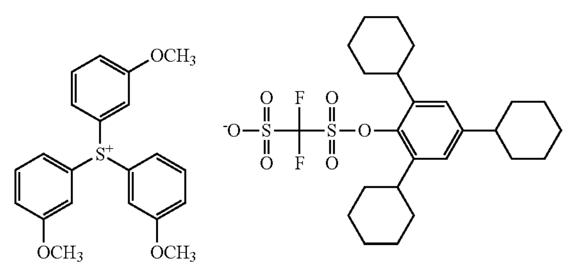
(z126)
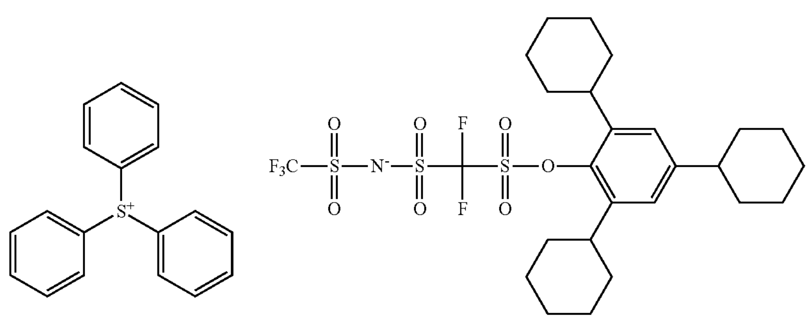
(z127)
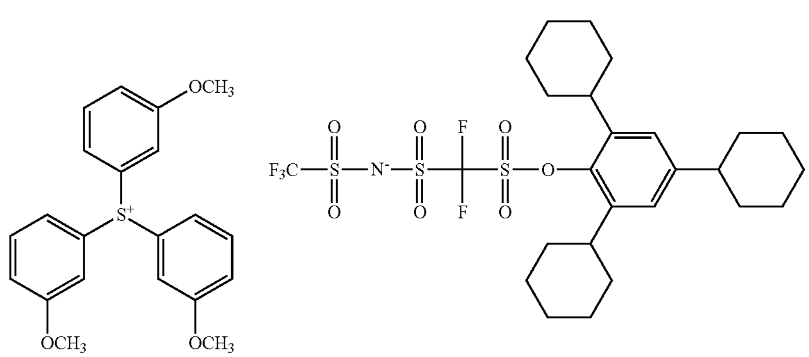

-continued
(z128)
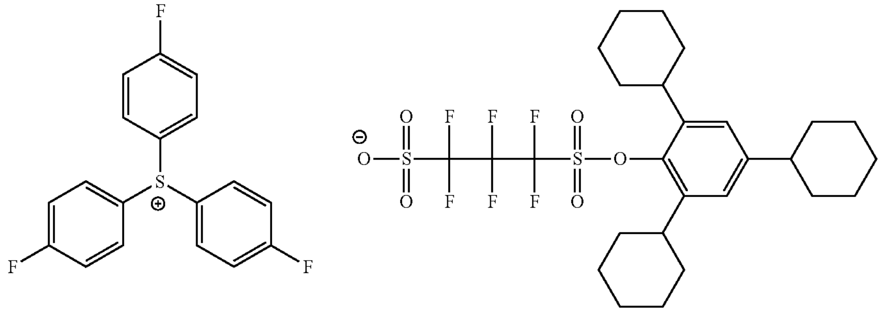
(z129)
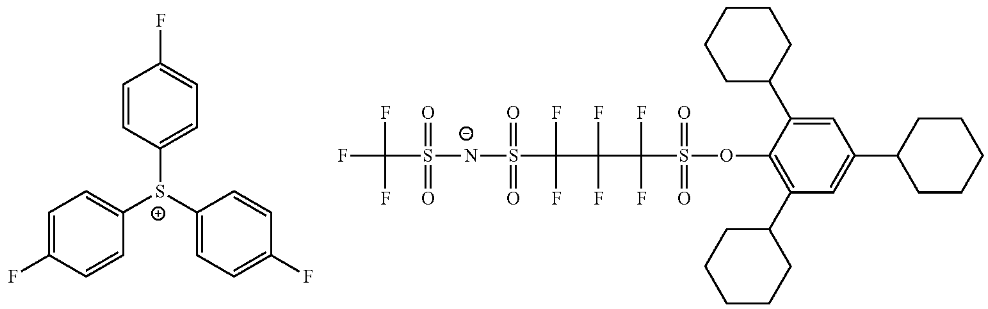
(z130)
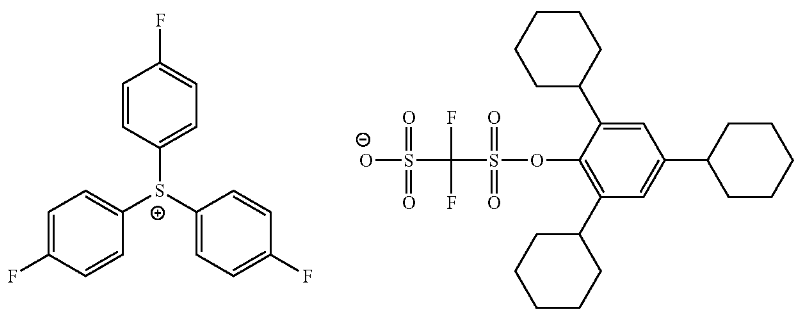
(z131)
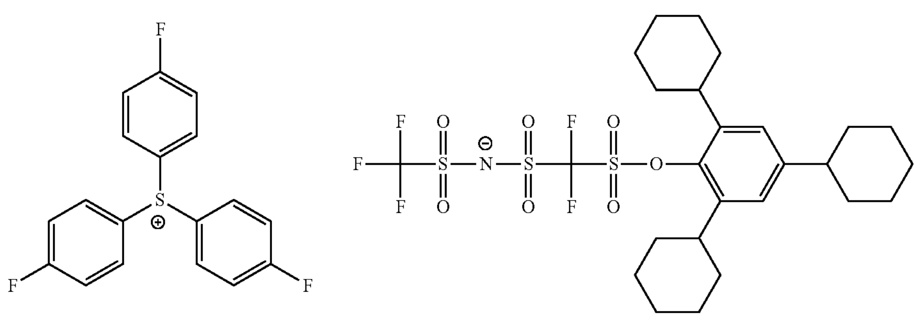
(z132)
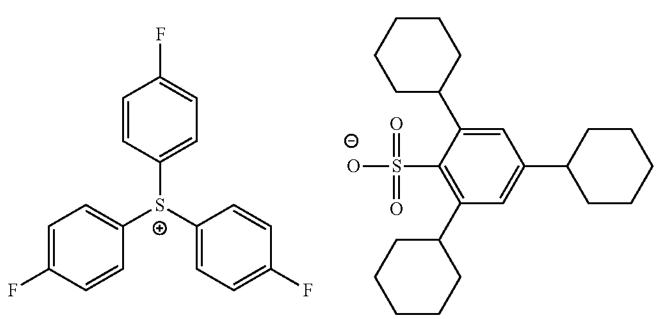

-continued
(z133)
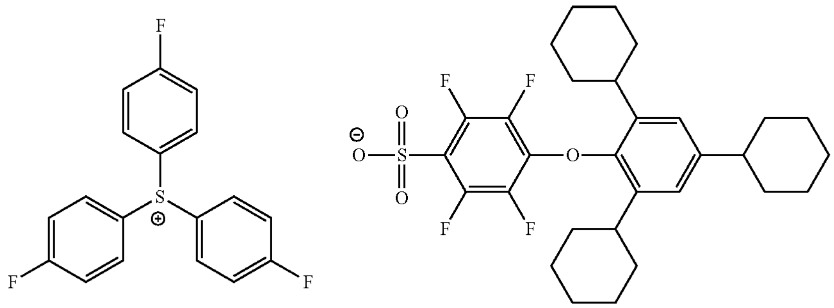
(z134)
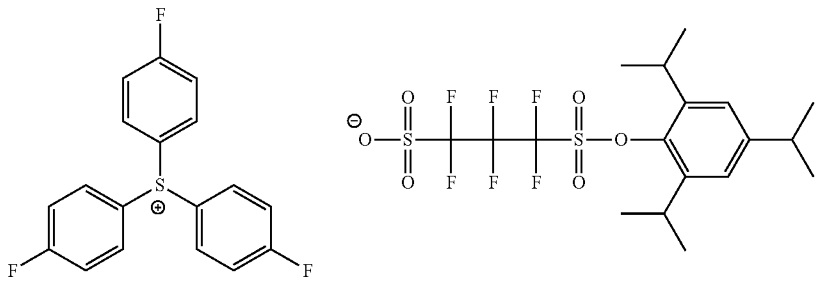
(z135)
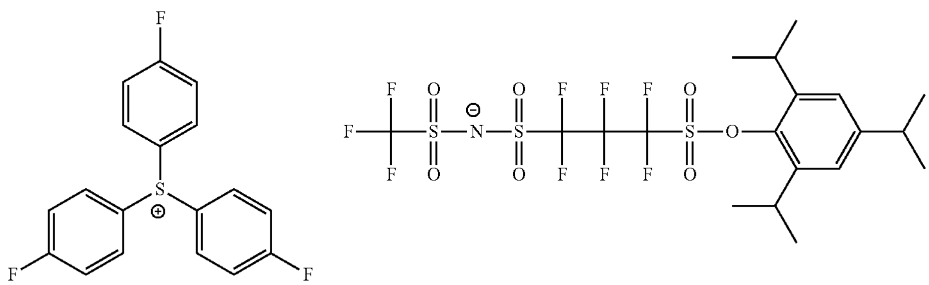
(z136)
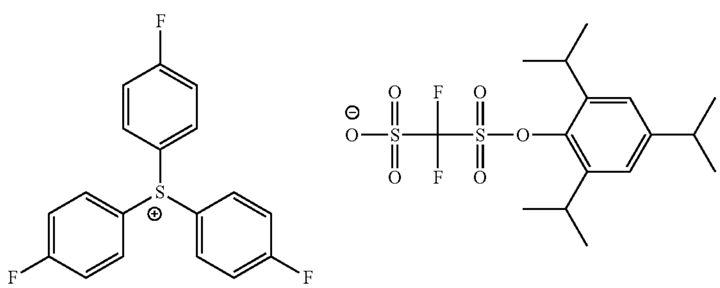
(z137)
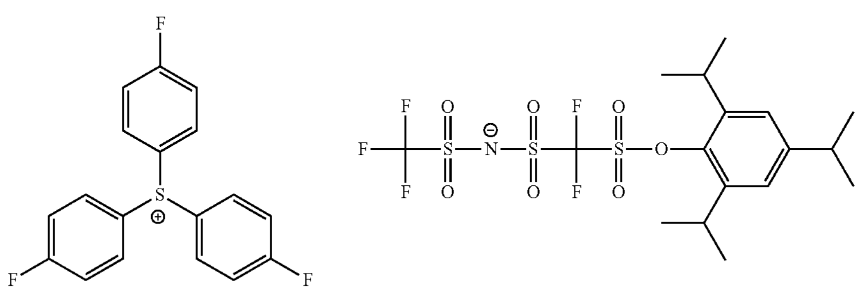

-continued (z138)

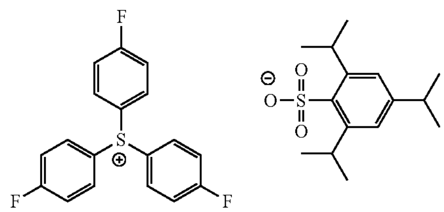

(z139)

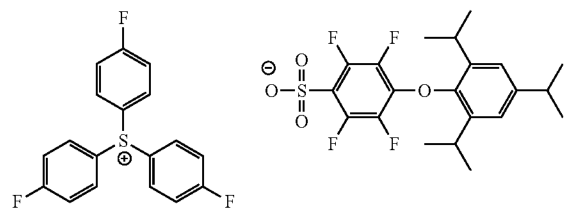

(z140)

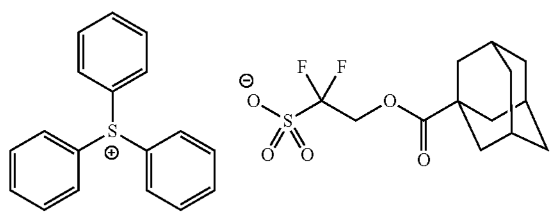

(z141)

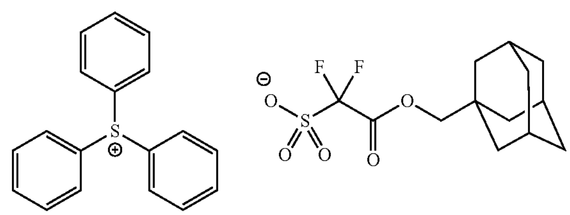

(z142)

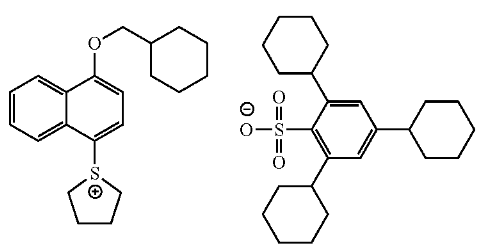

(z143)

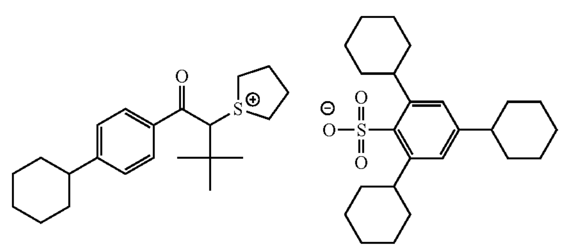

(z144)

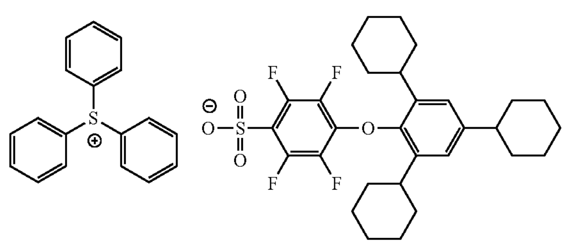

(z145)

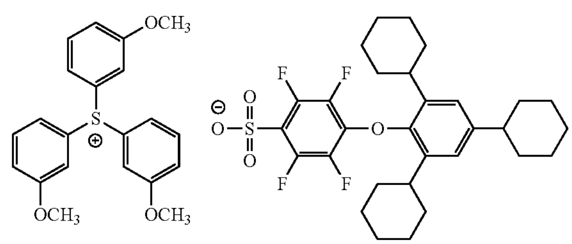

One kind of an acid generator may be used alone, or two or more kinds of acid generators may be used in combination.

The content of the photoacid generator is preferably from 0.1 to 50 mass %, more preferably from 0.5 to 45 mass %, still more preferably from 1 to 40 mass %, based on the total solid content of the composition.

[4] Compound Capable of Decomposing by the Action of an Acid to Generate an Acid The actinic ray-sensitive or radiation-sensitive resin composition of the present invention may further contain one compound or two or more compounds capable of decomposing by the action of an acid to generate an acid. The acid generated from the compound capable of decomposing by the action of an acid to generate an acid is preferably a sulfonic acid, a methide acid or an imide acid.

Examples of the compound capable of decomposing by the action of an acid to generate an acid which can be used in the present invention are illustrated below, but the present invention is not limited thereto.

(PA-1)

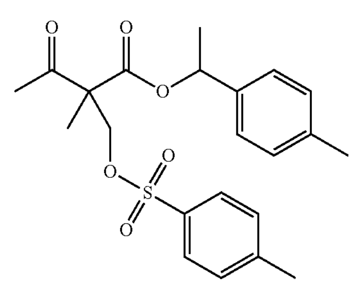

(PA-2)
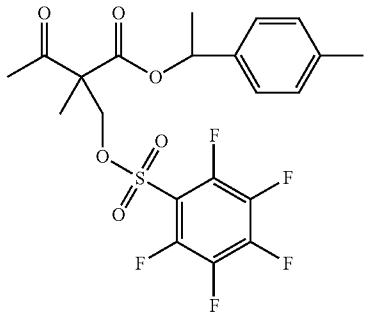
(PA-3)
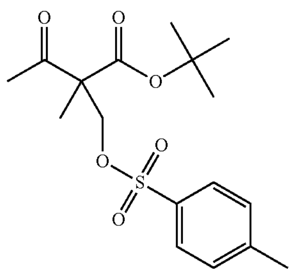
(PA-4)
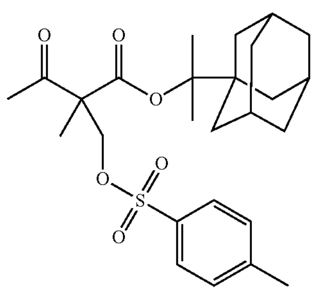
(PA-5)
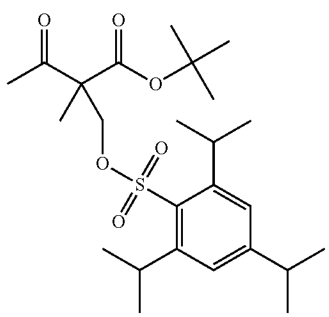
(PA-6)
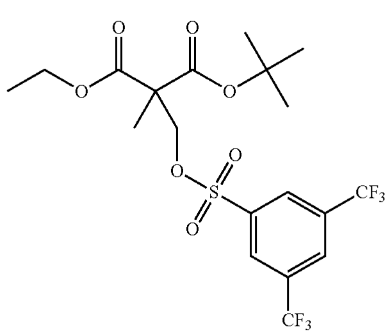
(PA-7)
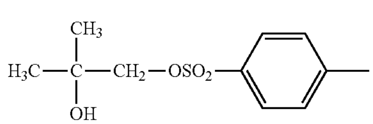
(PA-8)
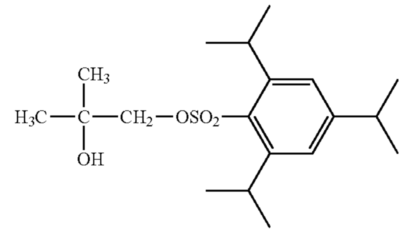
(PA-9)
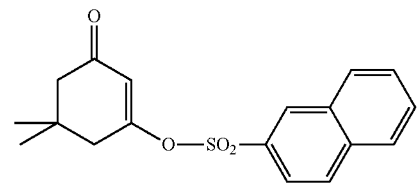
(PA-10)
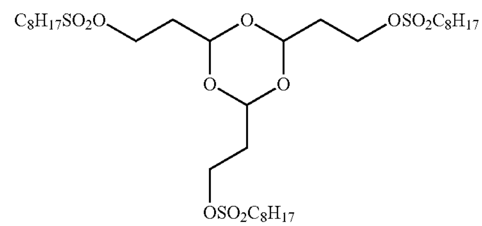
(PA-11)
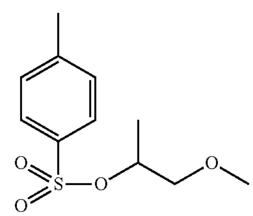
(PA-12)
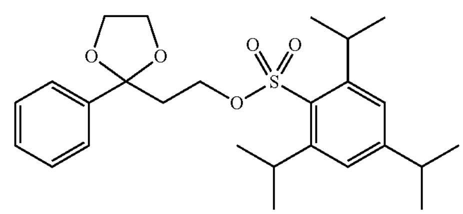
(PA-13)
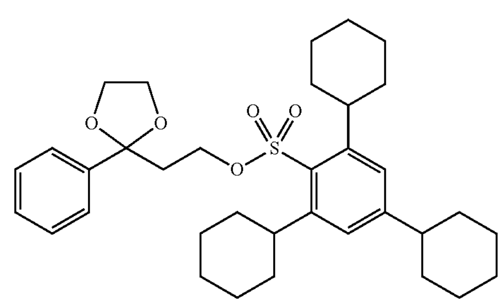
(PA-14)
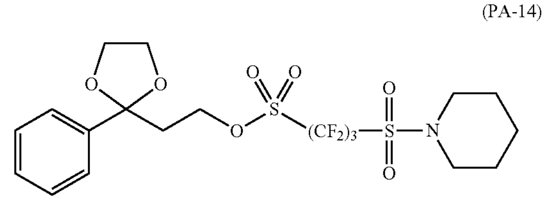

-continued (PA-15)

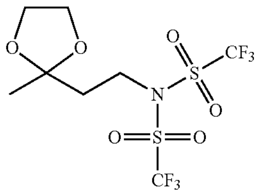

(PA-16)

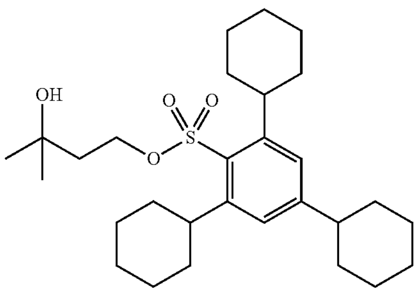

(PA-17)

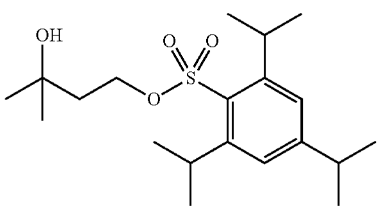

(PA-18)

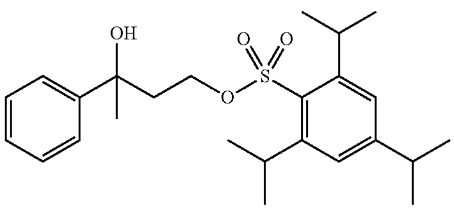

As for the compound capable of decomposing by the action of an acid to generate an acid, one compound may be used alone, or two or more compounds may be used in combination.

Incidentally, the content of the compound capable of decomposing by the action of an acid to generate an acid is preferably from 0.1 to 40 mass %, more preferably from 0.5 to 30 mass %, still more preferably from 1.0 to 20 mass %, based on the total solid content of the actinic ray-sensitive or radiation-sensitive resin composition.

[5] (C) Resist Solvent (Coating Solvent)

The solvent which can be used when preparing the composition is not particularly limited as long as it dissolves respective components, but examples thereof include an alkylene glycol monoalkyl ether carboxylate (e.g., propylene glycol monomethyl ether acetate (PGMEA; another name: 1-methoxy-2-acetoxypropane)), an alkylene glycol monoalkyl ether (e.g., propylene glycol monomethyl ether (PGME; another name: 1-methoxy-2-propanol)), a lactic acid alkyl ester (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (e.g., ethyl ethoxypropionate). Other examples of the solvent which can be used include solvents described in paragraph [0244] et seq. of U.S. Patent Application Publication No. 2008/0248425A1.

Among the solvents above, an alkylene glycol monoalkyl ether carboxylate and an alkylene glycol monoalkyl ether are preferred.

One of these solvents may be used alone, or two or more thereof may be mixed and used. In the case of mixing two or more solvents, it is preferred to mix a solvent having a hydroxyl group and a solvent having no hydroxyl group. The mass ratio between the solvent having a hydroxyl group and the solvent having no hydroxyl group is from 1/99 to 99/1, preferably from 10/90 to 90/10, more preferably from 20/80 to 60/40.

The solvent having a hydroxy group is preferably an alkylene glycol monoalkyl ether, and the solvent having no hydroxyl group is preferably an alkylene glycol monoalkyl ether carboxylate.

[6] Basic Compound

The actinic ray-sensitive or radiation-sensitive resin composition of the present invention may further contain a basic compound. The basic compound is preferably a compound having basicity stronger than that of phenol. The basic compound is preferably an organic basic compound, more preferably a nitrogen-containing basic compound.

The nitrogen-containing basic compound which can be used is not particularly limited, but, for example, compounds classified into the following (1) to (7) may be used.

(1) Compound Represented by Formula (BS-1):

(BS-1)

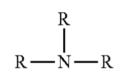

In formula (BS-1), each R independently represents a hydrogen atom or an organic group, provided that at least one of three R is an organic group. The organic group is a linear or branched alkyl group, a monocyclic or polycyclic cycloalkyl group, an aryl group or an aralkyl group.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples thereof include a phenyl group and a naphthyl group.

The carbon number of the aralkyl group as R is not particularly limited but is usually from 7 to 20, preferably from 7 to 11. Specific examples thereof include a benzyl group.

In the alkyl group, cycloalkyl group, aryl group and aralkyl group as R, a hydrogen atom may be substituted for by a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

In the compound represented by formula (BS-1), it is preferred that at least two R are an organic group.

Specific examples of the compound represented by formula (BS-1) include tri-n-butylamine, tri-n-pentyl amine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, and 2,4,6-tri(tert-butyl)aniline.

Also, the preferred basic compound represented by formula (BS-1) includes a compound where at least one R is an alkyl group substituted with a hydrophilic group. Specific examples thereof include triethanolamine and N,N-dihydroxyethylaniline.

The alkyl group as R may have an oxygen atom in the alkyl chain. That is, an oxyalkylene chain may be formed. The oxyalkylene chain is preferably —$CH_2CH_2O$—. Specific examples thereof include tris(methoxyethoxyethyl)amine and compounds illustrated in column 3, line 60 et seq. of U.S. Pat. No. 6,040,112.

Out of basic compounds represented by formula (BS-1), examples of the compounds having a hydroxyl group, an oxygen atom or the like include the followings.

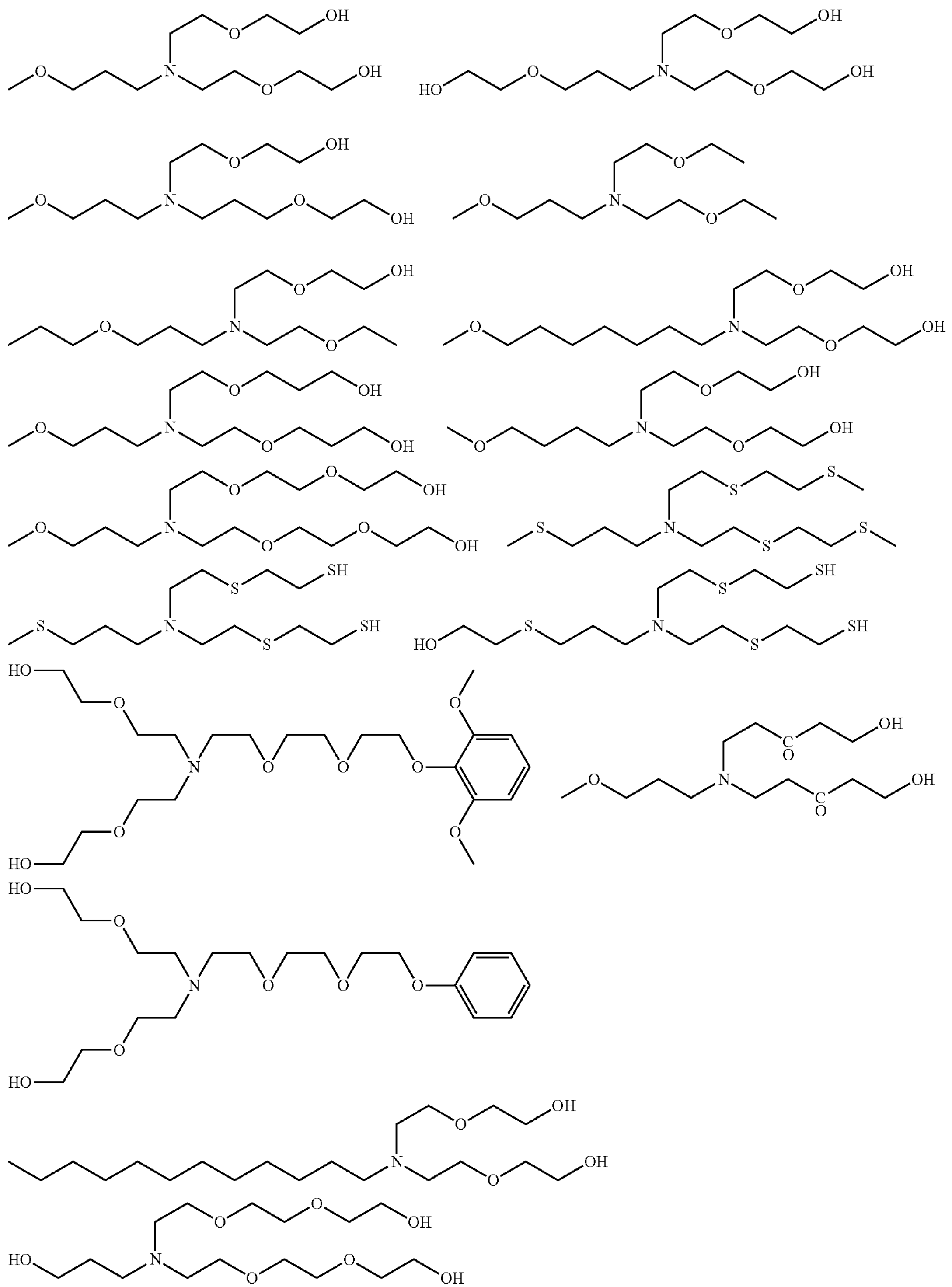

-continued

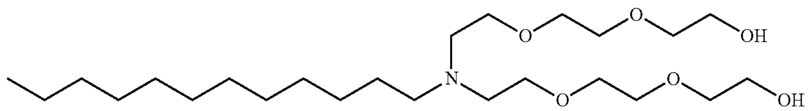

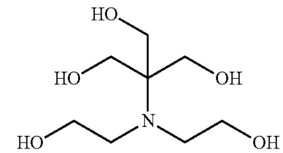

(2) Compound Having a Nitrogen-Containing Heterocyclic Structure

The nitrogen-containing heterocyclic ring may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure [e.g., N-hydroxyethylpiperidine, bis(1,2,2,6,6-pentamethyl-4-piperidyl)sebacate], a compound having a pyridine structure (e.g., 4-dimethylaminopyridine), and a compound having an antipyrine structure (e.g., antipyrine, hydroxyantipyrine).

Preferred examples of the compound having a nitrogen-containing heterocyclic structure include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These compounds may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

More preferred examples of the basic compound include imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group contained in an amine compound has a phenoxy group at the terminal opposite the N atom. The phenoxy group may have a substituent such as alkyl group, alkoxy group, halogen atom, cyano group, nitro group, carboxy group, carboxylic acid ester group, sulfonic acid ester group, aryl group, aralkyl group, acyloxy group and aryloxy group.

The compound preferably has at least one oxyalkylene chain between the phenoxy group and the nitrogen atom. The number of oxyalkylene chains per molecule is preferably from 3 to 9, more preferably from 4 to 6. Among oxyalkylene chains, —$CH_2CH_2O$— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

The phenoxy group-containing amine compound is obtained, for example, by reacting a primary or secondary amine having a phenoxy group with a haloalkyl ether under heating and after adding an aqueous solution of a strong base such as sodium hydroxide, potassium hydroxide and tetraalkylammonium, extracting the reaction product with an organic solvent such as ethyl acetate and chloroform. The phenoxy group-containing amine compound can be also obtained by reacting a primary or secondary amine with a haloalkyl ether having a phenoxy group at the terminal under heating and after adding an aqueous solution of a strong base such as sodium hydroxide, potassium hydroxide and tetraalkylammonium, extracting the reaction product with an organic solvent such as ethyl acetate and chloroform.

(4) Ammonium Salt

An ammonium salt may be also appropriately used as the basic compound.

The cation of the ammonium salt is preferably a tetraalkylammonium cation substituted with an alkyl group having a carbon number of 1 to 18, more preferably a tetramethylammonium cation, a tetraethylammonium cation, a tetra(n-butyl)ammonium cation, a tetra(n-heptyl)ammonium cation, a tetra(n-octyl)ammonium cation, a dimethyl-hexadecylammonium cation, a benzyltrimethyl cation or the like, still more preferably a tetra(n-butyl)ammonium cation.

The anion of the ammonium salt includes, for example, halide, sulfonate, borate, phosphate, hydroxide and carboxylate. Among these, hydroxide and carboxylate are preferred.

The halide is preferably chloride, bromide or iodide.

The sulfonate is preferably an organic sulfonate having a carbon number of 1 to 20. Examples of the organic sulfonate include an alkylsulfonate having a carbon number of 1 to 20, and an arylsulfonate.

The alkyl group contained in the alkylsulfonate may have a substituent, and examples of the substituent include a fluorine atom, a chlorine atom, a bromine atom, an alkoxy group, an acyl group, and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group contained in the arylsulfonate include a phenyl group, a naphthyl group, and an anthryl group. Such an aryl group may have a substituent. The substituent is preferably, for example, a linear or branched alkyl group having a carbon number of 1 to 6, or a cycloalkyl group having a carbon number of 3 to 6. Specific preferred examples thereof include a methyl group, an ethyl group, an n-propyl group, an isopropyl group, an n-butyl group, an i-butyl group, a tert-butyl group, an n-hexyl group and a cyclohexyl group.

Other substituents include an alkoxy group having a carbon number of 1 to 6, a halogen atom, cyano, nitro, an acyl group, and an acyloxy group.

The carboxylate may be either an aliphatic carboxylate or an aromatic carboxylate, and examples thereof include acetate, lactate, pyruvate, trifluoroacetate, adamantanecarboxylate, hydroxyadamantanecarboxylate, benzoate, naphthoate, salicylate, phthalate, and phenolate. Among these, benzoate, naphthoate, phenolate and the like are preferred, and benzoate is most preferred.

In this case, the ammonium salt is preferably, for example, tetra(n-butyl)ammonium benzoate or tetra(n-butyl)ammonium phenolate.

In the case that this ammonium salt is a hydroxide, the ammonium salt is preferably a tetraalkylammonium hydroxide having a carbon number of 1 to 8 (e.g., tetramethylammonium hydroxide, tetraethylammonium hydroxide, tetra-(n-butyl)ammonium hydroxide).

(5) (PA) Compound Having a Proton Acceptor Functional Group and Undergoing Decomposition Upon Irradiation with an Actinic Ray or Radiation to Generate a Compound Reduced in or Deprived of the Proton Acceptor Property or Changed from Proton Acceptor-Functioning to Acidic The composition of the present invention may further contain, as a basic compound, a compound having a proton acceptor functional group and undergoing decomposition upon irradiation with an actinic ray or radiation to generate a compound reduced in or deprived of the proton acceptor property or changed from proton acceptor-functioning to acidic [hereinafter, sometimes referred to as "compound (PA) "].

The proton acceptor functional group is a functional group having a group or electron capable of electrostatically interacting with a proton and means, for example, a functional group having a macrocyclic structure such as cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following formulae:

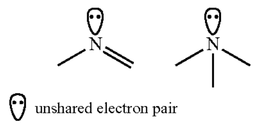

Preferred examples of the partial structure for the proton acceptor functional group include a crown ether structure, an aza-crown ether structure, a primary to tertiary amine structure, a pyridine structure, an imidazole structure, and a pyrazine structure.

The compound (PA) decomposes upon irradiation with an actinic ray or radiation to generate a compound reduced in or deprived of the proton acceptor property or changed from proton acceptor-functioning to acidic. The "reduced in or deprived of the proton acceptor property or changed from proton acceptor-functioning to acidic" as used herein indicates a change in the proton acceptor property due to addition of a proton to the proton acceptor functional group and specifically means that when a proton adduct is produced from the proton acceptor functional group-containing compound (PA) and a proton, the equilibrium constant in the chemical equilibrium decreases.

Specific examples of the compound (PA) are illustrated below, but the present invention is not limited thereto.

(PA-1)

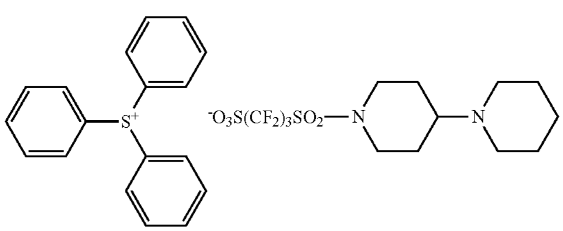

(PA-2)

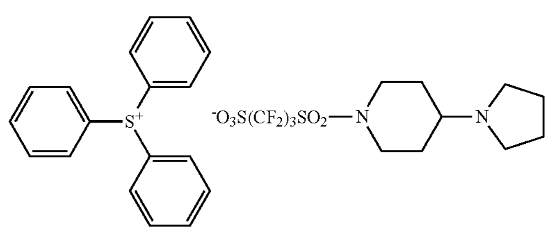

(PA-3)

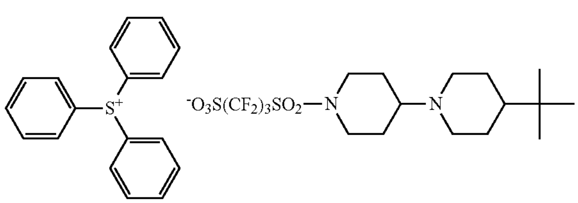

(PA-4)

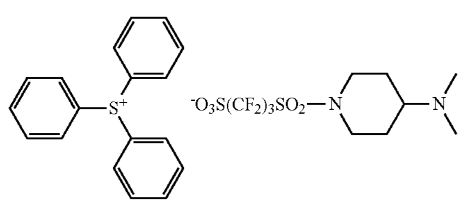

(PA-5)

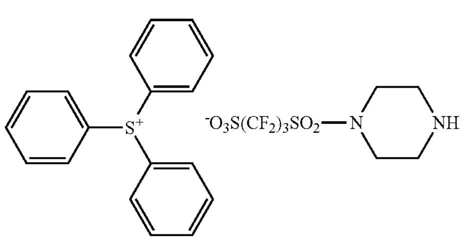

(PA-6)

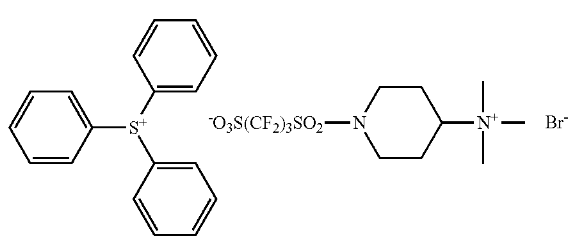

-continued
(PA-7)
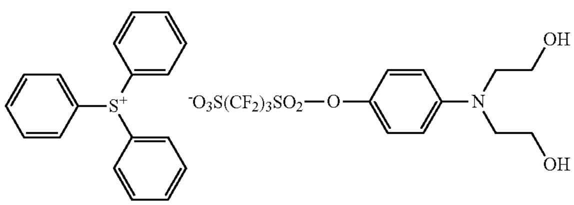
(PA-8)
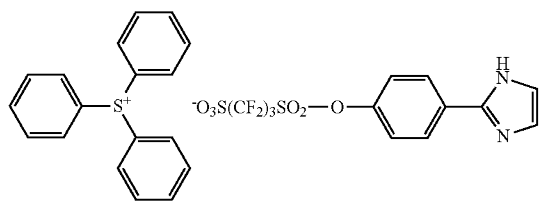
(PA-9)
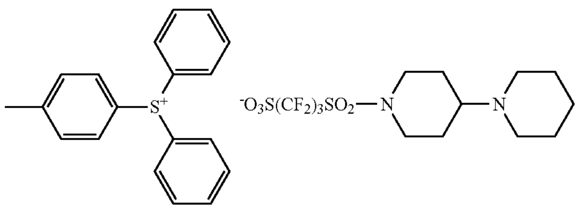
(PA-10)
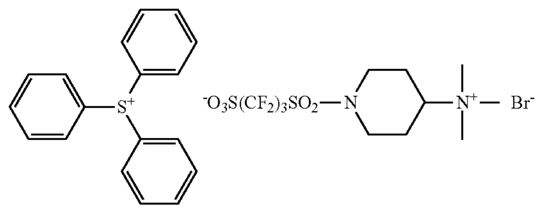
(PA-11)
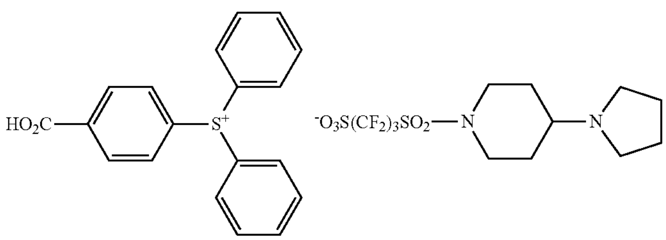
(PA-12)
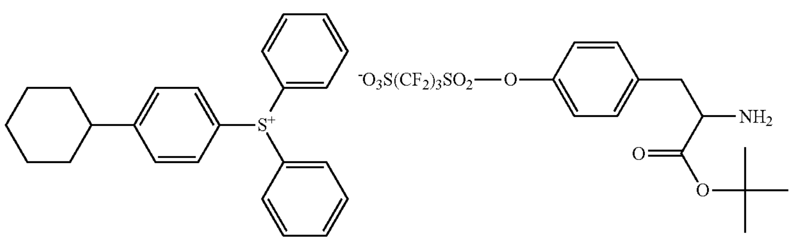
(PA-13)
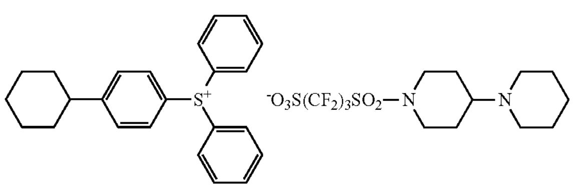
(PA-14)
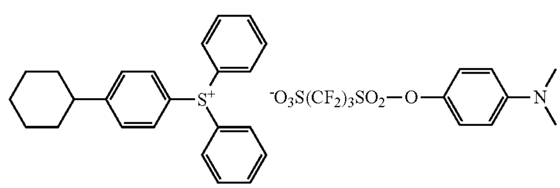
(PA-15)
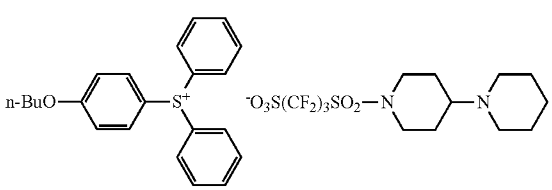
(PA-16)
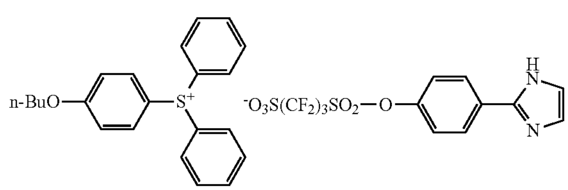
(PA-17)
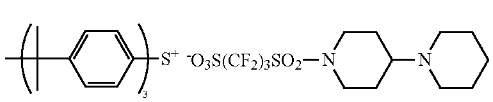
(PA-18)
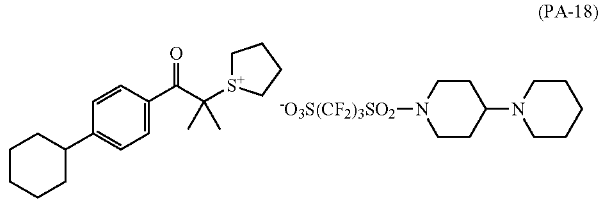

-continued
(PA-19)
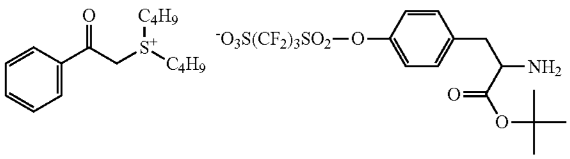
(PA-20)
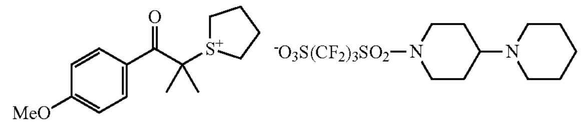
(PA-21)
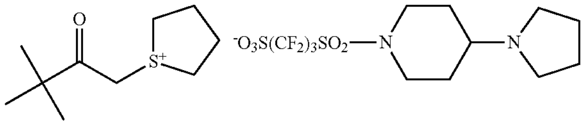
(PA-22)
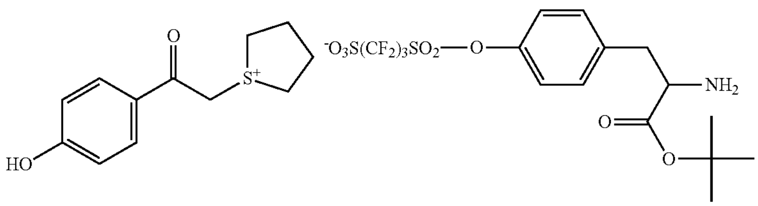
(PA-23)
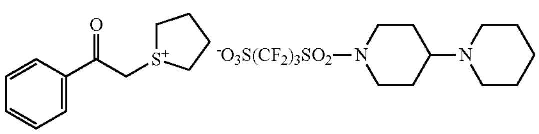
(PA-24)
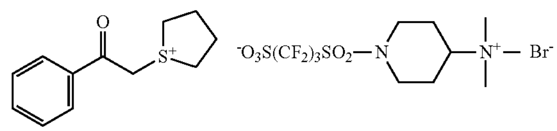
(PA-25)
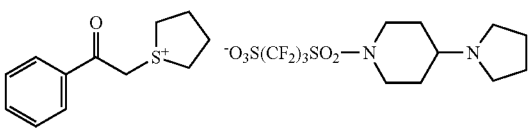
PA-26)
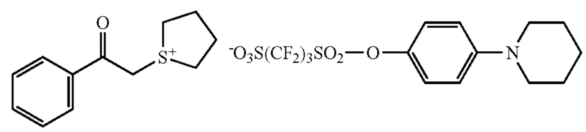
(PA-27)
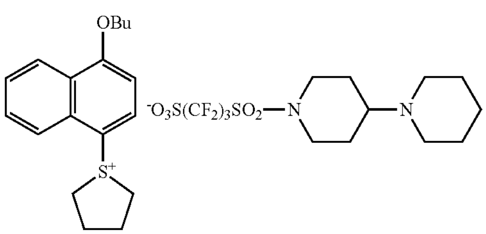
(PA-28)
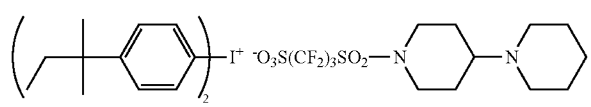
(PA-29)
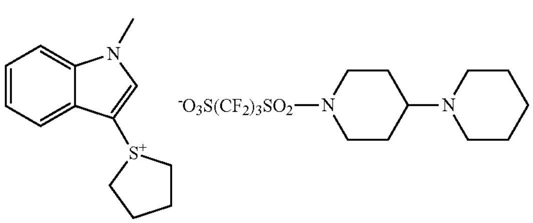
(PA-30)
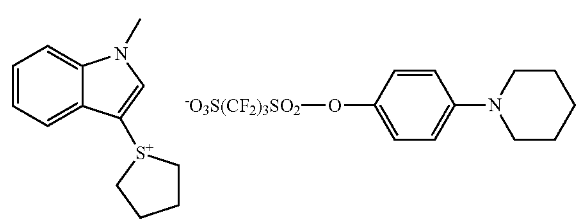
(PA-31)
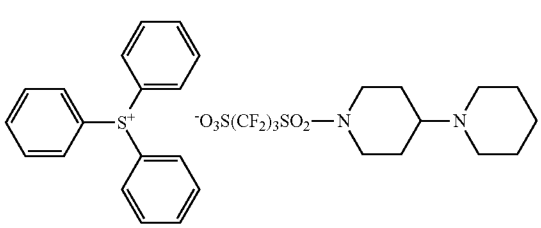
(PA-32)
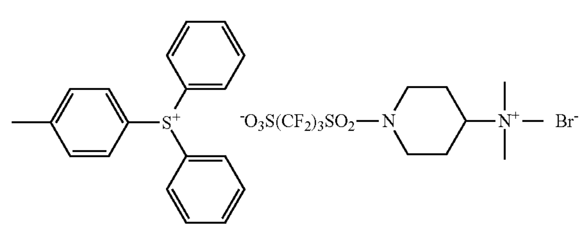

-continued
(PA-33)
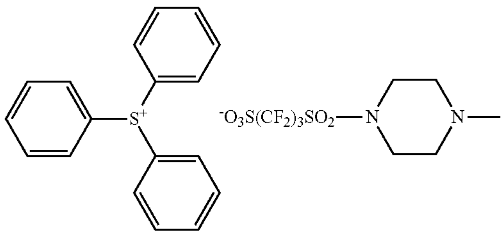
(PA-34)
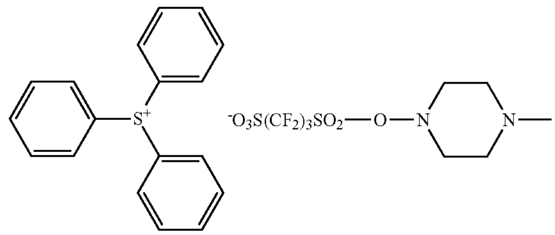
(PA-35)
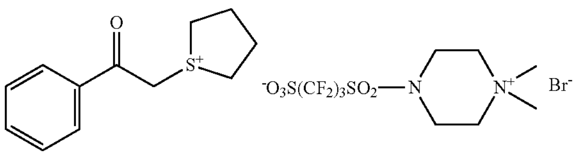
(PA-36)
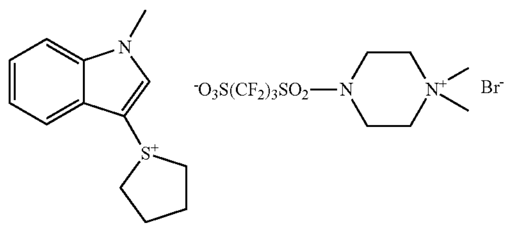
(PA-37)
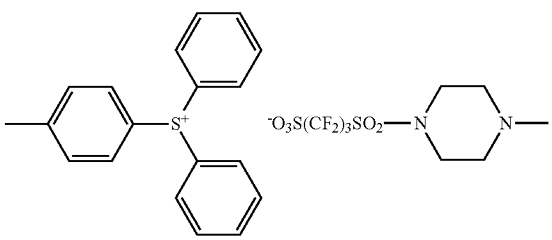
(PA-38)
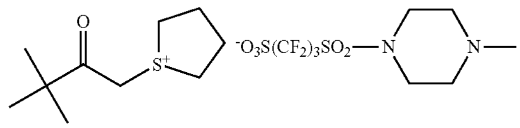
(PA-39)
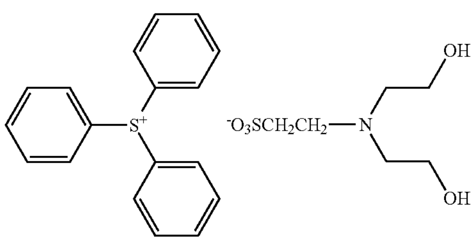
(PA-40)
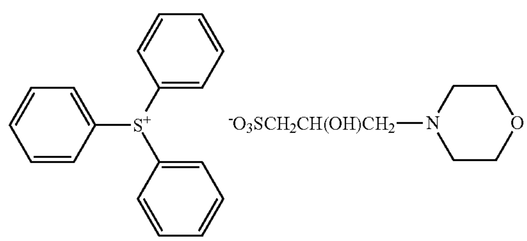
(PA-41)
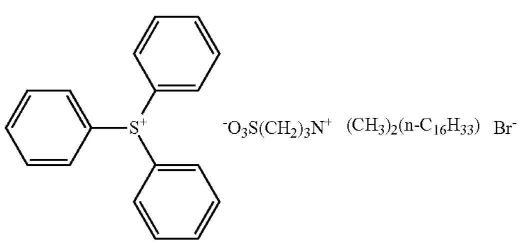
(PA-42)
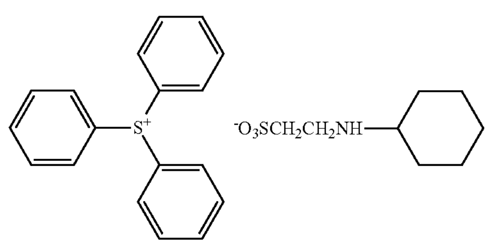
(PA-43)
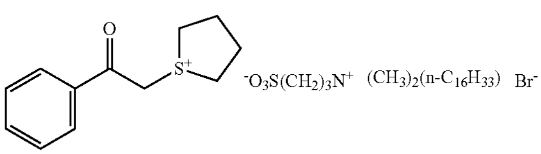
(PA-44)
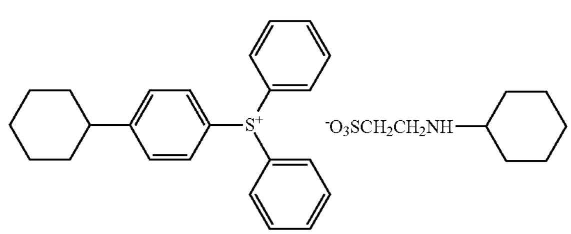

-continued
(PA-45)
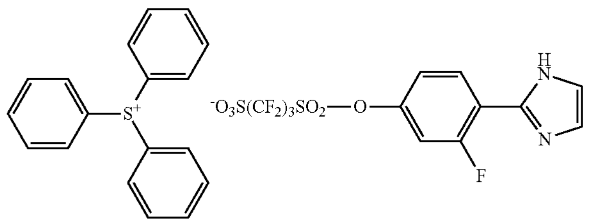
(PA-46)
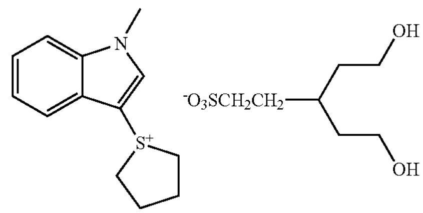
(PA-47)
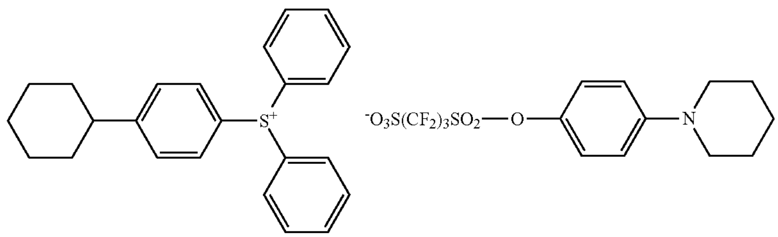
(PA-48)
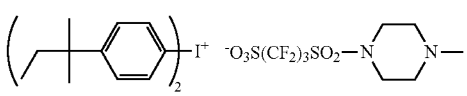
(PA-49)
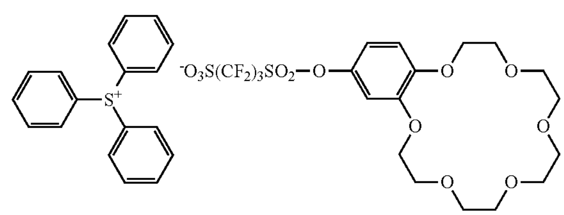
(PA-50)
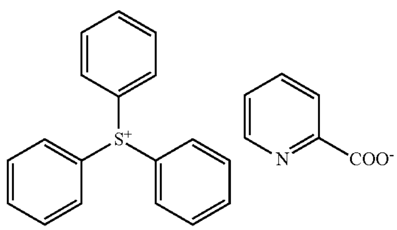
(PA-51)
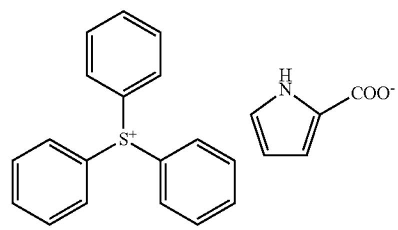
(PA-52)
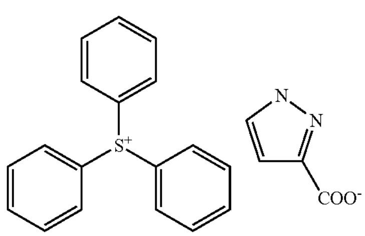
(PA-53)
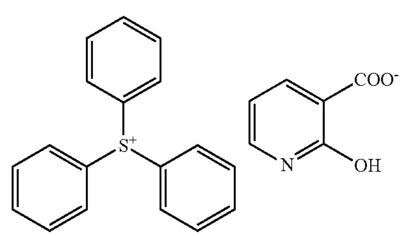
(PA-54)
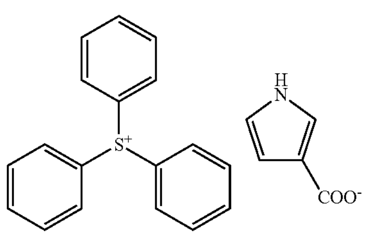
(PA-55)
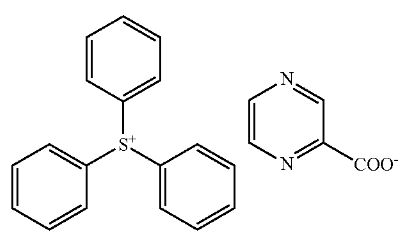

-continued
(PA-56)
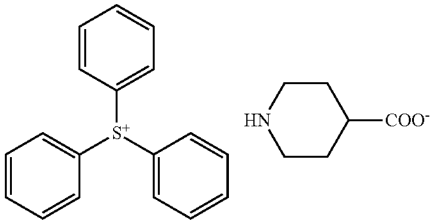
(PA-57)
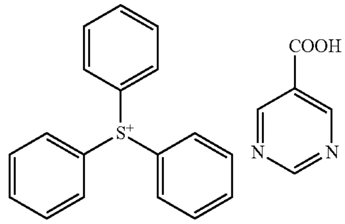
(PA-58)
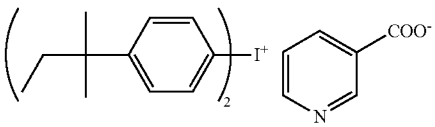
(PA-59)
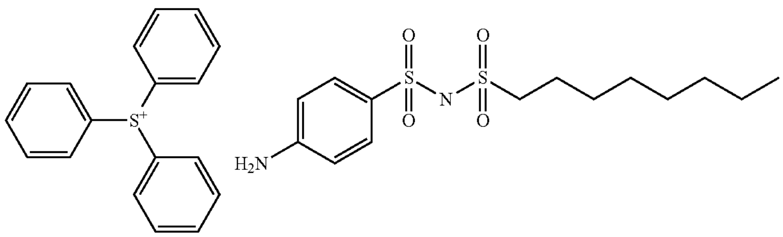
(PA-60)
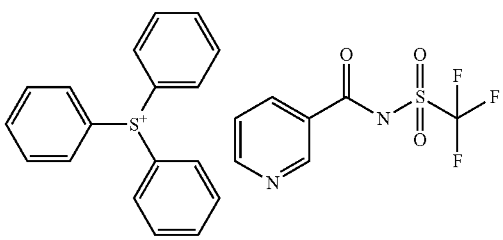
(PA-61)
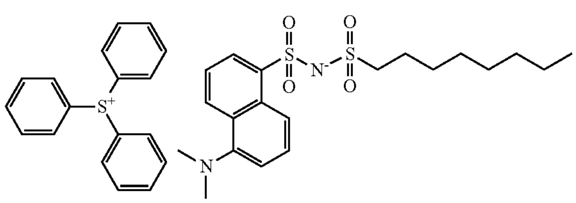
(PA-62)
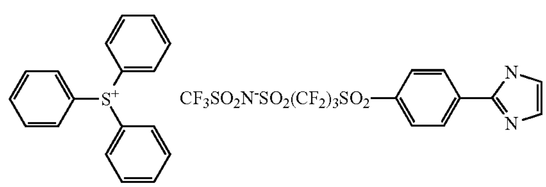
(PA-63)
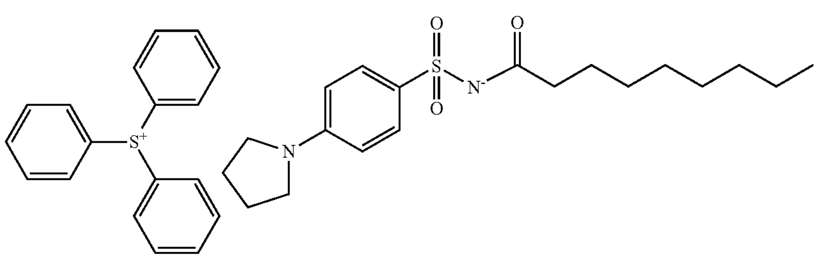
(PA-64)
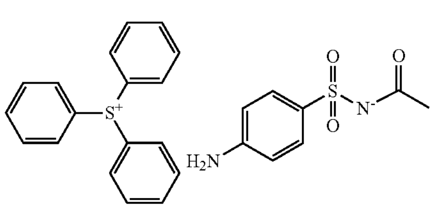
(PA-65)
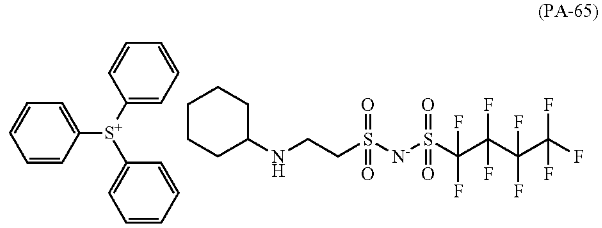

-continued
(PA-66)
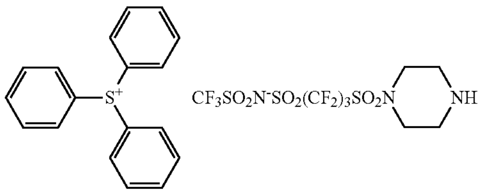
(PA-67)
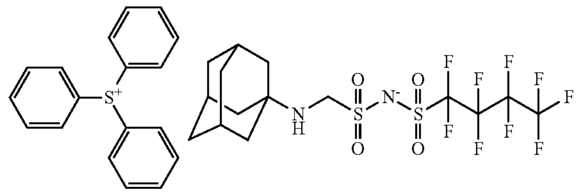
(PA-68)
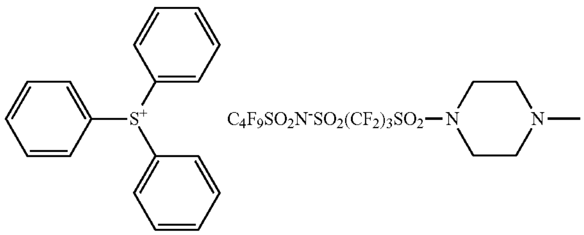
(PA-69)
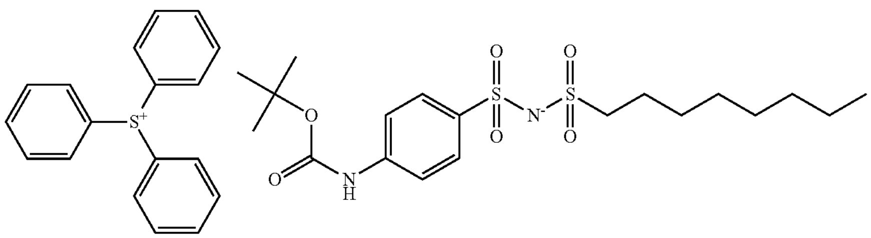
(PA-70)
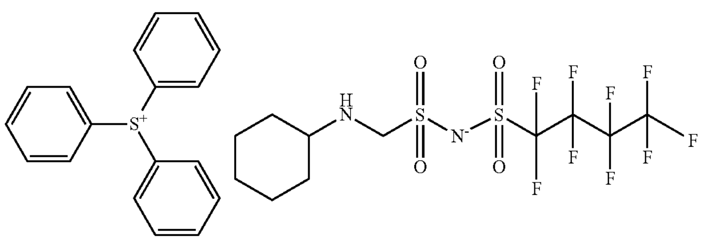
(PA-71)
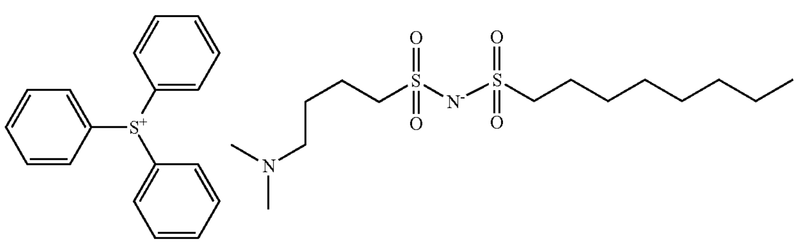
(PA-72)
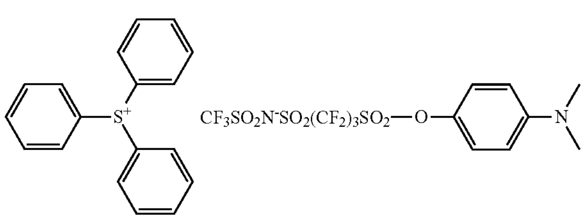
(PA-73)
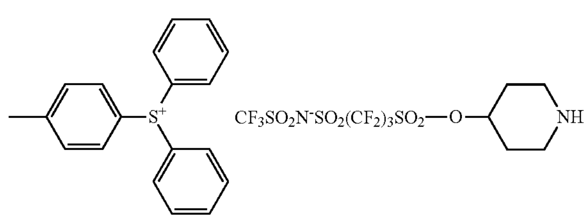

-continued
(PA-74)
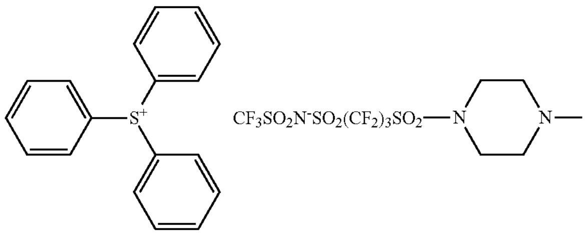
(PA-75)
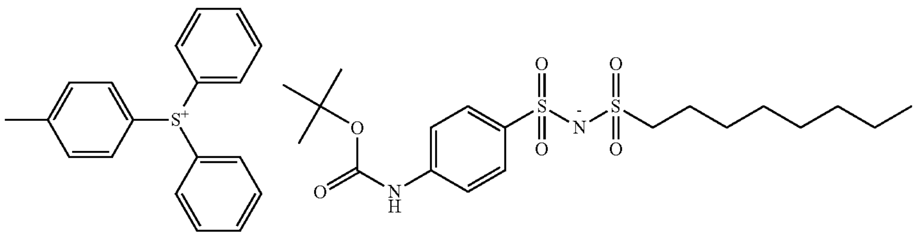
(PA-76)
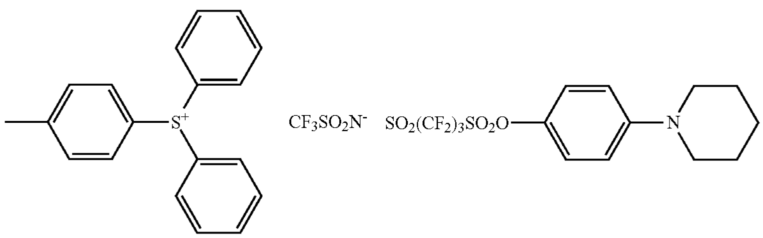
(PA-77)
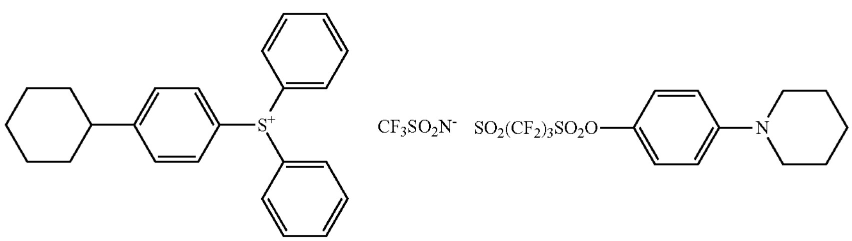
(PA-78)
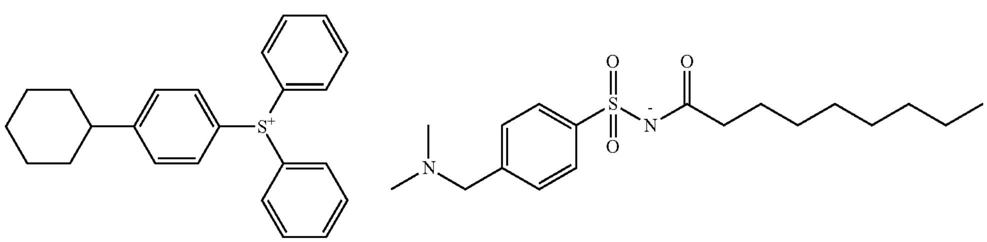
(PA-79)
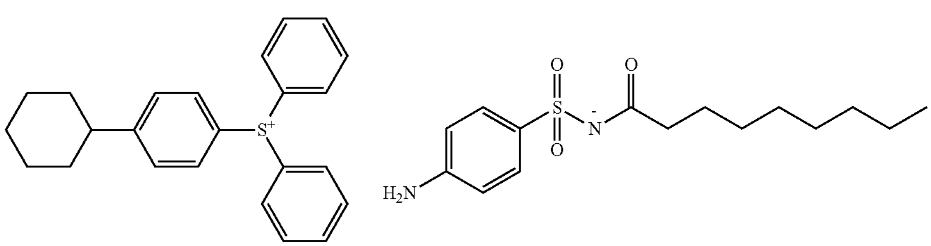

-continued
(PA-80)
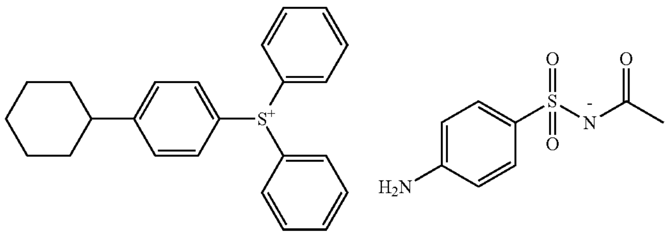
(PA-81)
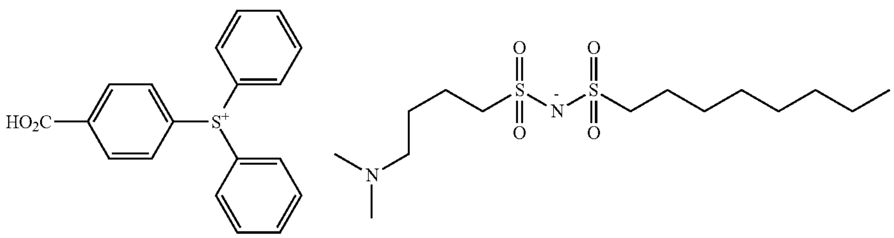
(PA-82)
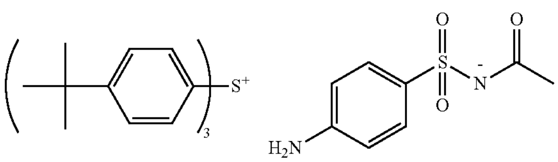
(PA-83)
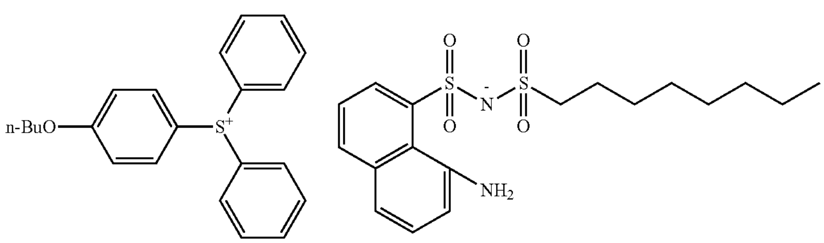
(PA-84)
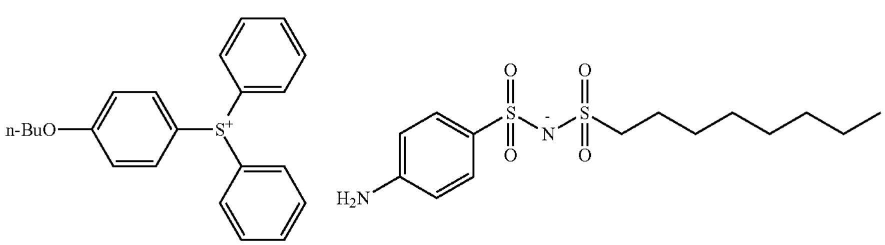
(PA-85)
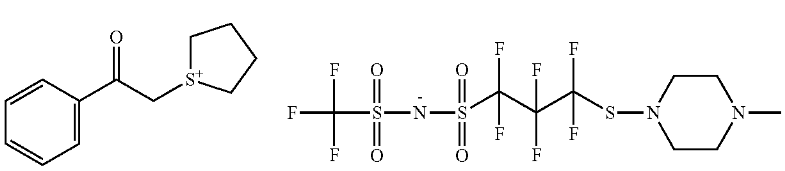
(PA-86)
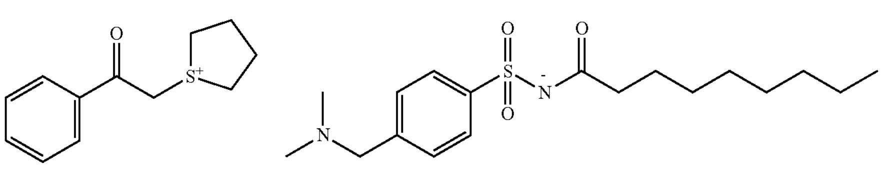

-continued
(PA-87)
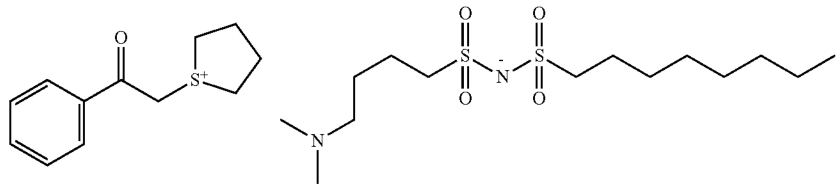
(PA-88)
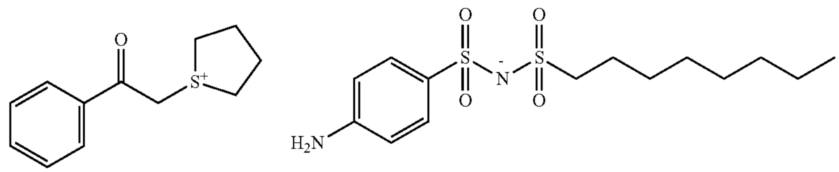
(PA-89)
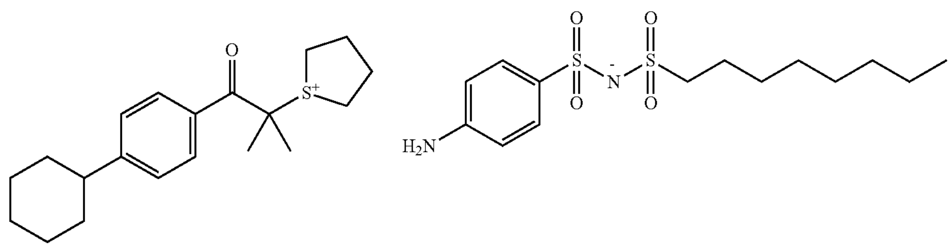
(PA-90)
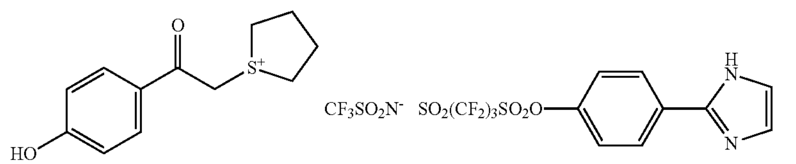
(PA-91)
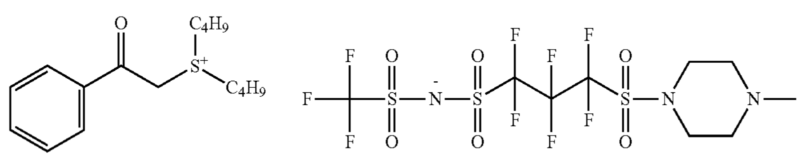
(PA-92)
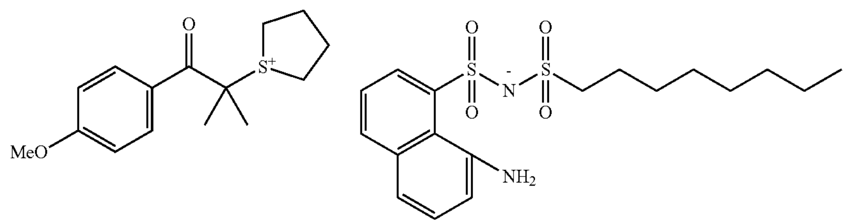
(PA-93)
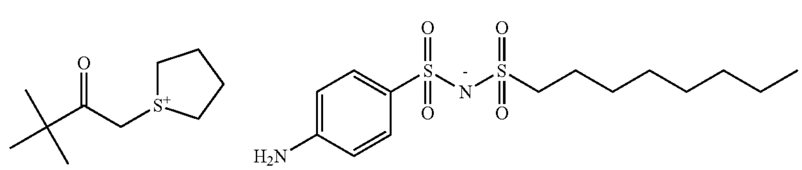
(PA-94)
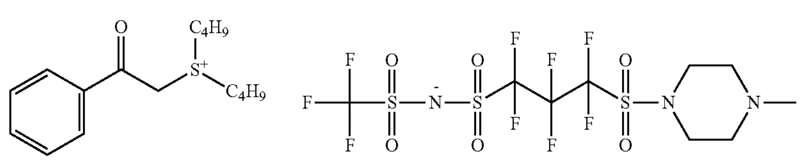

-continued (PA-95)

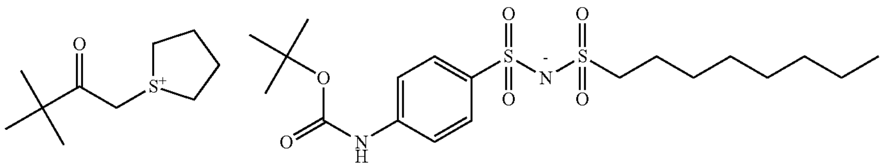

(PA-96)

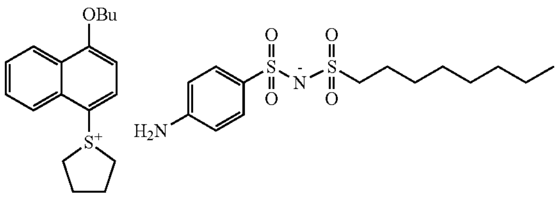

(PA-97)

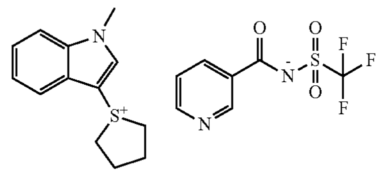

(PA-98)

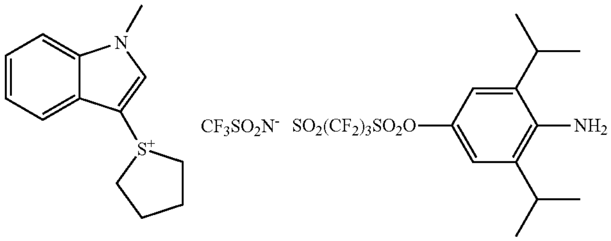

(PA-99)

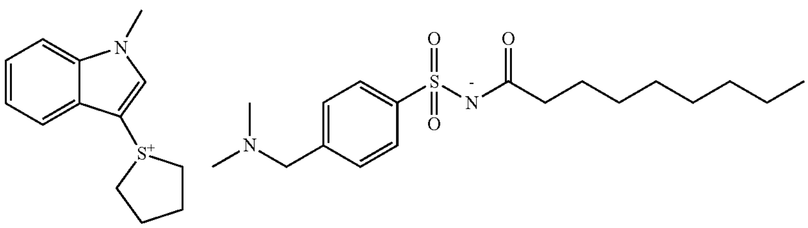

(PA-100)

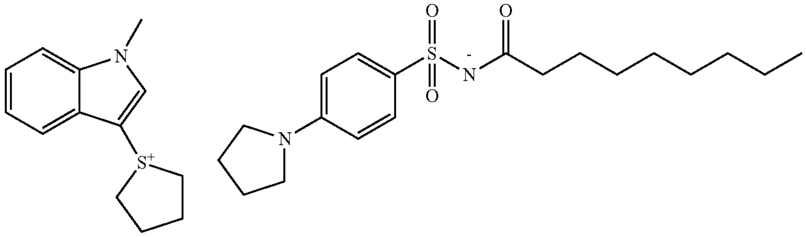

(PA-101)

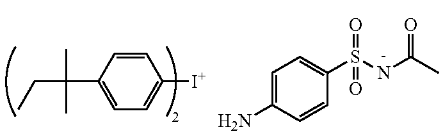

(PA-102)

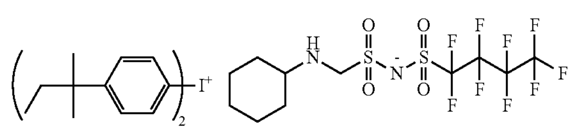

In the present invention, a compound (PA) other than the compound capable of generating a compound represented by formula (PA-1) can be also appropriately selected. For example, a compound that is an ionic compound and has a proton acceptor site in the cation moiety may be used. More specifically, examples of such a compound include a compound represented by the following formula (7):

(7)

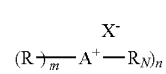

In the formula, A represents a sulfur atom or an iodine atom.

m represents 1 or 2, and n represents 1 or 2, provided that when A is a sulfur atom, m+n=3 and when A is an iodine atom, m+n=2.

R represents an aryl group.

$R_N$ represents an aryl group substituted with a proton acceptor functional group.

$X^-$ represents a counter anion.

Specific examples of $X^-$ are the same as those of $Z^-$ in formula (ZI).

Specific preferred examples of the aryl group of R and $R_N$ include a phenyl group.

Specific examples of the proton acceptor functional group contained in $R_N$ are the same as those of the proton acceptor functional group described above in formula (PA-1).

In the composition of the present invention, the blending ratio of the compound (PA) in the entire composition is preferably from 0.1 to 10 mass %, more preferably from 1 to 8 mass %, based on the total solid content.

(6) Guanidine Compound

The composition of the present invention may further contain a guanidine compound having a structure represented by the following formula:

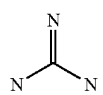

The guanidine compound exhibits strong basicity because thanks to three nitrogens, dispersion of positive electric charges of a conjugate acid is stabilized.

As for the basicity of the guanidine compound (A) for use in the present invention, the pKa of the conjugate acid is preferably 6.0 or more, more preferably from 7.0 to 20.0 in view of high neutralization reactivity with an acid and excellent roughness characteristics, and still more preferably from 8.0 to 16.0.

Such strong basicity makes it possible to suppress diffusion of an acid and contribute to formation of an excellent pattern profile.

The "pKa" as used herein is pKa in an aqueous solution and described, for example, in *Kagaku Binran* (*Chemical Handbook*) (*II*) (4th revised edition, compiled by The Chemical Society of Japan, Maruzen (1993)), and as this value is lower, the acid strength is higher. Specifically, the acid dissociation constant at 25° C. is measured using an aqueous infinite dilution solution, whereby pKa in an aqueous solution can be actually measured. Alternatively, a value based on Hammett's substituent constants and data base containing values known in publications can be determined by computation using the following software package 1. The pKa values referred to in the description of the present invention all are a value determined by computation using this software package.

Software Package 1: Advanced Chemistry Development (ACD/Labs) Software V8.14 for Solaris (1994-2007 ACD/Labs)

In the present invention, the log P is a logarithmic value of the n-octanol/water partition coefficient (P) and is an effective parameter capable of characterizing the hydrophilicity/hydrophobicity for compounds over a wide range. The partition coefficient is generally determined by computation but not from experiments and in the present invention, a value computed using CS ChemDraw Ultra Ver. 8.0 software package (Crippen's fragmentation method) is employed.

The log P of the guanidine compound (A) is preferably 10 or less. With this value or less, the compound can be uniformly incorporated in the resist film.

The log P of the guanidine compound (A) for use in the present invention is preferably from 2 to 10, more preferably from 3 to 8, still more preferably 4 to 8.

The guanidine compound (A) for use in the present invention preferably contains no nitrogen atom except for in the guanidine structure.

Specific examples of the guanidine compound are illustrated below, but the present invention is not limited thereto.

Log P: 4.29

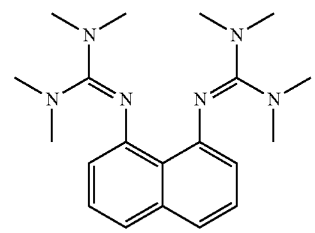

Log P: 3.32

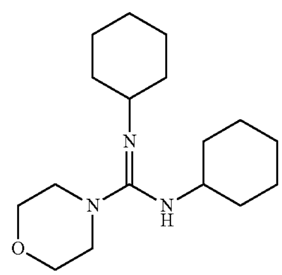

Log P: 3.1

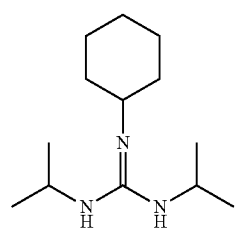

Log P: 5.24

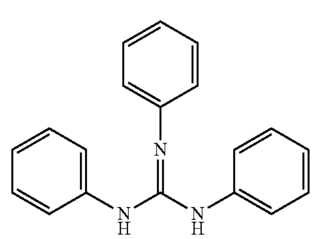

Log P: 4.89

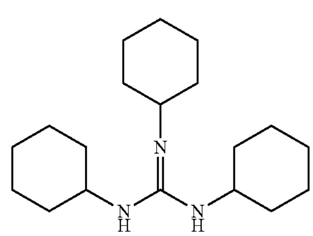

-continued

Log P: 5.11

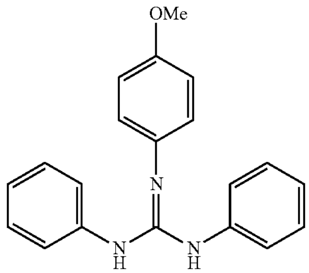

Log P: 2.61

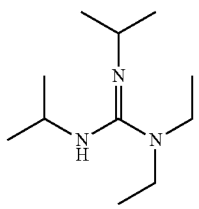

Log P: 4.61

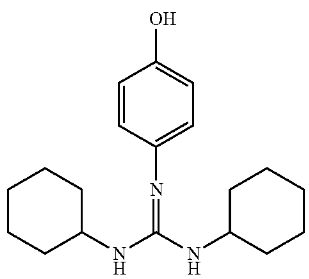

Log P: 5.83

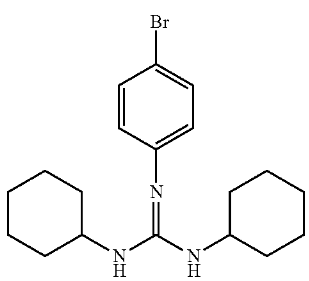

Log P: 1.75

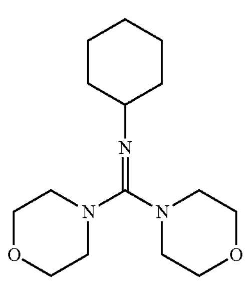

Log P: 4.95

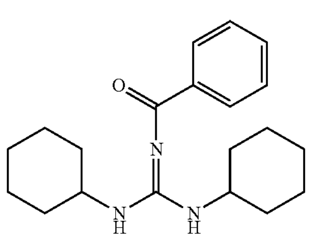

-continued

Log P: 4.51

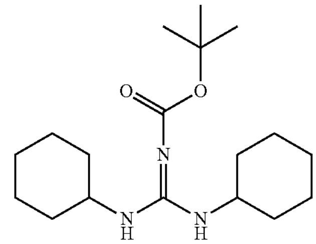

Log P: 4.55

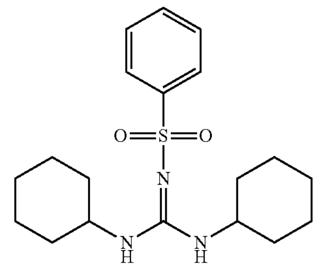

Log P: 4.43

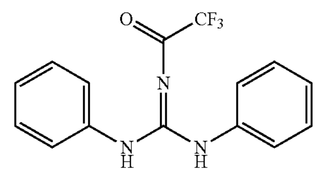

Log P: 3.18

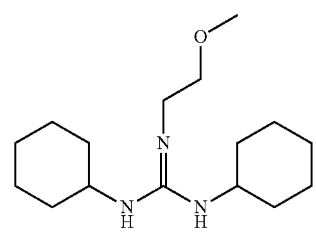

Log P: 4.4

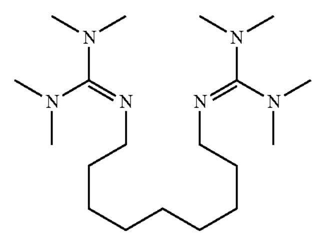

(7) Low Molecular Compound Having a Nitrogen Atom and Having a Group Capable of Leaving by the Action of an Acid The composition of the present invention may contain a low molecular compound having a nitrogen atom and having a group capable of leaving by the action of an acid (hereinafter, sometimes referred to as "low molecular compound (D)" or "compound (D)"). The low molecular compound (D) preferably exhibits basicity after the group capable of leaving by the action of an acid is eliminated.

The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the (D) low molecular compound having a group capable of leaving by the action of an acid is preferably from 100 to 1,000, more preferably from 100 to 700, still more preferably from 100 to 500.

The compound (D) is preferably an amine derivative having on the nitrogen atom a group capable of leaving by the action of an acid.

The compound (D) may have a protective group-containing carbamate group on the nitrogen atom. The protective group constituting the carbamate group can be represented by the following formula (d-1):

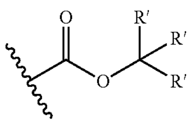

(d-1)

In formula (d-1), each R' independently represents a hydrogen atom, a linear or branched alkyl group, a cycloalkyl group, an aryl group, an aralkyl group or an alkoxyalkyl group. R' may combine with each other to form a ring.

R' is preferably a linear or branched alkyl group, a cycloalkyl group or an aryl group, more preferably a linear or branched alkyl group or a cycloalkyl group.

Specific structures of the protective group are illustrated below.

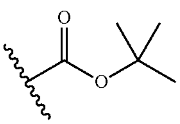
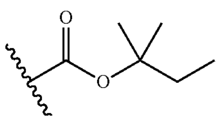
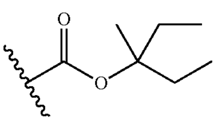
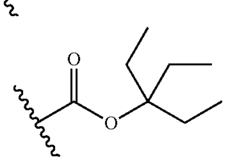
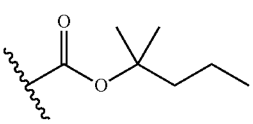
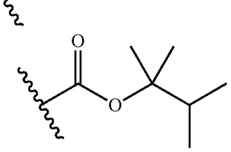
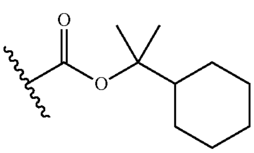
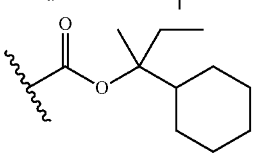
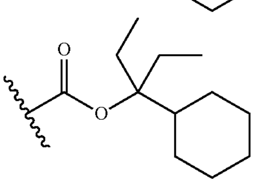
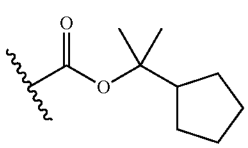
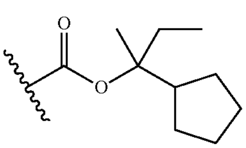
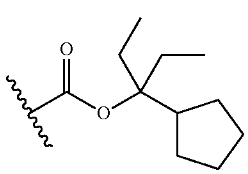
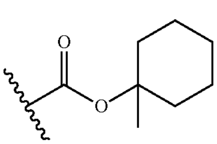
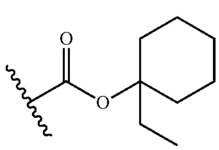

-continued

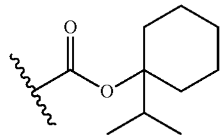
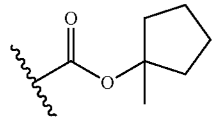
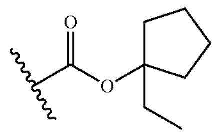
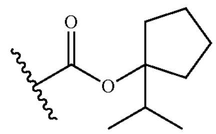
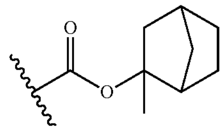
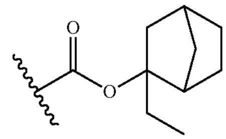
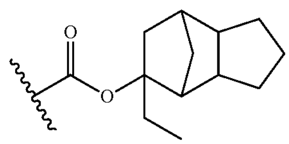
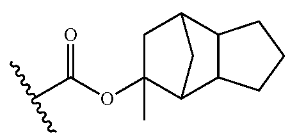
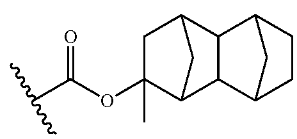
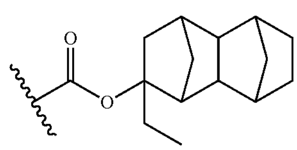
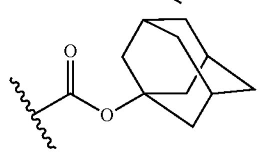
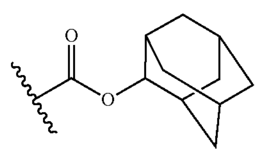
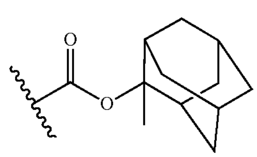
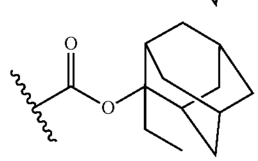
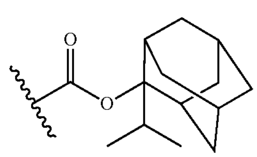
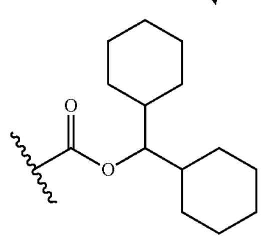
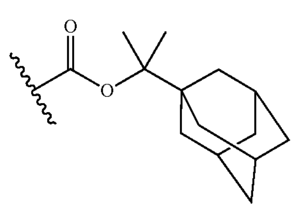

-continued

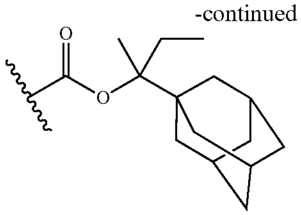

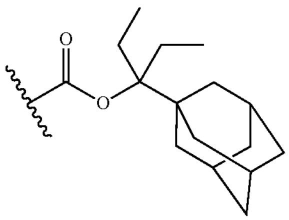

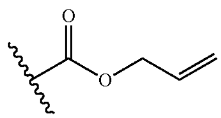

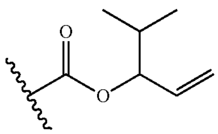

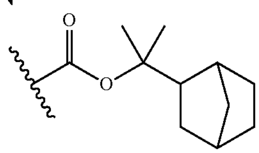

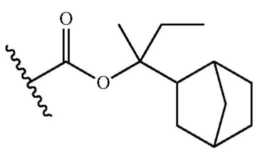

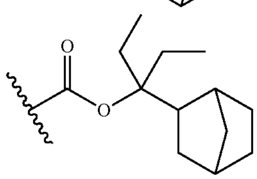

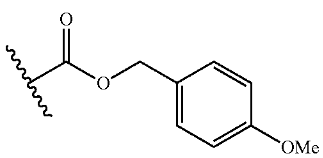

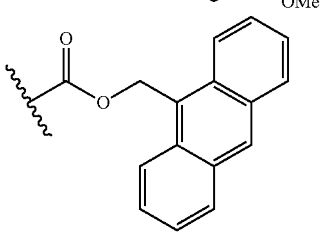

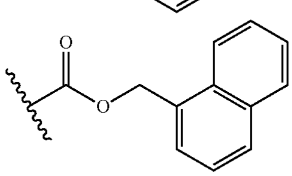

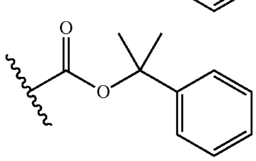

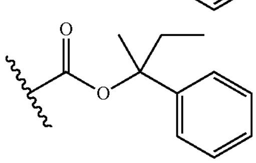

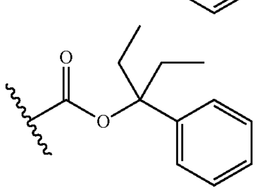

-continued

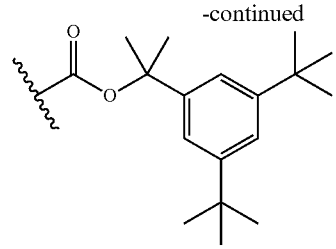

The compound (D) may be also composed by arbitrarily combining the basic compound and the structure represented by formula (d-1).

The compound (D) is more preferably a compound having a structure represented by the following formula (A).

Incidentally, the compound (D) may be a compound corresponding to the above-described basic compound as long as it is a low molecular compound having a group capable of leaving by the action of an acid.

(A)

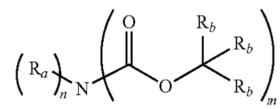

In formula (A), Ra represents a hydrogen atom, an alkyl group, a cycloalkyl group, an aryl group or an aralkyl group. Also, when n=2, two Ra may be the same or different, and two Ra may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group, an aralkyl group or an alkoxyalkyl group, provided that in —C(Rb)(Rb)(Rb), when one or more Rb are a hydrogen atom, at least one of the remaining Rb is a cyclopropyl group, a 1-alkoxyalkyl group or an aryl group.

At least two Rb may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (A), the alkyl group, cycloalkyl group, aryl group and aralkyl group of Ra and Rb may be substituted with a functional group such as hydroxyl group, cyano group, amino group, pyrrolidino group, piperidino group, morpholino group and oxo group, an alkoxy group, or a halogen atom. The same applies to the alkoxyalkyl group of Rb.

Examples of the alkyl group, cycloalkyl group, aryl group and aralkyl group (these alkyl, cycloalkyl, aryl and aralkyl groups may be substituted with the above-described functional group, an alkoxy group or a halogen atom) of Ra and/or Rb include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived groups, cycloalkane-derived groups, aromatic compound-derived groups, heterocyclic compound-derived groups, and functional groups such as hydroxyl group, cyano group, amino group, pyrrolidino group, piperidino group, morpholino group and oxo group.

Specific examples of the compound (D) particularly preferred in the present invention are illustrated below, but the present invention is not limited thereto.

(D-1)

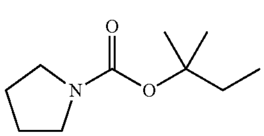

(D-2)

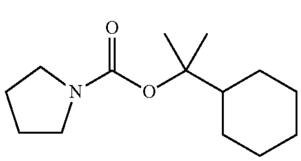

-continued (D-3)

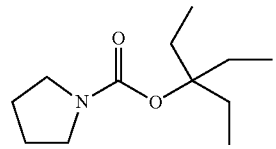

(D-4)

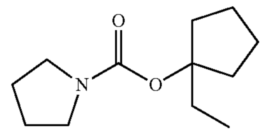

(D-5)

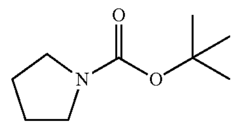

(D-6)

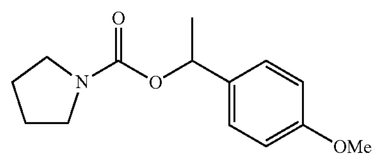

(D-7)

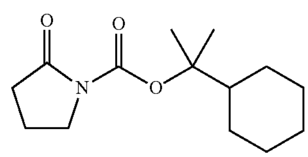

(D-8)

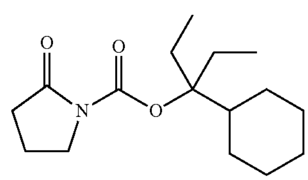

(D-9)

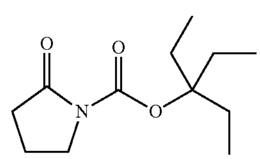

(D-10)

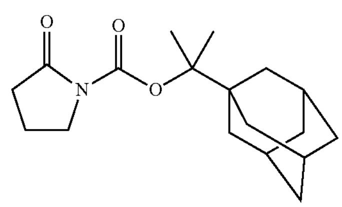

(D-11)

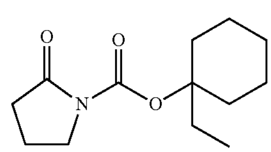

(D-12)

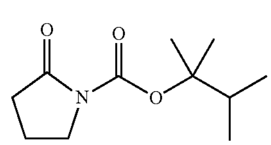

-continued
(D-13)
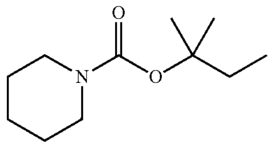
(D-14)
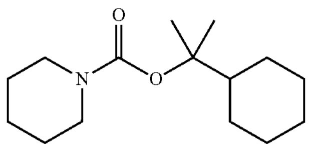
(D-15)
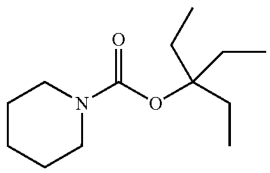
(D-16)
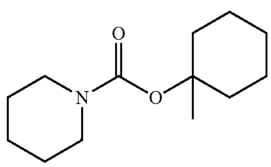
(D-17)
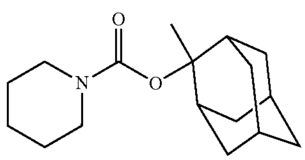
(D-18)
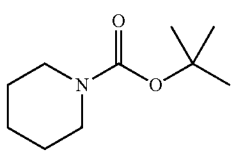
(D-19)
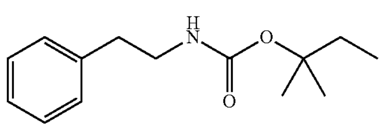
(D-20)
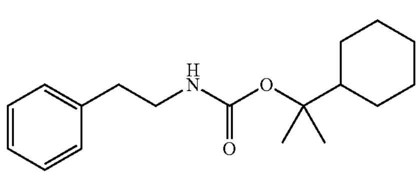
(D-21)
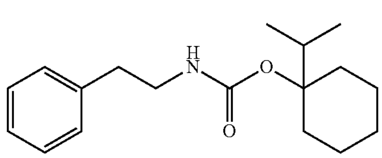
(D-22)
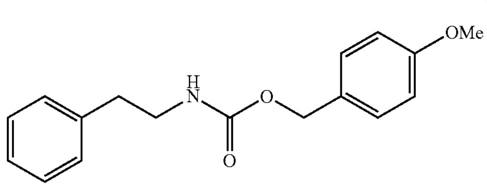
-continued
(D-23)
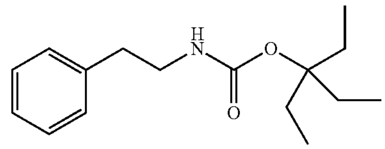
(D-24)
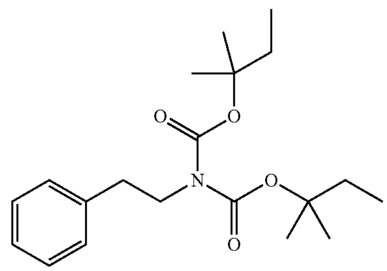
(D-25)
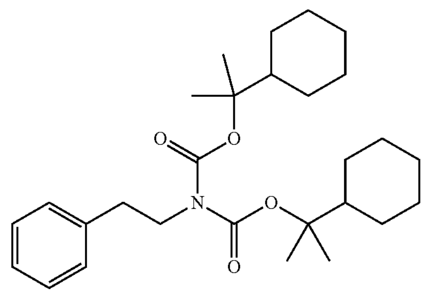
(D-26)
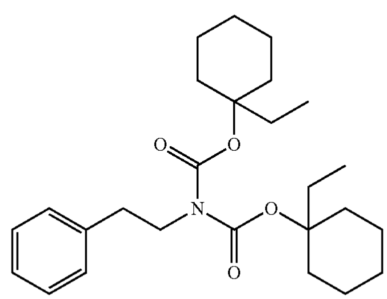
(D-27)
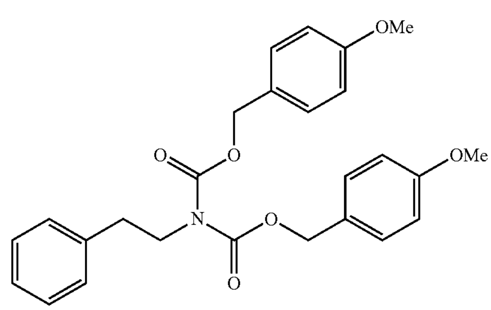
(D-28)
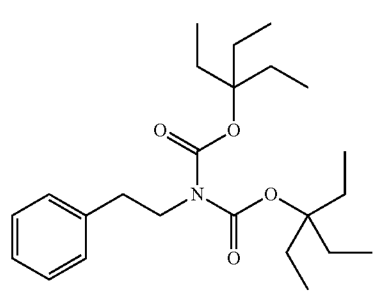

-continued
(D-29)
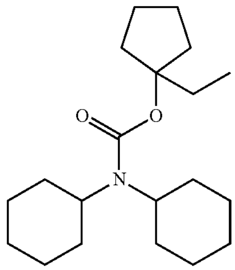
(D-30)
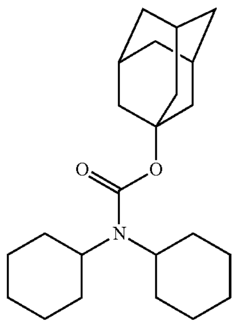
(D-31)
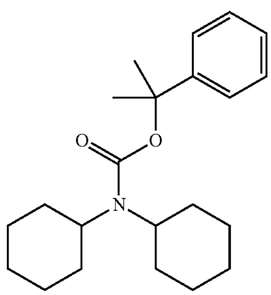
(D-32)
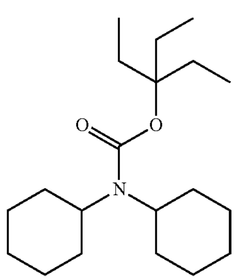
(D-33)
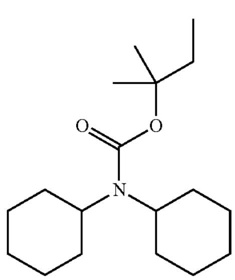
-continued
(D-34)
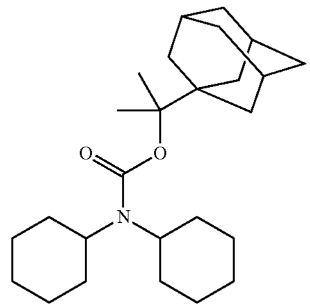
(D-35)
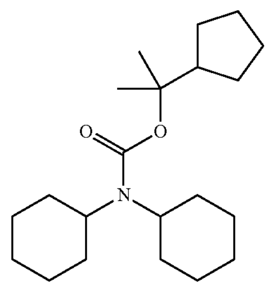
(D-36)
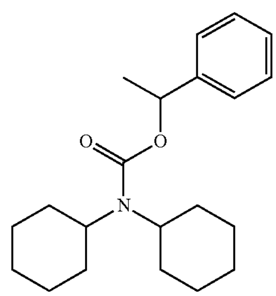
(D-37)
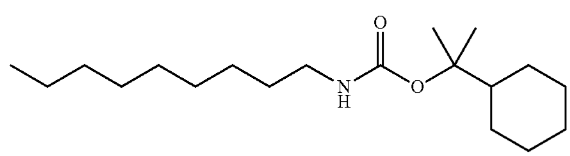
(D-38)
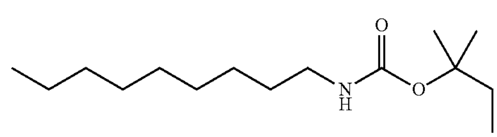
(D-39)
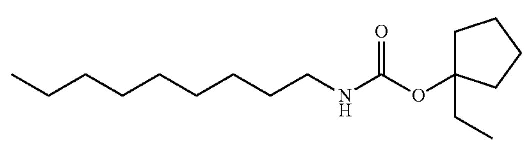
(D-40)
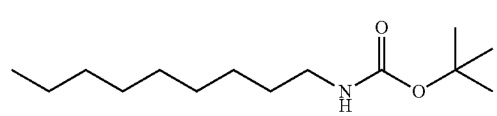

-continued
(D-41)
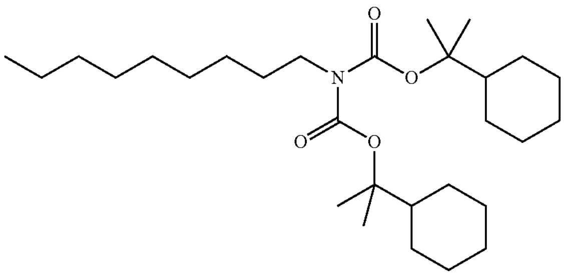
(D-42)
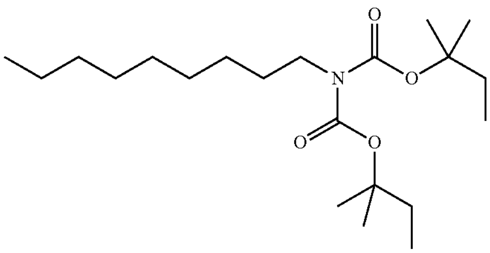
(D-43)
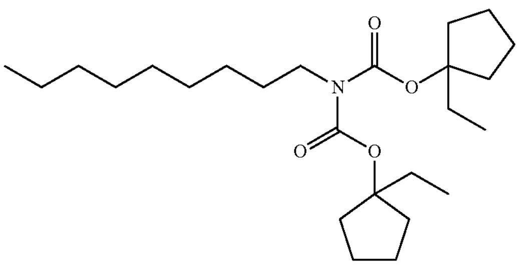
(D-44)
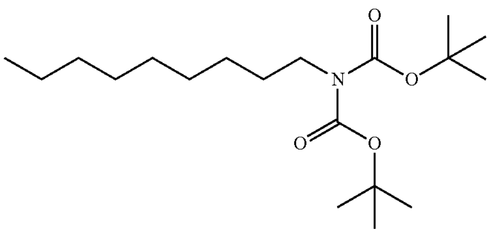
(D-45)
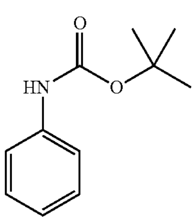
(D-46)
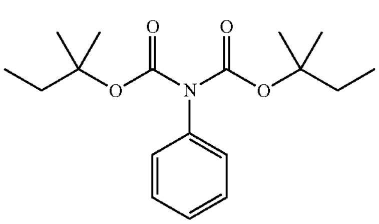
-continued
(D-47)
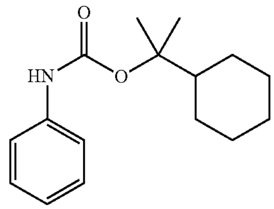
(D-48)
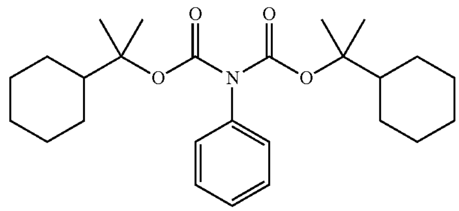
(D-49)
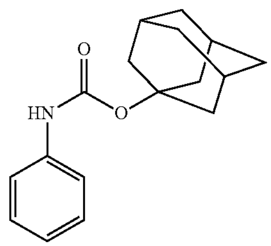
(D-50)
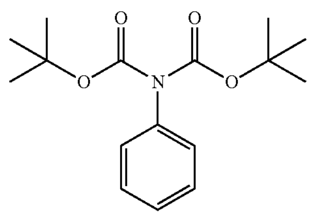
(D-51)
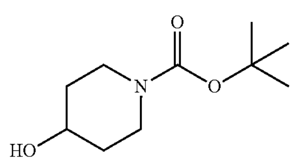
(D-52)
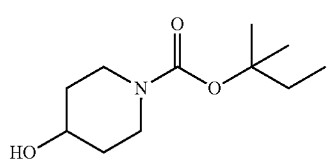
(D-53)
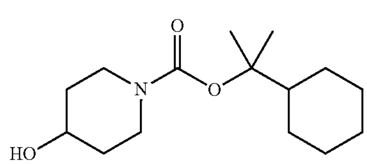
(D-54)
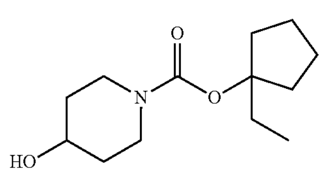

-continued (D-55)

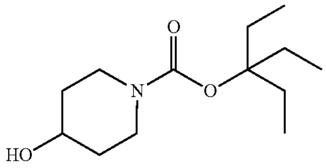

(D-56)

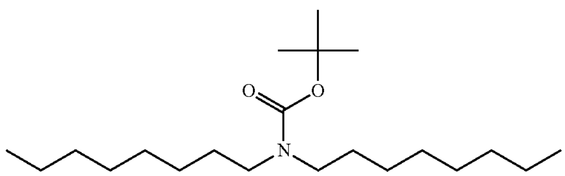

(D-57)

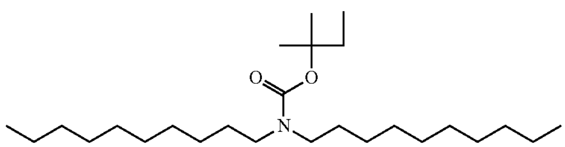

(D-58)

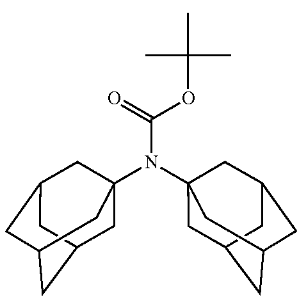

(D-59)

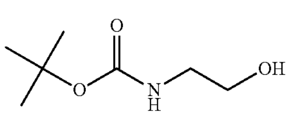

(D-60)

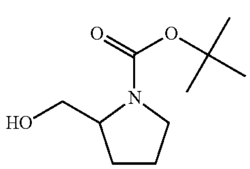

(D-61)

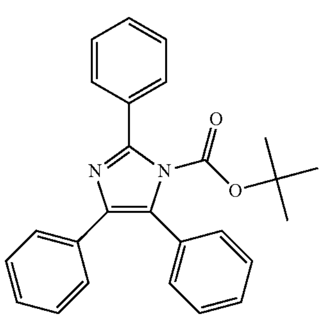

-continued (D-62)

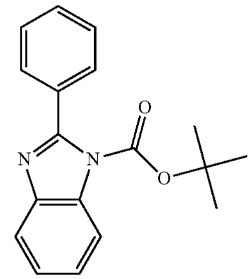

(D-63)

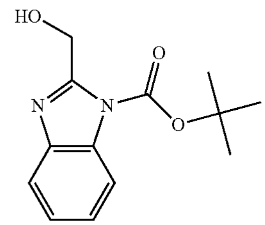

(D-64)

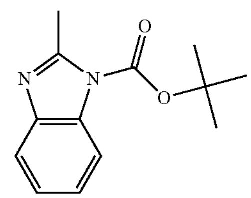

(D-65)

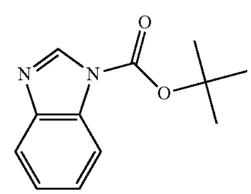

The compound represented by formula (A) can be synthesized by referring to, for example, JP-A-2007-298569 and JP-A-2009-199021.

In the present invention, as for the low molecular weight compound (D), one compound may be used alone, or two or more compounds may be mixed and used.

The composition of the present invention may or may not contain the low molecular compound (D), but in the case of containing the compound (D), the content thereof is usually from 0.001 to 20 mass %, preferably from 0.001 to 10 mass %, more preferably from 0.01 to 5 mass %, based on the total solid content of the composition combined with the basic compound.

In the case where the composition of the present invention contains an acid generator, the ratio between the acid generator and the compound (D) used in the composition is preferably acid generator/[compound (D)+basic compound] (by mol)=from 2.5 to 300. That is, the molar ratio is preferably 2.5 or more in view of sensitivity and resolution and is preferably 300 or less from the standpoint of suppressing the reduction in resolution due to thickening of the resist pattern over time after exposure until heat treatment. The acid generator/[compound (D)+basic compound] (by mol) is more preferably from 5.0 to 200, still more preferably from 7.0 to 150.

Other examples of the basic compound which can be used in the composition of the present invention include compounds synthesized in Examples of JP-A-2002-363146 and compounds described in paragraph 0108 of JP-A-2007-298569.

A photosensitive basic compound may be also used as the basic compound. Examples of the photosensitive basic compound which can be used include compounds described in JP-T-2003-524799 (the term "JP-T" as used herein means a "published Japanese translation of a PCT patent application") and *J. Photopolym. Sci. & Tech.*, Vol. 8, pp. 543-553 (1995).

The molecular weight of the basic compound is usually from 100 to 1,500, preferably from 150 to 1,300, more preferably from 200 to 1,000.

One kind of these basic compounds may be used alone, or two or more kinds thereof may be used in combination.

In the case where the composition of the present invention contains a basic compound, the content thereof is preferably from 0.01 to 8.0 mass %, more preferably from 0.1 to 5.0 mass %, still more preferably from 0.2 to 4.0 mass %, based on the total solid content of the composition.

The molar ratio of the basic compound to the photoacid generator is preferably from 0.01 to 10, more preferably from 0.05 to 5, still more preferably from 0.1 to 3. If the molar ratio is excessively large, the sensitivity and/or resolution may be reduced, whereas if the molar ratio is excessively small, thinning of the pattern may occur between exposure and heating (post-baking). The molar ratio is more preferably from 0.05 to 5, still more preferably from 0.1 to 3. In this molar ratio, the proportion of the photoacid generator is based on the total amount of the repeating unit (B) of the resin and the photoacid generator that may be further contained in the resin.

[7] Hydrophobic Resin (HR)

The actinic ray-sensitive or radiation-sensitive resin composition of the present invention may contain (HR) a hydrophobic resin separately from the resin (Ab).

The hydrophobic resin (HR) preferably contains a fluorine atom-containing group, a silicon atom-containing group or a hydrocarbon group having a carbon number of 5 or more so as to be unevenly distributed to the film surface. Such a group may be present in the main chain of the resin or may be substituted on the side chain. Specific examples of the hydrophobic resin (HR) are illustrated below.

(HR-1)

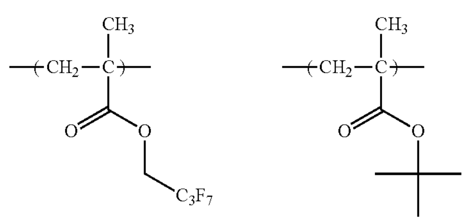

(HR-2)

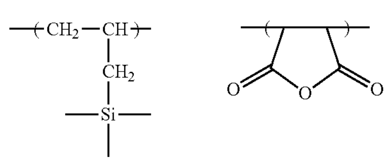

(HR-3)

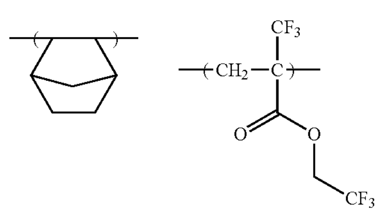

-continued (HR-4)

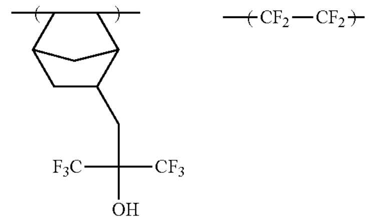

(HR-5)

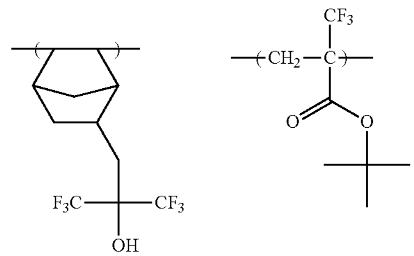

(HR-6)

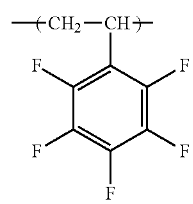

(HR-7)

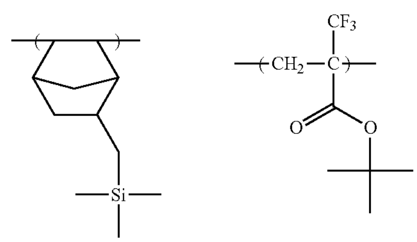

(HR-8)

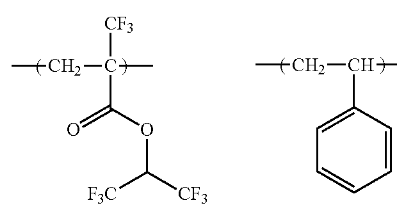

(HR-9)

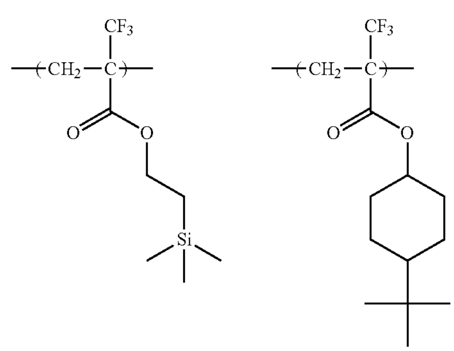

-continued
(HR-10)
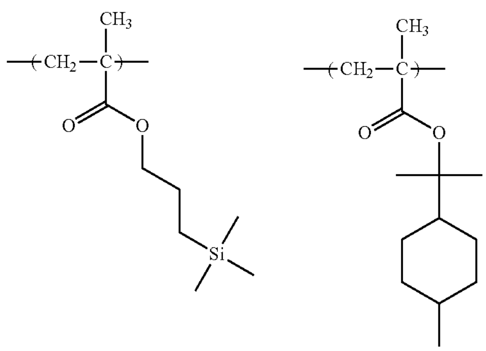
(HR-11)
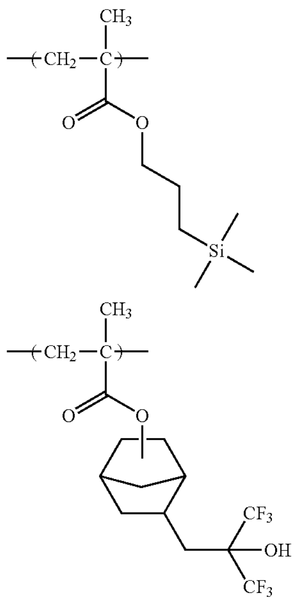
(HR-12)
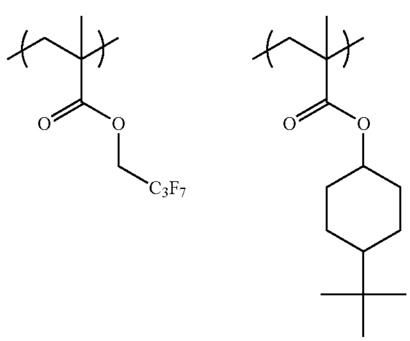
(HR-13)
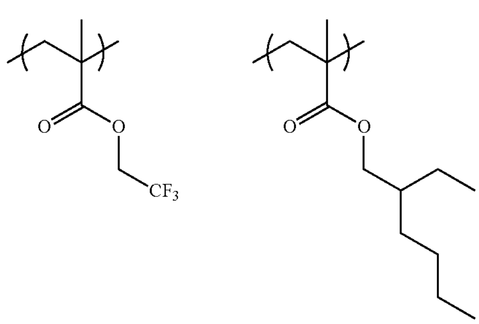
-continued
(HR-14)
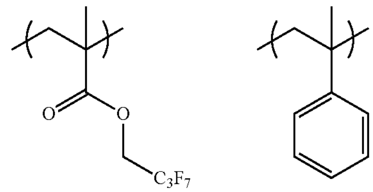
(HR-15)
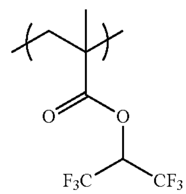
(HR-16)
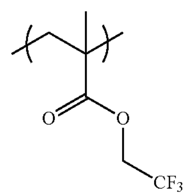
(HR-17)
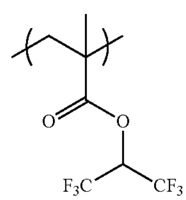
(HR-18)
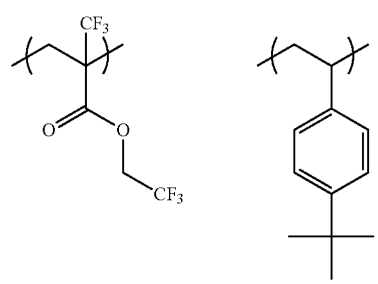
(HR-19)
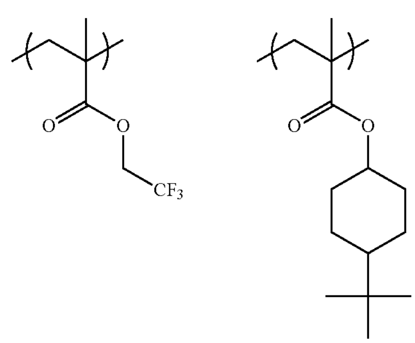

-continued
(HR-20)
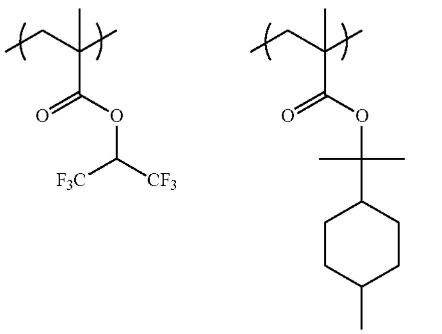
(HR-21)
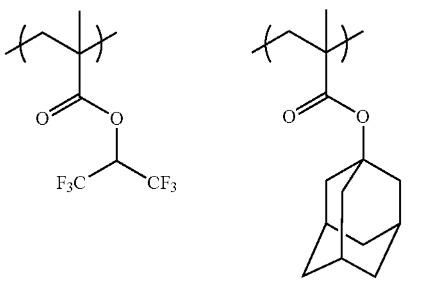
(HR-22)
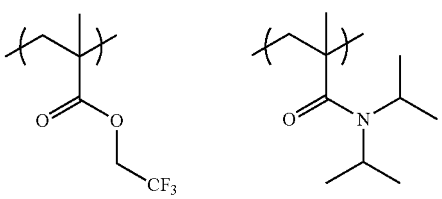
(HR-23)
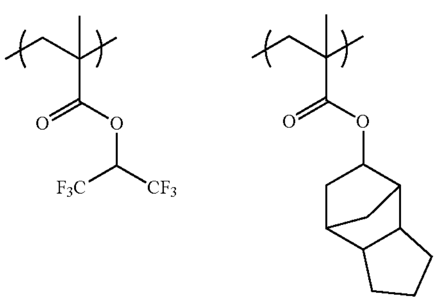
(HR-24)
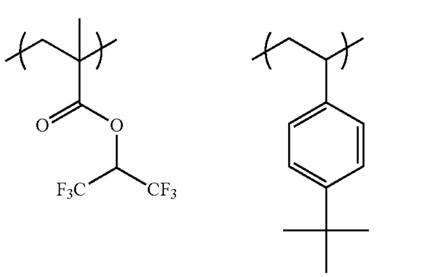
-continued
(HR-25)
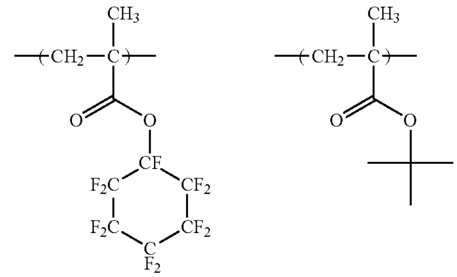
(HR-26)
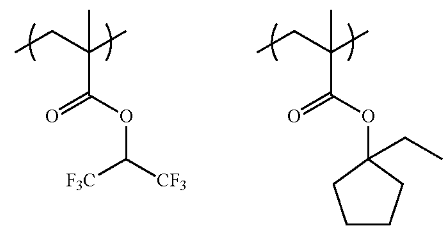
HR-27
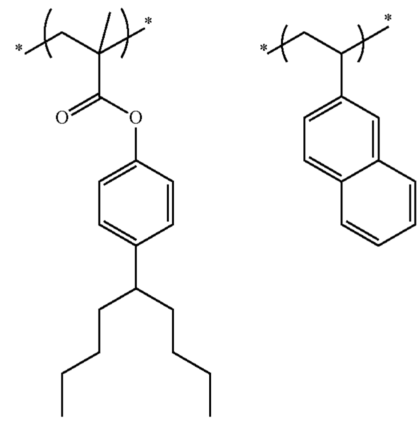
HR-28
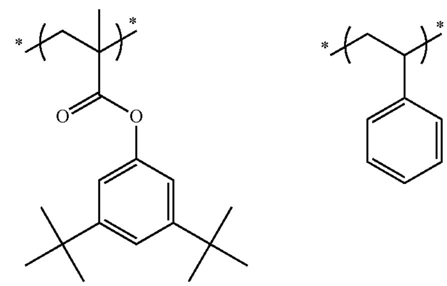
HR-29
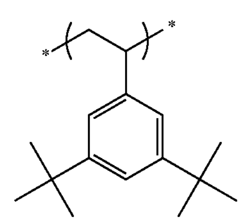

-continued
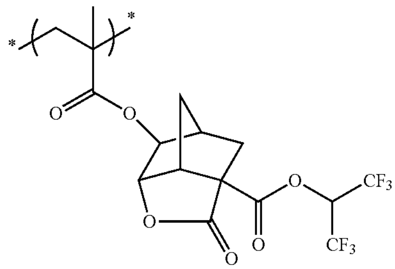
HR-30
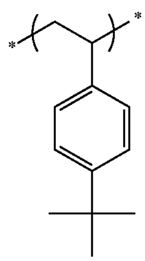
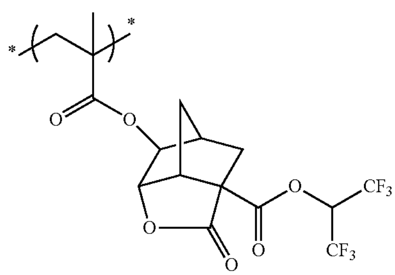
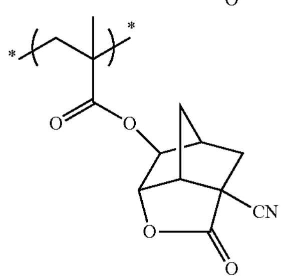
HR-31
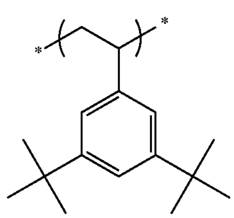
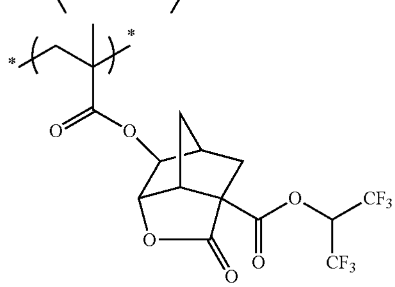
-continued
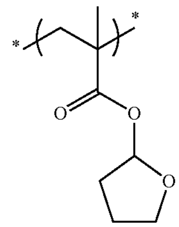
HR-32
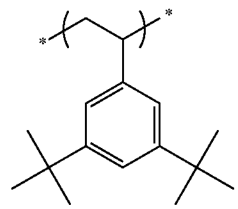
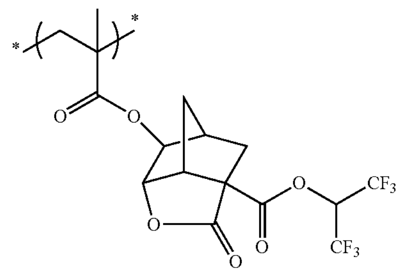
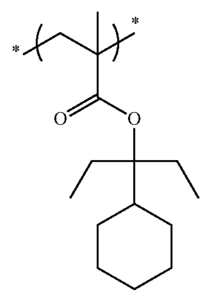
HR-33
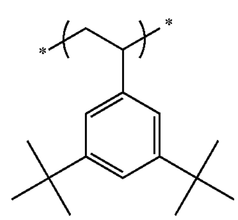
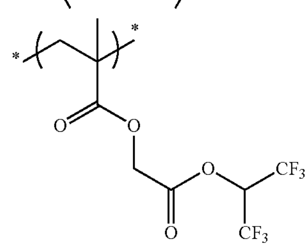
HR-34
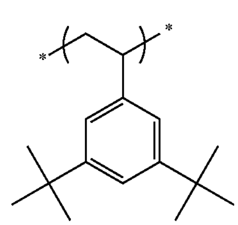

-continued

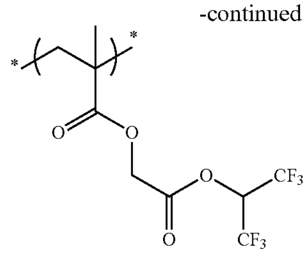

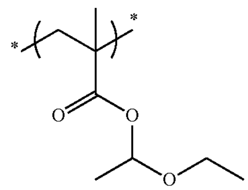

As the hydrophobic resin, in addition, those described in JP-A-2011-248019, JP-A-2010-175859 and JP-A-2012-032544 may be also preferably used.

[8] Surfactant

The composition of the present invention may further contain a surfactant. By virtue of containing a surfactant, when an exposure light source having a wavelength of 250 nm or less, particularly 220 nm or less, is used, a pattern with good sensitivity, resolution and adherence as well as less development defects can be formed.

As the surfactant, it is particularly preferred to use fluorine-containing and/or silicon-containing surfactants.

Examples of the fluorine-containing and/or silicon-containing surfactants include surfactants described in paragraph [0276] of U.S. Patent Application Publication 2008/0248425. There may be also used EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by DIC Corporation); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). Incidentally, Polysiloxane Polymer KP-341 (produced by Shin-Etsu Chemical Co., Ltd.) may be also used as the silicon-containing surfactant.

As for the surfactant, other than these known surfactants, a surfactant may be synthesized by using a fluoro-aliphatic compound produced by a telomerization process (also called a telomer process) or an oligomerization process (also called an oligomer process). Specifically, a fluoro-aliphatic group-containing polymer derived from the fluoro-aliphatic compound may be used as the surfactant. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate or methacrylate and/or a (poly(oxyalkylene)) methacrylate, and the polymer may have an irregular distribution or may be a block copolymer.

Examples of the poly(oxyalkylene) group include a poly(oxyethylene) group, a poly(oxypropylene) group, and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoro-aliphatic group-containing monomer and a (poly(oxyalkylene)) acrylate or methacrylate may be also a ternary or higher copolymer obtained by simultaneously copolymerizing, for example, two or more different fluoro-aliphatic group-containing monomers and two or more different (poly(oxyalkylene)) acrylates or methacrylates.

Examples thereof include, as the commercially available surfactant, Megaface F178, F-470, F-473, F-475, F-476 and F-472 (produced by DIC Corporation) and further include a copolymer of a $C_6F_{13}$ group-containing acrylate or methacrylate with a (poly(oxyalkylene)) acrylate or methacrylate, a copolymer of a $C_6F_{13}$ group-containing acrylate or methacrylate with a (poly(oxyethylene)) acrylate or methacrylate and a (poly(oxypropylene))acrylate or methacrylate, a copolymer of a $C_8F_{17}$ group-containing acrylate or methacrylate with a (poly(oxyalkylene)) acrylate or methacrylate, and a copolymer of a $C_8F_{17}$ group-containing acrylate or methacrylate with a (poly(oxyethylene)) acrylate or methacrylate and a (poly(oxypropylene)) acrylate or methacrylate.

Surfactants other than the fluorine-containing and/or silicon-containing surfactants, described in paragraph [0280] of U.S. Patent Application Publication No. 2008/0248425, may be also used.

As for these surfactants, one kind may be used alone, or two or more kinds may be used in combination.

In the case where the composition of the present invention contains a surfactant, the content of the surfactant is preferably from 0 to 2 mass %, more preferably from 0.0001 to 2 mass %, still more preferably from 0.0005 to 1 mass %, based on the total solid content of the composition.

[9] Other Additives

The composition of the present invention may appropriately contain, in addition to the components described above, a carboxylic acid, an onium carboxylate, a dissolution inhibiting compound having a molecular weight of 3,000 or less described, for example, in *Proceeding of SPIE,* 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid such as benzoic acid and naphthoic acid.

The content of the carboxylic acid is preferably from 0.01 to 10 mass %, more preferably from 0.01 to 5 mass %, still more preferably from 0.01 to 3 mass %, based on the total solid content concentration of the composition.

From the standpoint of enhancing the resolution, the actinic ray-sensitive or radiation-sensitive resin composition of the present invention is preferably used in a film thickness of 10 to 250 nm, more preferably from 20 to 200 nm, still more preferably from 30 to 100 nm. Such a film thickness can be achieved by setting the solid content concentration in the composition to an appropriate range, thereby imparting an appropriate viscosity and enhancing the coatability and film-forming property.

The solid content concentration in the actinic ray-sensitive or radiation-sensitive resin composition of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that probably thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition of the present invention is used by dissolving the components above in a predetermined organic solvent, preferably in the above-described mixed solvent, filtering the solution, and coating the filtrate on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[Usage]

The pattern forming method of the present invention is suitably used for the fabrication of a semiconductor microcircuit, for example, in the production of VLSI or a high-capacity microchip. Incidentally, at the fabrication of a semiconductor microcircuit, the resist film having formed therein a pattern is subjected to circuit formation or etching and the remaining resist film part is finally removed with a solvent or the like. Therefore, unlike a so-called permanent resist used for a printed board and the like, the resist film derived from the actinic ray-sensitive or radiation-sensitive resin composition of the present invention does not remain in the final product such as microchip.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronics, OA•media equipment, optics and communication equipment).

EXAMPLES

Synthesis Example 1

Synthesis of Resin (Ab-28)

46.50 g of Compound (10) was dissolved in 263.5 g of n-hexane, and 87.19 g of cyclohexanol, 46.50 g of anhydrous magnesium sulfate and 4.81 g of 10-camphorsulfonic acid were added thereto. This mixture was stirred at room temperature for 6 hours, and 10.49 g of triethylamine was added thereto, followed by stirring for 10 minutes. After removing solids by filtration, 400 g of ethyl acetate was added, and the organic layer was washed with 200 g of ion-exchanged water five times and then dried over anhydrous magnesium sulfate. The solvent was removed by distillation, as a result, 116.27 g of a solution containing Compound (11) was obtained.

8.80 g of acetyl chloride was added to 41.19 g of the solution containing Compound (11), and this mixture was stirred at room temperature for 2 hours to obtain 49.89 g of a solution containing Compound (12).

7.40 g of Compound (8) was dissolved in 79.93 g of dehydrated tetrahydrofuran, and 7.40 g of anhydrous magnesium sulfate and 60.89 g of triethylamine were added thereto. This mixture was stirred in a nitrogen atmosphere and after cooling to 0° C., 49.99 g of the solution containing Compound (12) was added dropwise, followed by stirring at room temperature for 3 hours. After removing solids by filtration, 400 g of ethyl acetate was added, and the organic layer was washed with 200 g of ion-exchanged water five times and then dried over anhydrous magnesium sulfate. The solvent was removed by distillation, and the residue was subjected to isolation and purification by column chromatography to obtain 23.91 g of Compound (13).

3.61 g of a 50.00 mass % cyclohexanone solution of Compound (6), 6.31 g of Compound (13), and 0.35 g of polymerization initiator V-601 (produced by Wako Pure Chemical Industries, Ltd.) were dissolved in 28.07 g of cyclohexanone, and 16.09 g of cyclohexanone was put in a reaction vessel and, in a nitrogen gas atmosphere, added dropwise to the system at 85° C. over 4 hours. The reaction solution was stirred under heating over 2 hours and then allowed to cool to room temperature.

The reaction solution above was added dropwise to 400 g of heptanone/ethyl acetate=9/1 (by mass), and a polymer was precipitated and collected by filtration. The solid collected by filtration was washed by spraying 200 g of heptane/ethyl acetate=9/1 (by mass), and the solid after washing was dried under reduced pressure to obtain 4.20 g of Resin (Ab-28).

The solvent was removed by distillation, as a result, 44.86 g of a solution containing Compound (2) was obtained.

4.52 g of acetyl chloride was added to 23.07 g of the solution containing Compound (2), and this mixture was stirred at room temperature for 2 hours to obtain 27.58 g of a solution containing Compound (3).

3.57 g of Compound (8) was dissolved in 26.18 g of dehydrated tetrahydrofuran, and 3.57 g of anhydrous magnesium sulfate and 29.37 g of triethylamine were added thereto. This mixture was stirred in a nitrogen atmosphere and after cooling to 0° C., 27.54 g of the solution containing Compound (3) was added dropwise, followed by stirring at room temperature for 3.5 hours. After removing solids by filtration, 400 g of ethyl acetate was added, and the organic layer was washed with 150 g of ion-exchanged water five times and then dried over anhydrous magnesium sulfate. The solvent was removed by distillation, and the residue was subjected to isolation and purification by column chromatography to obtain 8.65 g of Compound (4).

2.52 g of Compound (6) (a 50.00 mass % cyclohexanone solution), 0.78 g of Compound (5), 5.64 g of Compound (4) and 0.32 g of polymerization initiator V-601 (produced by Wako Pure Chemical Industries, Ltd.) were dissolved in 27.01 g of cyclohexanone, and 15.22 g of cyclohexanone was put in a reaction vessel and, in a nitrogen gas atmosphere, added dropwise to the system at 85° C. over 4 hours. The reaction solution was stirred under heating over 2 hours and then allowed to cool to room temperature.

The reaction solution above was added dropwise to 400 g of heptanone, and a polymer was precipitated and collected by filtration. The solid collected by filtration was washed by spraying 200 g of heptane, and the solid after washing was dried under reduced pressure to obtain 2.98 g of Resin (Ab-29).

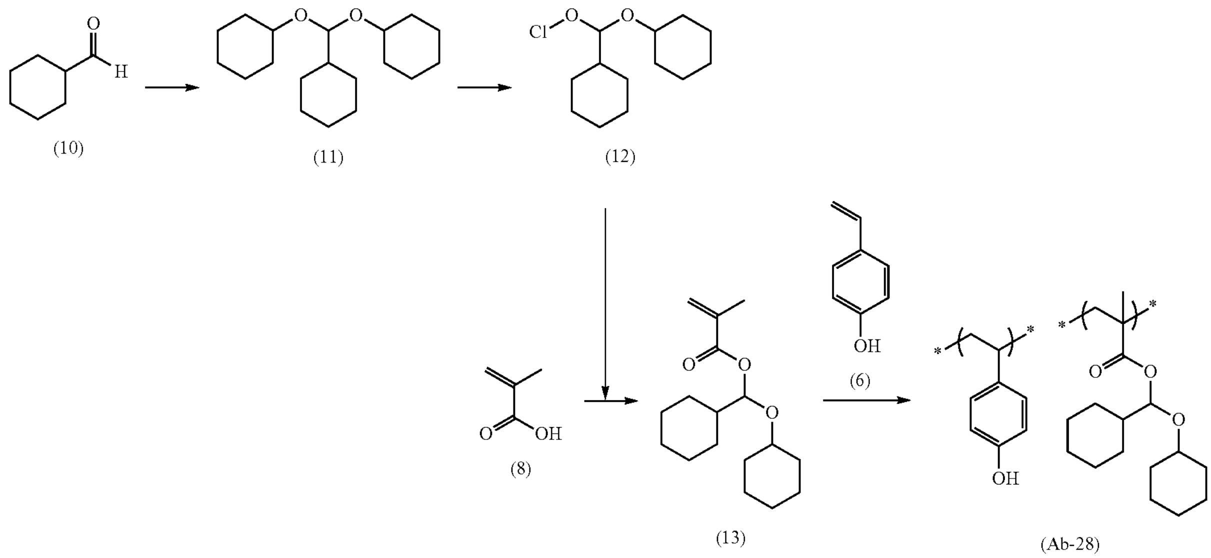

Synthesis Example 2

Synthesis of Resin (Ab-29)

20.00 g of Compound (1) was dissolved in 113.33 g of n-hexane, and 42.00 g of cyclohexanol, 20.00 g of anhydrous magnesium sulfate and 2.32 g of 10-camphorsulfonic acid were added thereto. This mixture was stirred at room temperature for 7.5 hours, and 5.05 g of triethylamine was added thereto, followed by stirring for 10 minutes. After removing solids by filtration, 400 g of ethyl acetate was added, and the organic layer was washed with 200 g of ion-exchanged water five times and then dried over anhydrous magnesium sulfate.

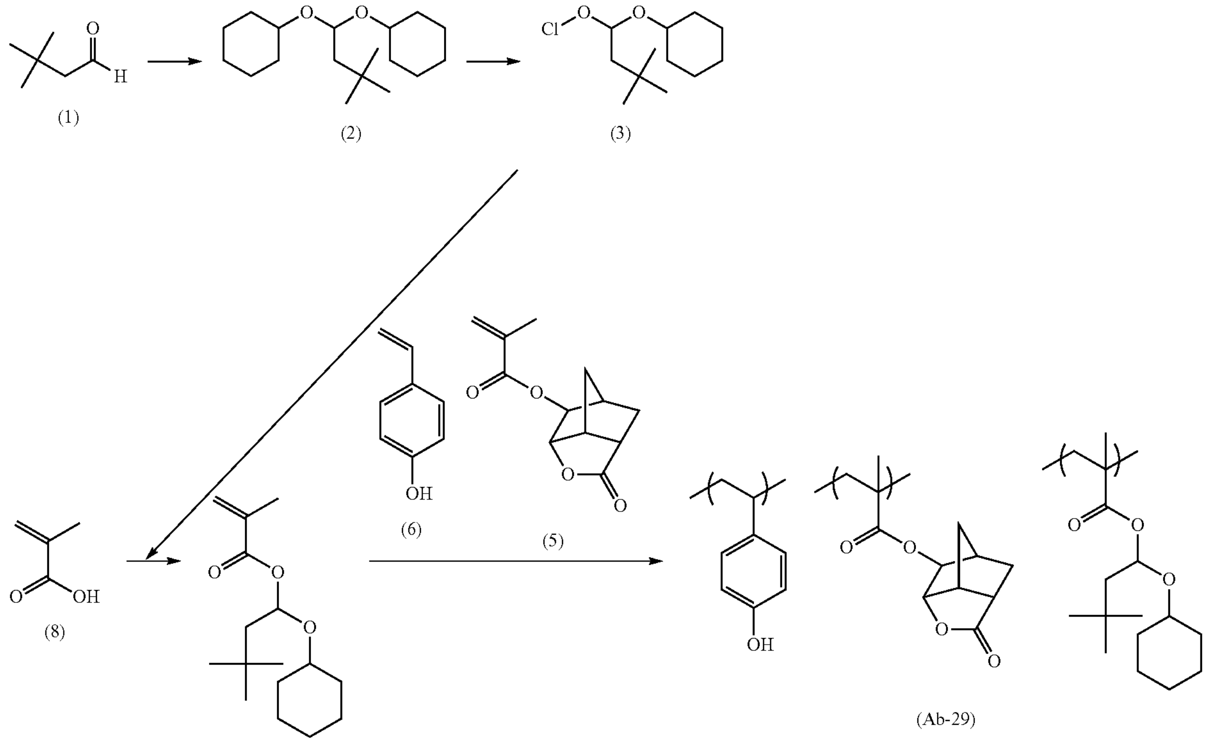
(Ab-29)
Resins (Ab-1) to (Ab-44) were synthesized in the same manner as Resins (Ab-28) and (Ab-29).
The structure, compositional ratio (by mol) of repeating units, mass average molecular weight (Mw) and polydispersity (Mw/Mn) of each of resins synthesized are shown below.
(Ab-1)
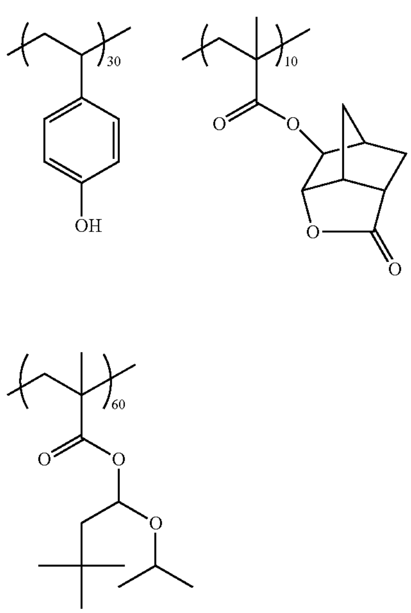
Mw: 12000
Mw/Mn: 1.50
-continued
(Ab-2)
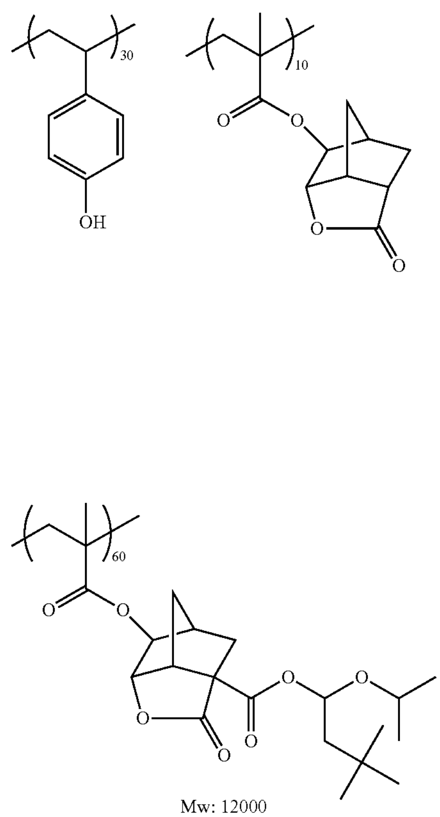
Mw: 12000
Mw/Mn: 1.52

-continued
(Ab-3)
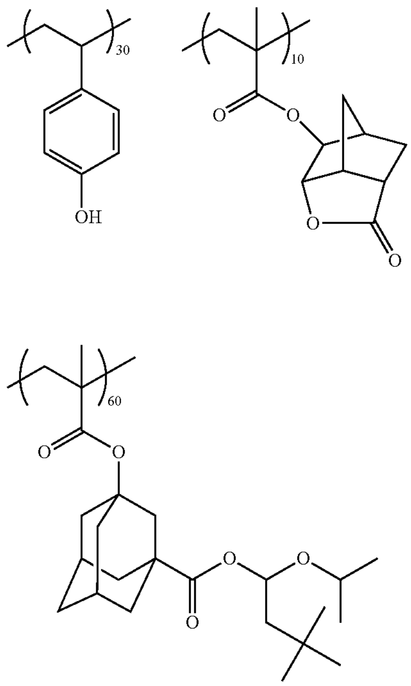
Mw: 11000
Mw/Mn: 1.55
(Ab-4)
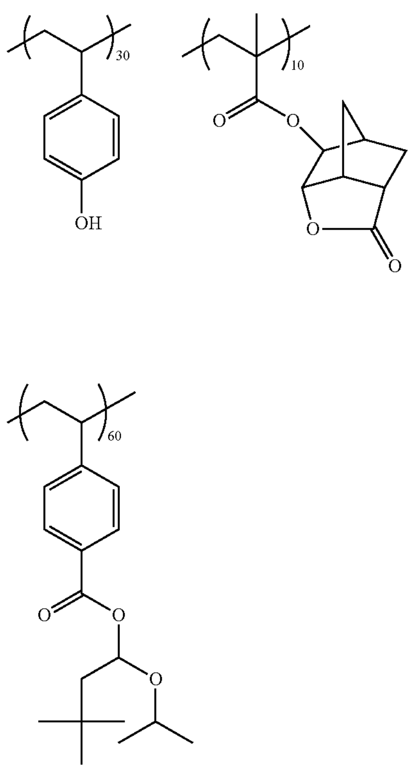
Mw: 11500
Mw/Mn: 1.48
-continued
(Ab-5)
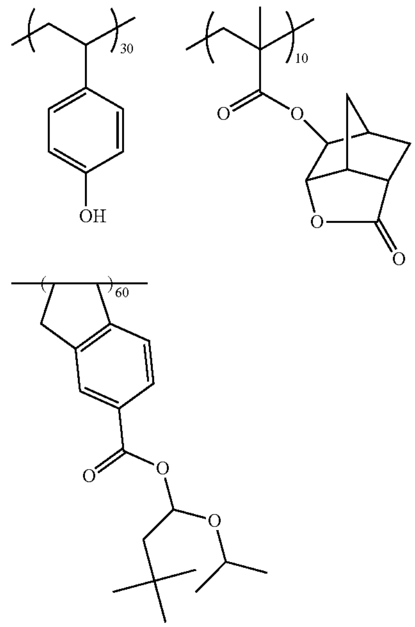
Mw: 11000
Mw/Mn: 1.51
(Ab-6)
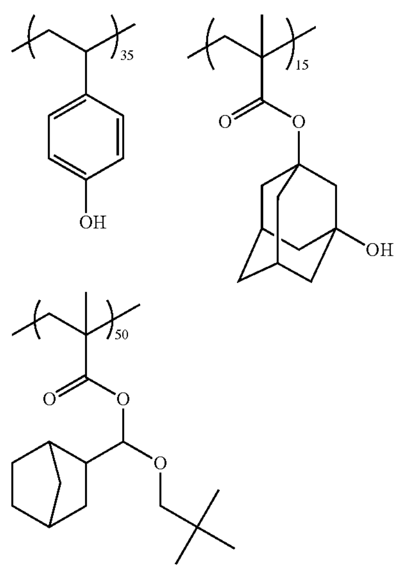
Mw: 17000
Mw/Mn: 1.62
(Ab-7)
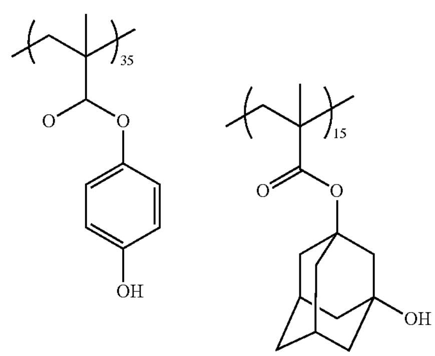

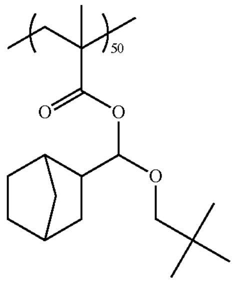
Mw: 17500
Mw/Mn: 1.63
(Ab-8)
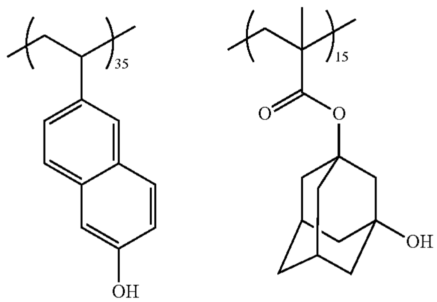
Mw: 18000
Mw/Mn: 1.59
(Ab-9)
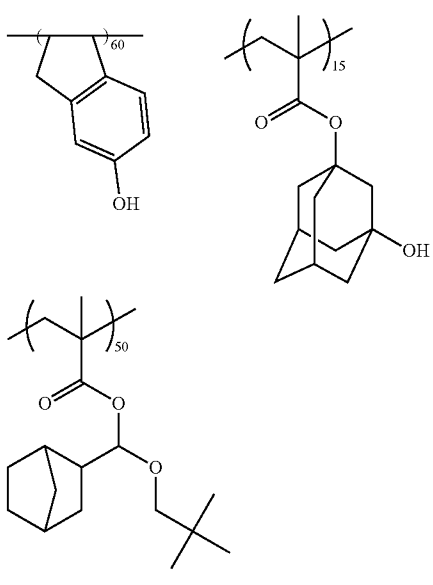
Mw: 17000
Mw/Mn: 1.65
(Ab-10)
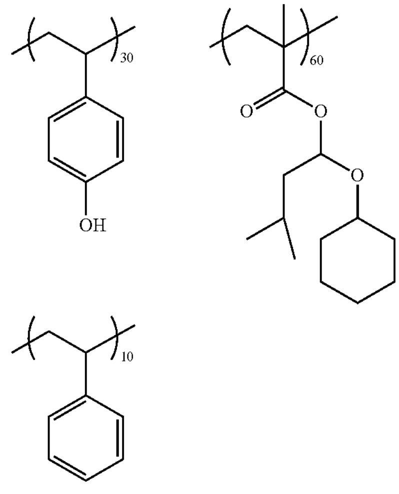
Mw: 7000
Mw/Mn: 1.55
(Ab-11)
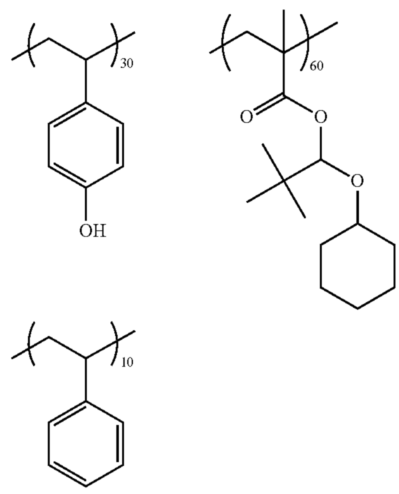
Mw: 6000
Mw/Mn: 1.56
(Ab-12)
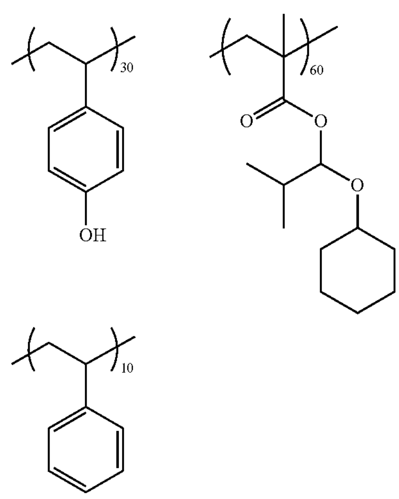
Mw: 7500
Mw/Mn: 1.58

-continued
(Ab-13)
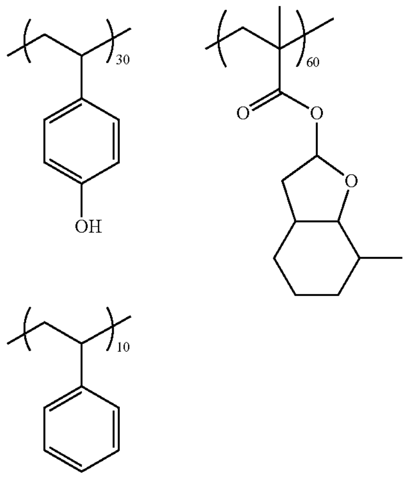
Mw: 8000
Mw/Mn: 1.53
(Ab-14)
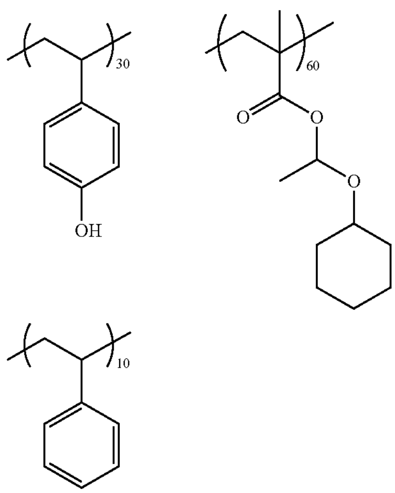
Mw: 7000
Mw/Mn: 1.54
(Ab-15)
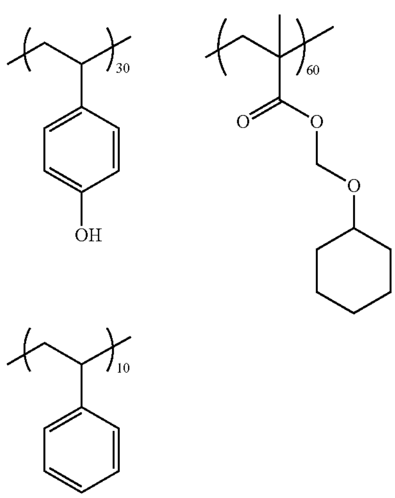
Mw: 6500
Mw/Mn: 1.54
-continued
(Ab-16)
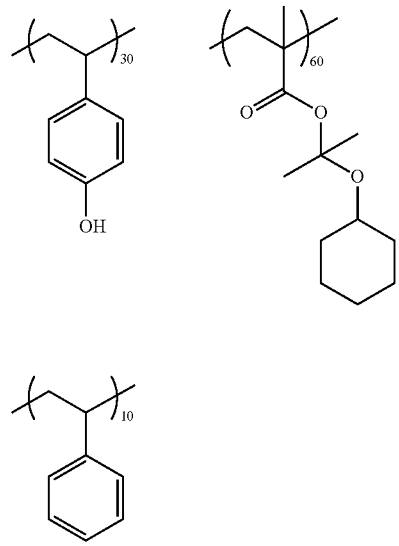
Mw: 7500
Mw/Mn: 1.55
(Ab-17-1)
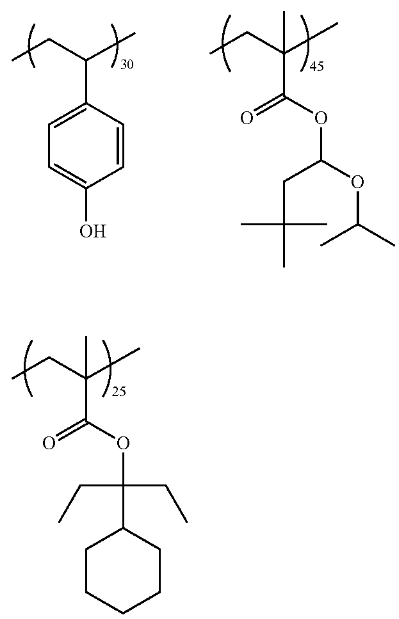
Mw: 15000
Mw/Mn: 1.48
(Ab-17-2)
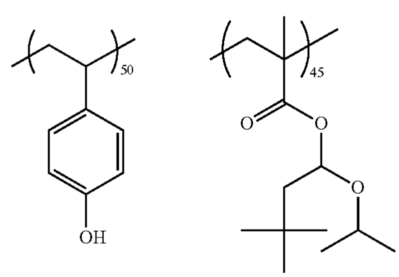

-continued
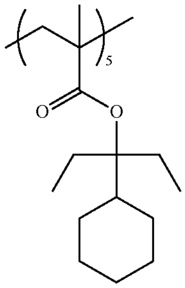
Mw: 14500
Mw/Mn: 1.47
(Ab-17-3)
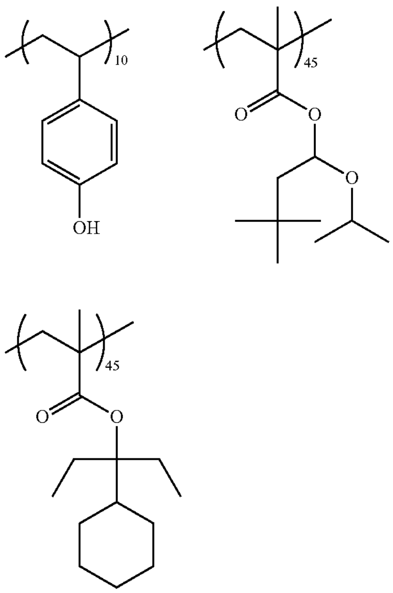
Mw: 15500
Mw/Mn: 1.49
(Ab-17-4)
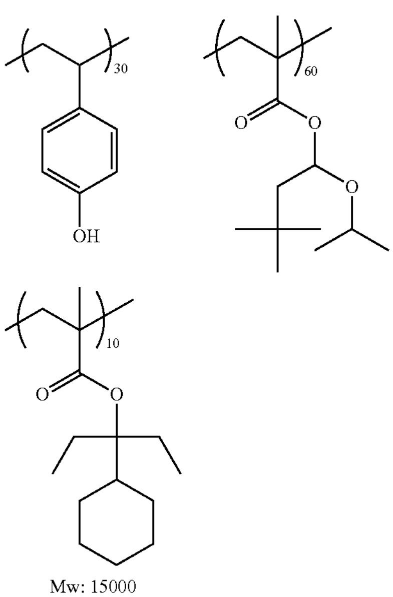
Mw: 15000
Mw/Mn: 1.50
-continued
(Ab-17-5)
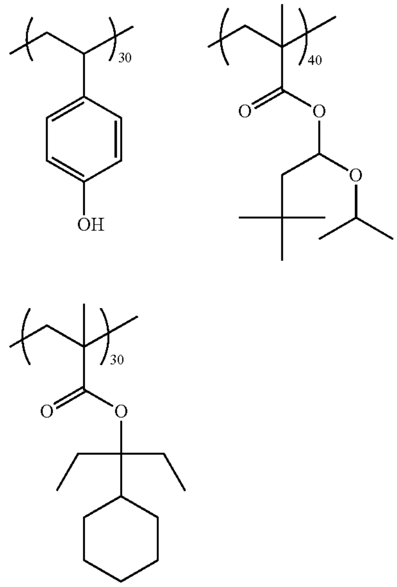
Mw: 15000
Mw/Mn: 1.51
(Ab-17-6)
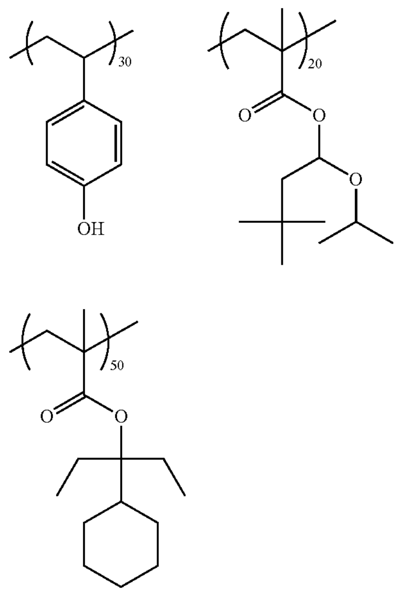
Mw: 15000
Mw/Mn: 1.49
(Ab-18)
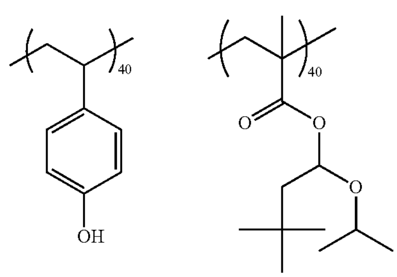

-continued
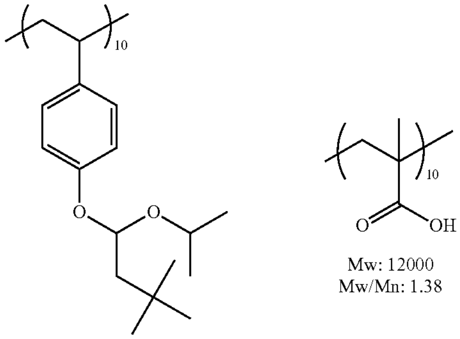
Mw: 12000
Mw/Mn: 1.38
(Ab-19)
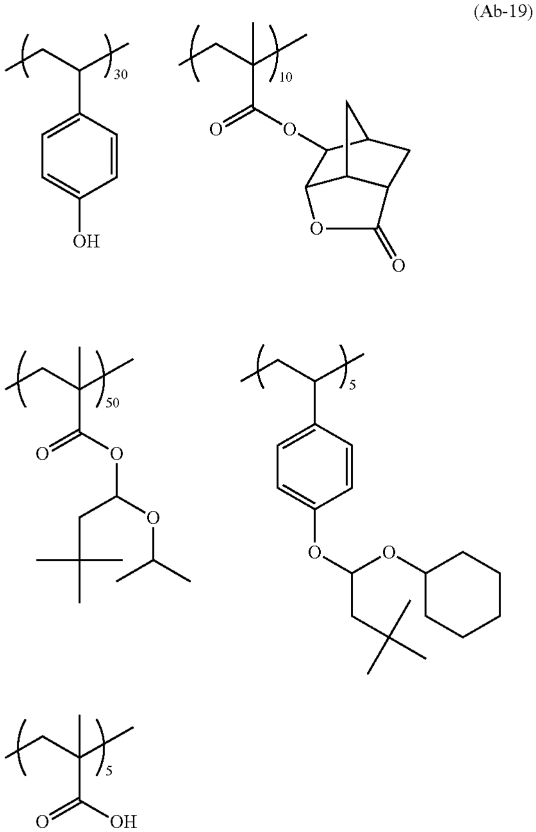
Mw: 14000
Mw/Mn: 1.42
(Ab-21)
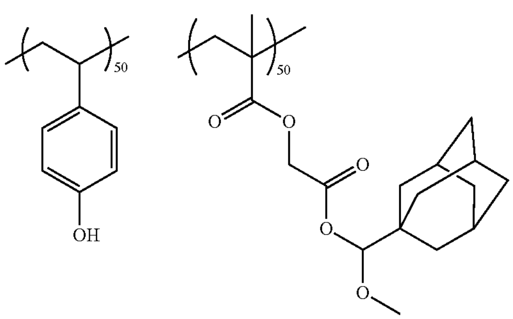
Mw: 3500
Mw/Mn: 1.75
-continued
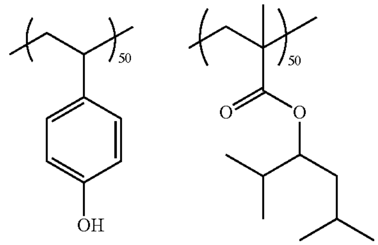
Mw: 5000
Mw/Mn: 1.37
(Ab-22)
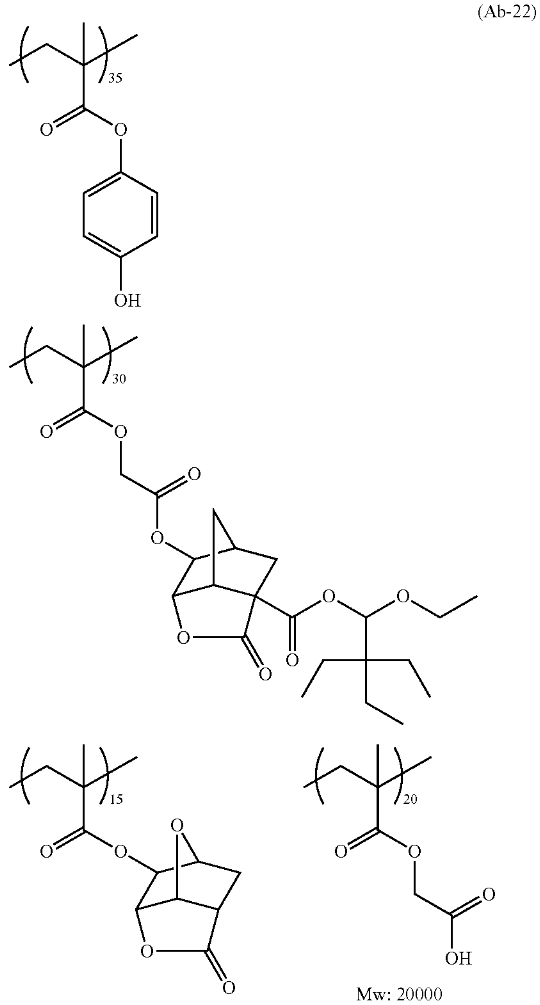
Mw: 20000
Mw/Mn: 1.69
(Ab-23)
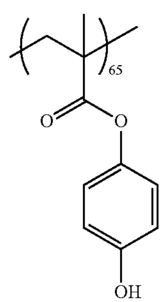

-continued
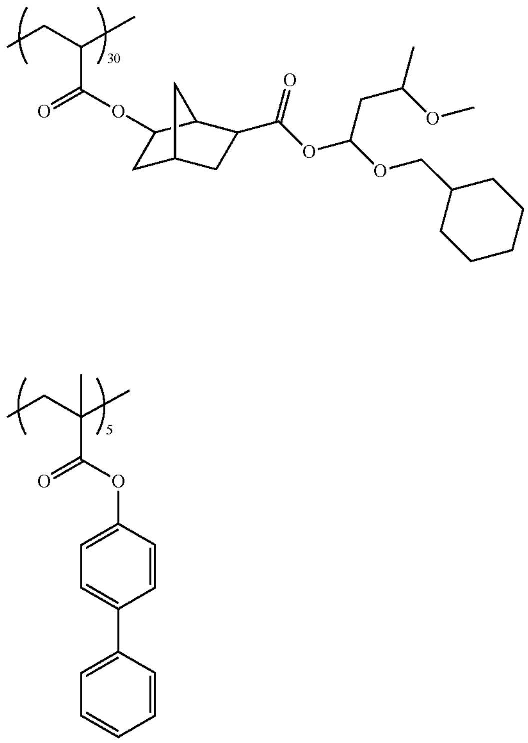
(Ab-24)
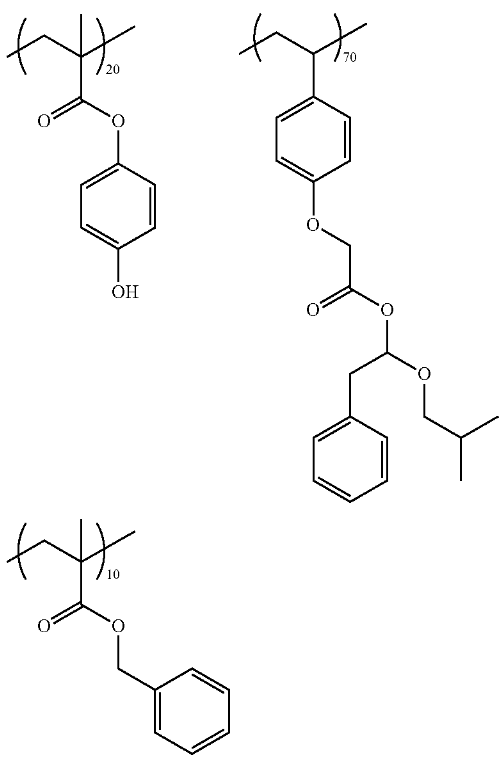
Mw: 25000
Mw/Mn: 1.53
-continued
(Ab-25)
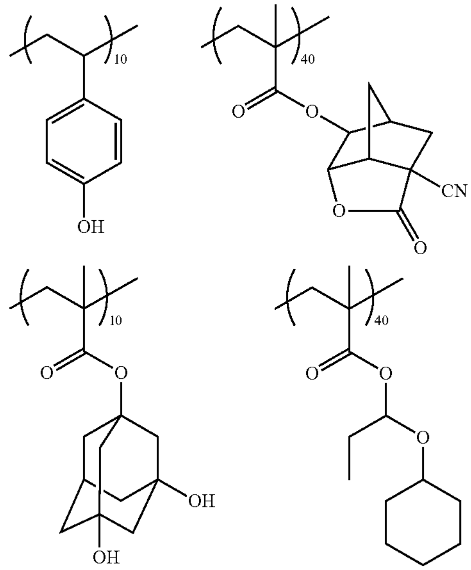
Mw: 15500
Mw/Mn: 1.59
(Ab-26)
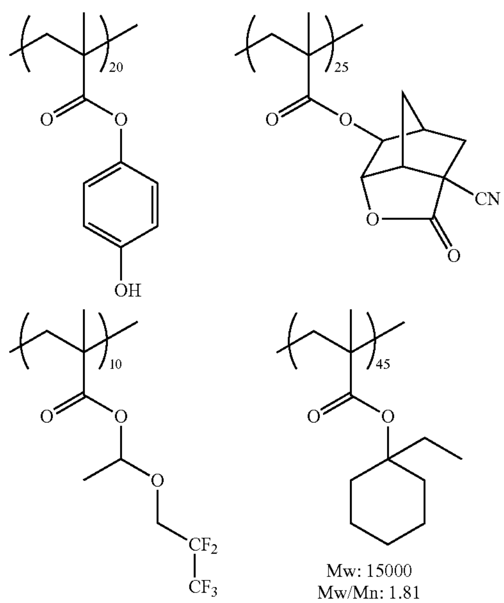
Mw: 15000
Mw/Mn: 1.81
(Ab-27)
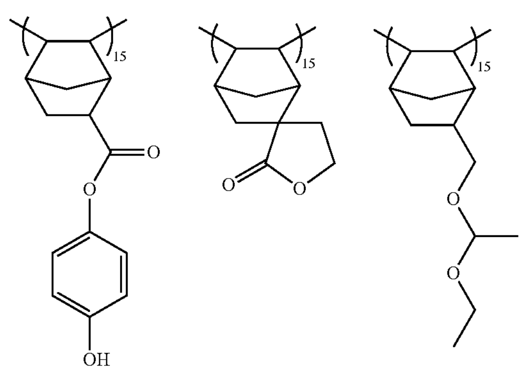

-continued
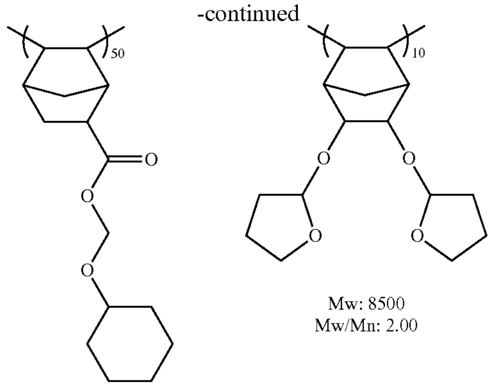
Mw: 8500
Mw/Mn: 2.00
(Ab-28)
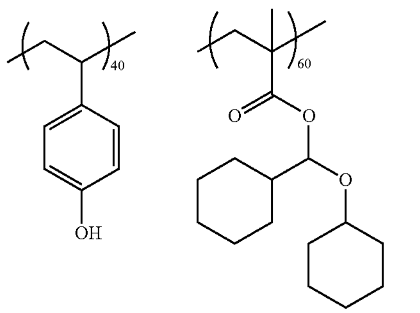
Mw: 8000
Mw/Mn: 1.50
(Ab-29)
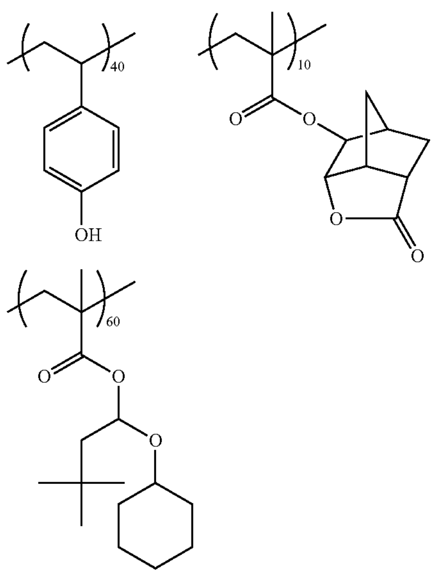
Mw: 11000
Mw/Mn: 1.42
(Ab-30)
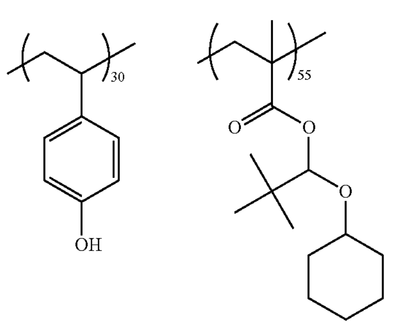
-continued
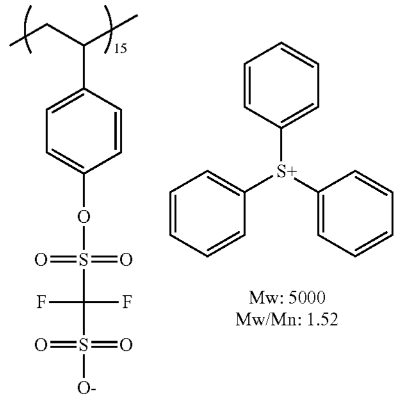
Mw: 5000
Mw/Mn: 1.52
(Ab-32)
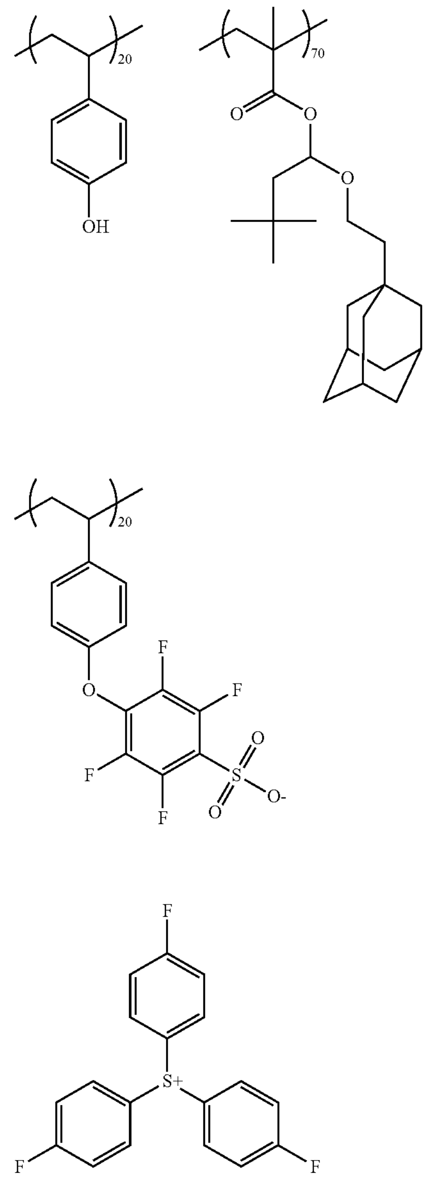
Mw: 15000
Mw/Mn: 1.62

(Ab-35)
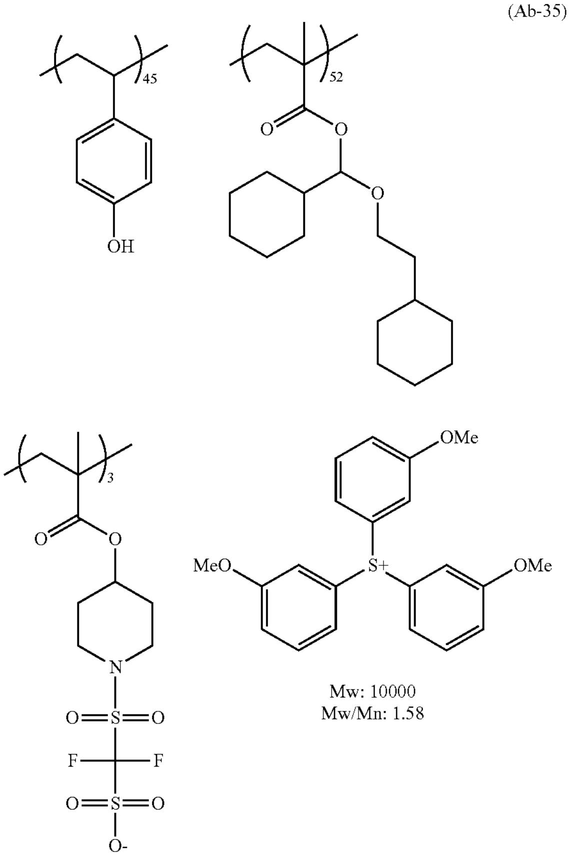
Mw: 10000
Mw/Mn: 1.58
(Ab-37)
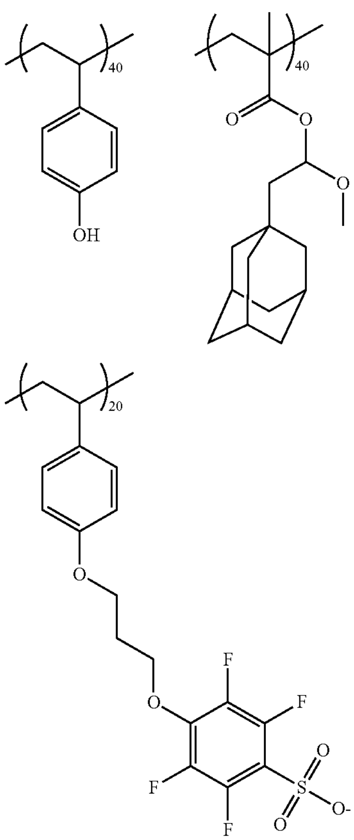
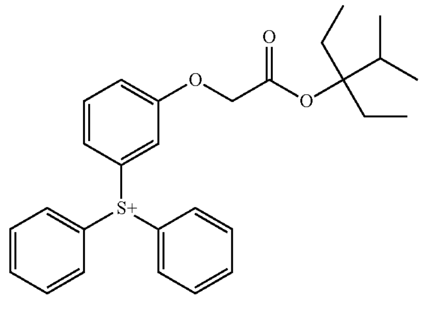
Mw: 12000
Mw/Mn: 1.60
(Ab-40)
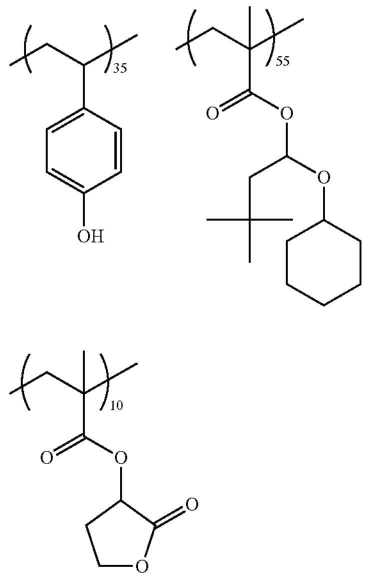
Mw: 8000
Mw/Mn: 1.55
(Ab-41)
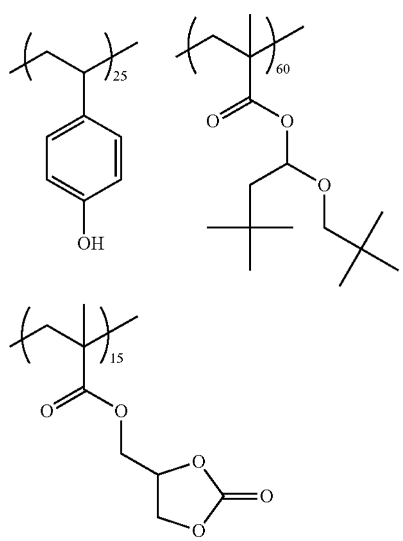
Mw: 12000
Mw/Mn: 1.60

-continued
(Ab-42)
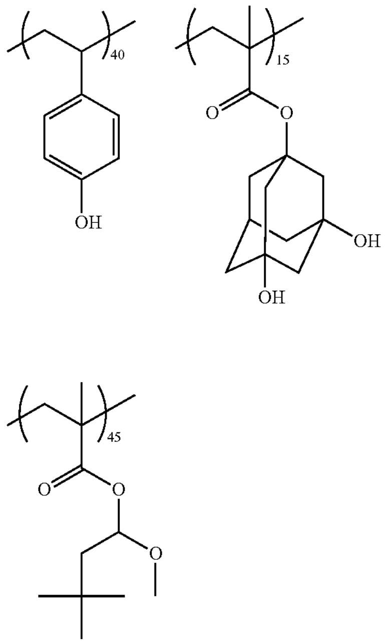
Mw: 11000
Mw/Mn: 1.67
(Ab-44)
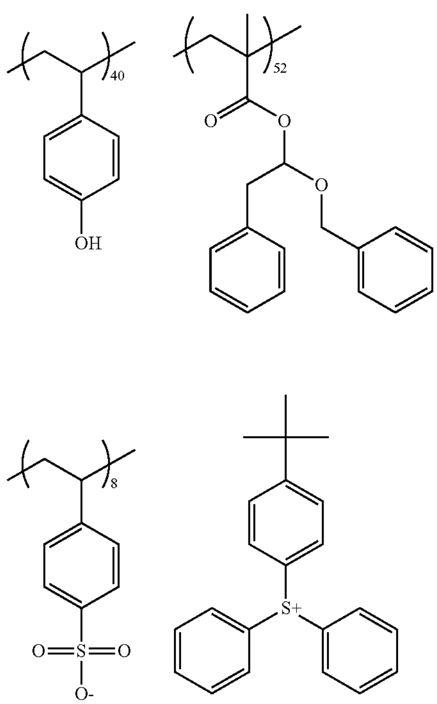
Mw: 16000
Mw/Mn: 1.65
Resins (Ab'-1) to (Ab'-5) were synthesized in the same manner. The structure, compositional ratio (by mol), weight average molecular weight and polydispersity of each of resins synthesized are shown below.
(Ab'-1)
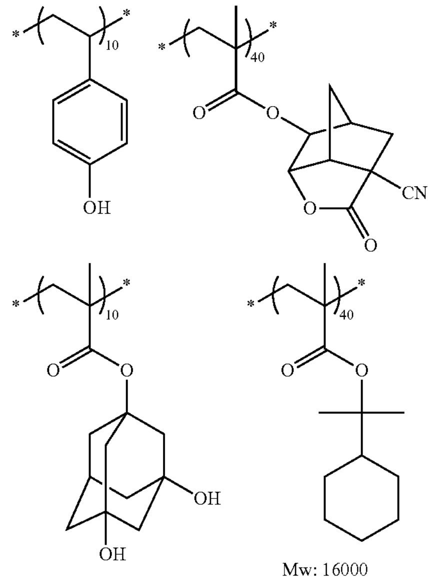
Mw: 16000
Mw/Mn: 1.60
(Ab'-2)
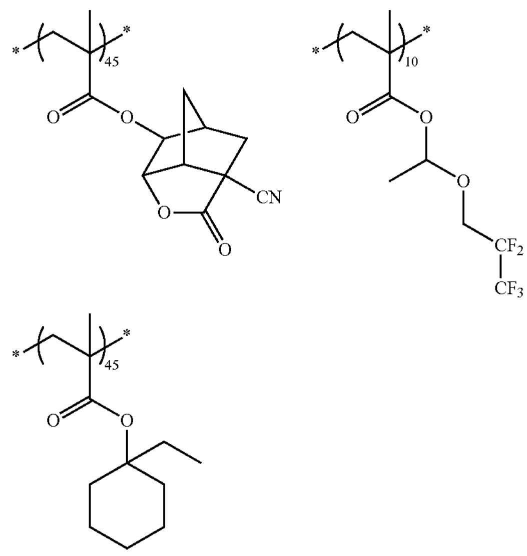
Mw: 15000
Mw/Mn: 1.80
(Ab'-3)
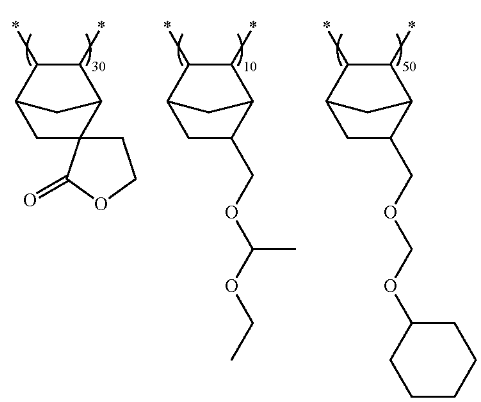

-continued

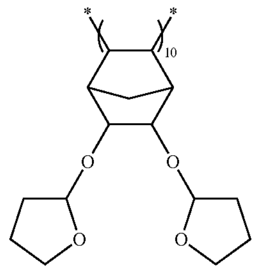

Mw: 8000
Mw/Mn: 2.00

(Ab′-4)

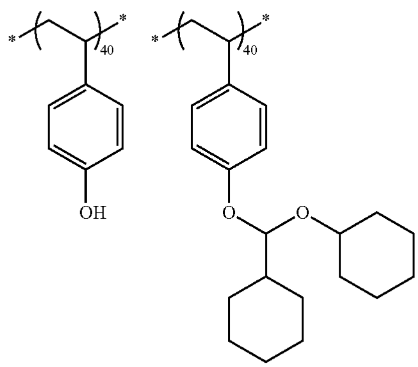

Mw: 8000
Mw/Mn: 1.51

(Ab′-5)

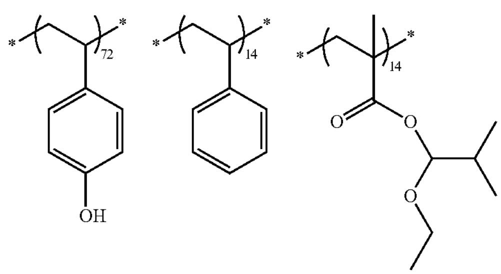

Mw: 16100
Mw/Mn: 1.63

Hydrophobic resins, acid generators, basic compounds, surfactants, solvents, developers and rinsing solutions used in Examples and Comparative Examples are shown below.

[Photoacid Generator]

The photoacid generator was appropriately selected from Acid Generators z1 to z145 recited above and used.

[Basic Compound]

N-1

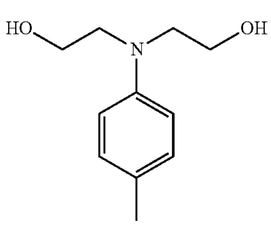

-continued

N-2

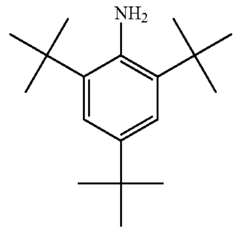

N-3

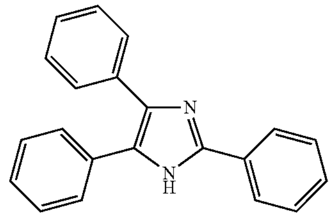

N-4

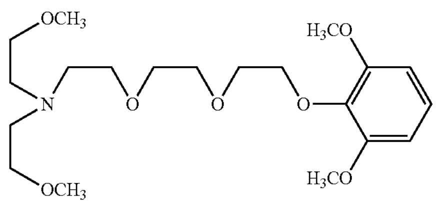

N-5

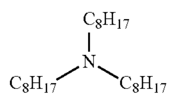

N-6

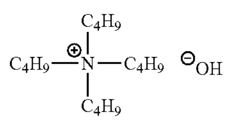

N-7

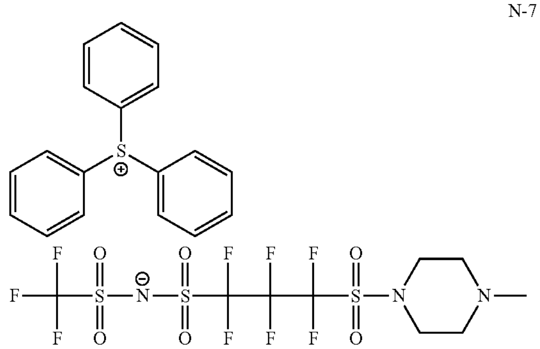

N-8

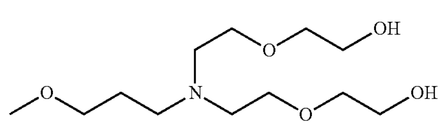

N-9

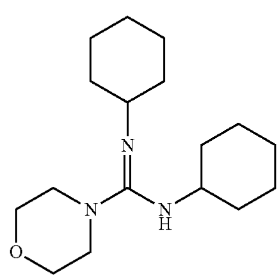

-continued

N-10

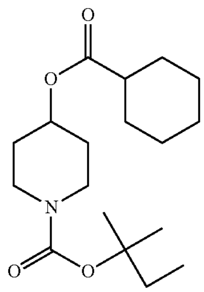

N-11

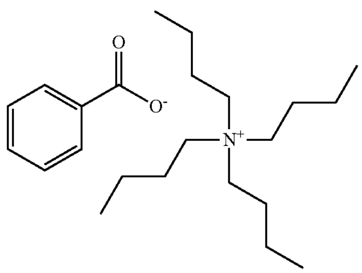

N-12

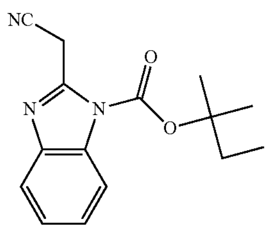

[Hydrophobic Resin]

HR-1

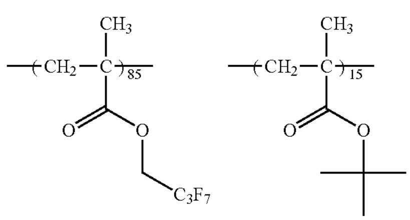

Mw: 1000
Mw/Mn: 1.51

HR-24

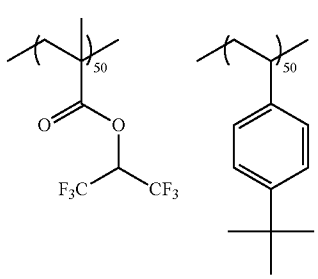

Mw: 5000
Mw/Mn: 1.60

-continued

HR-29

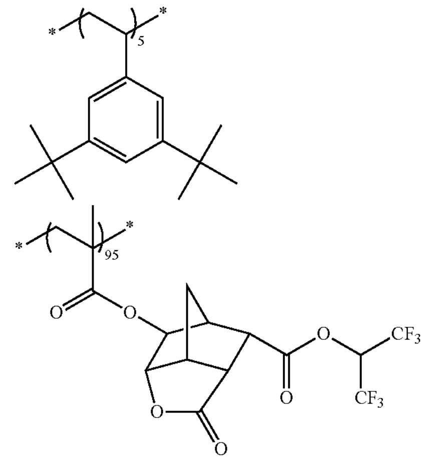

Mw: 12000
Mw/Mn: 1.55

[Solvent]
S-1: Propylene glycol monomethyl ether acetate (PGMEA) (b.p.=146° C.)
S-2: Propylene glycol monomethyl ether (PGME) (b.p.=120° C.)
S-3: Methyl lactate (b.p.=145° C.)
S-4: Cyclohexanone (b.p.=157° C.)
[Surfactant]
W-1: Megaface R08 (produced by DIC Corporation, containing fluorine and silicon)
W-2: Polysiloxane Polymer KP-341 (produced by Shin-Etsu Chemical Co., Ltd., silicon-containing)
W-3: Troysol S-366 (produced by Troy Chemical, fluorine-containing)
W-4: PF6320 (produced by OMNOVA, fluorine-containing)
[Developer and Rinsing Solution]
G-1: Butyl acetate
G-2: 2-Heptanone
G-3: Anisole
G-4: 4-Methyl-2-pentanol
G-5: 1-Hexanol
G-6: Decane
G-7: TMAH, Aqueous 2.38 mass % tetramethylammonium hydroxide solution

Examples 1A to 42A and Comparative Examples 1A to 5A

(1) Preparation and Coating of Coating Solution of Actinic Ray-Sensitive or Radiation-Sensitive Resin Composition The components shown in Table 1 below were dissolved in the solvent shown in the same Table at a concentration of 3.0 mass % in terms of solid content, and this solution was microfiltered through a membrane filter having a pore size of 0.1 μm to obtain an actinic ray-sensitive or radiation-sensitive resin composition (resist composition).

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 100 nm.

(2) EB Exposure and Development

The resist film-coated wafer obtained in (1) above was patternwise irradiated using an electron beam lithography apparatus (HL750, manufactured by Hitachi, Ltd., accelerating voltage: 50 KeV). At this time, the lithography was performed to form a 1:1 line-and-space pattern. After the electron beam lithography, the wafer was heated on a hot plate at 100° C. for 90 seconds, then developed by puddling the organic developer shown in the Table below for 30 seconds, rinsed by using the rinsing solution shown in the Table below, spun at a rotation speed of 4,000 rpm for 30 seconds and heated at 95° C. for 60 seconds to obtain a resist pattern of a 1:1 line-and-space pattern having a line width of 100 nm.

(3) Evaluation of Resist Pattern

Using a scanning electron microscope (S-9220, manufacture by Hitachi Ltd.), the obtained resist pattern was evaluated for sensitivity, pattern profile, and resolution of an isolated line pattern and an isolated space pattern by the following methods.

[Sensitivity]

The irradiation energy below which a 1:1 line-and-space pattern having a line width of 100 nm cannot be resolved was taken as the sensitivity.

[Evaluation of Pattern Profile]

The cross-sectional profile of a 1:1 line-and-space pattern having a line width of 100 nm formed at the irradiation dose giving the above-described sensitivity was observed using a scanning electron microscope (S-4300, manufactured by Hitachi, Ltd.) and evaluated on a scale of three grades of rectangular, reverse tapered and tapered.

[Resolution of Isolated Line Pattern; Resolving Power]

The limiting resolution (the minimum line width below which a line and a space cannot be separated and resolved) of an isolated line pattern (line:space=1:>100) formed at the irradiation dose giving the sensitivity above was determined. This value was taken as "resolution (nm)". However, in Comparative Example 5A, the resist film was irradiated with an electron beam by inverting the image drawing region, and the value obtained by determining the limiting resolution of an isolated line pattern (line:space=1:>100) was taken as "resolution (nm)".

[Resolution of Isolated Space Pattern; Resolving Power]

The limiting resolution (the minimum line width below which a line and a space cannot be separated and resolved) of an isolated space pattern (line:space=>100:1) was determined. This value was taken as "resolution (nm)". However, in Comparative Example 5A, the resist film was irradiated with an electron beam by inverting the image drawing region, and the value obtained by determining the limiting resolution of an isolated space pattern (line:space=>100:1) was taken as "resolution (nm)".

[Etching Resistance]

In (1) Preparation and Coating of Coating Solution of Actinic Ray-Sensitive or Radiation-Sensitive Resin Composition above, a resist film having a thickness of 200 nm was formed and then subjected to plasma etching under the condition of a temperature of 23° C. over 30 seconds by using a mixed gas of $C_4F_6$ (20 mL/min) and $O_2$ (40 mL/min). Thereafter, the residual film amount was measured, and the etching rate was calculated. The etching resistance was evaluated based on the following criteria.

(Evaluation Criteria)

A: When the etching rate is less than 15 Å/sec.

B: When the etching rate is 15 Å/sec or more.

TABLE 1

| | Resist Composition | | | | | | | Evaluation Results | | | | |
|---|---|---|---|---|---|---|---|---|---|---|---|---|
| | Resin (Ab) (78 mass %) | Solvent (mass ratio) | Photoacid Generator (20 mass %) | Basic Compound (2 mass %) | Surfactant (0.01 mass %) | Developer (mass ratio) | Rinsing Solution | Sensitivity ($\mu C/cm^2$) | Pattern Profile | Isolated Line Pattern Resolution (nm) | Isolated Space Pattern Resolution (nm) | Dry Etching Resistance |
| Example 1A | Ab-1 | S-1/S-2 (70/30) | z115 | N-8 | W-4 | G-1 | — | 14 | rectangular | 50.0 | 37.5 | A |
| Example 2A | Ab-2 | S-1/S-2 (70/30) | z115 | N-8 | W-4 | G-1 | — | 18 | rectangular | 62.5 | 50.0 | A |
| Example 3A | Ab-3 | S-1/S-2 (70/30) | z115 | N-8 | W-4 | G-1 | — | 21 | rectangular | 75.0 | 62.5 | A |
| Example 4A | Ab-4 | S-1/S-2 (70/30) | z115 | N-8 | W-4 | G-1 | — | 24 | rectangular | 87.5 | 75.0 | A |
| Example 5A | Ab-5 | S-1/S-2 (70/30) | z115 | N-8 | W-4 | G-1 | — | 26 | rectangular | 100.0 | 87.5 | A |
| Example 6A | Ab-6 | S-1/S-3 (80/20) | z108 | N-9 | W-3 | G-1 | — | 17 | rectangular | 62.5 | 50.0 | A |
| Example 7A | Ab-7 | S-1/S-3 (80/20) | z108 | N-9 | W-3 | G-1 | — | 20 | rectangular | 75.0 | 62.5 | A |
| Example 8A | Ab-8 | S-1/S-3 (80/20) | z108 | N-9 | W-3 | G-1 | — | 23 | rectangular | 87.5 | 75.0 | A |
| Example 9A | Ab-9 | S-1/S-3 (80/20) | z108 | N-9 | W-3 | G-1 | — | 25 | rectangular | 100.0 | 87.5 | A |
| Example 10A | Ab-10 | S-1/S-3 (90/10) | z121 | N-6 | W-3 | G-1 | — | 15 | rectangular | 62.5 | 50.0 | A |
| Example 11A | Ab-11 | S-1/S-3 (90/10) | z121 | N-6 | W-3 | G-1 | — | 18 | rectangular | 62.5 | 62.5 | A |
| Example 12A | Ab-12 | S-1/S-3 (90/10) | z121 | N-6 | W-3 | G-1 | — | 20 | rectangular | 75.0 | 62.5 | A |
| Example 13A | Ab-13 | S-1/S-3 (90/10) | z121 | N-6 | W-3 | G-1 | — | 21 | rectangular | 87.5 | 75.0 | A |
| Example 14A | Ab-14 | S-1/S-3 (90/10) | z121 | N-6 | W-3 | G-1 | — | 24 | rectangular | 87.5 | 75.0 | A |
| Example 15A | Ab-15 | S-1/S-3 (90/10) | z121 | N-6 | W-3 | G-1 | — | 26 | rectangular | 100.0 | 75.0 | A |
| Example 16A | Ab-16 | S-1/S-3 (90/10) | z121 | N-6 | W-3 | G-1 | — | 28 | rectangular | 112.5 | 87.5 | A |
| Example 17A | Ab-17-1 | S-1/S-2 (50/50) | z122 | N-8 | W-1 | G-1 | — | 16 | rectangular | 62.5 | 62.5 | A |
| Example 18A | Ab-17-2 | S-1/S-2 (50/50) | z122 | N-8 | W-1 | G-1 | — | 19 | rectangular | 75.0 | 75.0 | A |
| Example 19A | Ab-17-3 | S-1/S-2 (50/50) | z122 | N-8 | W-1 | G-1 | — | 24 | rectangular | 100.0 | 87.5 | A |
| Example 20A | Ab-17-4 | S-1/S-2 (50/50) | z127 | N-2 | W-3 | G-1 | — | 18 | rectangular | 50.0 | 50.0 | A |
| Example 21A | Ab-17-5 | S-1/S-2 (50/50) | z127 | N-2 | W-3 | G-1 | — | 20 | rectangular | 62.5 | 62.5 | A |
| Example 22A | Ab-17-6 | S-1/S-2 (50/50) | z127 | N-2 | W-3 | G-1 | — | 23 | rectangular | 87.5 | 75.0 | A |

TABLE 1-continued

| | | | | | | | | | | | | |
|---|---|---|---|---|---|---|---|---|---|---|---|---|
| Example 23A | Ab-18 | S-1/S-2 (80/20) | z114 | N-3 | W-4 | G-1 | — | 17 | rectangular | 75.0 | 37.5 | A |
| Example 24A | Ab-19 | S-1/S-2 (90/10) | z123 | N-9 | W-4 | G-1 | — | 16 | rectangular | 62.5 | 37.5 | A |
| Example 25A | Ab-20 | S-2/S-3 (50/50) | z67 | N-7 | W-2 | G-3 | G-5 | 26 | rectangular | 87.5 | 62.5 | A |
| Example 26A | Ab-21 | S-1/S-2 (60/40) | z119 | N-7 | W-4 | G-1 | — | 19 | rectangular | 75.0 | 50.0 | A |
| Example 27A | Ab-22 | S-4/S-3 (70/30) | z5 | N-10 | W-2 | G-2 | G-6 | 28 | rectangular | 75.0 | 62.5 | A |
| Example 28A | Ab-23 | S-3 | z11 | N-5 | W-3 | G-3 | G-6 | 22 | rectangular | 100.0 | 62.5 | A |
| Example 29A | Ab-24 | S-4/S-2 (80/20) | z39 | N-6 | W-1 | G-1/G-3 (80/20) | G-4 | 25 | rectangular | 87.5 | 87.5 | A |
| Example 30A | Ab-25 | S-2/S-4 (50/50) | z33 | N-4 | W-1 | G-1 | G-5 | 28 | rectangular | 100.0 | 62.5 | A |
| Example 31A | Ab-26 | S-1 | z69 | N-5 | W-2 | G-1 | G-4 | 24 | rectangular | 87.5 | 75.0 | A |
| Example 32A | Ab-27 | S-1/S-3 (60/40) | z32 | N-1 | W-4 | G-2 | G-4 | 27 | rectangular | 75.0 | 75.0 | A |
| Example 33A | Ab-28 | S-1/S-2 (80/20) | z118 | N-3 | W-3 | G-1 | — | 20 | rectangular | 50.0 | 50.0 | A |
| Example 34A | Ab-29 | S-1/S-2 (80/20) | z115 | N-7 | N-3 | G-1 | — | 16 | rectangular | 50.0 | 50.0 | A |
| Comparative Example 1A | Ab'-1 | S-2/S-4 (50/50) | z33 | N-4 | W-1 | G-1 | G-5 | 33 | tapered | 125.0 | 150.0 | A |
| Comparative Example 2A | Ab'-2 | S-1 | z69 | N-5 | W-2 | G-1 | G-4 | 39 | reverse tapered | 150.0 | 112.5 | B |
| Comparative Example 3A | Ab'-3 | S-1/S-3 (60/40) | z32 | N-1 | W-4 | G-2 | G-4 | 37 | reverse tapered | 150.0 | 112.5 | B |
| Comparative Example 4A | Ab'-4 | S-1/S-2 (80/20) | z118 | N-3 | W-3 | G-1 | — | | A pattern could not be formed. | | | A |
| Comparative Example 5A | Ab'-5 | S-1/S-3 (70/30) | z69 | N-2 | W-2 | G-7 | water | 31 | tapered | 125.0 | 150.0 | A |

TABLE 1-continued

| | Resist Composition | | | | | | | | Evaluation Results | | | | |
|---|---|---|---|---|---|---|---|---|---|---|---|---|---|
| | | | | | | | | | Isolated Line | | | | |
| | Hydrophobic Resin (mass %) | Resin (Ab) (mass %) | Solvent (mass ratio) | Photoacid Generator (mass %) | Basic Compound (mass %) | Surfactant (0.01 mass %) | Developer (mass ratio) | Rinsing Solution | Sensitivity ($\mu C/cm^2$) | Pattern Profile | Pattern Resolution (nm) | Isolated Space Pattern Resolution (nm) | Dry Etching Resistance |
| Example 35A | HR-1<br>10 | Ab-30<br>88 | S-2/S-1<br>(90/10) | —<br>0 | N-6<br>2 | W-3 | G-1 | — | 23 | rectangular | 75.0 | 62.5 | A |
| Example 36A | HR-24<br>3 | Ab-40<br>86 | S-1/S-2<br>(60/40) | z132<br>10 | N-11<br>1 | W-4 | G-2 | — | 21 | rectangular | 82.5 | 75.0 | A |
| Example 37A | HR-29<br>5 | Ab-41<br>62 | S-1/S-2<br>(80/20) | z133<br>30 | N-12<br>3 | W-4 | G-1 | — | 24 | rectangular | 82.5 | 75.0 | A |
| Example 38A | —<br>0 | Ab-35<br>94 | S-2/S-1<br>(70/30) | z130<br>5 | N-11<br>1 | W-2 | G-1 | — | 25 | rectangular | 100.0 | 75.0 | A |
| Example 39A | —<br>0 | Ab-32<br>98 | S-2/S-1<br>(80/20) | —<br>0 | N-12<br>2 | W-3 | G-1 | G-4 | 20 | rectangular | 75.0 | 75.0 | A |
| Example 40A | —<br>0 | Ab-37<br>97 | S-2 | —<br>0 | N-11<br>3 | W-3 | G-2 | — | 26 | rectangular | 100.0 | 82.5 | A |
| Example 41A | —<br>0 | Ab-42<br>78 | S-1/S-2<br>(50/50) | z124<br>20 | N-11<br>2 | W-1 | G-1 | — | 25 | rectangular | 82.5 | 75.0 | A |
| Example 42A | —<br>0 | Ab-44<br>98 | S-2/S-1<br>(60/40) | —<br>0 | N-6<br>2 | W-2 | G-1 | — | 24 | rectangular | 100.0 | 82.5 | A |

Examples 1B to 42B and Comparative Examples 1B to 5B

Exposure Condition 2: EUV Exposure (4) Preparation and Coating of Coating Solution of Actinic Ray-Sensitive or Radiation-Sensitive Resin Composition The components shown in Table 2 below were dissolved in the solvent shown in the same Table at a concentration of 1.5 mass % in terms of solid content, and this solution was microfiltered through a membrane filter having a pore size of 0.05 μm to obtain an actinic ray-sensitive or radiation-sensitive resin composition (resist composition).

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 50 nm.

(5) EUV Exposure and Development

The resist film-coated wafer obtained in (4) above was patternwise exposed by using an EUV exposure apparatus (Micro Exposure Tool, manufactured by Exitech, NA: 0.3, Quadrupole, outer sigma: 0.68, inner sigma: 0.36) through an exposure mask (line/space=1/1). After the exposure, the resist film was heated on a hot plate at 100° C. for 90 seconds, then developed by puddling the organic developer shown in the Table below for 30 seconds, rinsed by using the rinsing solution shown in the Table below, spun at a rotation speed of 4,000 rpm for 30 seconds and baked at 95° C. for 60 seconds to obtain a resist pattern of a 1:1 line-and-space pattern having a line width of 50 nm.

(6) Evaluation of Resist Pattern

Using a scanning electron microscope (S-938011, manufacture by Hitachi Ltd.), the obtained resist pattern was evaluated for sensitivity, pattern profile, and resolution of an isolated line pattern and an isolated space pattern by the following methods. The results are shown in the Table below.

[Sensitivity]

The exposure dose below which a 1:1 line-and-space pattern having a line width of 50 nm cannot be resolved was taken as the sensitivity.

(Evaluation of Pattern Profile)

The cross-sectional profile of a 1:1 line-and-space pattern having a line width of 50 nm formed at the exposure dose giving the above-described sensitivity was observed using a scanning electron microscope (S-4300, manufactured by Hitachi, Ltd.) and evaluated on a scale of three grades of rectangular, reverse tapered and tapered.

[Resolution of Isolated Line Pattern; Resolving Power]

The limiting resolution (the minimum line width below which a line and a space cannot be separated and resolved) of an isolated line pattern (line:space=1:5) formed through a mask of line:space=5:1 at the exposure dose giving the sensitivity above was determined. This value was taken as "resolution (nm)". However, in Comparative Example 5B, the value obtained by determining the limiting resolution (the minimum line width below which a line and a space cannot be separated and resolved) of an isolated line pattern formed through a mask of line:space=1:5 was taken as "resolution (nm)".

[Resolution of Isolated Space Pattern; Resolving Power]

The limiting resolution (the minimum line width below which a line and a space cannot be separated and resolved) of an isolated space pattern (line:space=5:1) formed through a mask of line:space=1:5 at the exposure dose giving the sensitivity above was determined. This value was taken as "resolution (nm)". However, in Comparative Example 5B, the value obtained by determining the limiting resolution (the minimum line width below which a line and a space cannot be separated and resolved) of an isolated space pattern formed through a mask of line:space=5:1 was taken as "resolution (nm)".

[Etching Resistance]

In (1) Preparation and Coating of Coating Solution of Actinic Ray-Sensitive or Radiation-Sensitive Resin Composition above, a resist film having a thickness of 200 nm was formed and then subjected to plasma etching under the condition of a temperature of 23° C. over 30 seconds by using a mixed gas of $C_4F_6$ (20 mL/min) and $O_2$ (40 mL/min). Thereafter, the residual film amount was measured, and the etching rate was calculated. The etching resistance was evaluated based on the following criteria.

(Evaluation Criteria)

A: When the etching rate is less than 15 Å/sec.

B: When the etching rate is 15 Å/sec or more.

TABLE 2

| | Resist Composition | | | | | | | Evaluation Results | | | | |
|---|---|---|---|---|---|---|---|---|---|---|---|---|
| | Resin (Ab) (78 mass %) | Solvent (mass ratio) | Photoacid Generator (20 mass %) | Basic Compound (2 mass %) | Surfactant (0.01 mass %) | Developer (mass ratio) | Rinsing Solution | Sensitivity (mJ/cm$^2$) | Pattern Profile | Isolated Line Pattern Resolution (nm) | Isolated Space Pattern Resolution (nm) | Dry Etching Resistance |
| Example 1B | Ab-1 | S-1/S-2 (70/30) | z115 | N-8 | W-4 | G-1 | — | 13 | rectangular | 34.0 | 30.0 | A |
| Example 2B | Ab-2 | S-1/S-2 (70/30) | z115 | N-8 | W-4 | G-1 | — | 16 | rectangular | 36.0 | 32.0 | A |
| Example 3B | Ab-3 | S-1/S-2 (70/30) | z115 | N-8 | W-4 | G-1 | — | 20 | rectangular | 36.0 | 34.0 | A |
| Example 4B | Ab-4 | S-1/S-2 (70/30) | z115 | N-8 | W-4 | G-1 | — | 24 | rectangular | 38.0 | 36.0 | A |
| Example 5B | Ab-5 | S-1/S-2 (70/30) | z115 | N-8 | W-4 | G-1 | — | 27 | rectangular | 40.0 | 38.0 | A |
| Example 6B | Ab-6 | S-1/S-3 (80/20) | z108 | N-9 | W-3 | G-1 | — | 20 | rectangular | 34.0 | 32.0 | A |
| Example 7B | Ab-7 | S-1/S-3 (80/20) | z108 | N-9 | W-3 | G-1 | — | 23 | rectangular | 36.0 | 34.0 | A |
| Example 8B | Ab-8 | S-1/S-3 (80/20) | z108 | N-9 | W-3 | G-1 | — | 25 | rectangular | 40.0 | 36.0 | A |
| Example 9B | Ab-9 | S-1/S-3 (80/20) | z108 | N-9 | W-3 | G-1 | — | 28 | rectangular | 42.0 | 38.0 | A |
| Example 10B | Ab-10 | S-1/S-3 (90/10) | z121 | N-6 | W-3 | G-1 | — | 14 | rectangular | 34.0 | 32.0 | A |
| Example 11B | Ab-11 | S-1/S-3 (90/10) | z121 | N-6 | W-3 | G-1 | — | 17 | rectangular | 36.0 | 34.0 | A |
| Example 12B | Ab-12 | S-1/S-3 (90/10) | z121 | N-6 | W-3 | G-1 | — | 19 | rectangular | 38.0 | 34.0 | A |
| Example 13B | Ab-13 | S-1/S-3 (90/10) | z121 | N-6 | W-3 | G-1 | — | 22 | rectangular | 40.0 | 36.0 | A |
| Example 14B | Ab-14 | S-1/S-3 (90/10) | z121 | N-6 | W-3 | G-1 | — | 24 | rectangular | 40.0 | 36.0 | A |
| Example 15B | Ab-15 | S-1/S-3 (90/10) | z121 | N-6 | W-3 | G-1 | — | 27 | rectangular | 40.0 | 38.0 | A |
| Example 16B | Ab-16 | S-1/S-3 (90/10) | z121 | N-6 | W-3 | G-1 | — | 29 | rectangular | 44.0 | 40.0 | A |
| Example 17B | Ab-17-1 | S-1/S-2 (50/50) | z122 | N-8 | W-1 | G-1 | — | 23 | rectangular | 36.0 | 36.0 | A |

TABLE 2-continued

| | | | | | | | | | | | | |
|---|---|---|---|---|---|---|---|---|---|---|---|---|
| Example 18B | Ab-17-2 | S-1/S-2 (50/50) | z122 | N-8 | W-1 | G-1 | — | 26 | rectangular | 40.0 | 40.0 | A |
| Example 19B | Ab-17-3 | S-1/S-2 (50/50) | z122 | N-8 | W-1 | G-1 | — | 29 | rectangular | 44.0 | 42.0 | A |
| Example 20B | Ab-17-4 | S-1/S-2 (50/50) | z127 | N-2 | W-3 | G-1 | — | 19 | rectangular | 34.0 | 34.0 | A |
| Example 21B | Ab-17-5 | S-1/S-2 (50/50) | z127 | N-2 | W-3 | G-1 | — | 24 | rectangular | 38.0 | 36.0 | A |
| Example 22B | Ab-17-6 | S-1/S-2 (50/50) | z127 | N-2 | W-3 | G-1 | — | 27 | rectangular | 40.0 | 38.0 | A |
| Example 23B | Ab-18 | S-1/S-2 (80/20) | z114 | N-3 | W-4 | G-1 | — | 18 | rectangular | 34.0 | 30.0 | A |
| Example 24B | Ab-19 | S-1/S-2 (90/10) | z123 | N-9 | W-4 | G-1 | — | 19 | rectangular | 32.0 | 32.0 | A |
| Example 25B | Ab-20 | S-2/S-3 (50/50) | z67 | N-7 | W-2 | G-3 | G-5 | 26 | rectangular | 42.0 | 36.0 | A |
| Example 26B | Ab-21 | S-1/S-2 (60/40) | z119 | N-7 | W-4 | G-1 | — | 18 | rectangular | 36.0 | 30.0 | A |
| Example 27B | Ab-22 | S-4/S-3 (70/30) | z5 | N-10 | W-2 | G-2 | G-6 | 27 | rectangular | 44.0 | 34.0 | A |
| Example 28B | Ab-23 | S-3 | z11 | N-5 | W-3 | G-3 | G-6 | 24 | rectangular | 38.0 | 34.0 | A |
| Example 29B | Ab-24 | S-4/S-2 (80/20) | z39 | N-6 | W-1 | G-1/G-3 (80/20) | G-4 | 22 | rectangular | 40.0 | 36.0 | A |
| Example 30B | Ab-25 | S-2/S-4 (50/50) | z33 | N-4 | W-1 | G-1 | G-5 | 28 | rectangular | 46.0 | 38.0 | A |
| Example 31B | Ab-26 | S-1 | z69 | N-5 | W-2 | G-1 | G-4 | 25 | rectangular | 42.0 | 36.0 | A |
| Example 32B | Ab-27 | S-1/S-3 (60/40) | z32 | N-1 | W-4 | G-2 | G-4 | 25 | rectangular | 40.0 | 34.0 | A |
| Example 33B | Ab-28 | S-1/S-2 (80/20) | z118 | N-3 | W-3 | G-1 | — | 22 | rectangular | 34.0 | 30.0 | A |
| Example 34B | Ab-29 | S-1/S-2 (80/20) | z115 | N-7 | N-3 | G-1 | — | 15 | rectangular | 36.0 | 32.0 | A |
| Comparative Example 1B | Ab'-1 | S-2/S-4 (50/50) | z33 | N-4 | W-1 | G-1 | G-5 | 31 | tapered | 50.0 | 50.0 | A |

TABLE 2-continued

| | | | | | | | | | | | | |
|---|---|---|---|---|---|---|---|---|---|---|---|---|
| Comparative Example 2B | Ab'-2 | S-1 | z69 | N-5 | W-2 | G-1 | G-4 | 38 | reverse tapered | 56.0 | 44.0 | B |
| Comparative Example 3B | Ab'-3 | S-1/S-3 (60/40) | z32 | N-1 | W-4 | G-2 | G-4 | 39 | reverse tapered | 54.0 | 44.0 | B |
| Comparative Example 4B | Ab'-4 | S-1/S-2 (80/20) | z118 | N-3 | W-3 | G-1 | — | A pattern could not be formed. | | | | A |
| Comparative Example 5B | Ab'-5 | S-1/S-3 (70/30) | z113 | N-2 | W-3 | G-7 | water | 31 | tapered | 52.0 | 48.0 | A |

| | Resist Composition | | | | | | | | Evaluation Results | | | | |
|---|---|---|---|---|---|---|---|---|---|---|---|---|---|
| | | | | | | | | | Isolated Line | | | | |
| | Hydrophobic Resin (mass %) | Resin (Ab) (mass %) | Solvent (mass ratio) | Photoacid Generator (mass %) | Basic Compound (mass %) | Surfactant (0.01 mass %) | Developer (mass ratio) | Rinsing Solution | Sensitivity (mJ/cm$^2$) | Pattern Profile | Pattern Resolution (nm) | Isolated Space Pattern Resolution (nm) | Dry Etching Resistance |
| Example 35B | HR-1 10 | Ab-30 88 | S-2/S-1 (90/10) | — 0 | N-6 2 | W-3 | G-1 | — | 20 | rectangular | 36.0 | 32.0 | A |
| Example 36B | HR-24 3 | Ab-40 86 | S-1/S-2 (60/40) | z132 10 | N-11 1 | W-4 | G-2 | — | 26 | rectangular | 32.0 | 30.0 | A |
| Example 37B | HR-29 5 | Ab-41 62 | S-1/S-2 (80/20) | z133 30 | N-12 3 | W-4 | G-1 | — | 23 | rectangular | 36.0 | 34.0 | A |
| Example 38B | — 0 | Ab-35 94 | S-2/S-1 (70/30) | z130 5 | N-11 1 | W-2 | G-1 | — | 19 | rectangular | 34.0 | 32.0 | A |
| Example 39B | — 0 | Ab-32 98 | S-2/S-1 (80/20) | — 0 | N-12 2 | W-3 | G-1 | G-4 | 22 | rectangular | 40.0 | 34.0 | A |
| Example 40B | — 0 | Ab-37 97 | S-2 | — 0 | N-11 3 | W-3 | G-2 | — | 24 | rectangular | 38.0 | 36.0 | A |
| Example 41B | — 0 | Ab-42 78 | S-1/S-2 (50/50) | z124 20 | N-11 2 | W-1 | G-1 | — | 22 | rectangular | 36.0 | 32.0 | A |
| Example 42B | — 0 | Ab-44 98 | S-2/S-1 (60/40) | — 0 | N-6 2 | W-2 | G-1 | — | 26 | rectangular | 38.0 | 34.0 | A |

As seen from the Tables above, in Examples 1A to 42A and Examples 1B to 42B, all of high sensitivity, high resolution at the formation of an isolated line pattern and an isolated space pattern, good pattern profile and high dry etching resistance are apparently satisfied at the same time, as compared with Comparative Examples 1A, 4A, 5A, 1B, 4B and 5B using a resin not containing a repeating unit represented by formula (Ab1) and Comparative Examples 2A, 3A, 2B and 3B using a resin not containing a repeating unit represented by formula (A).

INDUSTRIAL APPLICABILITY

According to the present invention, a pattern forming method ensuring that in an ultrafine region (for example, a region where the line width or space width is on the order of tens of nm), all of high sensitivity, high resolution at the formation of an isolated line pattern and an isolated space pattern, good pattern profile and high dry etching resistance are satisfied at the same time, an actinic ray-sensitive or radiation-sensitive resin composition, a resist film, a manufacturing method of an electronic device using the same, and an electronic device can be provided.

This application is based on a Japanese patent application filed on Jul. 27, 2012 (Japanese Patent Application No. 2012-167815), US provisional application filed on Oct. 2, 2012 (U.S. Provisional Application No. 61/708,782), and Japanese patent application filed on Mar. 15, 2013 (Japanese Patent Application No. 2013-054402), and the contents thereof are incorporated herein by reference.

The invention claimed is:

1. A pattern forming method comprising, in order, (1) a step of forming a film by using an actinic ray-sensitive or radiation-sensitive resin composition containing a compound capable of generating an acid upon irradiation with an actinic ray or radiation, a resin (Ab) having a repeating unit represented by the following formula (Ab1) and a repeating unit represented by the following formula (A), and a solvent, (2) a step of exposing the film, and (3) a step of developing the exposed film by using an organic solvent-containing developer to form a negative pattern:

(Ab1)

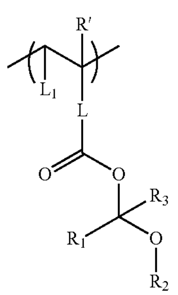

wherein in formula (Ab1),

R' represents a hydrogen atom or an alkyl group, $L_1$ represents a hydrogen atom or an alkyl group, $L_1$ may combine with L to form a ring and in this case, $L_1$ represents an alkylene group or a carbonyl group, L represents a single bond or a divalent linking group, and when $L_1$ and L combine to form a ring, L represents a trivalent linking group, $R_1$ represents a hydrogen atom or a monovalent substituent, $R_2$ represents a monovalent substituent, and $R_1$ and $R_2$ may combine with each other to form a ring, and $R_3$ represents a hydrogen atom, an alkyl group or a cycloalkyl group;

(A)

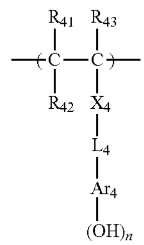

wherein in formula (A), each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ or $X_4$ to form a ring and in this case, $R_{42}$ represents a single bond or an alkylene group, $X_4$ represents a single bond, an alkylene group, —COO— or —$CONR_{64}$—, wherein $R_{64}$ represents a hydrogen atom or an alkyl group, $L_4$ represents a single bond, —COO— or an alkylene group, $Ar_4$ represents an (n+1)-valent aromatic ring group and in the case of combining with $R_{42}$ to form a ring, $Ar_4$ represents an (n+2)-valent aromatic ring group, and n represents an integer of 1 to 4.

2. The pattern forming method as claimed in claim 1, wherein the repeating unit represented by formula (A) is a repeating unit represented by the following formula (A1) or (A2):

(A1)

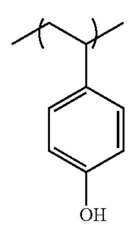

(A2)

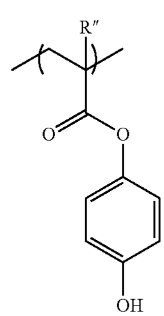

wherein in formula (A2),

R" represents a hydrogen atom or a methyl group.

3. The pattern forming method as claimed in claim 1, wherein the content of the repeating unit represented by formula (A) is from 20 to 40 mol % based on all repeating units in the resin (Ab).

4. The pattern forming method as claimed in claim 1, wherein in formula (Ab1), $L_1$ represents a hydrogen atom.

5. The pattern forming method as claimed in claim 1, wherein in formula (Ab1), $R_2$ represents an alkyl group or a cycloalkyl group.

6. The pattern forming method as claimed in claim 1, wherein in formula (Ab1), $R_3$ represents a hydrogen atom.

7. The pattern forming method as claimed in claim 1, wherein in formula (Ab1), L represents a single bond, an aromatic ring group, a norbornane ring group or an adamantane ring group.

8. The pattern forming method as claimed in claim 1, wherein the repeating unit represented by formula (Ab1) is a repeating unit represented by any one of the following formulae (Ab1-1) to (Ab1-4):

(Ab1-1)

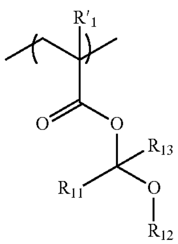

wherein in formula (Ab1-1),
R'$_1$ represents a hydrogen atom or a methyl group, and
$R_{11}$, $R_{12}$ and $R_{13}$ have the same meanings as $R_1$, $R_2$ and $R_3$ in formula (Ab1), respectively;

(Ab1-2)

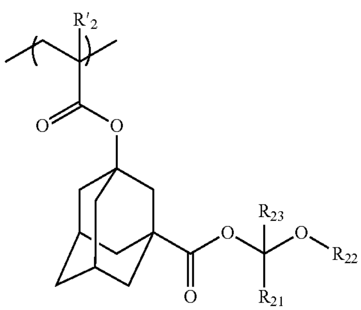

wherein in formula (Ab1-2),
R'$_2$ represents a hydrogen atom or a methyl group, and
$R_{21}$, $R_{22}$ and $R_{23}$ have the same meanings as $R_1$, $R_2$ and $R_3$ in formula (Ab1), respectively;

(Ab1-3)

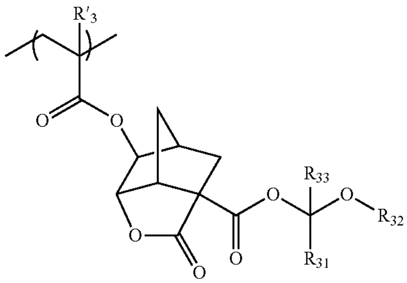

wherein in formula (Ab1-3),
R'$_3$ represents a hydrogen atom or a methyl group, and
$R_{31}$, $R_{32}$ and $R_{33}$ have the same meanings as $R_1$, $R_2$ and $R_3$ in formula (Ab1), respectively; and (Ab1-4)

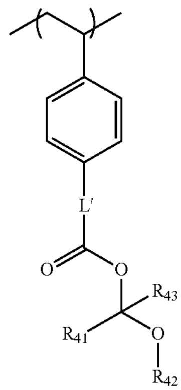

wherein in formula (Ab1-4),
L' represents a single bond or a divalent linking group, and
$R_{41}$, $R_{42}$ and $R_{43}$ have the same meanings as $R_1$, $R_2$ and $R_3$ in formula (Ab1), respectively.

9. The pattern forming method as claimed in claim 1, wherein the exposure is exposure to an electron beam or an extreme-ultraviolet ray.

10. The pattern forming method as claimed in claim 1, wherein the repeating unit represented by formula (Ab1) is a repeating unit represented by formula (Ab1-c):

(Ab1-c)

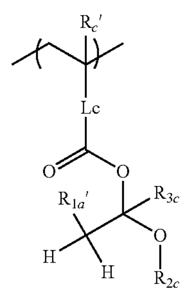

wherein in formula (Ab1-c),
$R_c$' represents a hydrogen atom or an alkyl group,
$L_c$ represents a single bond or a divalent linking group,
$R_{1a}$' represents a hydrogen atom or a monovalent substituent,
$R_{2c}$ represents a monovalent substituent, and $R_{1a}$' and $R_{2c}$ may combine with each other to form a ring, and
$R_{3c}$ represents a hydrogen atom, an alkyl group or a cycloalkyl group.

11. A method for manufacturing an electronic device, comprising:
(1) providing a substrate selected from a silicon- or silicon dioxide-coated substrate,
(2) forming a film on the substrate using an actinic ray-sensitive or radiation-sensitive resin composition containing a compound capable of generating an acid upon irradiation with an actinic ray or radiation, a resin (Ab) having a repeating unit represented by the following formula (Ab1) and a repeating unit represented by the following formula (A), and a solvent, (3) exposing the film, and (4) developing the exposed film by using an organic solvent-containing developer to form a negative pattern on the substrate:

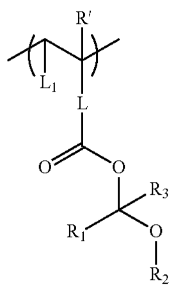

(Ab1)

wherein in formula (Ab1),

R' represents a hydrogen atom or an alkyl group, $L_1$ represents a hydrogen atom or an alkyl group, $L_1$ may combine with L to form a ring and in this case, $L_1$ represents an alkylene group or a carbonyl group, L represents a single bond or a divalent linking group, and when $L_1$ and L combine to form a ring, L represents a trivalent linking group, $R_1$ represents a hydrogen atom or a monovalent substituent, $R_2$ represents a monovalent substituent, and $R_1$ and $R_2$ may combine with each other to form a ring, and $R_3$ represents a hydrogen atom, an alkyl group or a cycloalkyl group;

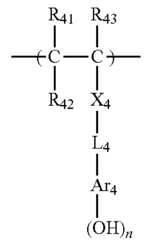

(A)

wherein in formula (A), each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ or $X_4$ to form a ring and in this case, $R_{42}$ represents a single bond or an alkylene group, $X_4$ represents a single bond, an alkylene group, —COO— or —CONR$_{64}$—, wherein $R_{64}$ represents a hydrogen atom or an alkyl group, $L_4$ represents a single bond, —COO— or an alkylene group, $Ar_4$ represents an (n+1)-valent aromatic ring group and in the case of combining with $R_{42}$ to form a ring, $Ar_4$ represents an (n+2)-valent aromatic ring group, and n represents an integer of 1 to 4.

* * * * *